US012360450B2

(12) United States Patent
Kita et al.

(10) Patent No.: US 12,360,450 B2
(45) Date of Patent: Jul. 15, 2025

(54) RESIN, RESIST COMPOSITION AND METHOD FOR PRODUCING RESIST PATTERN, AND COMPOUND

(71) Applicant: SUMITOMO CHEMICAL COMPANY, LIMITED, Tokyo (JP)

(72) Inventors: Yuji Kita, Osaka (JP); Koji Ichikawa, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 532 days.

(21) Appl. No.: 17/122,082

(22) Filed: Dec. 15, 2020

(65) Prior Publication Data

US 2021/0191266 A1 Jun. 24, 2021

(30) Foreign Application Priority Data

Dec. 18, 2019 (JP) ................................ 2019-228374
Mar. 3, 2020 (JP) ................................ 2020-035989

(51) Int. Cl.
*G03F 7/038* (2006.01)
*C08L 65/00* (2006.01)
*G03F 7/004* (2006.01)
*G03F 7/20* (2006.01)

(52) U.S. Cl.
CPC ............ *G03F 7/0382* (2013.01); *C08L 65/00* (2013.01); *G03F 7/0045* (2013.01)

(58) Field of Classification Search
None
See application file for complete search history.

(56) References Cited

U.S. PATENT DOCUMENTS

| | | | | |
|---|---|---|---|---|
| 6,110,640 | A | 8/2000 | Kawamura et al. | |
| 6,132,931 | A | 10/2000 | Kawamura et al. | |
| 2008/0241743 | A1 | 10/2008 | Mizutani et al. | |
| 2018/0348632 | A1 | 12/2018 | Masuyama et al. | |
| 2020/0071268 | A1 * | 3/2020 | Inoue | G03F 7/0046 |

FOREIGN PATENT DOCUMENTS

| | | | | | |
|---|---|---|---|---|---|
| EP | 1975713 | A2 * | 10/2008 | | G03F 7/0392 |
| JP | H10-186642 | A | 7/1998 | | |
| JP | 2004318044 | A | 11/2004 | | |
| JP | 2005133065 | A | 5/2005 | | |
| JP | 2009086354 | A | * | 4/2009 | |
| JP | 2011033839 | A | * | 2/2011 | |
| JP | 2011053365 | A | * | 3/2011 | G03F 7/004 |
| JP | 2011059347 | A | * | 3/2011 | G03F 7/004 |
| JP | 2011070029 | A | * | 4/2011 | G03F 7/004 |
| JP | 2016089124 | A | * | 5/2016 | |
| JP | 6423681 | B2 | | 11/2018 | |
| WO | WO-2016031437 | A1 | * | 3/2016 | G03F 7/004 |
| WO | WO-2020158417 | A1 | * | 8/2020 | C08F 20/10 |

OTHER PUBLICATIONS

Search Report (Form PCT/ISA 201 A) and Written Opinion (Form BE237) issued Aug. 31, 2021, by Belgian Patent Office in corresponding Belgian Patent Application No. BE202005941 and an English translation of the Written Opinion. (13 pages).
Office Action issued on May 21, 2024, by the Taiwan Patent Office in corresponding TW Application No. 109144311, with an English translation of the Office Action.

* cited by examiner

*Primary Examiner* — Martin J Angebranndt
(74) *Attorney, Agent, or Firm* — Panitch Schwarze Belisario & Nadel LLP

(57) ABSTRACT

Disclosed are a resin comprising a structural unit represented by formula (I), and a structural unit represented by formula (a1-1) and/or a structural unit represented by formula (a1-2), and a resist composition including this resin:

(I)

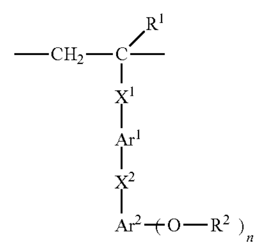

(a1-1)

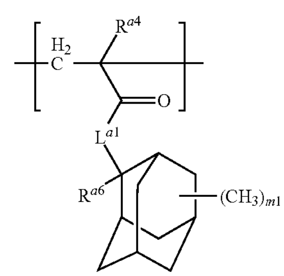

(a1-2)

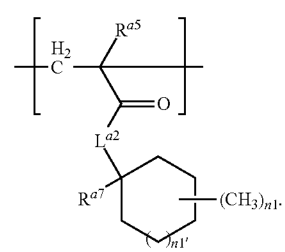

26 Claims, No Drawings

RESIN, RESIST COMPOSITION AND METHOD FOR PRODUCING RESIST PATTERN, AND COMPOUND

TECHNICAL FIELD

The present invention relates to a resin, a resist composition and a method for producing a resist pattern using the resist composition, and a compound.

BACKGROUND ART

Patent Document 1 mentions a resin including the following structural units:

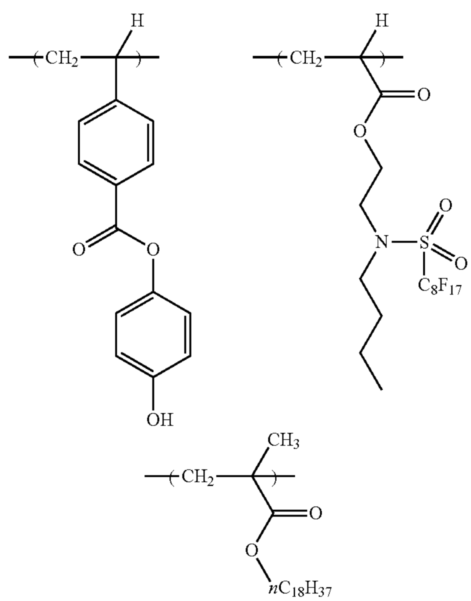

PRIOR ART DOCUMENT

Patent Document

Patent Document 1: JP 10-186642 A

DISCLOSURE OF THE INVENTION

Problems to be Solved by the Invention

An object of the present invention is to provide a resin that forms a resist pattern with line edge roughness (LER) which is better than that of a resist pattern formed from a resist composition comprising the above-mentioned resin.

Means for Solving the Problems

The present invention includes the following inventions.

[1]A resin comprising a structural unit represented by formula (I), and at least one structural unit selected from the group consisting of a structural unit represented by formula (a1-1) and a structural unit represented by formula (a1-2):

(I)

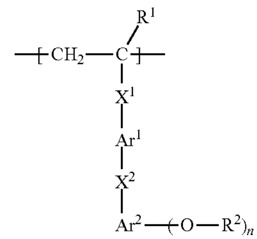

wherein, in formula (I), $R^1$ represents a hydrogen atom or a methyl group, $X^1$ represents a single bond or —CO—O—* (* represents a bonding site to $Ar^1$), $X^2$ represents —CO—O—*, —O—*, —O—CO—*, —O—CO—$(CH_2)_{mm}$—O—* or —O—$(CH_2)_{nn}$—CO—O—* (* represents a bonding site to $Ar^2$), mm and nn represent 0 or 1, $Ar^1$ and $Ar^2$ each independently represent an aromatic hydrocarbon group having 6 to 36 carbon atoms which may have a substituent, $R^2$ each independently represent a hydrogen atom or an acid-labile group, or when two or more $R^2$ exist, two $R^2$ may combine together to form a group having an acetal ring structure, n represents an integer of 1 to 3, and when n is an integer of 2 or more, a plurality of $R^2$ may be the same or different from each other:

(a1-1)

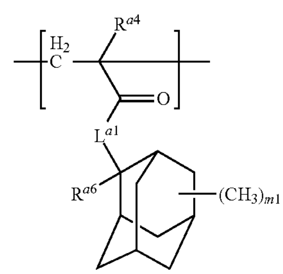

(a1-2)

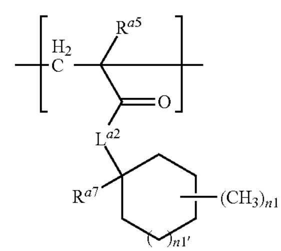

wherein, in formula (a1-1) and formula (a1-2), $L^{a1}$ and $L^{a2}$ each independently represent —O— or *—O—$(CH_2)_{k1}$—CO—O—, k1 represents an integer of 1 to 7, and * represents a bonding site to —CO—, $R^{a4}$ and $R^{a5}$ each independently represent a hydrogen atom or a methyl group, $R^{a6}$ and $R^{a7}$ each independently represent an alkyl group having 1 to 8 carbon atoms, an alkenyl group having 2 to 8 carbon atoms, an alicyclic hydrocarbon group having 3 to 18 carbon atoms, an aromatic hydrocarbon group having 6 to 18 carbon atoms, or a group obtained by combining these groups, m1 represents an integer of 0 to 14, n1 represents an integer of 0 to 10, and n1' represents an integer of 0 to 3.

[2] The resin according to [1], wherein $X^1$ is a single bond.

[3] The resin according to [1] or [2], wherein $X^2$ is —CO—O—* or —O—* (* represents a bonding site to $Ar^2$).

[4] The resin according to any one of [1] to [3], wherein n is 1 or 2.

[5] The resin according to any one of [1] to [4], wherein the acid-labile group in $R^2$ is a group represented by formula (1a) or a group represented by formula (2a):

(1a)

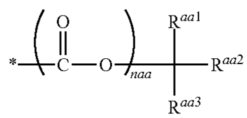

wherein, in formula (1a), $R^{aa1}$, $R^{aa2}$ and $R^{aa3}$ each independently represent an alkyl group having 1 to 8 carbon atoms which may have a substituent, an alkenyl group having 2 to 8 carbon atoms which may have a substituent, an alicyclic hydrocarbon group having 3 to 20 carbon atoms which may have a substituent, or an aromatic hydrocarbon group having 6 to 18 carbon atoms which may have a substituent, or $R^{aa1}$ and $R^{aa2}$ may be bonded each other to form an alicyclic hydrocarbon group having 3 to 20 carbon atoms together with carbon atoms to which $R^{aa1}$ and $R^{aa2}$ are bonded, $n^{aa}$ represents 0 or 1, and

* represents a bond:

(2a)

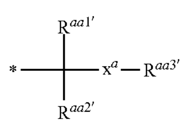

wherein, in formula (2a), $R^{aa1'}$ and $R^{aa2'}$ each independently represent a hydrogen atom or a hydrocarbon group having 1 to 12 carbon atoms, $R^{aa3'}$ represents a hydrocarbon group having 1 to 20 carbon atoms, or $R^{aa2'}$ and $R^{aa3'}$ may be bonded each other to form a heterocyclic group having 3 to 20 carbon atoms together with —C—$X^a$— to which $R^{aa2'}$ and $R^{aa3'}$ are bonded, —$CH_2$— included in the hydrocarbon group and the heterocyclic group may be replaced by —O— or —S—, $X^a$ represents an oxygen atom or a sulfur atom, and

* represents a bond.

[6] The resin according to any one of [1] to [5], wherein $R^2$ is a hydrogen atom, or n is 2 or more and two $R^2$ combine together to form a group having an acetal ring structure.

[7] The resin according to any one of [1] to [6], further comprising a structural unit represented by formula (a2-A):

(a2-A)

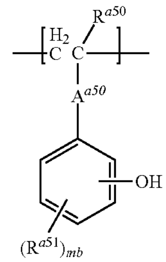

wherein, in formula (a2-A), $R^{a50}$ represents a hydrogen atom, a halogen atom or an alkyl group having 1 to 6 carbon atoms which may have a halogen atom, $R^{a51}$ represents a halogen atom, a hydroxy group, an alkyl group having 1 to 6 carbon atoms, an alkoxy group having 1 to 6 carbon atoms, an alkoxyalkyl group having 2 to 12 carbon atoms, an alkoxyalkoxy group having 2 to 12 carbon atoms, an alkylcarbonyl group having 2 to 4 carbon atoms, an alkylcarbonyloxy group having 2 to 4 carbon atoms, an acryloyloxy group or a methacryloyloxy group, $A^{a50}$ represents a single bond or *—$X^{a51}$-($A^{a52}$-$X^{a52}$)$_{nb}$—, and * represents a bonding site to carbon atoms to which —$R^{a50}$ is bonded, $A^{a52}$ represents an alkanediyl group having 1 to 6 carbon atoms, $X^{a51}$ and $X^{a52}$ each independently represent —O—, —CO—O— or —O—CO—, nb represents 0 or 1, and mb represents an integer of 0 to 4, and when mb is an integer of 2 or more, a plurality of $R^{a51}$ may be the same or different from each other.

[8]A resist composition comprising the resin according to any one of [1] to [7] and an acid generator.

[9] The resist composition according to [8], wherein the acid generator comprises a salt represented by formula (B1):

(B1)

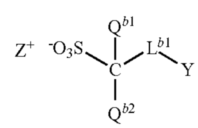

wherein, in formula (B1), $Q^{b1}$ and $Q^{b2}$ each independently represent a fluorine atom or a perfluoroalkyl group having 1 to 6 carbon atoms, $L^{b1}$ represents a divalent saturated hydrocarbon group having 1 to 24 carbon atoms, —$CH_2$— included in the divalent saturated hydrocarbon group may be replaced by —O— or —CO—, and a hydrogen atom included in the divalent saturated hydrocarbon group may be substituted with a fluorine atom or a hydroxy group, Y represents a methyl group which may have a substituent or an alicyclic hydrocarbon group having 3 to 24 carbon atoms which may have a substituent, and —$CH_2$— included in the alicyclic hydrocarbon group may be replaced by —O—, —$S(O)_2$— or —CO—, and $Z^+$ represents an organic cation.

[10] The resist composition according to [8] or [9], further comprising a salt generating an acid having an acidity lower than that of an acid generated from the acid generator.

[11]A method for producing a resist pattern, which comprises:

(1) a step of applying the resist composition according to any one of [8] to [10] on a substrate, (2) a step of drying the applied composition to form a composition layer, (3) a step of exposing the composition layer, (4) a step of heating the exposed composition layer, and (5) a step of developing the heated composition layer.

[12]A compound represented by formula (IA):

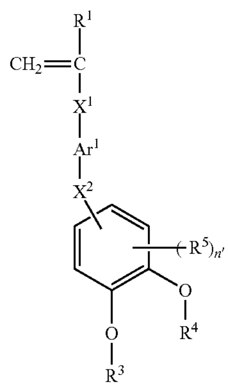

(IA)

wherein, in formula (IA), $R^1$ represents a hydrogen atom or a methyl group, $X^1$ represents a single bond or —CO—O—* (* represents a bonding site to $Ar^1$), $X^2$ represents —CO—O—*, —O—*, —O—CO—*, —O—CO—$(CH_2)_{mm}$—O—* or —O—$(CH_2)_{nn}$—CO—O—* (* represents a bonding site to the benzene ring), mm and nn represent 0 or 1, $Ar^1$ represents an aromatic hydrocarbon group having 6 to 36 carbon atoms which may have a substituent, $R^3$ and $R^4$ each independently represent a hydrogen atom or an acid-labile group, or $R^3$ and $R^4$ may combine together to form a group having an acetal ring structure, $R^5$ represents a halogen atom, an alkyl fluoride group having 1 to 6 carbon atoms or an alkyl group having 1 to 12 carbon atoms, and —$CH_2$— included in the alkyl group and the alkyl fluoride group may be replaced by —O— or —CO—, and n' represents an integer of 0 to 3, and when n' is 2 or more, a plurality of $R^5$ may be the same or different from each other.

[13] The compound according to [12], wherein $X^1$ is a single bond.

[14] The compound according to [12] or [13], wherein $X^2$ is —CO—O—* or —O—* (* represents a bonding site to the benzene ring).

[15] The compound according to any one of [12] to [14], wherein n' is 0.

[16] The compound according to any one of [12] to [15], wherein $R^3$ and $R^4$ are a hydrogen atom, or $R^3$ and $R^4$ combine together to form a group having an acetal ring structure.

[17]A resin comprising a structural unit derived from the compound according to any one of [12] to [16].

Effects of the Invention

It is possible to produce a resist pattern with satisfactory line edge roughness (LER) by using a resist composition in which a resin including a structural unit of the present invention is used.

MODE FOR CARRYING OUT THE INVENTION

In the present specification, "(meth)acrylic monomer" means at least one selected from the group consisting of a monomer having a structure of "$CH_2$=CH—CO—" and a monomer having a structure of "$CH_2$=C($CH_3$)—CO—". Similarly, "(meth)acrylate" and "(meth)acrylic acid" mean "at least one selected from the group consisting of acrylate and methacrylate" and "at least one selected from the group consisting of acrylic acid and methacrylic acid", respectively. When a structural unit having "$CH_2$=C($CH_3$)—CO—" or "$CH_2$=CH—CO—" is exemplified, a structural unit having both groups shall be similarly exemplified. In groups mentioned in the present specification, regarding groups capable of having both a linear structure and a branched structure, they may have either the linear or branched structure. "Combined group" means a group obtained by bonding two or more exemplified groups, and a valence of the group may appropriately vary depending on the bonding state. "derived" or "induced" in the present specification means that a polymerizable C═C bond included in the molecule becomes a —C—C— group by polymerization. When stereoisomers exist, all stereoisomers are included.

In the present specification, "solid component of resist composition" means the total of components excluding the below-mentioned solvent (E) from the total amount of the resist composition.

[Resin]

The resin of the present invention is a resin (hereinafter sometimes referred to as "resin (A)") including a structural unit represented by formula (I) (hereinafter sometimes referred to as structural unit (I)), and at least one structural unit selected from the group consisting of a structural unit represented by formula (a1-1) (hereinafter sometimes referred to as structural unit (a1-1)) and a structural unit represented by formula (a1-2) (hereinafter sometimes referred to as structural unit (a1-2)).

<Structural Unit (I)>

The structural unit (I) is represented by the following formula:

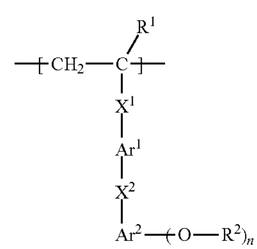

(I)

wherein, in formula (I), $R^1$ represents a hydrogen atom or a methyl group, $X^1$ represents a single bond or —CO—O—* (* represents a bonding site to $Ar^1$), $X^2$ represents —CO—O—*, —O—*, —O—CO—*, —O—CO—$(CH_2)_{mm}$—O—* or —O—$(CH_2)_{nn}$—CO—O—* (* represents a bonding site to $Ar^2$), mm and nn represent 0 or 1, $Ar^1$ and $Ar^2$ each independently represent an aromatic hydrocarbon group having 6 to 36 carbon atoms which may have a substituent, $R^2$ each independently represent a hydrogen atom or an acid-labile group, or when two or more $R^2$ exist, two $R^2$ may combine together to form a group having an acetal ring structure, n represents an integer of 1 to 3, and when n is an integer of 2 or more, a plurality of $R^2$ may be the same or different from each other.

Examples of the divalent aromatic hydrocarbon group for $Ar^1$ and $Ar^2$ include a benzenediyl group, a naphthalenediyl group, an anthracenediyl group and the like.

Examples of the trivalent or tetravalent aromatic hydrocarbon group for $Ar^2$ include a benzenetriyl group, a benzenetetrayl group, a naphthalenetriyl group, a naphthalenetetrayl group, an anthracenetriyl group, an anthracenetetrayl group and the like.

The number of carbon atoms of the aromatic hydrocarbon group is preferably 6 to 24, more preferably 6 to 18, still more preferably 6 to 14, yet more preferably 6 to 10, and further preferably 6.

Examples of the substituent of the aromatic hydrocarbon group include a hydroxy group, a halogen atom, a cyano group, an alkyl group having 1 to 16 carbon atoms (—$CH_2$— included in the alkyl group may be replaced by —O— or —CO—), an alkyl fluoride group having 1 to 12 carbon atoms (—$CH_2$— included in the alkyl fluoride group may be replaced by —O— or —CO—), an alicyclic hydrocarbon group having 3 to 12 carbon atoms, an aromatic hydrocarbon group having 6 to 10 carbon atoms, or groups obtained by combining these groups.

Examples of the halogen atom include a fluorine atom, a chlorine atom, a bromine atom and an iodine atom.

Examples of the alkyl group having 1 to 16 carbon atoms include a methyl group, an ethyl group, a propyl group, a butyl group, a pentyl group, a hexyl group, a heptyl group, an octyl group, a nonyl group, a decyl group, an undecyl group, a dodecyl group and the like. The number of carbon atoms of the alkyl group is preferably 1 to 12, more preferably 1 to 9, still more preferably 1 to 6, and yet more preferably 1 to 4.

When —$CH_2$— included in the alkyl group is replaced by —O— or —CO—, the number of carbon atoms before replacement is taken as the total number of carbon atoms of the alkyl group. Examples of the group in which —$CH_2$— included in the alkyl group is replaced by —O— or —CO— include a hydroxy group (group in which —$CH_2$— included in the methyl group is replaced by —O—), a carboxy group (group in which —$CH_2$—$CH_2$-included in the ethyl group is replaced by —O—CO—), an alkoxy group (group in which —$CH_2$— at any position included in the alkyl group is replaced by —O—), an alkoxycarbonyl group (group in which —$CH_2$—$CH_2$— at any position included in the alkyl group is replaced by —O—CO—), an alkylcarbonyl group (group in which —$CH_2$— at any position included in alkyl group is replaced by —CO—), an alkylcarbonyloxy group (group in which —$CH_2$—$CH_2$— at any position included in the alkyl group is replaced by —CO—O—) and the like.

Examples of the alkoxy group include an alkoxy group having 1 to 15 carbon atoms, for example, a methoxy group, an ethoxy group, a propoxy group, a butoxy group, a pentyloxy group, a hexyloxy group, an octyloxy group, a 2-ethylhexyloxy group, a nonyloxy group, a decyloxy group, an undecyloxy group, a dodecyloxy group and the like. The number of carbon atoms of the alkoxy group is preferably 1 to 12, more preferably 1 to 11, still more preferably 1 to 6, and yet more preferably 1 to 4.

The alkoxycarbonyl group, the alkylcarbonyl group and the alkylcarbonyloxy group represent a group in which a carbonyl group or a carbonyloxy group is bonded to the alkyl group or alkoxy group mentioned above.

Examples of the alkoxycarbonyl group include an alkoxycarbonyl group having 2 to 15 carbon atoms, for example, a methoxycarbonyl group, an ethoxycarbonyl group, a butoxycarbonyl group and the like. Examples of the alkylcarbonyl group include an alkylcarbonyl group having 2 to 16 carbon atoms, for example, an acetyl group, a propionyl group and a butyryl group. Examples of the alkylcarbonyloxy group include an alkylcarbonyloxy group having 2 to 15 carbon atoms, for example, an acetyloxy group, a propionyloxy group, a butyryloxy group and the like. The number of carbon atoms of the alkoxycarbonyl group is preferably 2 to 13, more preferably 2 to 11, still more preferably 2 to 6, and yet more preferably 2 to 4. The number of carbon atoms of the alkylcarbonyl group is preferably 2 to 13, more preferably 2 to 12, still more preferably 2 to 6, and yet more preferably 2 to 4. The number of carbon atoms of the alkylcarbonyloxy group is preferably 2 to 13, more preferably 2 to 11, still more preferably 2 to 6, and yet more preferably 2 to 4.

Examples of the alkyl fluoride group having 1 to 12 carbon atoms include alkyl fluoride groups such as a trifluoromethyl group, a difluoromethyl group, a perfluoroethyl group, a 2,2,2-trifluoroethyl group, a 1,1,2,2-tetrafluoroethyl group, a perfluoropropyl group, a 2,2,3,3,3-pentafluoropropyl group, a perfluorobutyl group, a 1,1,2,2,3,3,4,4-octafluorobutyl group, a perfluoropentyl group, a 2,2,3,3,4,4,5,5,5-nonafluoropentyl group and a perfluorohexyl group. The number of carbon atoms of the alkyl fluoride group is preferably 1 to 9, more preferably 1 to 6, and still more preferably 1 to 4.

When —$CH_2$— included in the alkyl fluoride group is replaced by —O— or —CO—, the number of carbon atoms before replacement is taken as the total number of carbon atoms of the alkyl fluoride group. Examples of the group in which —$CH_2$— included in the alkyl fluoride group is replaced by —O— or —CO— include an alkoxy fluoride group (group in which —$CH_2$— at any position included in the alkyl fluoride group is replaced by —O—), an alkoxycarbonyl fluoride group (group in which —$CH_2$—$CH_2$— at any position included in the alkyl fluoride group is replaced by —O—CO—), an alkylcarbonyl fluoride group (group in which —$CH_2$— at any position included in the alkyl fluoride group is replaced by —CO—), an alkylcarbonyloxy fluoride group (group in which —$CH_2$—$CH_2$— at any position included in the alkyl fluoride group is replaced by —CO—O—) and the like.

Examples of the alkoxy fluoride group, the alkoxycarbonyl fluoride group, the alkylcarbonyl fluoride group and the alkylcarbonyloxy fluoride group include an alkoxy fluoride group having 1 to 11 carbon atoms, an alkoxycarbonyl fluoride group having 2 to 11 carbon atoms, an alkylcarbonyl fluoride group having 2 to 12 carbon atoms and an alkylcarbonyloxy fluoride group having 2 to 11 carbon atoms, and one or more hydrogen atoms of the above-exemplified groups may be substituted with a fluorine atom.

The alicyclic hydrocarbon group having 3 to 12 carbon atoms may be either monocyclic or polycyclic, and examples thereof include the following groups. ** is a bond to an aromatic hydrocarbon group.

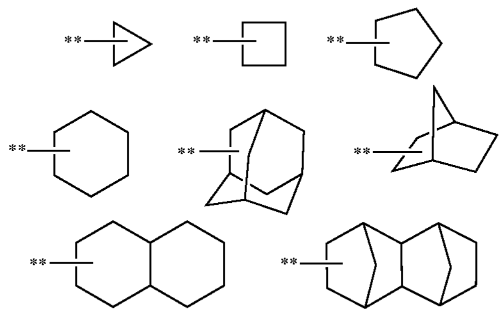

Examples of the aromatic hydrocarbon group having 6 to 10 carbon atoms include a phenyl group, a naphthyl group and the like.

Examples of the combined group in the substituent of the aromatic hydrocarbon group include a group obtained by combining a hydroxy group and an alkyl group having 1 to 12 carbon atoms, a group obtained by combining an alkoxy group having 1 to 12 carbon atoms and an alkoxy group having 1 to 12 carbon atoms, a group obtained by combining an alkyl group having 1 to 12 carbon atoms and an aromatic hydrocarbon group having 6 to 10 carbon atoms and the like.

Examples of the group obtained by combing a hydroxy group and an alkyl group having 1 to 12 carbon atoms include hydroxyalkyl groups having 1 to 12 carbon atoms, such as a hydroxymethyl group and a hydroxyethyl group.

Examples of the group obtained by combining an alkoxy group having 1 to 12 carbon atoms and an alkoxy group having 1 to 12 carbon atoms include alkoxyalkoxy groups having 2 to 24 carbon atoms, such as an ethoxyethoxy group.

Examples of the group obtained by combining an alkyl group having 1 to 12 carbon atoms and an aromatic hydrocarbon group having 6 to 10 carbon atoms include aralkyl group having 7 to 22 carbon atoms, such as a benzyl group.

The substituent is preferably a halogen atom, an alkyl fluoride group having 1 to 6 carbon atoms, an alkyl group having 1 to 12 carbon atoms, a hydroxy group, an alkoxy group having 1 to 11 carbon atoms, an alkoxycarbonyl group having 2 to 11 carbon atoms, an alkylcarbonyl group having 2 to 12 carbon atoms or an alkylcarbonyloxy group having 2 to 11 carbon atoms, more preferably a halogen atom, an alkyl fluoride group having 1 to 6 carbon atoms, a hydroxy group, an alkoxy group having 1 to 11 carbon atoms, an alkoxycarbonyl group having 2 to 11 carbon atoms, an alkylcarbonyl group having 2 to 12 carbon atoms or an alkylcarbonyloxy group having 2 to 11 carbon atoms, and still more preferably a halogen atom, a hydroxy group, an alkyl fluoride group having 1 to 6 carbon atoms or an alkoxy group having 1 to 11 carbon atoms.

The acid-labile group for $R^2$ means a group in which a group represented by $R^2$ is eliminated by contact with an acid (e.g., p-toluenesulfonic acid) to form a hydroxy group.

When $R^2$ of the structural unit (I) used in the production of the resin (A) is an acid-labile group, in the resin (A), $R^2$ may be eliminated ($R^2$ is converted into a hydrogen atom) by contact with an acid, and the elimination ratio is preferably 40% to 100%, more preferably 60% to 100%, and still more preferably 100%.

Examples of the acid-labile group include a group represented by formula (1a) (hereinafter sometimes referred to as "acid-labile group (1a)"), a group represented by formula (2a) (hereinafter sometimes referred to as "acid-labile group (2a)") and the like:

(1a)

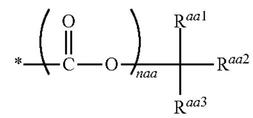

wherein, in formula (1a), $R^{aa1}$, $R^{aa2}$ and $R^{aa3}$ each independently represent an alkyl group having 1 to 8 carbon atoms which may have a substituent, an alkenyl group having 2 to 8 carbon atoms which may have a substituent, an alicyclic hydrocarbon group having 3 to 20 carbon atoms which may have a substituent, or an aromatic hydrocarbon group having 6 to 18 carbon atoms which may have a substituent, or $R^{aa1}$ and $R^{aa2}$ may be bonded each other to form an alicyclic hydrocarbon group having 3 to 20 carbon atoms together with carbon atoms to which $R^{aa1}$ and $R^{aa2}$ are bonded, $n^{aa}$ represents 0 or 1, and

* represents a bond:

(2a)

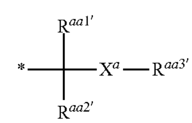

wherein, in formula (2a), $R^{aa1'}$ and $R^{aa2'}$ each independently represent a hydrogen atom or a hydrocarbon group having 1 to 12 carbon atoms, $R^{aa3'}$ represents a hydrocarbon group having 1 to 20 carbon atoms, or $R^{aa2'}$ and $R^{aa3'}$ may be bonded each other to form a heterocyclic group having 3 to 20 carbon atoms together with —C—$X^a$— to which $R^{aa2'}$ and $R^{aa3'}$ are bonded, and —$CH_2$— included in the hydrocarbon group and the heterocyclic group may be replaced by —O— or —S—, $X^a$ represents an oxygen atom or a sulfur atom, and

* represents a bond.

Examples of the alkyl group for $R^{aa1}$, $R^{aa2}$ and $R^{aa3}$ include a methyl group, an ethyl group, a propyl group, an n-butyl group, an n-pentyl group, an n-hexyl group, an n-heptyl group, an n-octyl group and the like. The number of carbon atoms of the alkyl group for $R^{aa1}$, $R^{aa2}$ and $R^{aa3}$ is preferably 1 to 6, and more preferably 1 to 3.

Examples of the alkenyl group for $R^{aa1}$, $R^{aa2}$ and $R^{aa3}$ include an ethenyl group, a propenyl group, an isopropenyl group, a butenyl group, an isobutenyl group, a tert-butenyl group, a pentenyl group, a hexenyl group, a heptenyl group, an octynyl group, an isooctynyl group and a nonenyl group.

The alicyclic hydrocarbon group for $R^{aa1}$, $R^{aa2}$ and $R^{aa3}$ may be either monocyclic or polycyclic. Examples of the monocyclic alicyclic hydrocarbon group include cycloalkyl groups such as a cyclopentyl group, a cyclohexyl group, a cycloheptyl group and a cyclooctyl group. Examples of the polycyclic alicyclic hydrocarbon group include a decahydronaphthyl group, an adamantyl group, a norbornyl group and the following groups (* represents a bond). The number of carbon atoms of the alicyclic hydrocarbon group for $R^{aa1}$, $R^{aa2}$ and $R^{aa3}$ is preferably 3 to 16, and more preferably 3 to 12.

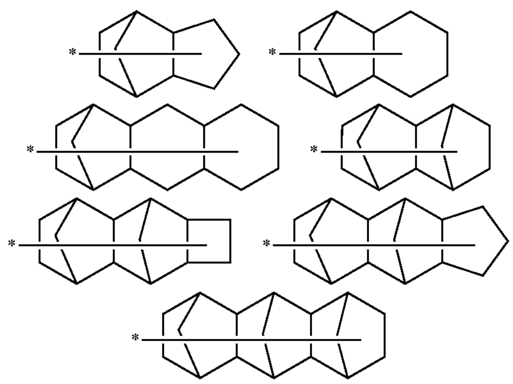

Examples of the aromatic hydrocarbon group for $R^{aa1}$, $R^{aa2}$ and $R^{aa3}$ include aryl groups such as a phenyl group, a naphthyl group, an anthryl group, a biphenyl group and a phenanthryl group. The number of carbon atoms of the aromatic hydrocarbon group for $R^{aa1}$, $R^{aa2}$ and $R^{aa3}$ is preferably 6 to 14, and more preferably 6 to 10.

Examples of the substituent of the alkyl group having 1 to 8 carbon atoms which may have a substituent include an alkenyl group having 2 to 8 carbon atoms, an alicyclic hydrocarbon group having 3 to 20 carbon atoms and an aromatic hydrocarbon group having 6 to 18 carbon atoms. Examples of the substituent of the alkenyl group having 2 to 8 carbon atoms which may have a substituent include an alkyl group having 1 to 8 carbon atoms, an alicyclic hydrocarbon group having 3 to 20 carbon atoms and an aromatic hydrocarbon group having 6 to 18 carbon atoms. Examples of the substituent of the alicyclic hydrocarbon group having 3 to 20 carbon atoms which may have a substituent include an alkyl group having 1 to 8 carbon atoms, an alkenyl group having 2 to 8 carbon atoms and an aromatic hydrocarbon group having 6 to 18 carbon atoms. Examples of the substituent of the aromatic hydrocarbon group having 6 to 18 carbon atoms which may have a substituent include an alkyl group having 1 to 8 carbon atoms, an alkenyl group having 2 to 8 carbon atoms and an alicyclic hydrocarbon group having 3 to 20 carbon atoms. More specifically, it is possible to exemplify groups obtained by combining the above-mentioned alkyl group and alicyclic hydrocarbon group (e.g., alkylcycloalkyl groups or cycloalkylalkyl groups such as a methylcyclohexyl group, a dimethylcyclohexyl group, a methylnorbornyl group, a cyclohexylmethyl group, an adamantylmethyl group, an adamantyldimethyl group and a norbornylethyl group), aralkyl groups such as a benzyl group, aromatic hydrocarbon groups having an alkyl group (a p-methylphenyl group, a p-tert-butylphenyl group, a tolyl group, a xylyl group, a cumenyl group, a mesityl group, a 2,6-diethylphenyl group, a 2-methyl-6-ethylphenyl group, etc.), aromatic hydrocarbon groups having an alicyclic hydrocarbon group (a p-cyclohexylphenyl group, a p-adamantylphenyl group, etc.), aryl-cycloalkyl groups such as a phenylcyclohexyl group, and the like.

naa is preferably 1.

When $R^{aa1}$ and $R^{aa2}$ are bonded each other to form an alicyclic hydrocarbon group, examples of —C($R^{aa1}$)($R^{aa2}$)($R^{aa3}$) include the following groups. The number of carbon atoms of the alicyclic hydrocarbon group is preferably 3 to 16, and more preferably 3 to 12. * represents a bond to —O—.

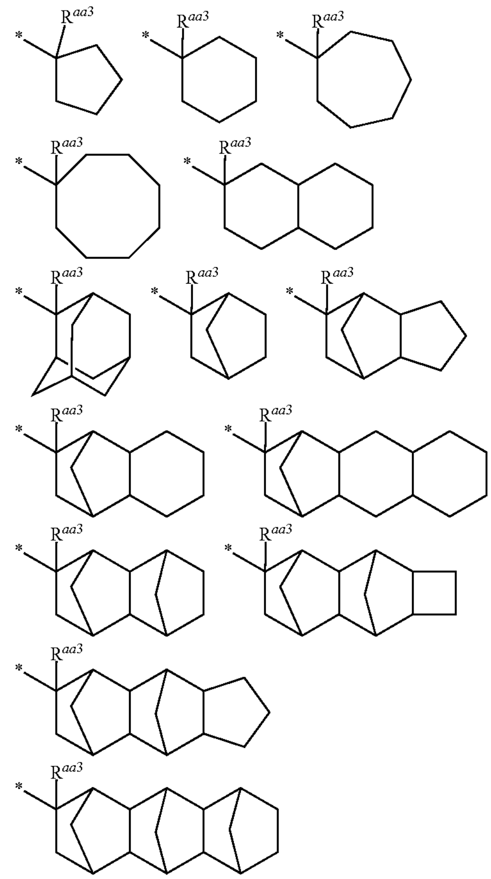

Examples of the group represented by formula (1a) include a 1,1-dialkylalkoxycarbonyl group (a group in which $R^{aa1}$, $R^{aa2}$ and $R^{aa3}$ are an alkyl group, and preferably a tert-butoxycarbonyl group in formula (1a)), a 2-alkyladamantan-2-yloxycarbonyl group (a group in which $R^{aa1}$, $R^{aa2}$ and carbon atoms to which they are bonded form an adamantyl group, and $R^{aa3}$ is an alkyl group in formula (1a)) and a 1-(adamantan-1-yl)-1-alkylalkoxycarbonyl group (a group in which $R^{aa1}$ and $R^{aa2}$ are an alkyl group, and $R^{aa3}$ is an adamantyl group in formula (1a)).

Examples of the hydrocarbon group for $R^{aa1'}$, $R^{aa2'}$ and $R^{aa3'}$ include an alkyl group, an alicyclic hydrocarbon group, an aromatic hydrocarbon group, and groups formed by combining these groups.

Examples of the alkyl group and the alicyclic hydrocarbon group include the same groups as mentioned for $R^{aa1}$, $R^{aa2}$ and $R^{aa3}$ Examples of the aromatic hydrocarbon group include aryl groups such as a phenyl group, a naphthyl group, an anthryl group, a biphenyl group and a phenanthryl group.

Examples of the combined group include groups obtained by combining the above-mentioned alkyl group and alicyclic hydrocarbon group (e.g., alkylcycloalkyl groups or cycloalkylalkyl groups such as a methylcyclohexyl group, a dimethylcyclohexyl group, a methylnorbornyl group, a cyclohexylmethyl group, an adamantylmethyl group, an adamantyldimethyl group and a norbornylethyl group), aralkyl groups such as a benzyl group, aromatic hydrocarbon groups having an alkyl group (a p-methylphenyl group, a p-tert-butylphenyl group, a tolyl group, a xylyl group, a cumenyl group, a mesityl group, a 2,6-diethylphenyl group, a 2-methyl-6-ethylphenyl group, etc.), aromatic hydrocarbon groups having an alicyclic hydrocarbon group (a p-cyclohexylphenyl group, a p-adamantylphenyl group, etc.), aryl-cycloalkyl groups such as a phenylcyclohexyl group, and the like.

When $R^{aa2'}$ and $R^{aa3'}$ are bonded each other to form a heterocyclic group together with carbon atoms and $X^a$ to which $R^{aa2'}$ and $R^{aa3'}$ are bonded, examples of —C($R^{aa1'}$)($R^{aa2'}$)—$X^a$—($R^{aa3'}$) include the following groups. * represents a bond.

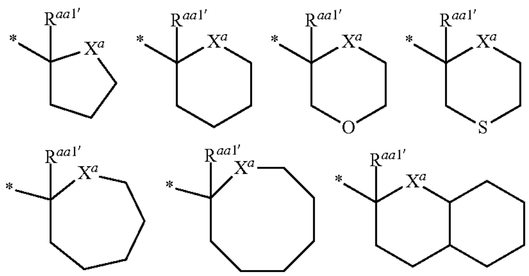

Of $R^{aa1'}$ and $R^{aa2'}$, at least one is preferably a hydrogen atom.

Specific examples of the acid-labile group (1a) include the following groups. * represents a bond.

(I-R$^2$-1-1)

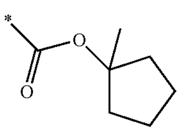

(I-R$^2$-1-2)

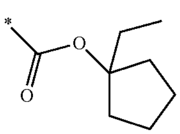

(I-R$^2$-1-3)

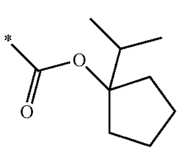

(I-R$^2$-1-4)

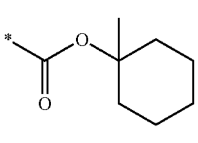

(I-R$^2$-1-5)

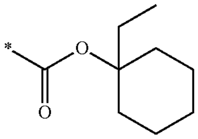

(I-R$^2$-1-6)

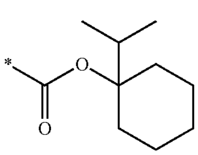

-continued (I-R$^2$-1-7)

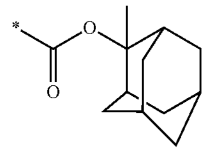

(I-R$^2$-1-8)

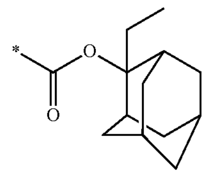

(I-R$^2$-1-9)

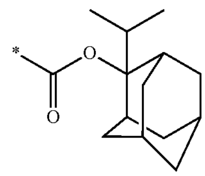

(I-R$^2$-1-10)

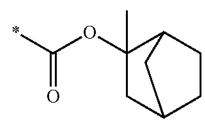

(I-R$^2$-1-11)

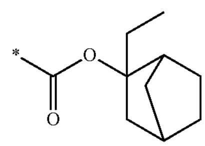

(I-R$^2$-1-12)

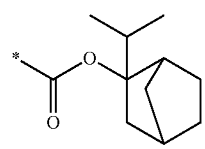

(I-R$^2$-1-13)

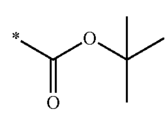

(I-R$^2$-1-14)

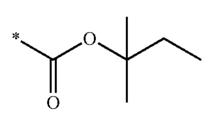

(I-R$^2$-1-15)

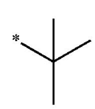

(I-R$^2$-1-16)

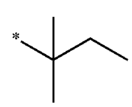

(I-R$^2$-1-17)

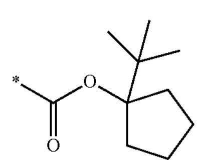

-continued
(I-$R^2$-1-18)
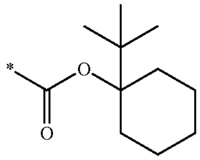
(I-$R^2$-1-19)
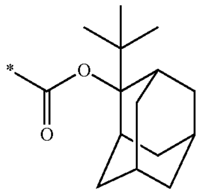
(I-$R^2$-1-20)
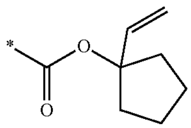
(I-$R^2$-1-21)
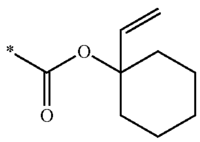
(I-$R^2$-1-22)
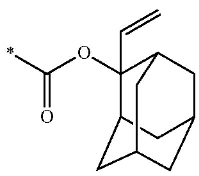
(I-$R^2$-1-23)
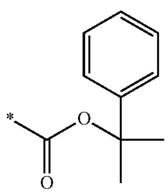
(I-$R^2$-1-24)
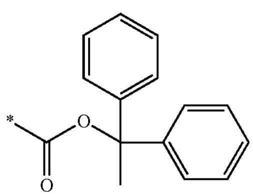
Specific examples of the acid-labile group (2a) include the following groups. * represents a bond.
(I-$R^2$-2-1)
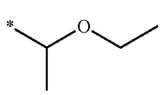
(I-$R^2$-2-2)
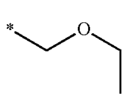
-continued
(I-$R^2$-2-3)
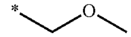
(I-$R^2$-2-4)
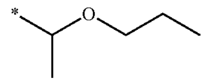
(I-$R^2$-2-5)
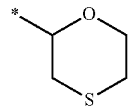
(I-$R^2$-2-6)
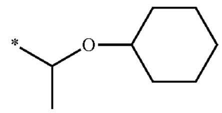
(I-$R^2$-2-7)
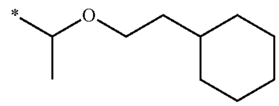
(I-$R^2$-2-8)
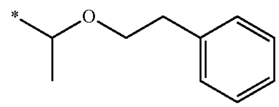
(I-$R^2$-2-9)
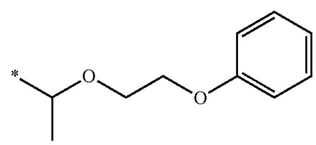
(I-$R^2$-2-10)
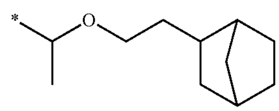
(I-$R^2$-2-11)
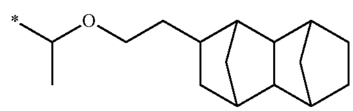
(I-$R^2$-2-12)
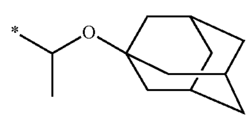
(I-$R^2$-2-13)
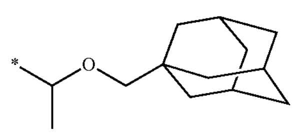
(I-$R^2$-2-14)
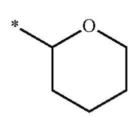
(I-$R^2$-2-15)
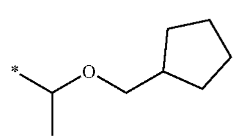

-continued (I-R²-2-16)

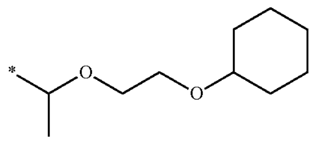

(I-R²-2-17)

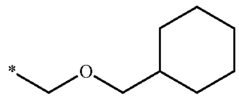

(I-R²-2-18)

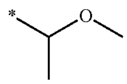

(I-R²-2-19)

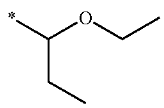

In the structural unit (I), a plurality of $R^2$ may be the same or different.

When two $R^2$ combine together to form a group having an acetal ring structure, examples of $*—(R^2)_2$ include a group represented by formula (3a) (hereinafter sometimes referred to as "group (3a)"):

(3a)

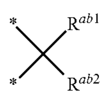

wherein, in formula (3a), $R^{ab1}$ and $R^{ab2}$ each independently represent a hydrogen atom, an alkyl group having 1 to 8 carbon atoms or an alicyclic hydrocarbon group having 3 to 20 carbon atoms, or $R^{ab1}$ and $R^{ab2}$ may be bonded each other to form an alicyclic hydrocarbon group having 3 to 20 carbon atoms together with carbon atoms to which $R^{ab1}$ and $R^{ab2}$ are bonded, and $—CH_2—$ included in the alkyl group and the alicyclic hydrocarbon group may be replaced by —O— or —CO—, and

* represents a bond to an oxygen atom.

Examples of the alkyl group and the alicyclic hydrocarbon group include the same groups as mentioned for $R^{aa1}$, $R^{aa2}$ and $R^{aa3}$.

Examples of the group (3a) include the groups represented by the followings. * represents a bond to an oxygen atom.

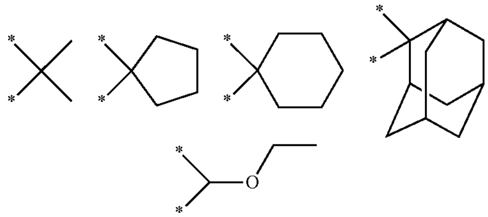

When two $R^2$ combine together to form a group having an acetal ring structure, examples of $*—Ar^2—(O—R^2)_2$ include groups represented by the followings (in which the benzene ring may have a substituent) and the like. * represents a bond to $X^2$.

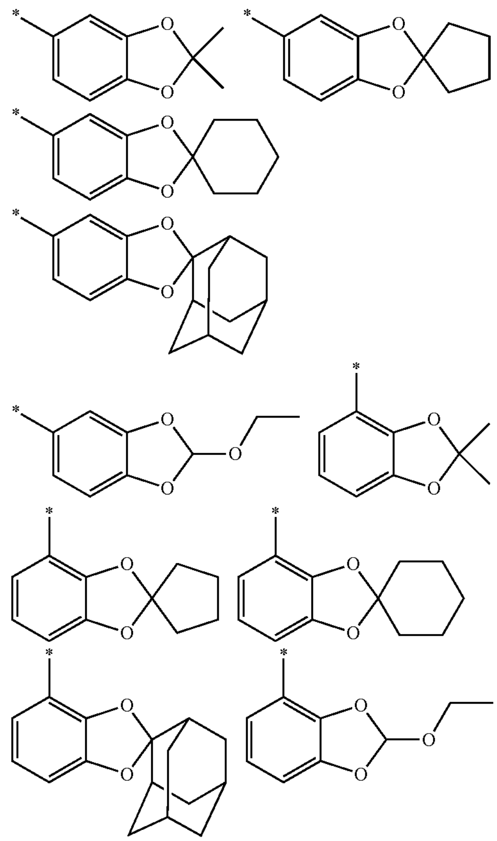

The acid-labile group in $R^2$ is preferably an acid-labile group (2a).

$R^2$ is preferably a hydrogen atom or a group represented by formula (2a), or two $R^2$ preferably combine together to form a group having an acetal ring structure, and $R^2$ is more preferably a hydrogen atom, or two $R^2$ more preferably combine together to form a group having an acetal ring structure.

$Ar^1$ is preferably an aromatic hydrocarbon group having 6 to 24 carbon atoms which may have a substituent, more preferably an aromatic hydrocarbon group having 6 to 18 carbon atoms which may have a substituent, still more preferably an aromatic hydrocarbon group having 6 to 18 carbon atoms, yet more preferably an aromatic hydrocarbon group having 6 to 10 carbon atoms, and further preferably a benzenediyl group.

$Ar^2$ is preferably an aromatic hydrocarbon group having 6 to 24 carbon atoms which may have a substituent, more preferably an aromatic hydrocarbon group having 6 to 18 carbon atoms which may have a substituent, still more preferably an aromatic hydrocarbon group having 6 to 18 carbon atoms, yet more preferably an aromatic hydrocarbon group having 6 to 10 carbon atoms, further preferably a benzenediyl group, a benzenetriyl group or a benzenetetrayl group, and still further preferably a benzenediyl group or a benzenetriyl group.

n is preferably 1 or 2, and more preferably 2.

The bonding position of $—O—R^2$ in $Ar^2$ may be the ortho-position, the meta-position or the para-position with respect to the bonding position of $X^2$, $X^2$ is preferably —CO—O—*, —O—* or —O—CO—*, and more preferably —CO—O—* or —O—*.

When the resin (A) includes a structural unit (I) in which $R^2$ is a hydrogen atom, the amount of the structural unit (I) in which $R^2$ is a hydrogen atom is preferably 40 to 100 mol %, more preferably 60 to 100 mol %, and still more preferably 100 mol %, based on the total amount of the structural unit (I).

Examples of the structural unit (I) include structural units mentioned below. The structural unit (I) is preferably a structural unit (I-1) to a structural unit (I-14), a structural unit (I-17) to a structural unit (I-20), a structural unit (I-25) to a structural unit (I-28), a structural unit (I-33) to a structural unit (I-58) or a structural unit (I-67) to a structural unit (I-92), and more preferably a structural unit (I-1) to a structural unit (I-8), a structural unit (I-13), a structural unit (I-14), a structural unit (I-17) to a structural unit (I-20), a structural unit (I-25) to a structural unit (I-28), a structural unit (I-33) to a structural unit (I-58), a structural unit (I-67), a structural unit (I-68), a structural unit (I-71), a structural unit (I-72), a structural unit (I-81) or a structural unit (I-82).

(I-1)

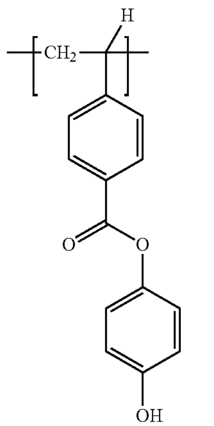

(I-2)

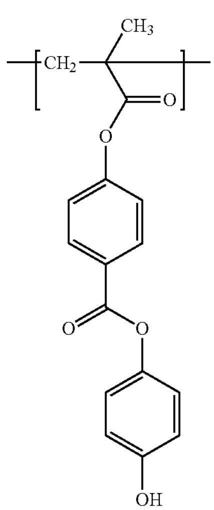

-continued (I-3)

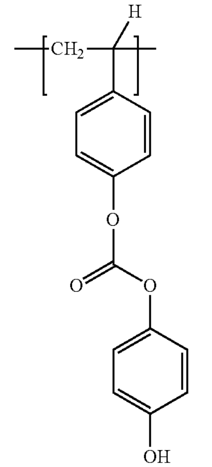

(I-4)

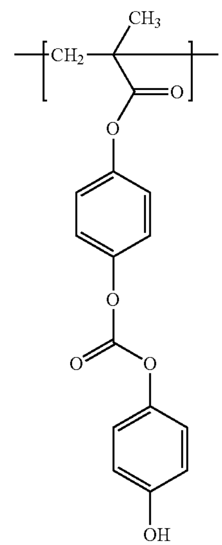

(I-5)

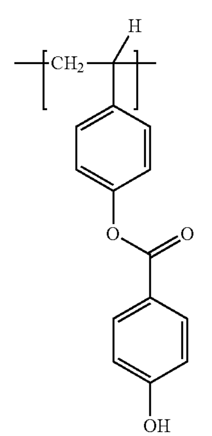

-continued
(I-6)
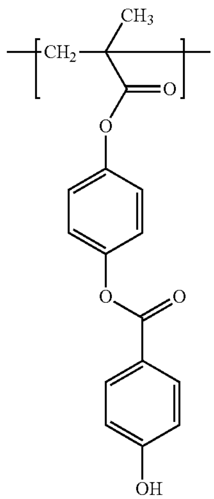
(I-7)
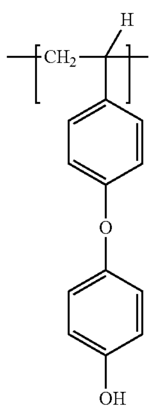
(I-8)
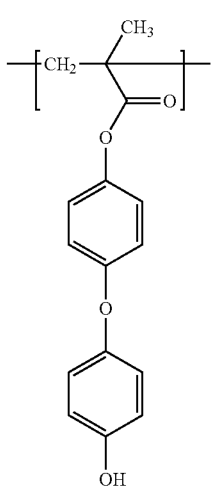
-continued
(I-9)
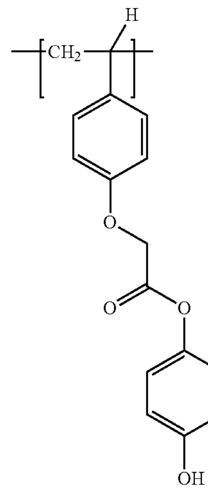
(I-10)
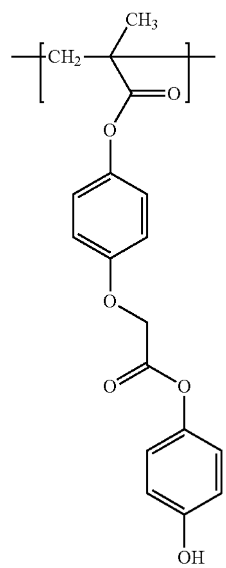
(I-11)
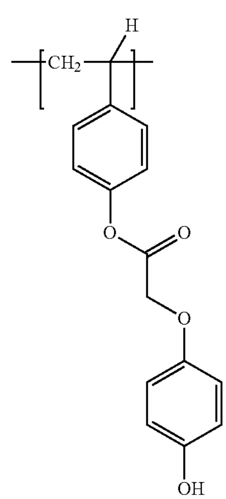

-continued
(I-12)
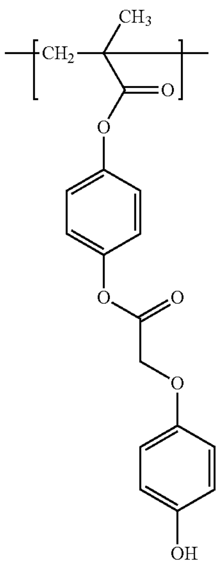
(I-13)
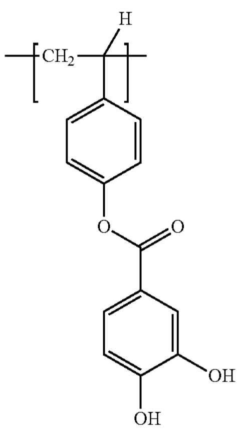
(I-14)
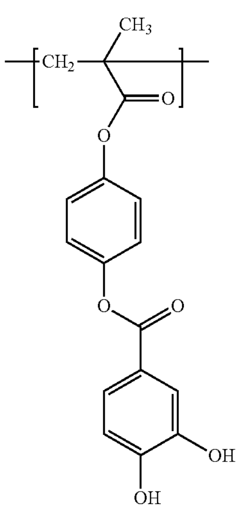
-continued
(I-15)
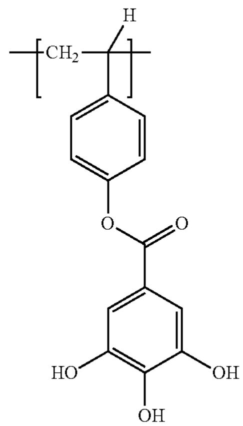
(I-16)
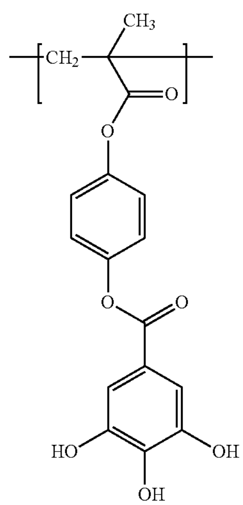
(I-17)
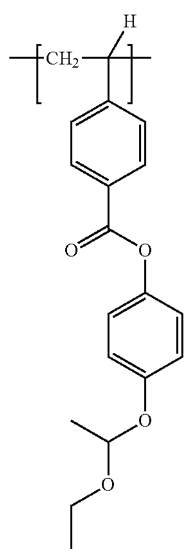

-continued
(I-18)
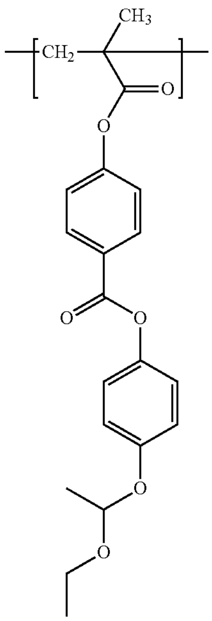
(I-19)
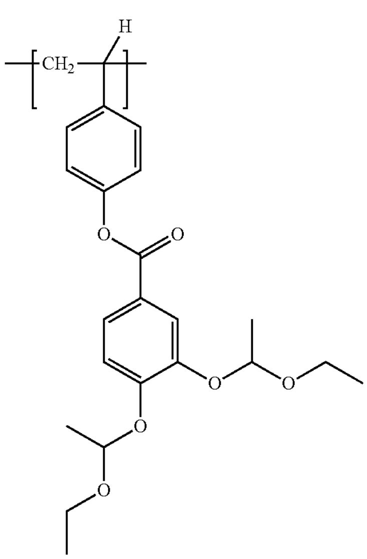
-continued
(I-20)
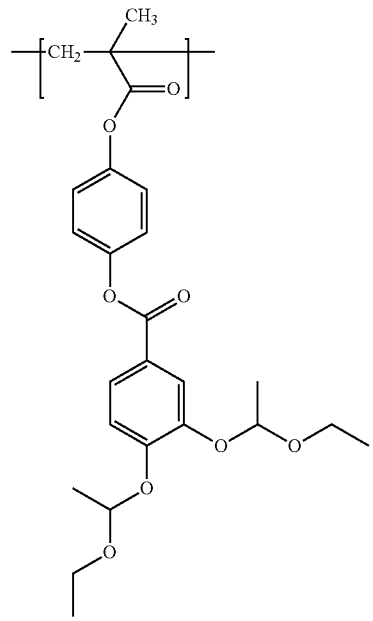
(I-21)
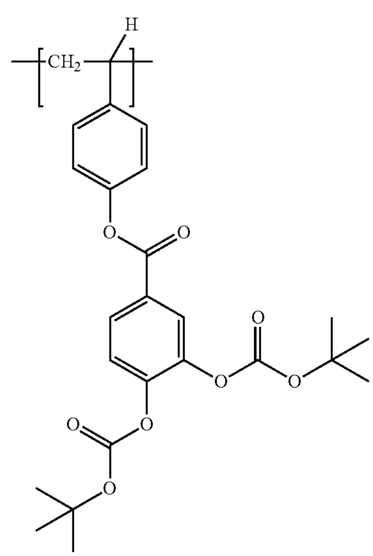

-continued
(I-22)
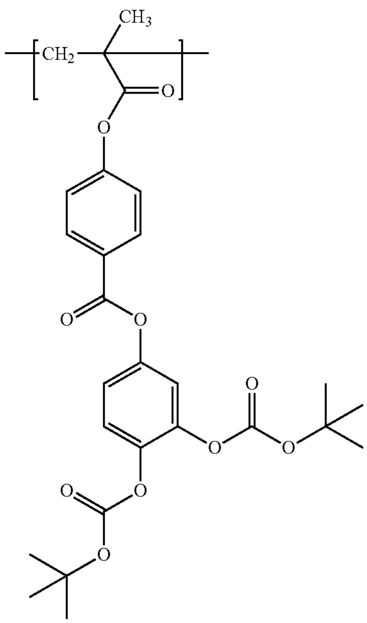
(I-23)
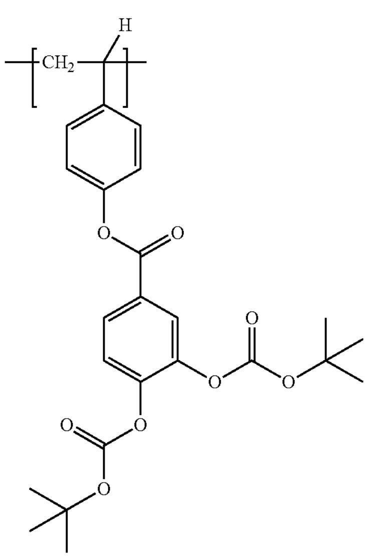
-continued
(I-24)
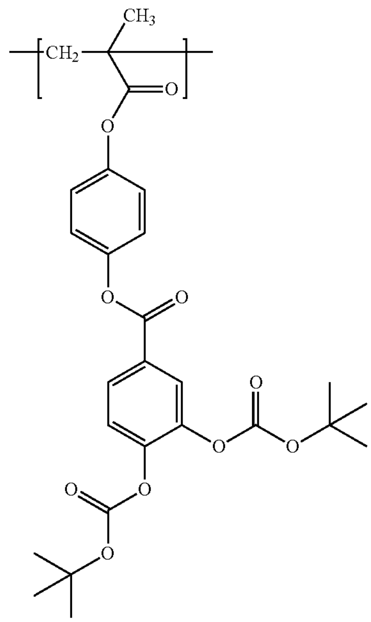
(I-25)
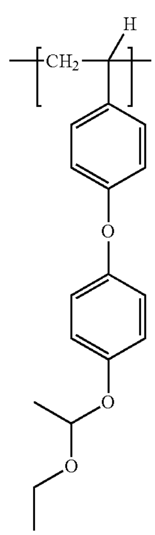

-continued
(I-26)
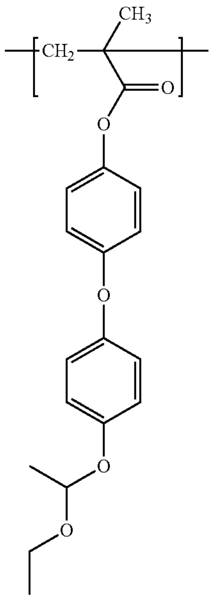
(I-27)
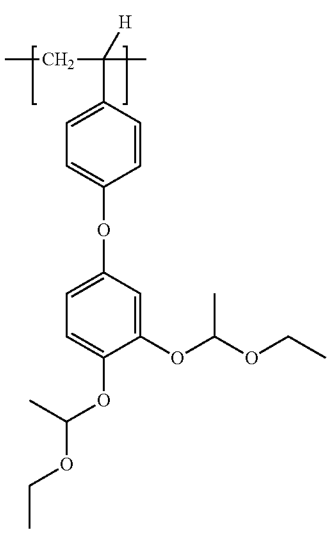
-continued
(I-28)
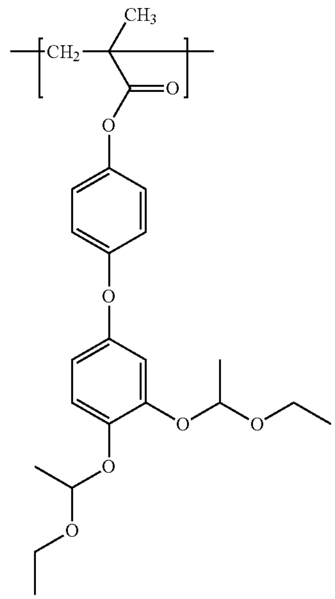
(I-29)
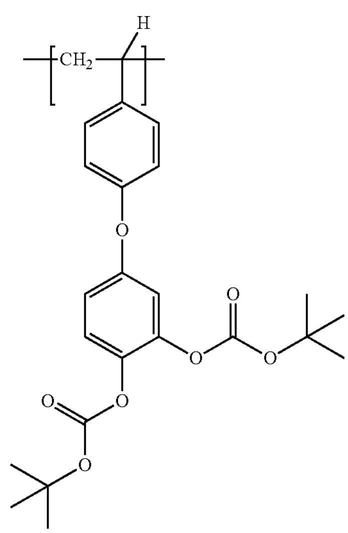

-continued
(I-30)
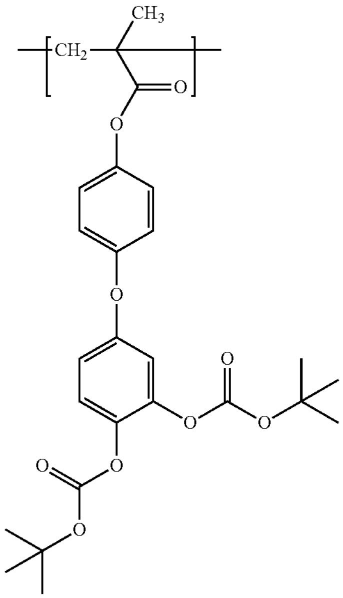
(I-31)
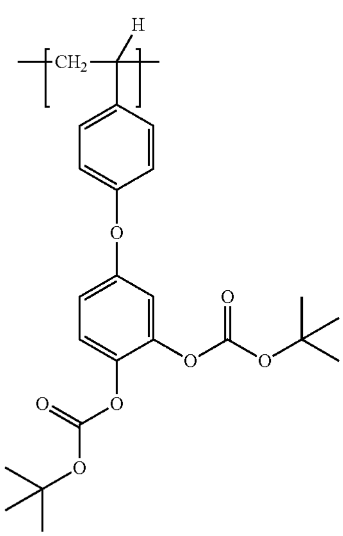
-continued
(I-32)
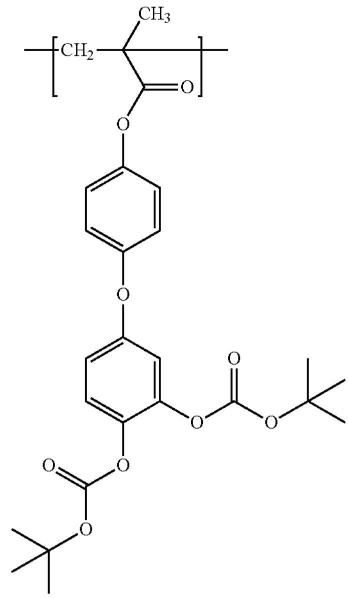
(I-33)
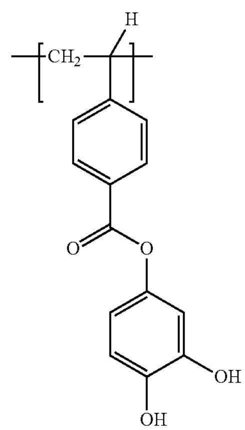
(I-34)
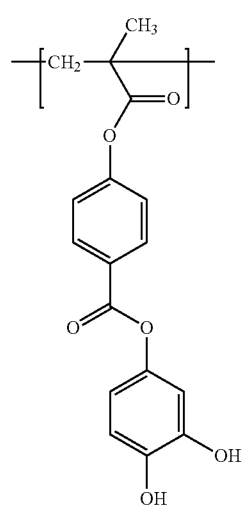

-continued
(I-35)
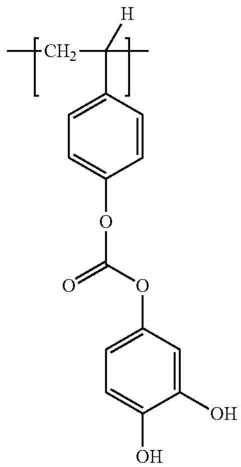
(I-36)
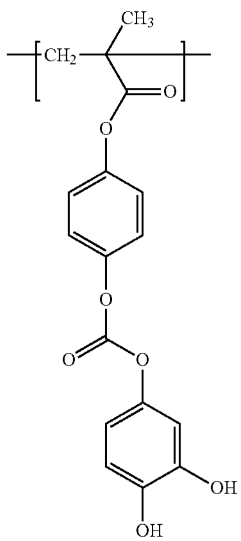
(I-37)
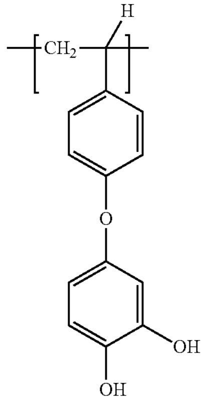
-continued
(I-38)
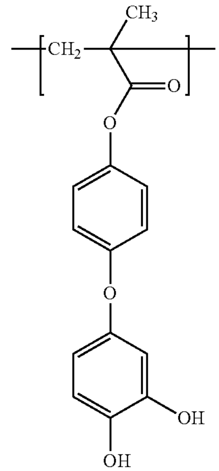
(I-39)
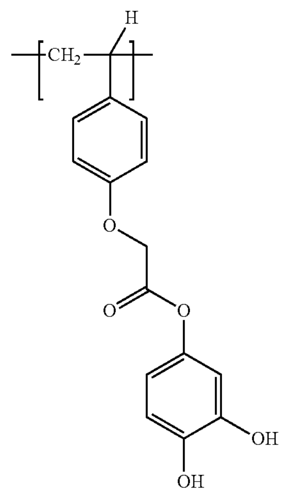
(I-40)
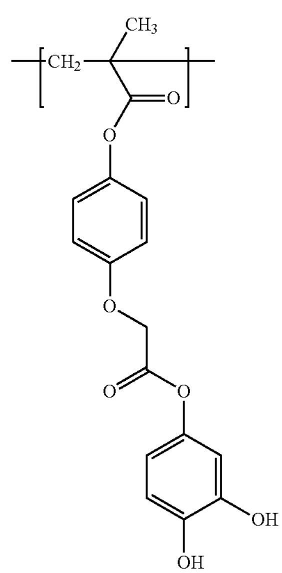

-continued
(I-41)
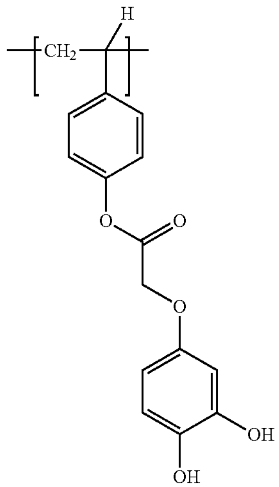
(I-42)
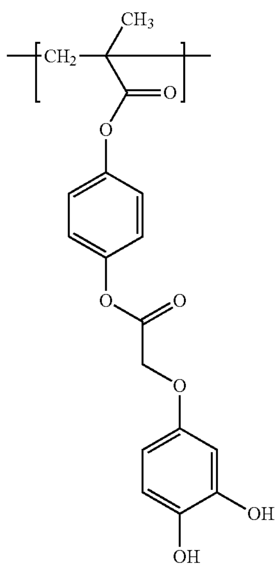
(I-43)
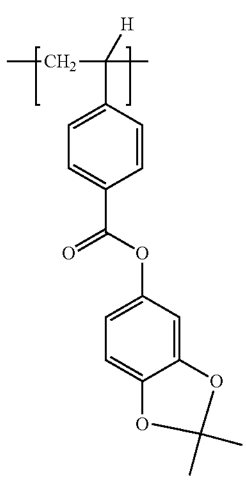
-continued
(I-44)
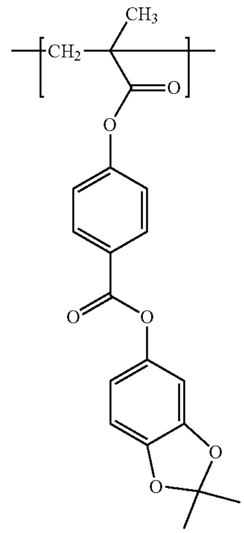
(I-45)
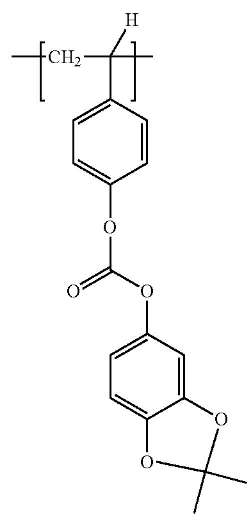
(I-46)
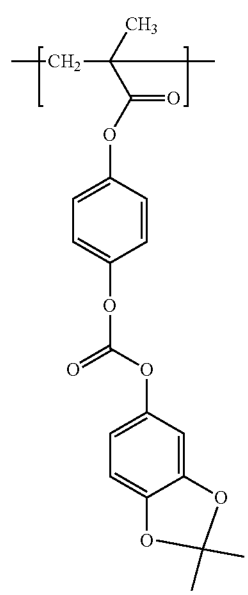

-continued
(I-47)
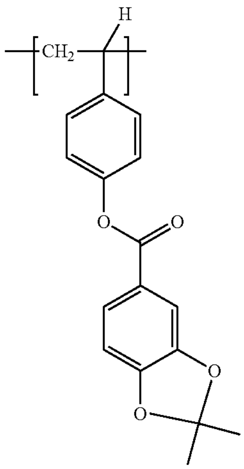
(I-48)
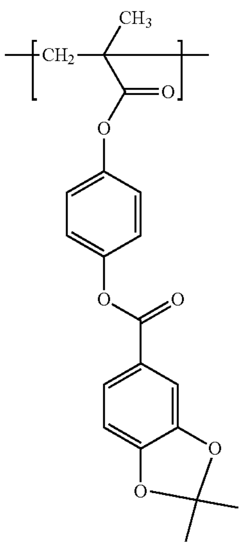
(I-49)
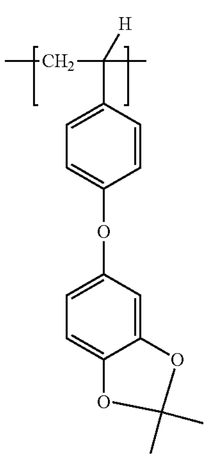
-continued
(I-50)
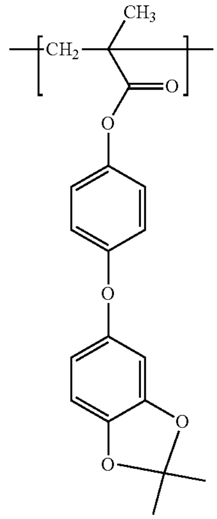
(I-51)
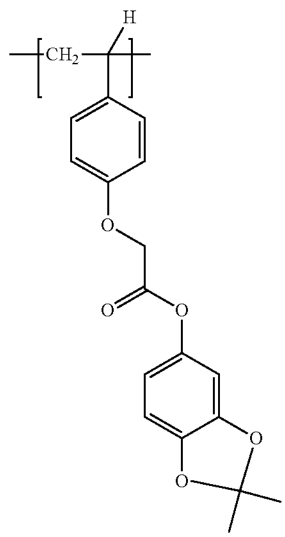
(I-52)
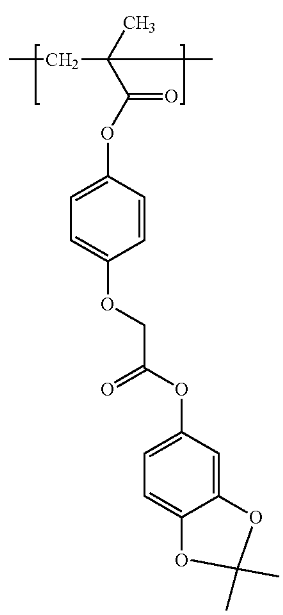

-continued
(I-53)
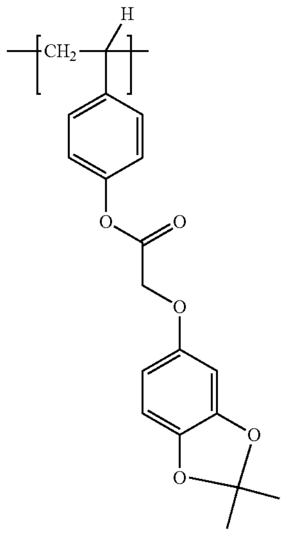
(I-54)
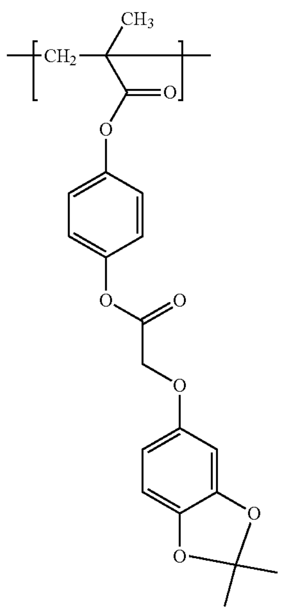
(I-55)
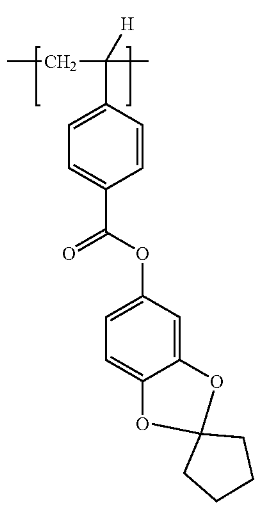
-continued
(I-56)
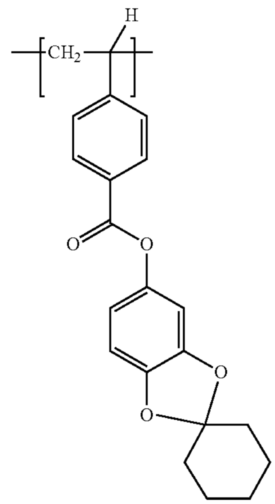
(I-57)
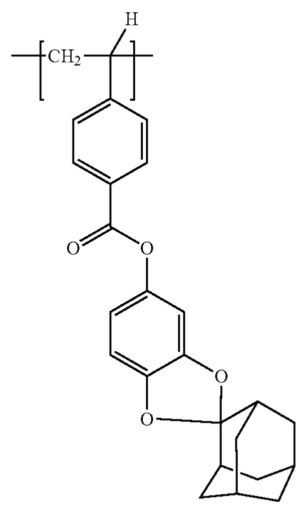
(I-58)
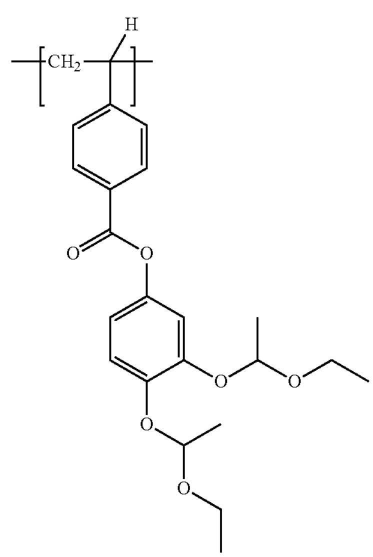

-continued
(I-59)
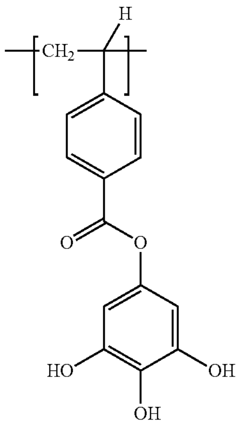
(I-60)
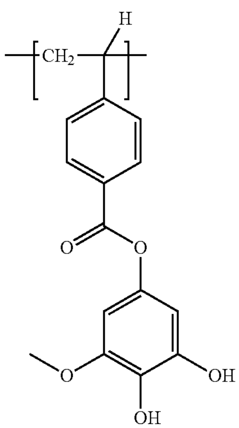
(I-61)
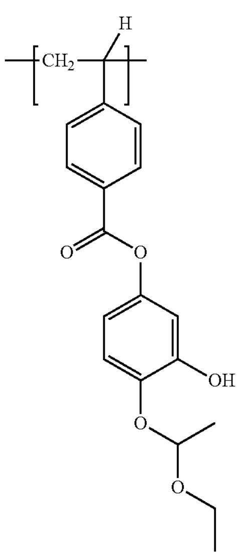
-continued
(I-62)
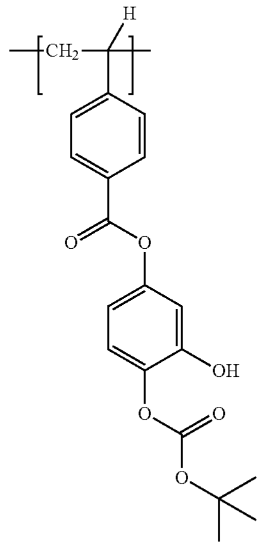
(I-63)
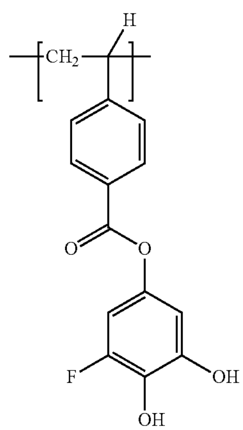
(I-64)
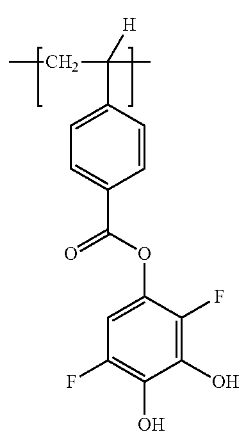

-continued
(I-65)
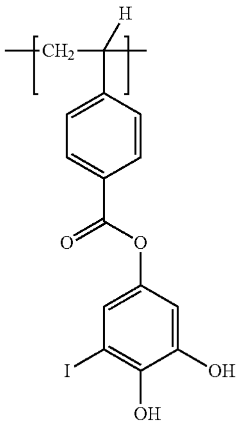
(I-66)
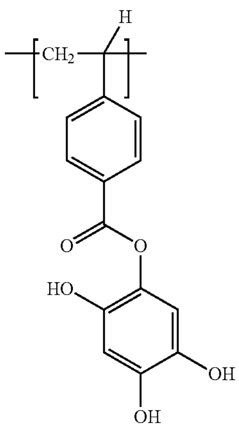
(I-67)
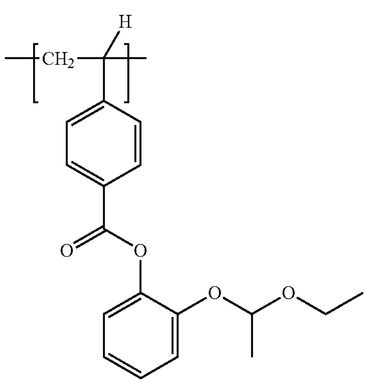
(I-68)
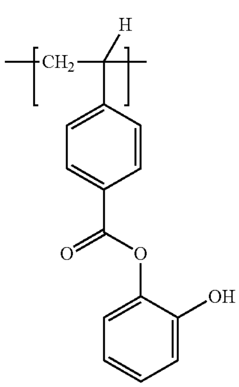
-continued
(I-69)
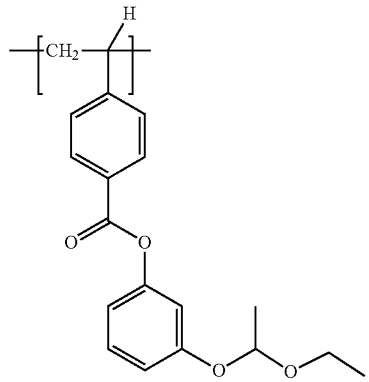
(I-70)
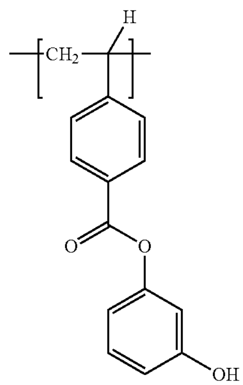
(I-71)
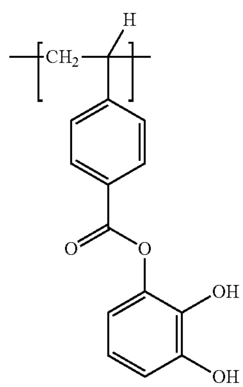
(I-72)
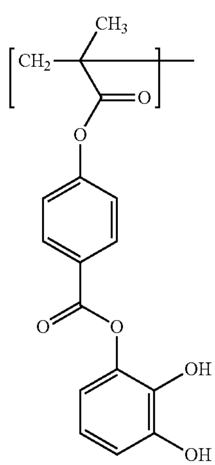

-continued
(I-73)
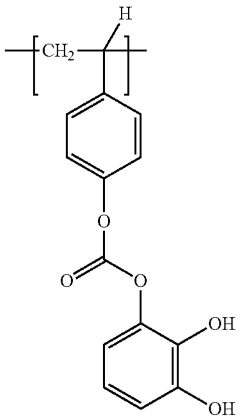
(I-74)
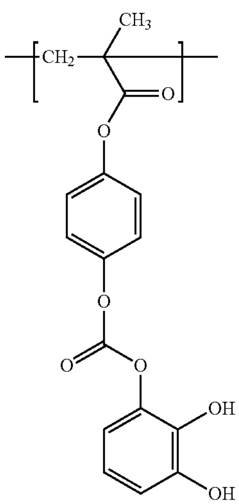
(I-75)
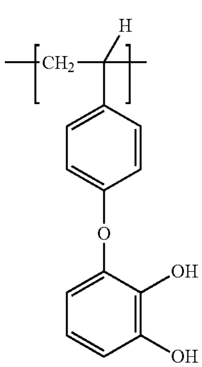
-continued
(I-76)
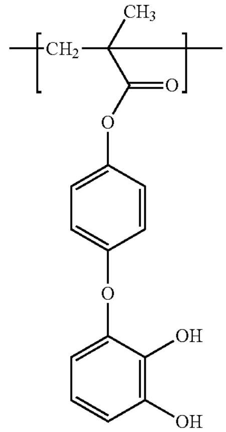
(I-77)
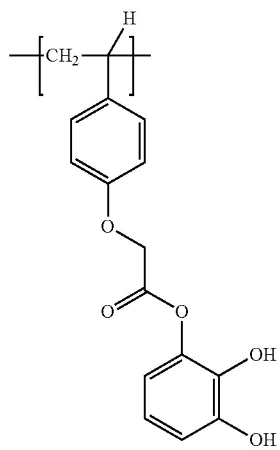
(I-78)
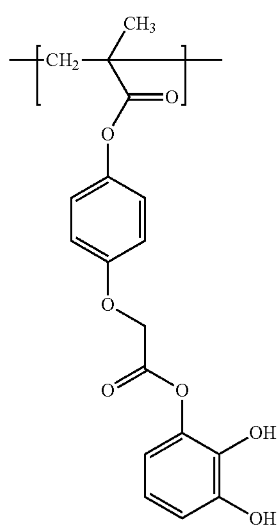

-continued
(I-79)
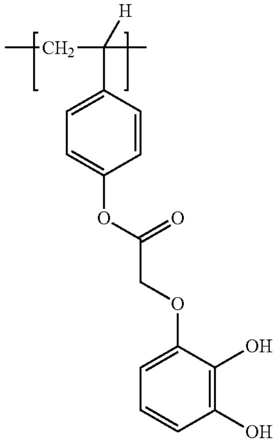
(I-80)
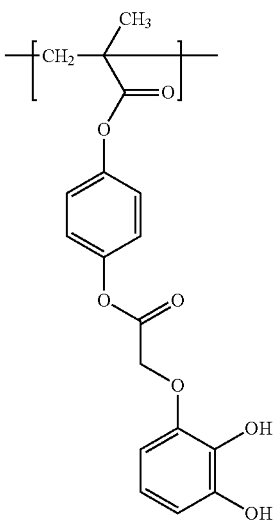
(I-81)
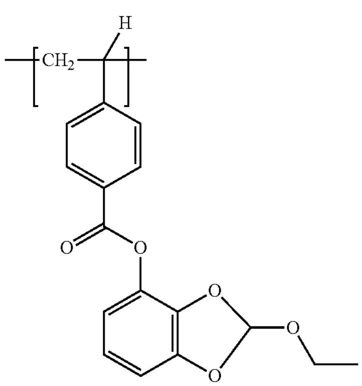
-continued
(I-82)
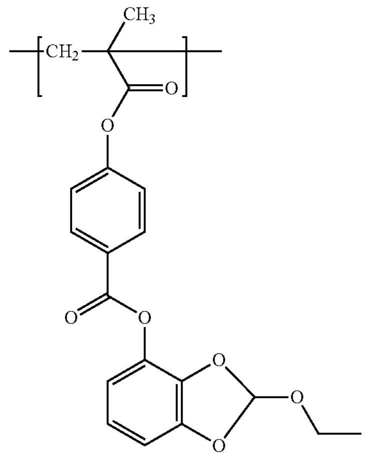
(I-83)
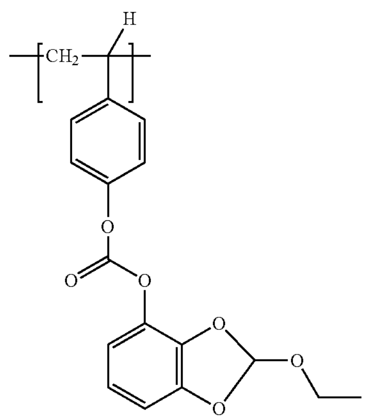
(I-84)
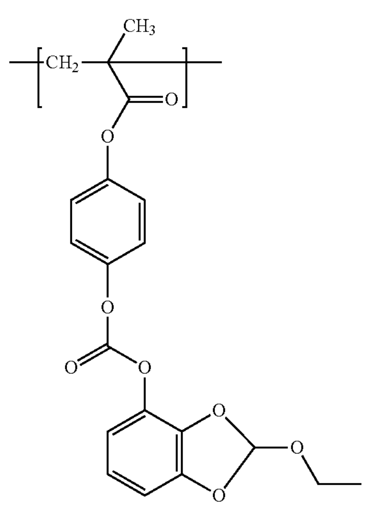

-continued
(I-85)
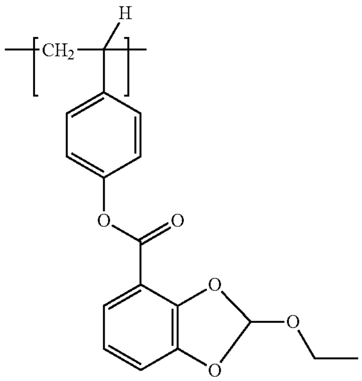
(I-86)
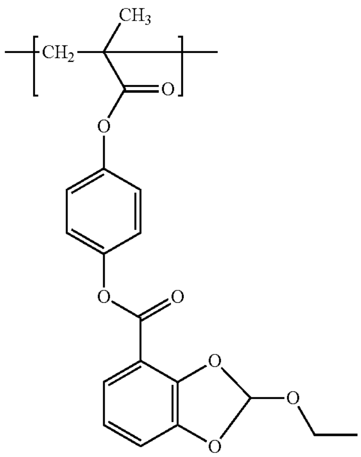
(I-87)
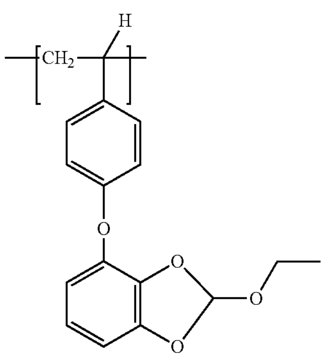
(I-88)
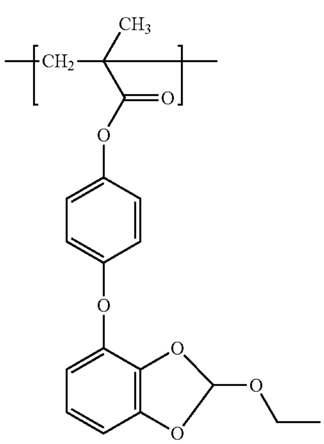
-continued
(I-89)
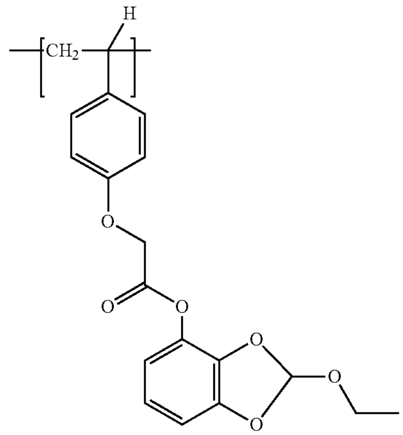
(I-90)
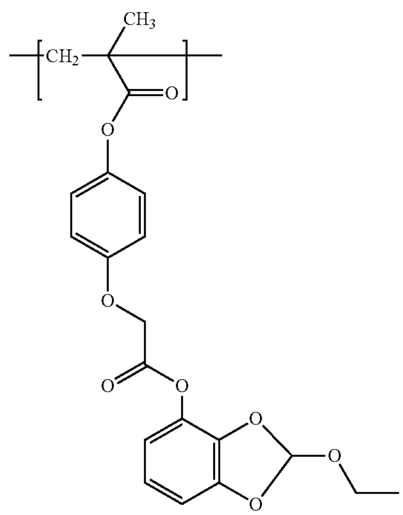
(I-91)
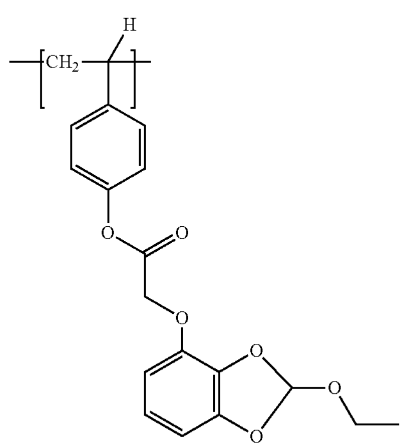

-continued (I-92)

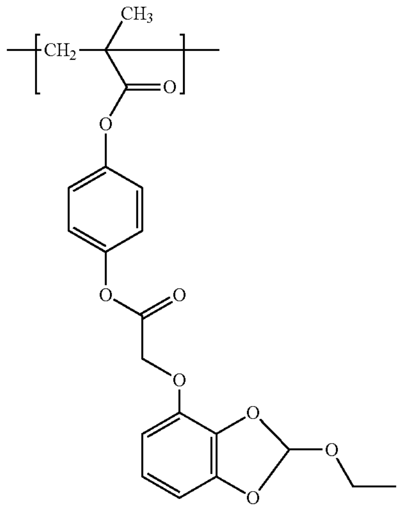

It is also possible to exemplify, as the structural unit (I), structural units in which a hydrogen atom corresponding to $R^1$ in structural units each represented by formula (I-1), formula (1-3), formula (1-5), formula (1-7), formula (1-9), formula (I-11), formula (1-13), formula (I-15), formula (1-17), formula (1-19), formula (1-21), formula (I-23), formula (I-25), formula (I-27), formula (I-29), formula (I-31), formula (I-33), formula (I-35), formula (I-37), formula (I-39), formula (I-41), formula (I-43), formula (I-45), formula (I-47), formula (I-49), formula (I-51), formula (I-53), formula (I-55) to formula (I-70), formula (I-71), formula (I-73), formula (I-75), formula (I-77), formula (I-79), formula (I-81), formula (I-83), formula (I-85), formula (I-87), formula (I-89) and formula (I-91) is substituted with a methyl group, and structural units in which a methyl group corresponding to $R^1$ in structural units each represented by formula (I-2), formula (I-4), formula (I-6), formula (I-8), formula (I-10), formula (I-12), formula (I-14), formula (I-16), formula (I-18), formula (I-20), formula (I-22), formula (I-24), formula (I-26), formula (I-28), formula (I-30), formula (I-32), formula (I-34), formula (I-36), formula (I-38), formula (I-40), formula (I-42), formula (I-44), formula (I-46), formula (I-48), formula (I-50), formula (I-52), formula (I-54), formula (I-72), formula (I-74), formula (I-76), formula (I-78), formula (I-80), formula (I-82), formula (I-84), formula (I-86), formula (I-88), formula (I-90) and formula (I-92) is substituted with a hydrogen atom.

The content of the structural unit (I) in the resin (A) is preferably 3 to 80 mol %, more preferably 5 to 60 mol %, still more preferably 5 to 55 mol %, and yet more preferably 5 to 50 mol %, based on all structural units.

In the resin (A), the structural unit (I) may be included alone, or two or more thereof may be included.

<Structural Unit (A1-1) and Structural Unit (A1-2)>

A structural unit (a1-1) and a structural unit (a1-2) are represented by the following formulas:

(a1-1)

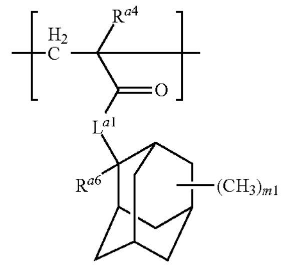

(a1-2)

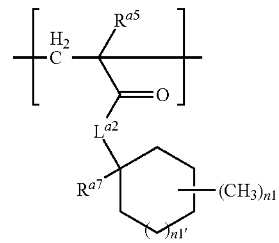

wherein, in formula (a1-1) and formula (a1-2),

- $L^{a1}$ and $L^{a2}$ each independently represent —O— or *—O—$(CH_2)_{k1}$—CO—O—, k1 represents an integer of 1 to 7, and * represents a bonding site to —CO—,
- $R^{a4}$ and $R^{a5}$ each independently represent a hydrogen atom or a methyl group,
- $R^{a6}$ and $R^{a7}$ each independently represent an alkyl group having 1 to 8 carbon atoms, an alkenyl group having 2 to 8 carbon atoms, an alicyclic hydrocarbon group having 3 to 18 carbon atoms, an aromatic hydrocarbon group having 6 to 18 carbon atoms, or a group obtained by combining these groups,
- m1 represents an integer of 0 to 14,
- n1 represents an integer of 0 to 10, and
- n1' represents an integer of 0 to 3.

$R^{a4}$ and $R^{a5}$ are preferably a methyl group.

$L^{a1}$ and $L^{a2}$ are preferably an oxygen atom or *—O—$(CH_2)_{k01}$—CO—O— (in which k01 is preferably an integer of 1 to 4, and more preferably 1), and more preferably an oxygen atom.

Examples of the alkyl group, the alkenyl group, the alicyclic hydrocarbon group, the aromatic hydrocarbon group and the group obtained by combining these groups in $R^{a6}$ and $R^{a7}$ include the same groups as mentioned for $R^{a1}$, $R^{a2}$ and $R^{a3}$ in formula (1) mentioned below.

The alkyl group in $R^{a6}$ and $R^{a7}$ is preferably an alkyl group having 1 to 6 carbon atoms, more preferably a methyl group, an ethyl group, an isopropyl group or a t-butyl group, and still more preferably an ethyl group, an isopropyl group or a t-butyl group.

The alkenyl group in $R^{a6}$ and $R^{a7}$ is preferably an alkenyl group having 2 to 6 carbon atoms, and more preferably an ethenyl group, a propenyl group, an isopropenyl group or a butenyl group.

The number of carbon atoms of the alicyclic hydrocarbon group for $R^{a6}$ and $R^{a7}$ is preferably 5 to 12, and more preferably 5 to 10.

The number of carbon atoms of the aromatic hydrocarbon group for $R^{a6}$ and $R^{a7}$ is preferably 6 to 12, and more preferably 6 to 10.

Regarding the group obtained by combining an alkyl group and an alicyclic hydrocarbon group, the total number of carbon atoms of the combination of the alkyl group and the alicyclic hydrocarbon group is preferably 18 or less.

Regarding the group obtained by combining an alkyl group and an aromatic hydrocarbon group, the total number of carbon atoms of the combination of the alkyl group and the aromatic hydrocarbon group is preferably 18 or less.

$R^{a6}$ and $R^{a7}$ each independently represent preferably an alkyl group having 1 to 6 carbon atoms, an alkenyl group having 2 to 6 carbon atoms or an aromatic hydrocarbon group having 6 to 12 carbon atoms, more preferably a methyl group, an ethyl group, an isopropyl group, a t-butyl group, an ethenyl group, a phenyl group or a naphthyl group, and still more preferably an ethyl group, an isopropyl group, a t-butyl group, an ethenyl group or a phenyl group.

m1 is preferably an integer of 0 to 3, and more preferably 0 or 1.

n1 is preferably an integer of 0 to 3, and more preferably 0 or 1.

n1' is preferably an integer of 0 to 2, and more preferably 0 or 1.

Examples of the structural unit (a1-1) include structural units derived from the monomers mentioned in JP 2010-204646 A. Of these, a structural unit represented by any one of formula (a1-1-1) to formula (a1-1-7) and a structural unit in which a methyl group corresponding to $R^{a4}$ in the structural unit (a1-1) is substituted with a hydrogen atom are preferable, and a structural unit represented by any one of formula (a1-1-1) to formula (a1-1-4) is more preferable.

(a1-1-1)

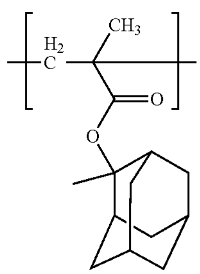

(a1-1-2)

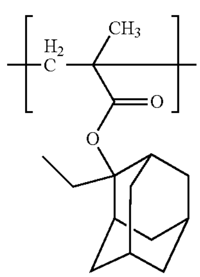

(a1-1-3)

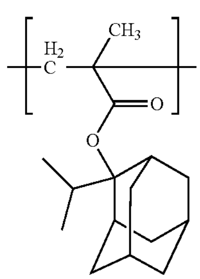

-continued (a1-1-4)

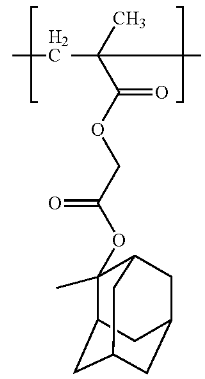

(a1-1-5)

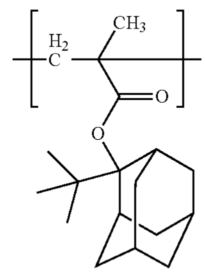

(a1-1-6)

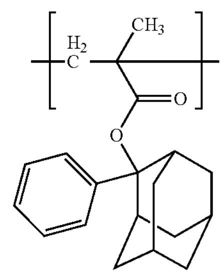

(a1-1-7)

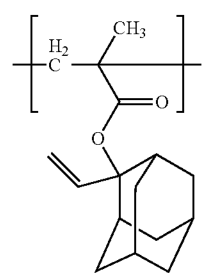

The content of the structural unit (a1-1) in the resin (A) is preferably 1 to 60 mol %, more preferably 1 to 55 mol %, still more preferably 2 to 55 mol %, and yet more preferably 2 to 50 mol %, based on all structural units.

Examples of the structural unit (a1-2) include a structural unit represented by any one of formula (a1-2-1) to formula (a1-2-12) and a structural unit in which a methyl group corresponding to $R^{a3}$ in the structural unit (a1-2) is substituted with a hydrogen atom, and a structural unit represented by any one of formula (a1-2-2), formula (a1-2-5), formula (a1-2-6) and formula (a1-2-10) to formula (a1-2-12) is preferable.

(a1-2-1)

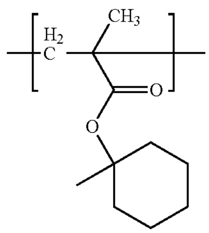

(a1-2-2)

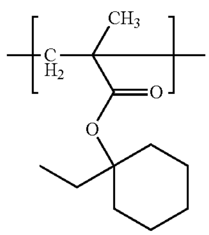

(a1-2-3)

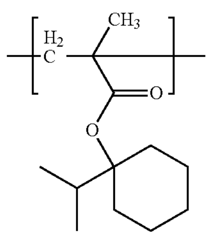

(a1-2-4)

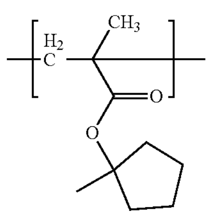

(a1-2-5)

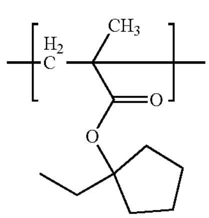

(a1-2-6)

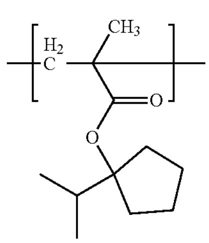

(a1-2-7)

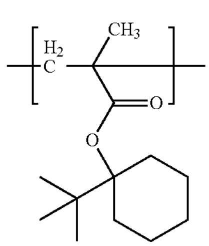

-continued (a1-2-8)

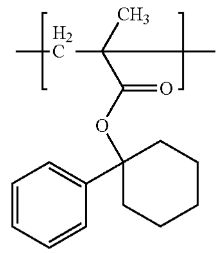

(a1-2-9)

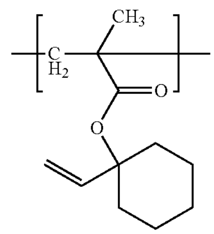

(a1-2-10)

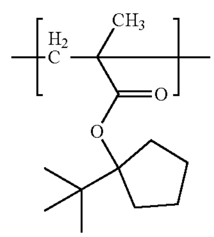

(a1-2-11)

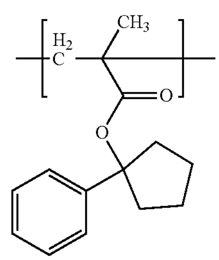

(a1-2-12)

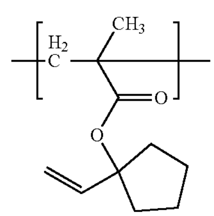

The content of the structural unit (a1-2) in the resin (A) is preferably 5 to 70 mol %, more preferably 10 to 65 mol %, still more preferably 15 to 65 mol %, and yet more preferably 15 to 60 mol %, based on all structural units.

The total content of the structural unit (a1-1) and the structural unit (a1-2) is usually 10 to 95 mol %, preferably 15 to 80 mol %, more preferably 15 to 75 mol %, still more preferably 20 to 70 mol %, and yet more preferably 25 to 65 mol %, based on all structural units of the resin (A).

The resin (A) of the present invention may be a polymer including one or more structural units other than the structural unit (I), the structural unit (a1-1) and the structural unit (a1-2). Examples of the structural unit other than the structural unit (I), the structural unit (a1-1) and the structural unit (a1-2) include a structural unit having an acid-labile group other than the structural unit (I), the structural unit (a1-1) and the structural unit (a1-2) (hereinafter sometimes referred to as "structural unit (a1)"), a structural unit which is a structural unit other than the structural unit having an acid-labile group and has a halogen atom (hereinafter sometimes referred to as "structural unit (a4)"), a structural unit having no acid-labile group other than the structural unit (I) (hereinafter sometimes referred to as "structural unit (s)"), a structural unit having a non-leaving hydrocarbon group (hereinafter sometimes referred to as "structural unit (a5)") and the like. The "acid-labile group" means a group having a leaving group which is eliminated by contact with an acid, thus forming a hydrophilic group (e.g. a hydroxy group or a carboxy group).

<Structural Unit (a1)>

The structural unit (a1) is derived from a monomer having an acid-labile group (hereinafter sometimes referred to as "monomer (a1)").

The acid-labile group contained in the resin (A) is preferably a group represented by formula (1) (hereinafter also referred to as group (1)) and/or a group represented by formula (2) (hereinafter also referred to as group (2)):

(1)

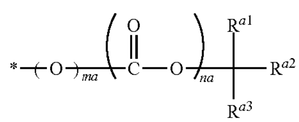

wherein, in formula (1), $R^{a1}$, $R^{a2}$ and $R^{a3}$ each independently represent an alkyl group having 1 to 8 carbon atoms, an alkenyl group having 2 to 8 carbon atoms, an alicyclic hydrocarbon group having 3 to 20 carbon atoms, an aromatic hydrocarbon group having 6 to 18 carbon atoms, or groups obtained by combining these groups, or $R^{a1}$ and $R^{a2}$ are bonded each other to form an alicyclic hydrocarbon group having 3 to 20 carbon atoms together with carbon atoms to which $R^{a1}$ and $R^{a2}$ are bonded, ma and na each independently represent 0 or 1, and at least one of ma and na represents 1, and

* represents a bonding site:

(2)

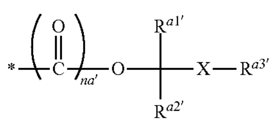

wherein, in formula (2), $R^{a1'}$ and $R^{a2'}$ each independently represent a hydrogen atom or a hydrocarbon group having 1 to 12 carbon atoms, $R^{a3'}$ represents a hydrocarbon group having 1 to 20 carbon atoms, or $R^{a2'}$ and $R^{a3'}$ are bonded each other to form a heterocyclic group having 3 to 20 carbon atoms together with carbon atoms and X to which $R^{a2'}$ and $R^{a3'}$ are bonded, and —$CH_2$— included in the hydrocarbon group and the heterocyclic group may be replaced by —O— or —S—, X represents an oxygen atom or a sulfur atom, na' represents 0 or 1, and

* represents a bonding site.

Examples of the alkyl group in $R^{a1}$, $R^{a2}$ and $R^{a3}$ include a methyl group, an ethyl group, a propyl group, a butyl group, a pentyl group, a hexyl group, a heptyl group, an octyl group and the like.

Examples of the alkenyl group in $R^{a1}$, $R^{a2}$ and $R^{a3}$ include an ethenyl group, a propenyl group, an isopropenyl group, a butenyl group, an isobutenyl group, a tert-butenyl group, a pentenyl group, a hexenyl group, a heptenyl group, an octynyl group, an isooctynyl group, a nonenyl group and the like.

The alicyclic hydrocarbon group in $R^{a1}$, $R^{a2}$ and $R^{a3}$ may be either monocyclic or polycyclic. Examples of the monocyclic alicyclic hydrocarbon group include cycloalkyl groups such as a cyclopentyl group, a cyclohexyl group, a cycloheptyl group and a cyclooctyl group. Examples of the polycyclic alicyclic hydrocarbon group include a decahydronaphthyl group, an adamantyl group, a norbornyl group and the following groups (* represents a bonding site). The number of carbon atoms of the alicyclic hydrocarbon group for $R^{a1}$, $R^{a2}$ and $R^{a3}$ is preferably 3 to 16.

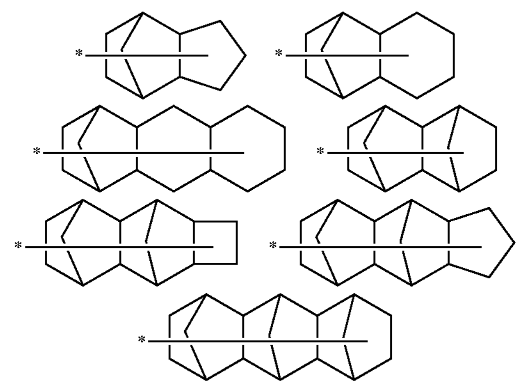

Examples of the aromatic hydrocarbon group in $R^{a1}$, $R^{a2}$ and $R^{a3}$ include aryl groups such as a phenyl group, a naphthyl group, an anthryl group, a biphenyl group and a phenanthryl group.

Examples of the combined group include groups obtained by combining the above-mentioned alkyl group and alicyclic hydrocarbon group (e.g., alkylcycloalkyl groups or cycloalkylalkyl groups such as a methylcyclohexyl group, a dimethylcyclohexyl group, a methylnorbornyl group, a cyclohexylmethyl group, an adamantylmethyl group, an adamantyldimethyl group and a norbornylethyl group), aralkyl groups such as a benzyl group, aromatic hydrocarbon groups having an alkyl group (a p-methylphenyl group, a p-tert-butylphenyl group, a tolyl group, a xylyl group, a cumenyl group, a mesityl group, a 2,6-diethylphenyl group, a 2-methyl-6-ethylphenyl group, etc.), aromatic hydrocarbon groups having an alicyclic hydrocarbon group (a p-cyclohexylphenyl group, a p-adamantylphenyl group, etc.), aryl-cycloalkyl groups such as a phenylcyclohexyl group, and the like.

Preferably, ma is 0 and na is 1.

When $R^{a1}$ and $R^{a2}$ are bonded each other to form an alicyclic hydrocarbon group, examples of —$C(R^{a1})(R^{a2})(R^{a3})$ include the following groups. The alicyclic hydrocarbon group preferably has 3 to 12 carbon atoms. * represents a bonding site to —O—.

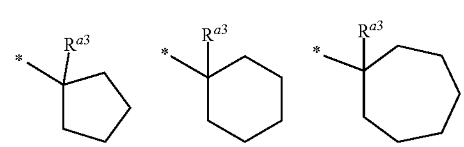

-continued

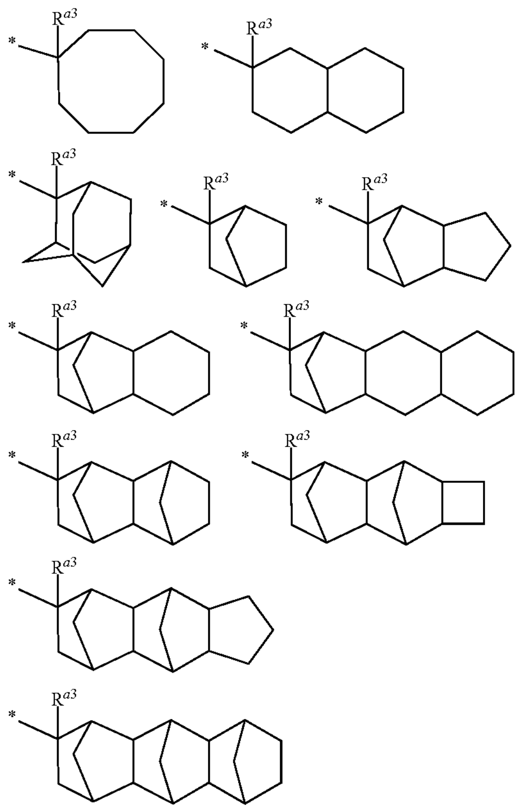

Examples of the hydrocarbon group in $R^{a1\prime}$, $R^{a2\prime}$ and $R^{a3\prime}$ include an alkyl group, an alicyclic hydrocarbon group, an aromatic hydrocarbon group, and groups obtained by combining these groups.

Examples of the alkyl group and the alicyclic hydrocarbon group include those which are the same as mentioned for $R^{a1}$, $R^{a2}$ and $R^{a3}$.

Examples of the aromatic hydrocarbon group include aryl groups such as a phenyl group, a naphthyl group, an anthryl group, a biphenyl group and a phenanthryl group.

Examples of the combined group include groups obtained by combining the above-mentioned alkyl group and alicyclic hydrocarbon group (e.g., alkylcycloalkyl groups or cycloalkylalkyl groups such as a methylcyclohexyl group, a dimethylcyclohexyl group, a methylnorbornyl group, a cyclohexylmethyl group, an adamantylmethyl group, an adamantyldimethyl group and a norbornylethyl group), aralkyl groups such as a benzyl group, aromatic hydrocarbon groups having an alkyl group (a p-methylphenyl group, a p-tert-butylphenyl group, a tolyl group, a xylyl group, a cumenyl group, a mesityl group, a 2,6-diethylphenyl group, a 2-methyl-6-ethylphenyl group, etc.), aromatic hydrocarbon groups having an alicyclic hydrocarbon group (a p-cyclohexylphenyl group, a p-adamantylphenyl group, etc.), aryl-cycloalkyl groups such as a phenylcyclohexyl group, and the like.

When $R^{a2\prime}$ and $R^{a3\prime}$ are bonded each other to form a heterocyclic ring together with carbon atoms and X to which $R^{a2\prime}$ and $R^{a3\prime}$ are bonded, examples of —C($R^{a1\prime}$) ($R^{a2\prime}$)—X—$R^{a3\prime}$ include the following rings. * represents a bonding site.

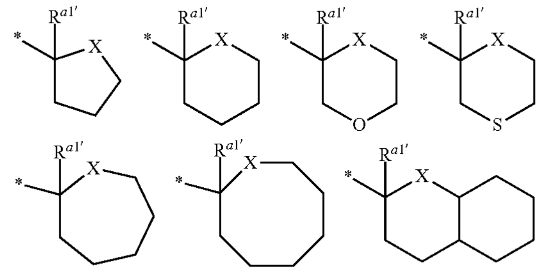

Of $R^{a1\prime}$ and $R^{a2\prime}$, at least one is preferably a hydrogen atom.

na' is preferably 0.

Examples of the group (1) include the following groups.

A group wherein, in formula (1), $R^{a1}$, $R^{a2}$ and $R^{a3}$ are alkyl groups, ma=0 and na=1. The group is preferably a tert-butoxycarbonyl group.

A group wherein, in formula (1), $R^{a1}$ and $R^{a2}$ are bonded each other to form an adamantyl group together with carbon atoms to which $R^{a1}$ and $R^{a2}$ are bonded, $R^{a3}$ is an alkyl group, ma=0 and na=1.

A group wherein, in formula (1), $R^{a1}$ and $R^{a2}$ are each independently an alkyl group, $R^{a3}$ is an adamantyl group, ma=0 and na=1.

Specific examples of the group (1) include the following groups. * represents a bonding site.

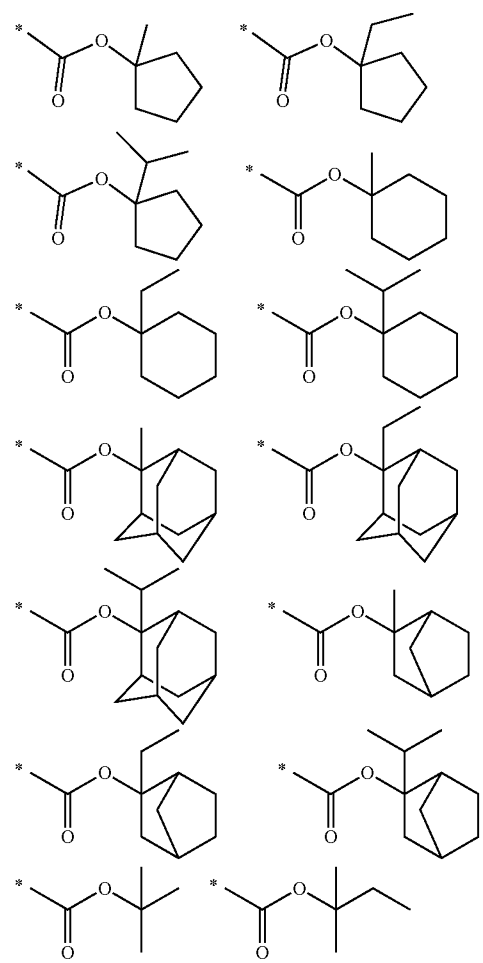

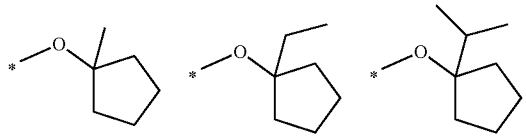
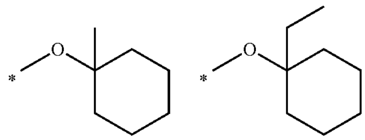
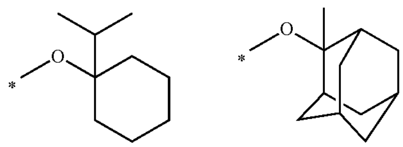
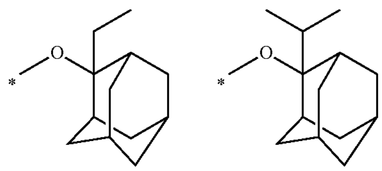
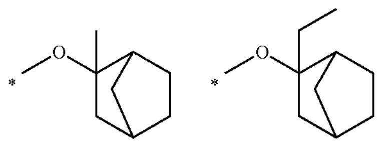
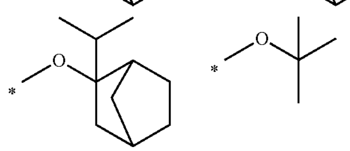
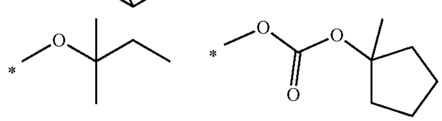
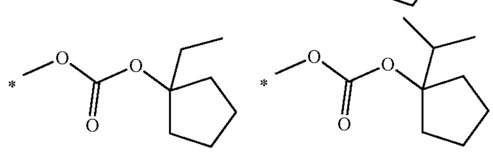
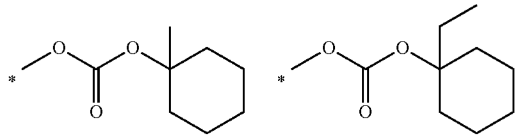
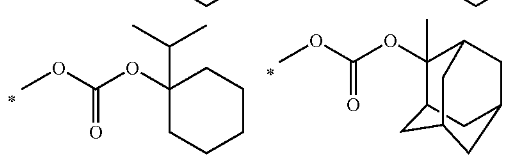
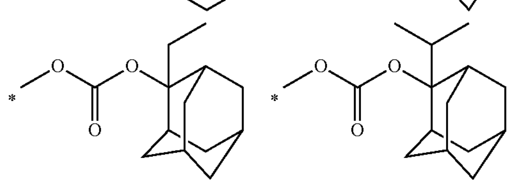
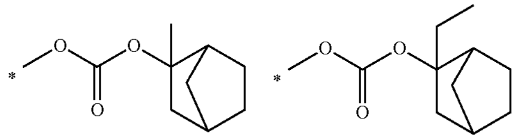
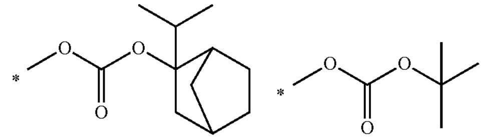
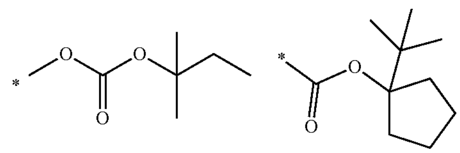
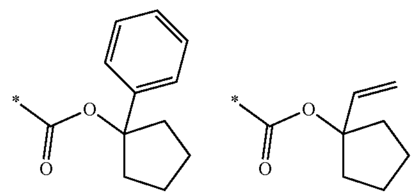
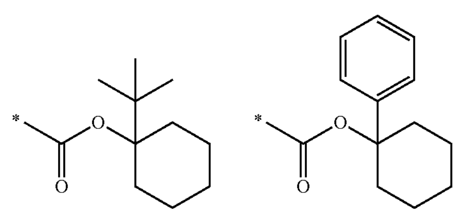
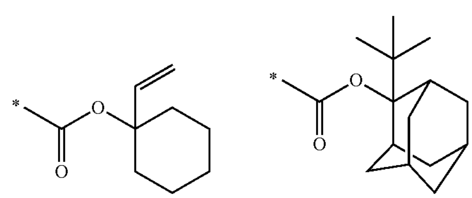
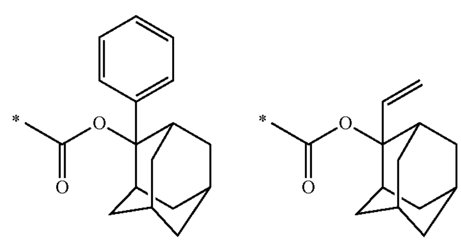
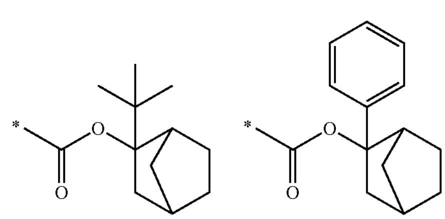
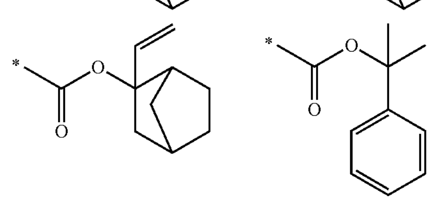

-continued
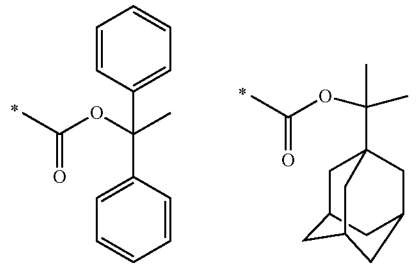
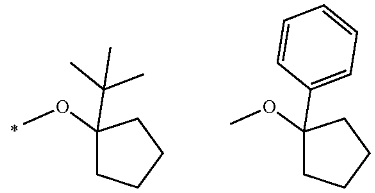
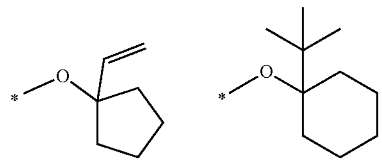
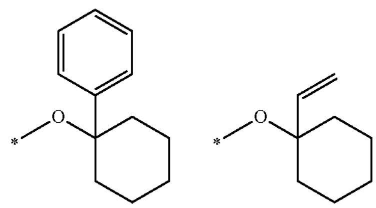
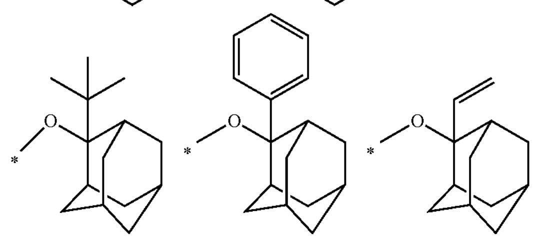
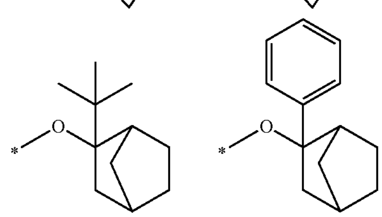
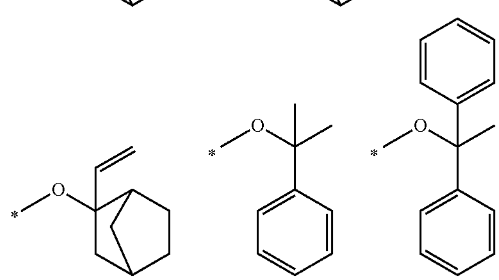
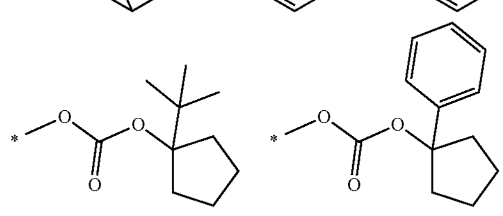
-continued
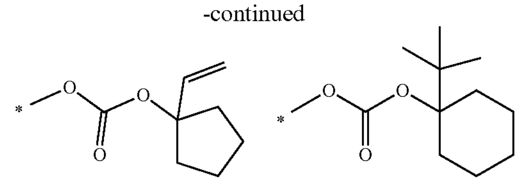
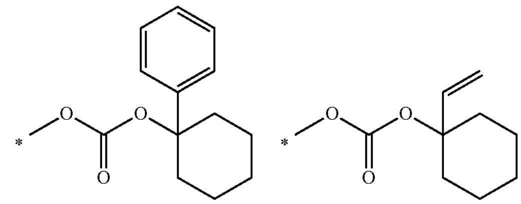
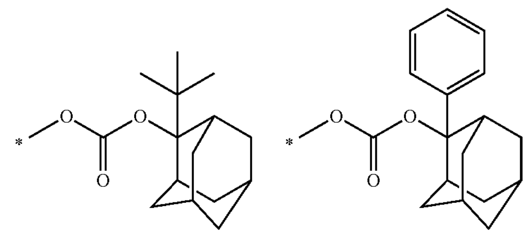
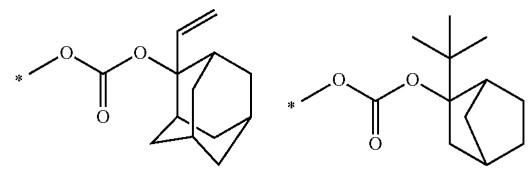
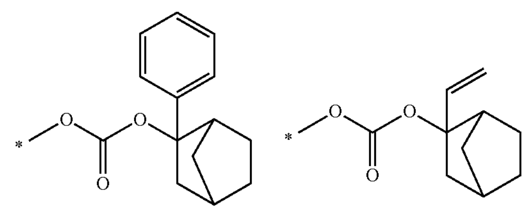
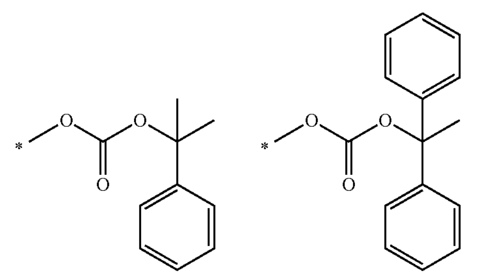
Specific examples of the group (2) include the following groups. * represents a bonding site.
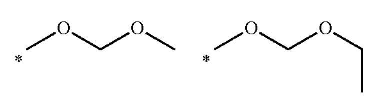
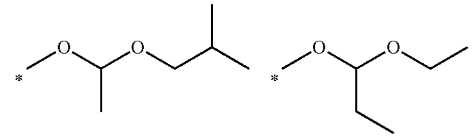
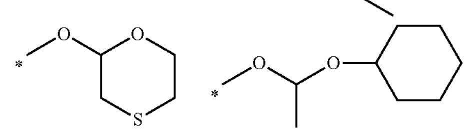

-continued

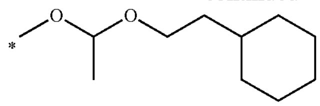

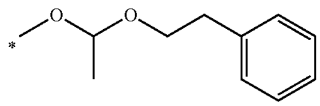

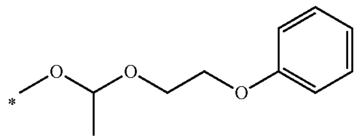

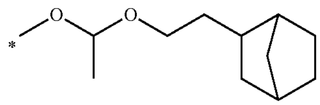

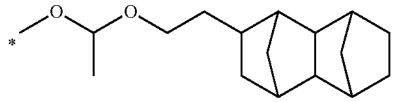

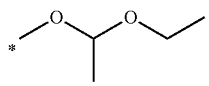

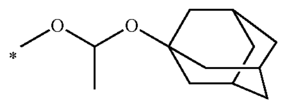

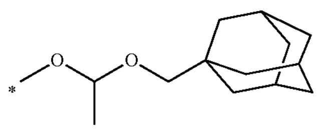

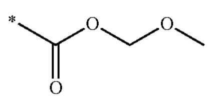

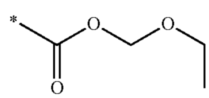

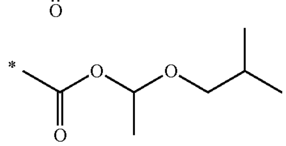

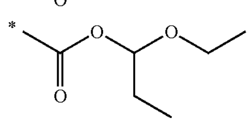

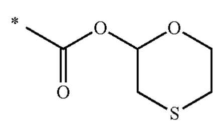

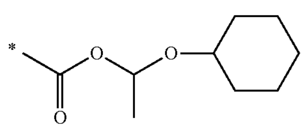

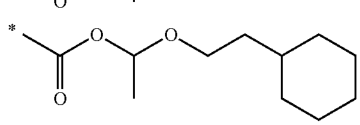

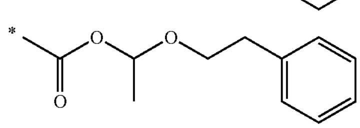

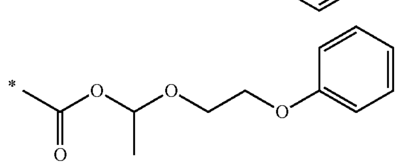

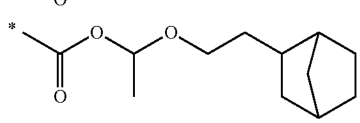

-continued

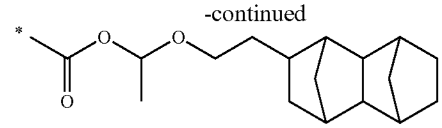

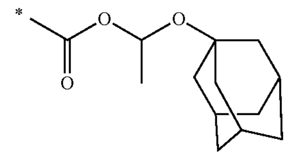

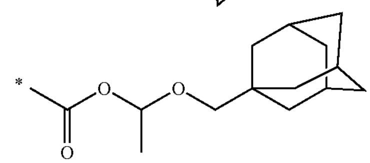

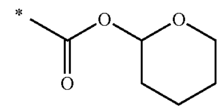

The monomer (a1) is preferably a monomer having an acid-labile group and an ethylenic unsaturated bond, and more preferably a (meth)acrylic monomer having an acid-labile group.

Of the (meth)acrylic monomers having an acid-labile group, those having an alicyclic hydrocarbon group having 5 to 20 carbon atoms are preferably exemplified. When a resin (A) including a structural unit derived from a monomer (a1) having a bulky structure such as an alicyclic hydrocarbon group is used in a resist composition, it is possible to improve the resolution of a resist pattern.

The structural unit derived from a (meth)acrylic monomer having a group (1) is preferably a structural unit represented by formula (a1-0) (hereinafter sometimes referred to as structural unit (a1-0)). These structural units may be used alone, or two or more structural units may be used in combination:

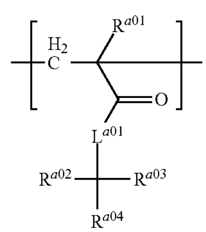

(a1-0)

wherein, in formula (a1-0), $L^{a01}$ represents —O— or *—O—$(CH_2)_{k1}$—CO—O—, k1 represents an integer of 1 to 7, * represents a bonding site to —CO—, $R^{a01}$ represents a hydrogen atom or a methyl group, and $R^{a02}$, $R^{a03}$ and $R^{a04}$ each independently represent an alkyl group having 1 to 8 carbon atoms, an alicyclic hydrocarbon group having 3 to 18 carbon atoms, an aromatic hydrocarbon group having 6 to 18 carbon atoms, or groups obtained by combining these groups.

$R^{a01}$ is preferably a methyl group.

$L^{a01}$ is preferably an oxygen atom or *—O—$(CH_2)_{k01}$—CO—O— (in which k01 is preferably an integer of 1 to 4, and more preferably 1), and more preferably an oxygen atom.

Examples of the alkyl group for $R^{a02}$, $R^{a03}$ and $R^{a04}$ include a methyl group, an ethyl group, a propyl group, an n-butyl group, an n-pentyl group, an n-hexyl group, an n-heptyl group, an n-octyl group and the like.

The alicyclic hydrocarbon group for $R^{a02}$, $R^{a03}$ and $R^{a04}$ may be either monocyclic or polycyclic. Examples of the monocyclic alicyclic hydrocarbon group include cycloalkyl groups such as a cyclopentyl group, a cyclohexyl group, a cycloheptyl group, a cyclooctyl group and the like. Examples of the polycyclic alicyclic hydrocarbon group include a decahydronaphthyl group, an adamantyl group, a norbornyl group and the following groups (* represents a bonding site). The number of carbon atoms of the alicyclic hydrocarbon group for $R^{a02}$, $R^{a03}$ and $R^{a04}$ is preferably 3 to 16.

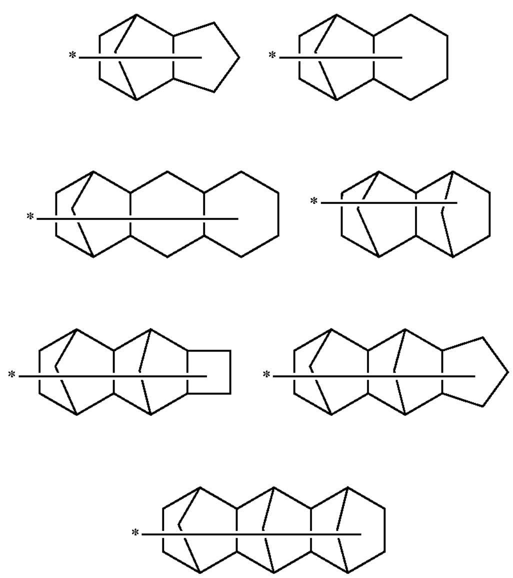

Examples of the aromatic hydrocarbon group for $R^{a02}$, $R^{a03}$ and $R^{a04}$ include aryl groups such as a phenyl group, a naphthyl group, an anthryl group, a biphenyl group and a phenanthryl group.

Examples of the combined group include groups obtained by combining the above-mentioned alkyl group and alicyclic hydrocarbon group (e.g., alkylcycloalkyl groups or cycloalkylalkyl groups such as a methylcyclohexyl group, a dimethylcyclohexyl group, a methylnorbornyl group, a cyclohexylmethyl group, an adamantylmethyl group, an adamantyldimethyl group and a norbornylethyl group), aralkyl groups such as a benzyl group, aromatic hydrocarbon groups having an alkyl group (a p-methylphenyl group, a p-tert-butylphenyl group, a tolyl group, a xylyl group, a cumenyl group, a mesityl group, a 2,6-diethylphenyl group, a 2-methyl-6-ethylphenyl group, etc.), aromatic hydrocarbon groups having an alicyclic hydrocarbon group (a p-cyclohexylphenyl group, a p-adamantylphenyl group, etc.), aryl-cycloalkyl groups such as a phenylcyclohexyl group, and the like.

The number of carbon atoms of the alicyclic hydrocarbon group for $R^{a02}$, $R^{a03}$ and $R^{a04}$ is preferably 5 to 12, and more preferably 5 to 10.

The number of carbon atoms of the aromatic hydrocarbon group for $R^{a02}$, $R^{a03}$ and $R^{a04}$ is preferably 6 to 12, and more preferably 6 to 10.

Regarding the group obtained by combining an alkyl group and an alicyclic hydrocarbon group, the total number of carbon atoms of the combination of the alkyl group and the alicyclic hydrocarbon group is preferably 18 or less.

Regarding the group obtained by combining an alkyl group and an aromatic hydrocarbon group, the total number of carbon atoms of the combination of the alkyl group and the aromatic hydrocarbon group is preferably 18 or less.

$R^{a02}$ and $R^{a03}$ are preferably an alkyl group having 1 to 6 carbon atoms or an aromatic hydrocarbon group having 6 to 12 carbon atoms, and more preferably a methyl group, an ethyl group, a phenyl group or a naphthyl group.

$R^{a04}$ is preferably an alkyl group having 1 to 6 carbon atoms or an alicyclic hydrocarbon group having 5 to 12 carbon atoms, and more preferably a methyl group, an ethyl group, a cyclohexyl group or an adamantyl group.

Examples of the structural unit (a1-0) include a structural unit represented by any one of formula (a1-0-1) to formula (a1-0-18) and a structural unit in which a methyl group corresponding to $R^{a01}$ in the structural unit (a1-0) is substituted with a hydrogen atom, and a structural unit represented by any one of formula (a1-0-1) to formula (a1-0-10), formula (a1-0-13) and formula (a1-0-14) is preferable.

(a1-0-1)

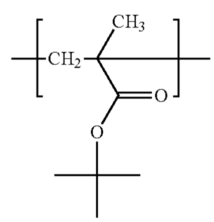

(a1-0-2)

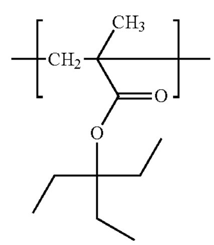

(a1-0-3)

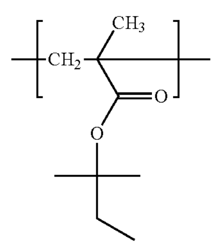

(a1-0-4)

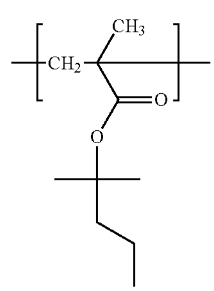

-continued
(a1-0-5)
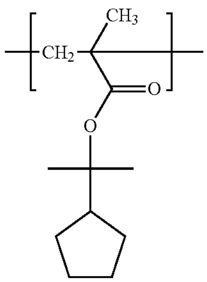
(a1-0-6)
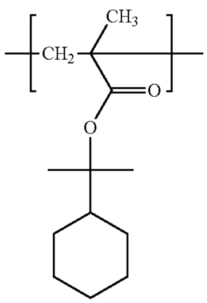
(a1-0-7)
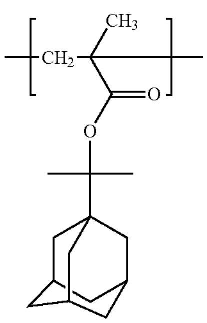
(a1-0-8)
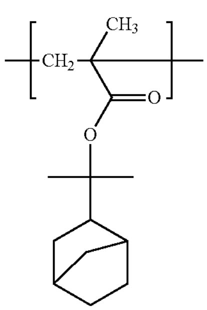
(a1-0-9)
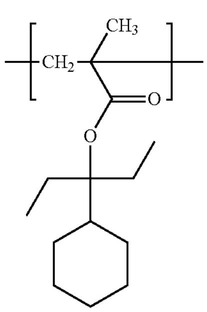
-continued
(a1-0-10)
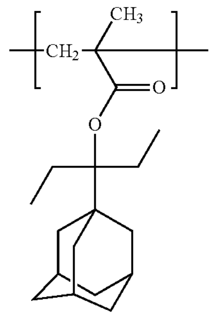
(a1-0-11)
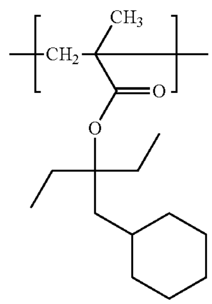
(a1-0-12)
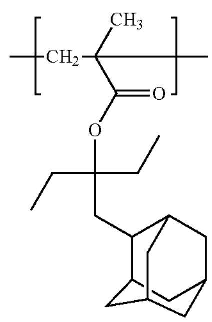
(a1-0-13)
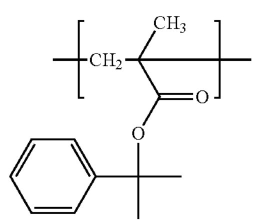
(a1-0-14)
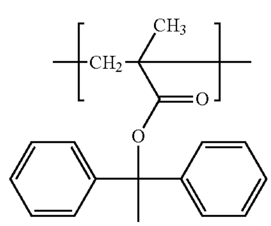
(a1-0-15)
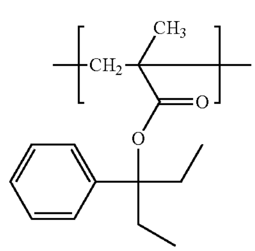

-continued (a1-0-16)

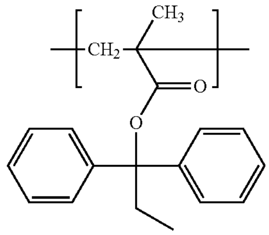

(a1-0-17)

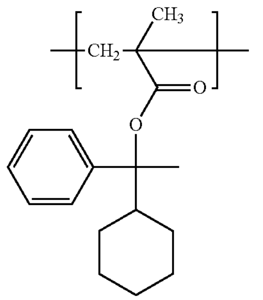

(a1-0-18)

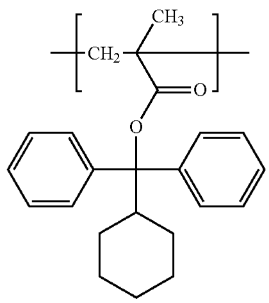

When the resin (A) includes the structural unit (a1-0), the content is usually 5 to 60 mol %, preferably 5 to 50 mol %, and more preferably 10 to 40 mol %, based on all structural units of the resin (A).

Examples of the structural unit having a group (2) in the structural unit (a1) include a structural unit represented by formula (a1-4) (hereinafter sometimes referred to as "structural unit (a1-4)"):

(a1-4)

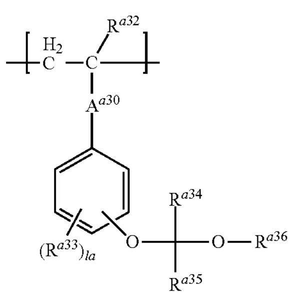

wherein, in formula (a1-4), $R^{a32}$ represents a hydrogen atom, a halogen atom, or an alkyl group having 1 to 6 carbon atoms which may have a halogen atom, $R^{a33}$ represents a halogen atom, a hydroxy group, an alkyl group having 1 to 6 carbon atoms, an alkoxy group having 1 to 6 carbon atoms, an alkoxyalkyl group having 2 to 12 carbon atoms, an alkoxyalkoxy group having 2 to 12 carbon atoms, an alkylcarbonyl group having 2 to 4 carbon atoms, an alkylcarbonyloxy group having 2 to 4 carbon atoms, an acryloyloxy group or a methacryloyloxy group, $A^{a30}$ represents a single bond or *—$X^{a31}$-($A^{a32}$-$X^{a32}$)$_{nc}$—, and * represents a bonding site to carbon atoms to which —$R^{a32}$ is bonded, $A^{a32}$ represents an alkanediyl group having 1 to 6 carbon atoms, $X^{a31}$ and $X^{a32}$ each independently represent —O—, —CO—O— or —O—CO—, nc represents 0 or 1, la represents an integer of 0 to 4, and when la is an integer of 2 or more, a plurality of $R^{a33}$ may be the same or different from each other, and $R^{a34}$ and $R^{a35}$ each independently represent a hydrogen atom or a hydrocarbon group having 1 to 12 carbon atoms, $R^{a36}$ represents a hydrocarbon group having 1 to 20 carbon atoms, or $R^{a35}$ and $R^{a36}$ may be bonded each other to form a divalent hydrocarbon group having 2 to 20 carbon atoms together with —C—O— to which $R^{a33}$ and $R^{a36}$ are bonded, and —$CH_2$— included in the hydrocarbon group and the divalent hydrocarbon group may be replaced by —O— or —S—.

Examples of the halogen atom for $R^{a32}$ and $R^{a33}$ include a fluorine atom, a chlorine atom and a bromine atom.

Examples of the alkyl group having 1 to 6 carbon atoms which may have a halogen atom in $R^{a32}$ include a trifluoromethyl group, a difluoromethyl group, a methyl group, a perfluoroethyl group, a 2,2,2-trifluoroethyl group, a 1,1,2,2-tetrafluoroethyl group, an ethyl group, a perfluoropropyl group, a 2,2,3,3,3-pentafluoropropyl group, a propyl group, a perfluorobutyl group, a 1,1,2,2,3,3,4,4-octafluorobutyl group, a butyl group, a perfluoropentyl group, a 2,2,3,3,4,4,5,5,5-nonafluoropentyl group, a pentyl group, a hexyl group and a perfluorohexyl group.

$R^{a32}$ is preferably a hydrogen atom or an alkyl group having 1 to 4 carbon atoms, more preferably a hydrogen atom, a methyl group or an ethyl group, and still more preferably a hydrogen atom or a methyl group.

Examples of the alkyl group in $R^{a33}$ include a methyl group, an ethyl group, a propyl group, an isopropyl group, a butyl group, a sec-butyl group, a tert-butyl group, a pentyl group and a hexyl group.

Examples of the alkoxy group in $R^{a33}$ include a methoxy group, an ethoxy group, a propoxy group, an isopropoxy group, a butoxy group, a sec-butoxy group, a tert-butoxy group, a pentyloxy group and a hexyloxy group. The alkoxy group is preferably an alkoxy group having 1 to 4 carbon atoms, more preferably a methoxy group or an ethoxy group, and still more preferably a methoxy group.

Examples of the alkoxyalkyl group in $R^{a33}$ include a methoxymethyl group, an ethoxyethyl group, a propoxymethyl group, an isopropoxymethyl group, a butoxymethyl group, a sec-butoxymethyl group and a tert-butoxymethyl group. The alkoxyalkyl group is preferably an alkoxyalkyl group having 2 to 8 carbon atoms, more preferably a methoxymethyl group or an ethoxyethyl group, and still more preferably a methoxymethyl group.

Examples of the alkoxyalkoxy group in $R^{a33}$ include a methoxymethoxy group, a methoxyethoxy group, an ethoxymethoxy group, an ethoxyethoxy group, a propoxymethoxy group, an isopropoxymethoxy group, a butoxymethoxy group, a sec-butoxymethoxy group and a tert-butoxymethoxy group. The alkoxyalkoxy group is preferably an alkoxyalkoxy group having 2 to 8 carbon atoms, and more preferably a methoxyethoxy group or an ethoxyethoxy group.

Examples of the alkylcarbonyl group in $R^{a33}$ include an acetyl group, a propionyl group and a butyryl group. The alkylcarbonyl group is preferably an alkylcarbonyl group having 2 to 3 carbon atoms, and more preferably an acetyl group.

Examples of the alkylcarbonyloxy group in $R^{a33}$ include an acetyloxy group, a propionyloxy group and a butyryloxy group. The alkylcarbonyloxy group is preferably an alkylcarbonyloxy group having 2 to 3 carbon atoms, and more preferably an acetyloxy group.

$R^{a33}$ is preferably a halogen atom, a hydroxy group, an alkyl group having 1 to 4 carbon atoms, an alkoxy group having 1 to 4 carbon atoms or an alkoxyalkoxy group having 2 to 8 carbon atoms, more preferably a fluorine atom, an iodine atom, a hydroxy group, a methyl group, a methoxy group, an ethoxy group, an ethoxyethoxy group or an ethoxymethoxy group and still more preferably a fluorine atom, an iodine atom, a hydroxy group, a methyl group, a methoxy group or an ethoxyethoxy group.

Examples of *—$X^{a31}$-($A^{a32}$-$X^{a32}$)$_{nc}$— include *—O—, *—CO—O—, *—O—CO—, *—CO—O-$A^{a32}$-CO—O—, *—O—CO-$A^{a32}$-O—, *—O-$A^{a32}$-CO—O—, *—CO—O-$A^{a32}$-O—CO— and *—O—CO-$A^{a32}$-O—CO—. Of these, *—CO—O—, *—CO—O-$A^{a32}$-CO—O— or *—O-$A^{a32}$-CO—O— is preferable.

Examples of the alkanediyl group in $A^{a32}$ include a methylene group, an ethylene group, a propane-1,3-diyl group, a propane-1,2-diyl group, a butane-1,4-diyl group, a pentane-1,5-diyl group, a hexane-1,6-diyl group, a butane-1,3-diyl group, a 2-methylpropane-1,3-diyl group, a 2-methylpropane-1,2-diyl group, a pentane-1,4-diyl group and a 2-methylbutane-1,4-diyl group.

$A^{a32}$ is preferably a methylene group or an ethylene group.

$A^{a30}$ is preferably a single bond, *—CO—O— or *—CO—O-$A^{a32}$-CO—O—, more preferably a single bond, *—CO—O— or *—CO—O—$CH_2$—CO—O—, and still more preferably a single bond or *—CO—O—.

La is preferably 0, 1 or 2, more preferably 0 or 1, and still more preferably 0.

Examples of the hydrocarbon group in $R^{a34}$, $R^{a35}$ and $R^{a36}$ include an alkyl group, an alicyclic hydrocarbon group, an aromatic hydrocarbon group, and groups obtained by combining these groups.

Examples of the alkyl group include a methyl group, an ethyl group, a propyl group, a butyl group, a pentyl group, a hexyl group, a heptyl group, an octyl group and the like.

The alicyclic hydrocarbon group may be either monocyclic or polycyclic. Examples of the monocyclic alicyclic hydrocarbon group include cycloalkyl groups such as a cyclopentyl group, a cyclohexyl group, a cycloheptyl group and a cyclooctyl group. Examples of the polycyclic alicyclic hydrocarbon group include a decahydronaphthyl group, an adamantyl group, a norbornyl group, and the following groups (* represents a bonding site).

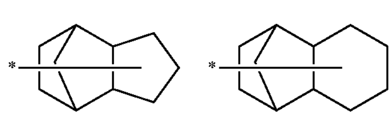

-continued

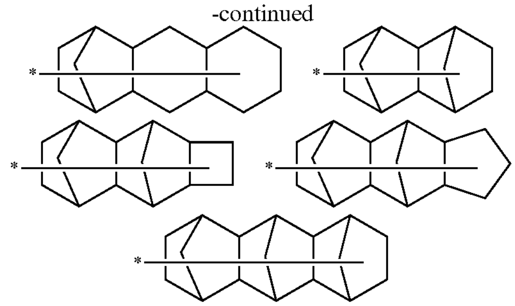

Examples of the aromatic hydrocarbon group include aryl groups such as a phenyl group, a naphthyl group, an anthryl group, a biphenyl group and a phenanthryl group.

Examples of the combined group include groups obtained by combining the above-mentioned alkyl group and alicyclic hydrocarbon group (e.g., alkylcycloalkyl groups or cycloalkylalkyl groups such as a methylcyclohexyl group, a dimethylcyclohexyl group, a methylnorbornyl group, a cyclohexylmethyl group, an adamantylmethyl group, an adamantyldimethyl group and a norbornylethyl group), aralkyl groups such as a benzyl group, aromatic hydrocarbon groups having an alkyl group (a p-methylphenyl group, a p-tert-butylphenyl group, a tolyl group, a xylyl group, a cumenyl group, a mesityl group, a 2,6-diethylphenyl group, a 2-methyl-6-ethylphenyl group, etc.), aromatic hydrocarbon groups having an alicyclic hydrocarbon group (a p-cyclohexylphenyl group, a p-adamantylphenyl group, etc.), aryl-cycloalkyl groups such as a phenylcyclohexyl group, and the like. In particular, examples of $R^{a36}$ include an alkyl group having 1 to 18 carbon atoms, an alicyclic hydrocarbon group having 3 to 18 carbon atoms, an aromatic hydrocarbon group having 6 to 18 carbon atoms, or groups formed by combining these groups.

$R^{a34}$ is preferably a hydrogen atom.

$R^{a35}$ is preferably a hydrogen atom, an alkyl group having 1 to 12 carbon atoms or an alicyclic hydrocarbon group having 3 to 12 carbon atoms, and more preferably a methyl group or an ethyl group.

The hydrocarbon group for $R^{a36}$ is preferably an alkyl group having 1 to 18 carbon atoms, an alicyclic hydrocarbon group having 3 to 18 carbon atoms, an aromatic hydrocarbon group having 6 to 18 carbon atoms, or groups formed by combining these group, and more preferably an alkyl group having 1 to 18 carbon atoms, an alicyclic hydrocarbon group having 3 to 18 carbon atoms or an aralkyl group having 7 to 18 carbon atoms. The alkyl group and the alicyclic hydrocarbon group in $R^{a36}$ are preferably unsubstituted. The aromatic hydrocarbon group in $R^{a36}$ is preferably an aromatic ring having an aryloxy group having 6 to 10 carbon atoms.

—OC($R^{a34}$)($R^{a35}$)—O—$R^{a36}$ in the structural unit (a1-4) is eliminated by contact with an acid (e.g., p-toluenesulfonic acid) to form a hydroxy group.

—OC($R^{a34}$)($R^{a35}$)—O—$R^{a36}$ is preferably bonded to the o-position or the p-position of the benzene ring, and more preferably the p-position.

The structural unit (a1-4) includes, for example, structural units derived from the monomers mentioned in JP 2010-204646 A. The structural unit preferably includes structural units represented by formula (a1-4-1) to formula (a1-4-18) and a structural unit in which a hydrogen atom corresponding to $R^{a32}$ in the structural unit (a1-4) is substituted with a methyl group, and more preferably structural units each represented by formula (a1-4-1) to formula (a1-4-5), formula (a1-4-10), formula (a1-4-13) and formula (a1-4-14).
(a1-4-1)
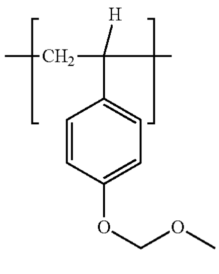
(a1-4-2)
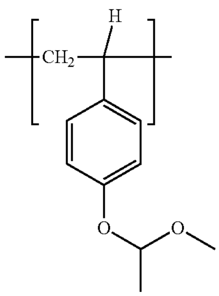
(a1-4-3)
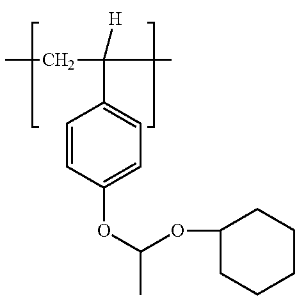
(a1-4-4)
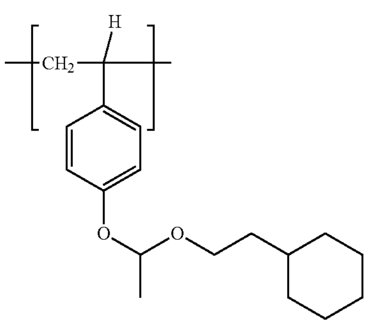
(a1-4-5)
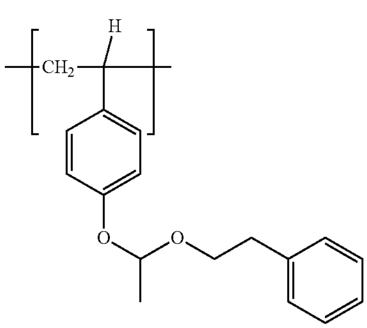
-continued
(a1-4-6)
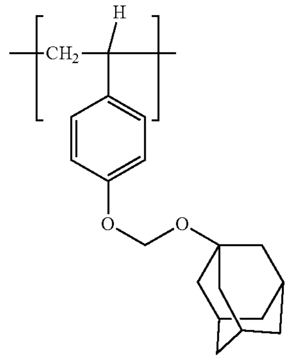
(a1-4-7)
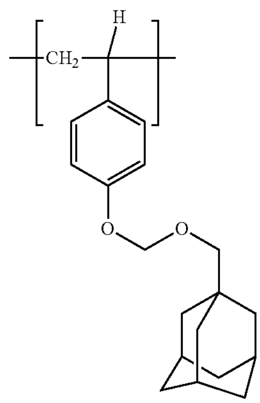
(a1-4-8)
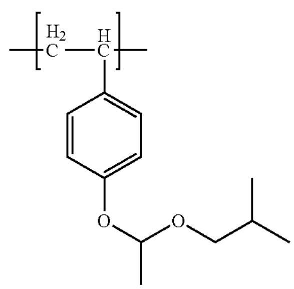
(a1-4-9)
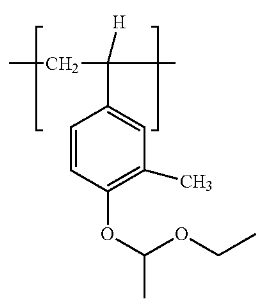
(a1-4-10)
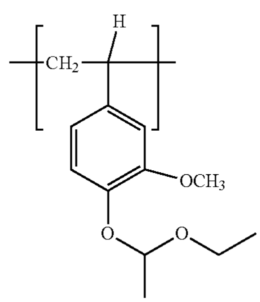

-continued (a1-4-11)

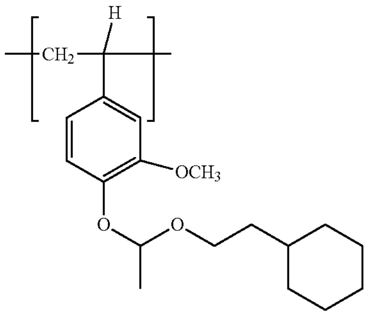

(a1-4-12)

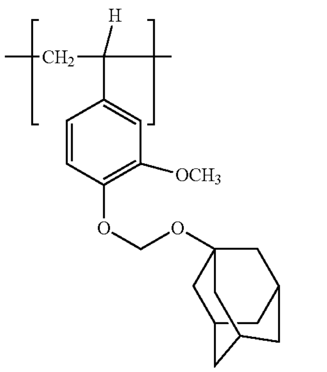

(a1-4-13)

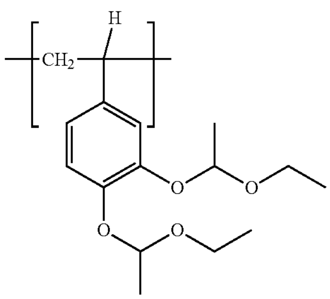

(a1-4-14)

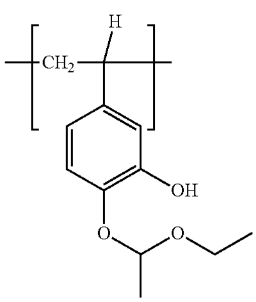

(a1-4-15)

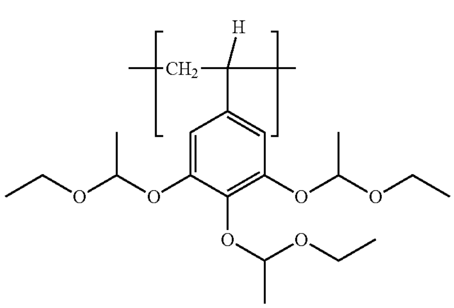

-continued (a1-4-16)

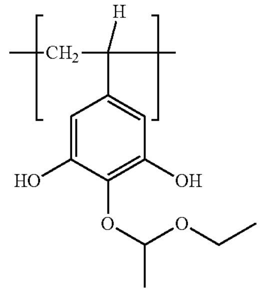

(a1-4-17)

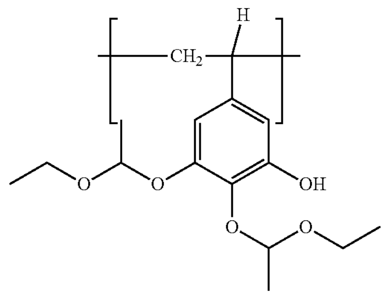

(a1-4-18)

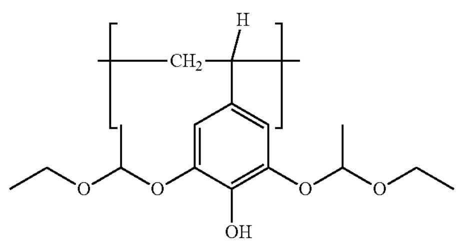

When the resin (A) includes the structural unit (a1-4), the content is preferably 1 to 60 mol %, more preferably 2 to 50 mol %, and still more preferably 3 to 40 mol %, based on the total of all structural units of the resin (A).

Examples of the structural unit having a group (2) derived from a (meth)acrylic monomer also include a structural unit represented by formula (a1-5) (hereinafter sometimes referred to as "structural unit (a1-5)").

(a1-5)

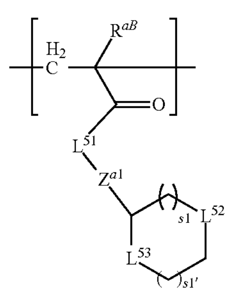

In formula (a1-5), $R^{a8}$ represents an alkyl group having 1 to 6 carbon atoms which may have a halogen atom, a hydrogen atom or a halogen atom, $Z^{a1}$ represents a single bond or $*—(CH_2)_{h3}—CO-L^{54}-$, h3 represents an integer of 1 to 4, and * represents a bonding site to $L^{51}$, $L^{51}$, $L^{52}$, $L^{53}$ and $L^{54}$ each independently represent —O— or —S—, s1 represents an integer of 1 to 3, and s1' represents an integer of 0 to 3.

Examples of the halogen atom include a fluorine atom and a chlorine atom, and a fluorine atom is preferable.

Examples of the alkyl group having 1 to 6 carbon atoms which may have a halogen atom include a methyl group, an ethyl group, a propyl group, a butyl group, a pentyl group, a hexyl group, a heptyl group, an octyl group, a fluoromethyl group and a trifluoromethyl group.

In formula (a1-5), $R^{a8}$ is preferably a hydrogen atom, a methyl group or a trifluoromethyl group.

$L^{51}$ is preferably an oxygen atom.

Of $L^{52}$ and $L^{53}$, one is —O— and the other one is —S—, preferably.

s1 is preferably 1.

s1' is preferably an integer of 0 to 2.

$Z^{a1}$ is preferably a single bond or *—$CH_2$—CO—O—.

Examples of the structural unit (a1-5) include structural units derived from the monomers mentioned in JP 2010-61117 A. Of these, structural units each represented by formula (a1-5-1) to formula (a1-5-4) are preferable, and a structural unit represented by formula (a1-5-1) or formula (a1-5-2) is more preferable.

(a1-5-1)

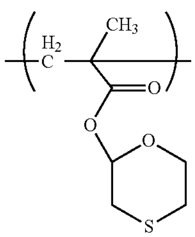

(a1-5-2)

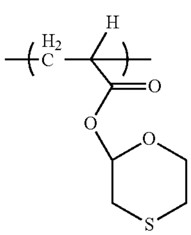

(a1-5-3)

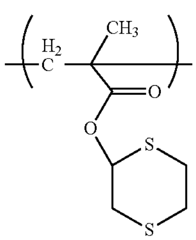

(a1-5-4)

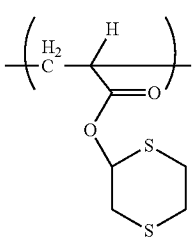

When the resin (A) includes the structural unit (a1-5), the content is preferably 1 to 50 mol %, more preferably 3 to 45 mol %, still more preferably 5 to 40 mol %, and yet more preferably 5 to 30 mol %, based on all structural units of the resin (A)

Examples of the structural unit (a1) also include the following structural unit.

(a1-3-1)

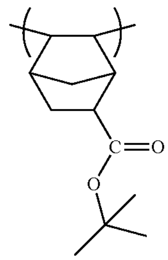

(a1-3-2)

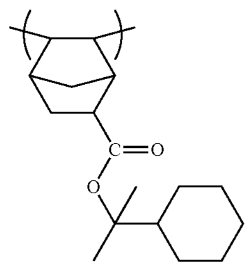

(a1-3-3)

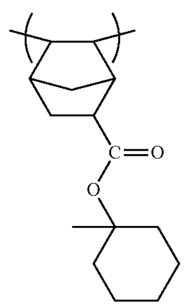

(a1-3-4)

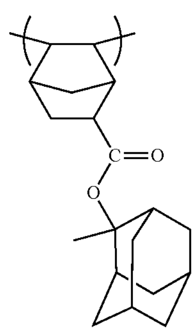

-continued (a1-3-5)

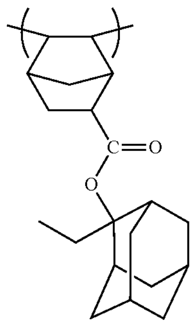

(a1-3-6)

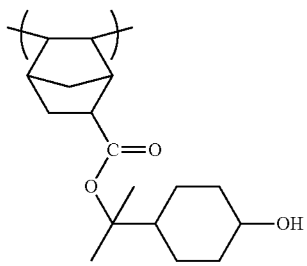

(a1-3-7)

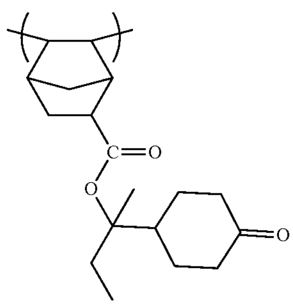

When the resin (A) includes the above structural units, the content is preferably 5 to 60 mol %, more preferably 5 to 50 mol %, and still more preferably 10 to 40 mol %, based on all structural units of the resin (A).

Examples of the structural unit (a1) also include the following structural units.

(a1-6-1)

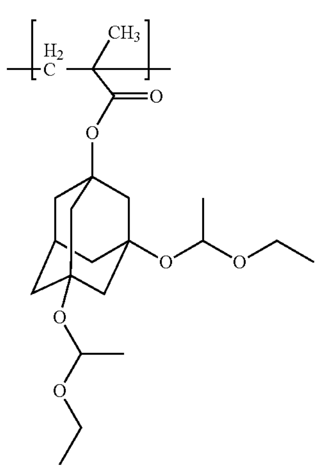

-continued (a1-6-2)

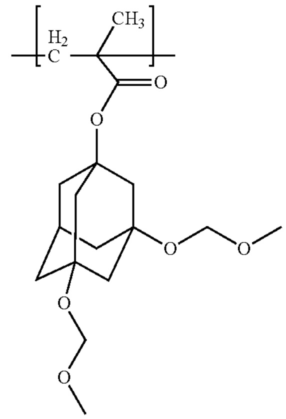

(a1-6-3)

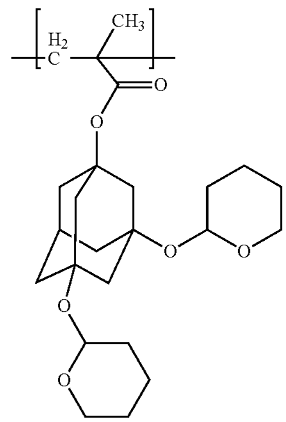

When the resin (A) includes the above structural units (a1-6-1) to (a1-6-3), the content is preferably 10 to 60 mol %, more preferably 15 to 55 mol %, still more preferably 20 to 50 mol %, yet more preferably 20 to 45 mol %, and particularly preferably 20 to 40 mol %, based on all structural units of the resin (A).

<Structural Unit (s)>

The structural unit (s) is derived from a monomer having no acid-labile group (hereinafter sometimes referred to as "monomer (s)"). The monomer, from which the structural unit (s) is derived, has no acid-labile group known in the resist field.

The structural unit (s) preferably has a hydroxy group or a lactone ring. When a resin including a structural unit having a hydroxy group and having no acid-labile group (hereinafter sometimes referred to as "structural unit (a2)") and/or a structural unit having a lactone ring and having no acid-labile group (hereinafter sometimes referred to as "structural unit (a3)") is used in the resist composition of the present invention, it is possible to improve the resolution of a resist pattern and the adhesion to a substrate.

<Structural Unit (a2)>

The hydroxy group possessed by the structural unit (a2) may be either an alcoholic hydroxy group or a phenolic hydroxy group.

When a resist pattern is produced from the resist composition of the present invention, in the case of using, as an exposure source, high energy rays such as KrF excimer laser (248 nm), electron beam or extreme ultraviolet light (EUV), a structural unit (a2) having a phenolic hydroxy group is preferably used as the structural unit (a2), and a structural unit (a2-A) mentioned below is more preferably used. When using ArF excimer laser (193 nm) or the like, a structural unit (a2) having an alcoholic hydroxy group is preferably used as the structural unit (a2), and it is more preferably to use a structural unit (a2-1) mentioned below. The structural unit (a2) may be included alone, or two or more structural units may be included.

In the structural unit (a2), examples of the structural unit having a phenolic hydroxy group include a structural unit represented by formula (a2-A) (hereinafter sometimes referred to as "structural unit (a2-A)"):

(a2-A)

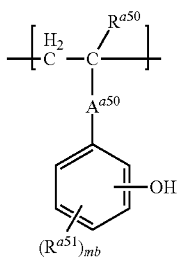

wherein, in formula (a2-A), $R^{a50}$ represents a hydrogen atom, a halogen atom or an alkyl group having 1 to 6 carbon atoms which may have a halogen atom, $R^{a51}$ represents a halogen atom, a hydroxy group, an alkyl group having 1 to 6 carbon atoms, an alkoxy group having 1 to 6 carbon atoms, an alkoxyalkyl group having 2 to 12 carbon atoms, an alkoxyalkoxy group having 2 to 12 carbon atoms, an alkylcarbonyl group having 2 to 4 carbon atoms, an alkylcarbonyloxy group having 2 to 4 carbon atoms, an acryloyloxy group or a methacryloyloxy group, $A^{a50}$ represents a single bond or $*—X^{a51}-(A^{a52}-X^{a52})_{nb}—$, and * represents a bonding site to carbon atoms to which $—R^{a50}$ is bonded, $A^{a52}$ represents an alkanediyl group having 1 to 6 carbon atoms, $X^{a51}$ and $X^{a52}$ each independently represent —O—, —CO—O— or —O—CO—, nb represents 0 or 1, and mb represents an integer of 0 to 4, and when mb is an integer of 2 or more, a plurality of $R^{a51}$ may be the same or different from each other.

Examples of the halogen atom in $R^{a50}$ and $R^{a51}$ include a fluorine atom, a chlorine atom and a bromine atom.

Examples of the alkyl group having 1 to 6 carbon atoms which may have a halogen atom in $R^{a50}$ include a trifluoromethyl group, a difluoromethyl group, a methyl group, a perfluoroethyl group, a 2,2,2-trifluoroethyl group, a 1,1,2,2-tetrafluoroethyl group, an ethyl group, a perfluoropropyl group, a 2,2,3,3,3-pentafluoropropyl group, a propyl group, a perfluorobutyl group, a 1,1,2,2,3,3,4,4-octafluorobutyl group, a butyl group, a perfluoropentyl group, a 2,2,3,3,4,4,5,5,5-nonafluoropentyl group, a pentyl group, a hexyl group and a perfluorohexyl group.

$R^{a50}$ is preferably a hydrogen atom or an alkyl group having 1 to 4 carbon atoms, more preferably a hydrogen atom, a methyl group or an ethyl group, and still more preferably a hydrogen atom or a methyl group.

Examples of the alkyl group in $R^{a51}$ include a methyl group, an ethyl group, a propyl group, an isopropyl group, a butyl group, a sec-butyl group, a tert-butyl group, a pentyl group and a hexyl group. The alkyl group is preferably an alkyl group having 1 to 4 carbon atoms, more preferably a methyl group or an ethyl group, and still more preferably a methyl group.

Examples of the alkoxy group in $R^{a51}$ include a methoxy group, an ethoxy group, a propoxy group, an isopropoxy group, a butoxy group, a sec-butoxy group and a tert-butoxy group. The alkoxy group is preferably an alkoxy group having 1 to 4 carbon atoms, more preferably a methoxy group or an ethoxy group, and still more preferably a methoxy group.

Examples of the alkoxyalkyl group in $R^{a51}$ include a methoxymethyl group, an ethoxyethyl group, a propoxymethyl group, an isopropoxymethyl group, a butoxymethyl group, a sec-butoxymethyl group and a tert-butoxymethyl group. The alkoxyalkyl group is preferably an alkoxyalkyl group having 2 to 8 carbon atoms, more preferably a methoxymethyl group or an ethoxyethyl group, and still more preferably a methoxymethyl group.

Examples of the alkoxyalkoxy group in $R^{a51}$ include a methoxymethoxy group, a methoxyethoxy group, an ethoxymethoxy group, an ethoxyethoxy group, a propoxymethoxy group, an isopropoxymethoxy group, a butoxymethoxy group, a sec-butoxymethoxy group and a tert-butoxymethoxy group. The alkoxyalkoxy group is preferably an alkoxyalkoxy group having 2 to 8 carbon atoms, and more preferably a methoxyethoxy group or an ethoxyethoxy group.

Examples of the alkylcarbonyl group in $R^{a51}$ include an acetyl group, a propionyl group and a butyryl group. The alkylcarbonyl group is preferably an alkylcarbonyl group having 2 to 3 carbon atoms, and more preferably an acetyl group.

Examples of the alkylcarbonyloxy group in $R^{a51}$ include an acetyloxy group, a propionyloxy group and a butyryloxy group. The alkylcarbonyloxy group is preferably an alkylcarbonyloxy group having 2 to 3 carbon atoms, and more preferably an acetyloxy group.

$R^{a51}$ is preferably a halogen atom, a hydroxy group, an alkyl group having 1 to 4 carbon atoms, an alkoxy group having 1 to 4 carbon atoms or an alkoxyalkoxy group having 2 to 8 carbon atoms, more preferably a fluorine atom, an iodine atom, a hydroxy group, a methyl group, a methoxy group, an ethoxy group, an ethoxyethoxy group or an ethoxymethoxy group, and still more preferably a fluorine atom, an iodine atom, a hydroxy group, a methyl group, a methoxy group or an ethoxyethoxy group.

Examples of $*—X^{a51}-(A^{a52}-X^{a52})_{nb}—$ include *—O—, *—C O—, *—O—CO—, $*—CO—O-A^{a52}-CO—O—$, $*—O—CO-A^{a52}-$, $*—O-A^{a52}-CO—O—$, $*—CO—O-A^{a52}-O—CO—$ and $*—O—CO-A^{a52}-O—CO—$. Of these, *—CO—O—, $*—CO—O-A^{a52}-CO—O—$ or $*—O-A^{a52}-CO—O—$ is preferable.

Examples of the alkanediyl group in $A^{a52}$ include a methylene group, an ethylene group, a propane-1,3-diyl group, a propane-1,2-diyl group, a butane-1,4-diyl group, a pentane-1,5-diyl group, a hexane-1,6-diyl group, a butane-1,3-diyl group, a 2-methylpropane-1,3-diyl group, a 2-methylpropane-1,2-diyl group, a pentane-1,4-diyl group and a 2-methylbutane-1,4-diyl group.

$A^{a52}$ is preferably a methylene group or an ethylene group.

$A^{a50}$ is preferably a single bond, *—CO—O— or $*—CO—O-A^{a52}-CO—O—$, more preferably a single bond, *—CO—O— or $*—CO—O—CH_2—CO—O—$, and still more preferably a single bond or *—CO—O—.

mb is preferably 0, 1 or 2, more preferably 0 or 1, and still more preferably 0.

The hydroxy group is preferably bonded to the o-position or the p-position of the benzene ring, and more preferably the p-position.

Examples of the structural unit (a2-A) include structural units derived from the monomers mentioned in JP 2010-204634 A and JP 2012-12577 A.

Examples of the structural unit (a2-A) include structural units represented by formula (a2-2-1) to formula (a2-2-16), and a structural unit in which a methyl group corresponding to $R^{a50}$ in the structural unit (a2-A) is substituted with a hydrogen atom in structural units represented by formula (a2-2-1) to formula (a2-2-16). The structural unit (a2-A) is preferably a structural unit represented by formula (a2-2-1), a structural unit represented by formula (a2-2-3), a structural unit represented by formula (a2-2-6), a structural unit represented by formula (a2-2-8), structural units represented by formula (a2-2-12) to formula (a2-2-14), and a structural unit in which a methyl group corresponding to $R^{a50}$ in the structural unit (a2-A) is substituted with a hydrogen atom in these structural units.

(a2-2-1)

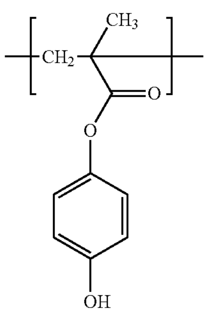

(a2-2-2)

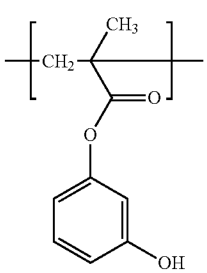

(a2-2-3)

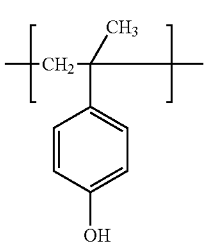

(a2-2-4)

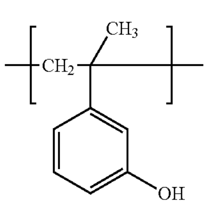

-continued (a2-2-5)

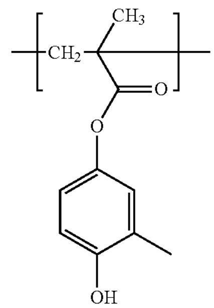

(a2-2-6)

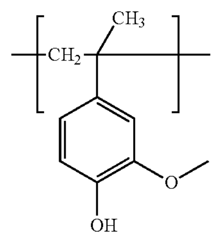

(a2-2-7)

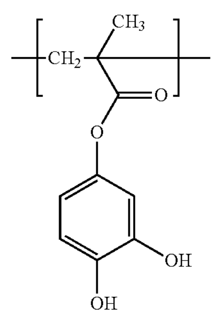

(a2-2-8)

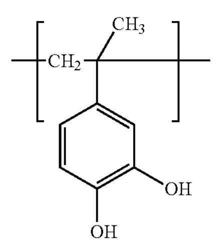

(a2-2-9)

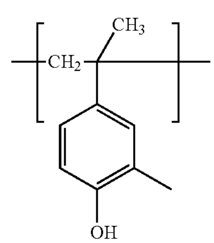

(a2-2-10)

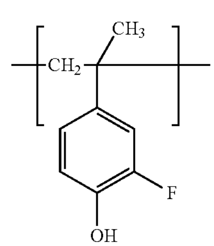

-continued (a2-2-11)

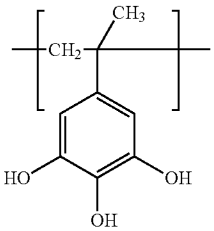

(a2-2-12)

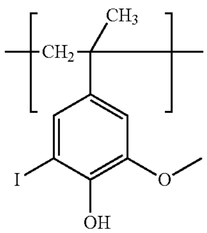

(a2-2-13)

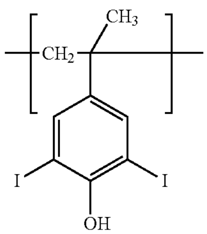

(a2-2-14)

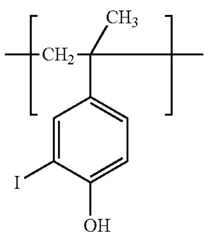

(a2-2-15)

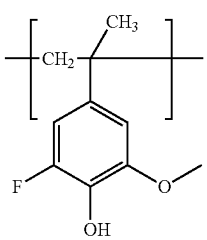

(a2-2-16)

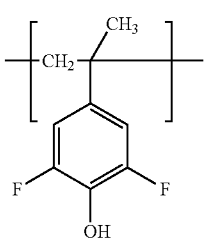

When the structural unit (a2-A) is included in the resin (A), the content of the structural unit (a2-A) is preferably 1 to 80 mol %, more preferably 3 to 70 mol %, still more preferably 5 to 60 mol %, and yet more preferably 10 to 50 mol %, based on all structural units.

The structural unit (a2-A) can be included in a resin (A) by polymerizing, for example, with a structural unit (a1-4) and treating with an acid such as p-toluenesulfonic acid. The structural unit (a2-A) can also be included in the resin (A) by polymerizing with acetoxystyrene and treating with an alkali such as tetramethylammonium hydroxide.

Examples of the structural unit having an alcoholic hydroxy group in the structural unit (a2) include a structural unit represented by formula (a2-1) (hereinafter sometimes referred to as "structural unit (a2-1)").

(a2-1)

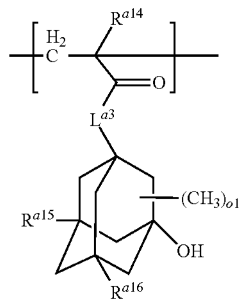

In formula (a2-1), $L^{a3}$ represents —O— or *—O—$(CH_2)_{k2}$—CO—O—, k2 represents an integer of 1 to 7, and * represents a bonding site to —CO—, $R^{a14}$ represents a hydrogen atom or a methyl group, $R^{a15}$ and $R^{a16}$ each independently represent a hydrogen atom, a methyl group or a hydroxy group, and o1 represents an integer of 0 to 10.

In formula (a2-1), $L^{a3}$ is preferably —O— or —O—$(CH_2)_{f1}$—CO—O— (f1 represents an integer of 1 to 4), and more preferably —O—, $R^{a14}$ is preferably a methyl group, $R^{a15}$ is preferably a hydrogen atom, $R^{a16}$ is preferably a hydrogen atom or a hydroxy group, and o1 is preferably an integer of 0 to 3, and more preferably 0 or 1.

The structural unit (a2-1) includes, for example, structural units derived from the monomers mentioned in JP 2010-204646 A. A structural unit represented by any one of formula (a2-1-1) to formula (a2-1-6) is preferable, a structural unit represented by any one of formula (a2-1-1) to formula (a2-1-4) is more preferable, and a structural unit represented by formula (a2-1-1) or formula (a2-1-3) is still more preferable.

(a2-1-1)

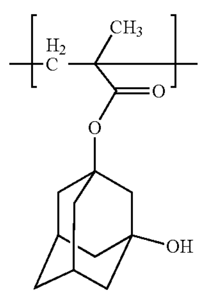

-continued (a2-1-2)

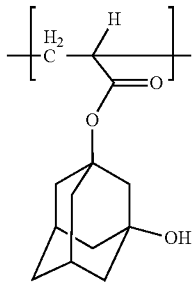

(a2-1-3)

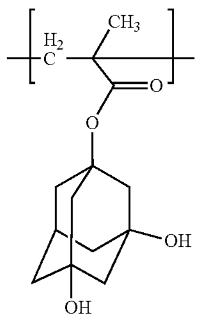

(a2-1-4)

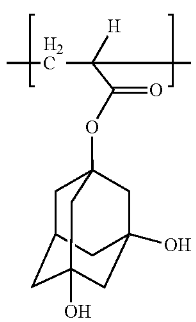

(a2-1-5)

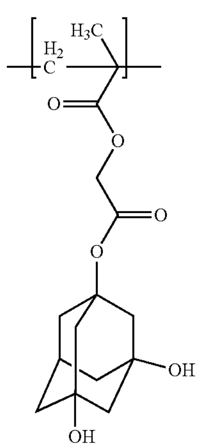

-continued (a2-1-6)

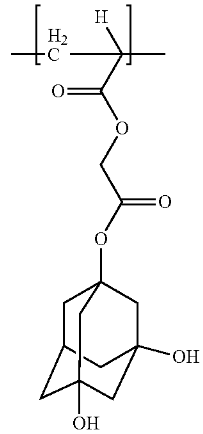

When the resin (A) includes the structural unit (a2-1), the content is usually 1 to 45 mol %, preferably 1 to 40 mol %, more preferably 1 to 35 mol %, still more preferably 1 to 20 mol %, and yet more preferably 1 to 10 mol %, based on all structural units of the resin (A).

<Structural Unit (a3)>

The lactone ring possessed by the structural unit (a3) may be a monocyclic ring such as a β-propiolactone ring, a γ-butyrolactone ring or a δ-valerolactone ring, or a condensed ring of a monocyclic lactone ring and the other ring. Preferably, a γ-butyrolactone ring, an adamantanelactone ring or a bridged ring including a γ-butyrolactone ring structure (e.g., a structural unit represented by the following formula (a3-2)) is exemplified.

The structural unit (a3) is preferably a structural unit represented by formula (a3-1), formula (a3-2), formula (a3-3) or formula (a3-4). These structural units may be included alone, or two or more structural units may be included:

(a3-1)

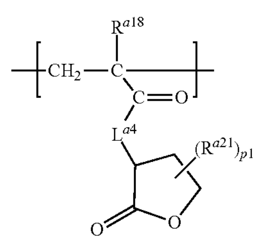

(a3-2)

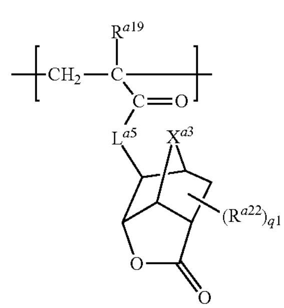

-continued (a3-3)

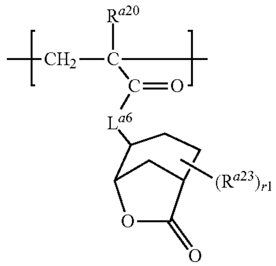

(a3-4)

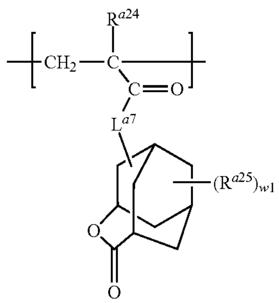

wherein, in formula (a3-1), formula (a3-2), formula (a3-3) and formula (a3-4),

- $L^{a4}$, $L^{as}$ and $L^{a6}$ each independently represent —O— or a group represented by *—O—$(CH_2)_{k3}$—CO—O— (k3 represents an integer of 1 to 7),
- $L^{a7}$ represents —O—, *—O-$L^{a8}$-O—, *—O-$L^{a8}$-CO—O—, *—O-$L^{a8}$-CO—O-$L^{a9}$-CO—O— or *—O-$L^{a8}$-O—CO-$L^{a9}$-O—,
- $L^{a8}$ and $L^{a9}$ each independently represent an alkanediyl group having 1 to 6 carbon atoms,
- * represents a bonding site to a carbonyl group,
- $R^{a18}$, $R^{a19}$ and $R^{a20}$ each independently represent a hydrogen atom or a methyl group,
- $R^{a24}$ represents an alkyl group having 1 to 6 carbon atoms which may have a halogen atom, a hydrogen atom or a halogen atom,
- $X^{a3}$ represents —$CH_2$— or an oxygen atom,
- $R^{a21}$ represents an aliphatic hydrocarbon group having 1 to 4 carbon atoms,
- $R^{a22}$, $R^{a23}$ and $R^{a25}$ each independently represent a carboxy group, a cyano group or an aliphatic hydrocarbon group having 1 to 4 carbon atoms,
- p1 represents an integer of 0 to 5,
- q1 represents an integer of 0 to 3,
- r1 represents an integer of 0 to 3,
- w1 represents an integer of 0 to 8, and
- when p1, q1, r1 and/or w1 is/are 2 or more, a plurality of $R^{a21}$, $R^{a22}$, $R^{a23}$ and/or $R^{a25}$ may be the same or different from each other.

Examples of the aliphatic hydrocarbon group in $R^{a21}$, $R^{a22}$, $R^{a23}$ and $R^{a25}$ include alkyl groups such as a methyl group, an ethyl group, a propyl group, an isopropyl group, a butyl group, a sec-butyl group and a tert-butyl group.

Examples of the halogen atom in $R^{a24}$ include a fluorine atom, a chlorine atom, a bromine atom and an iodine atom.

Examples of the alkyl group in $R^{a24}$ include a methyl group, an ethyl group, a propyl group, an isopropyl group, a butyl group, a sec-butyl group, a tert-butyl group, a pentyl group and a hexyl group, and the alkyl group is preferably an alkyl group having 1 to 4 carbon atoms, and more preferably a methyl group or an ethyl group.

Examples of the alkyl group having a halogen atom in $R^{a24}$ include a trifluoromethyl group, a perfluoroethyl group, a perfluoropropyl group, a perfluoroisopropyl group, a perfluorobutyl group, a perfluorosec-butyl group, a perfluoro-tert-butyl group, a perfluoropentyl group, a perfluorohexyl group, a trichloromethyl group, a tribromomethyl group, a triiodomethyl group and the like.

Examples of the alkanediyl group in $L^{a8}$ and $L^{a9}$ include a methylene group, an ethylene group, a propane-1,3-diyl group, a propane-1,2-diyl group, a butane-1,4-diyl group, a pentane-1,5-diyl group, a hexane-1,6-diyl group, a butane-1,3-diyl group, a 2-methylpropane-1,3-diyl group, a 2-methylpropane-1,2-diyl group, a pentane-1,4-diyl group and a 2-methylbutane-1,4-diyl group.

In formula (a3-1) to formula (a3-3), preferably, $L^{a4}$ to $L^{a6}$ are each independently —O— or a group in which k3 is an integer of 1 to 4 in *—O—$(CH_2)_{k3}$—CO—O—, more preferably —O— and *—O—$CH_2$—CO—O—, and still more preferably an oxygen atom, $R^{a18}$ to $R^{a21}$ are preferably a methyl group, preferably, $R^{a22}$ and $R^{a23}$ are each independently a carboxy group, a cyano group or a methyl group, and preferably, p1, q1 and r1 are each independently an integer of 0 to 2, and more preferably 0 or 1.

In formula (a3-4), $R^{a24}$ is preferably a hydrogen atom or an alkyl group having 1 to 4 carbon atoms, more preferably a hydrogen atom, a methyl group or an ethyl group, and still more preferably a hydrogen atom or a methyl group, $R^{a25}$ is preferably a carboxy group, a cyano group or a methyl group, $L^{a7}$ is preferably —O— or *—O-$L^{a8}$-CO—O—, and more preferably —O—, —O—$CH_2$—CO—O— or —O—$C_2H_4$—CO—O—, and w1 is preferably an integer of 0 to 2, and more preferably 0 or 1.

Particularly, formula (a3-4) is preferably formula (a3-4)':

(a3-4)'

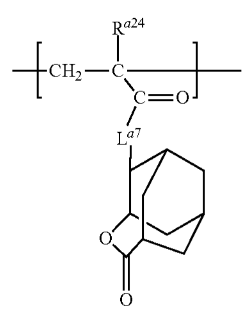

wherein $R^{a24}$ and $L^{a7}$ are the same as defined above.

Examples of the structural unit (a3) include structural units derived from the monomers mentioned in JP 2010-204646 A, the monomers mentioned in JP 2000-122294 A and the monomers mentioned in JP 2012-41274 A. The structural unit (a3) is preferably a structural unit represented by any one of formula (a3-1-1), formula (a3-1-2), formula (a3-2-1), formula (a3-2-2), formula (a3-3-1), formula (a3-3-2) and formula (a3-4-1) to formula (a3-4-12), and structural units in which methyl groups corresponding to $R^{a18}$, $R^{a19}$, $R^{a20}$ and $R^{a24}$ in formula (a3-1) to formula (a3-4) are substituted with hydrogen atoms in the above structural units.

(a3-1-1)
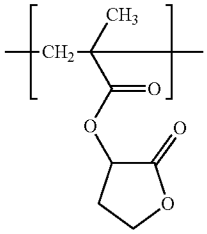
(a3-1-2)
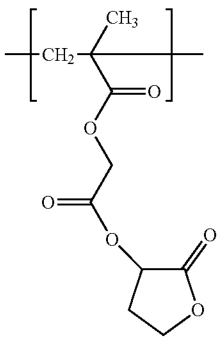
(a3-2-1)
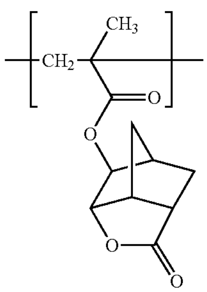
(a3-2-2)
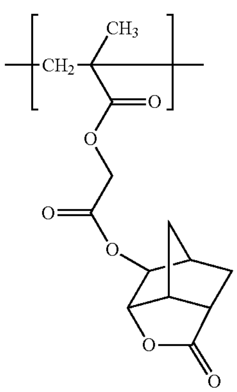
(a3-2x-1)
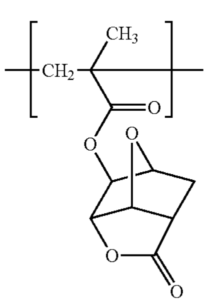
-continued
(a3-2x-2)
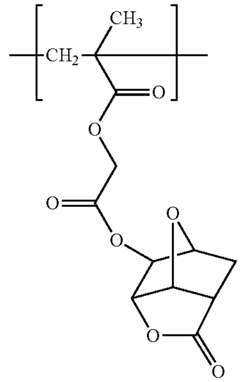
(a3-3-1)
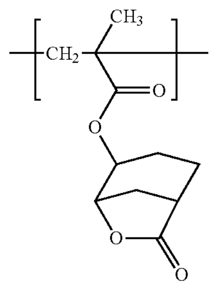
(a3-3-2)
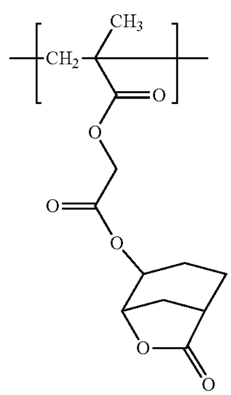
(a3-4-1)
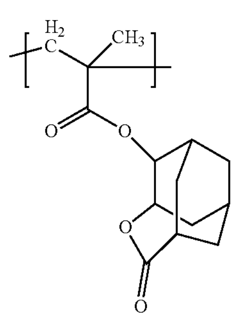

-continued
(a3-4-2)
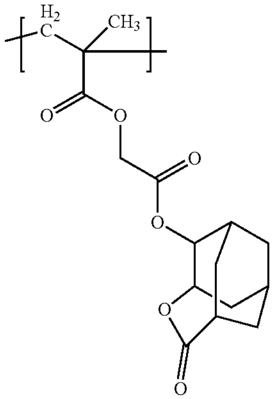
(a3-4-3)
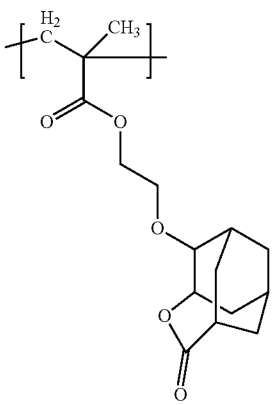
(a3-4-4)
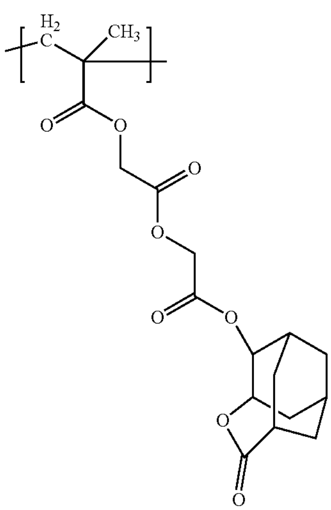
-continued
(a3-4-5)
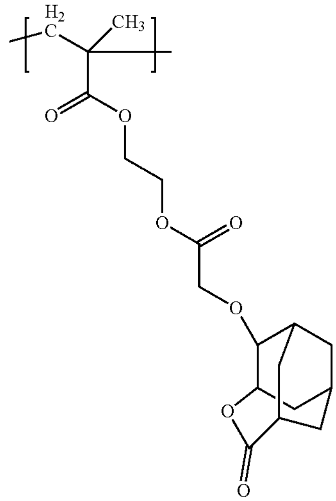
(a3-4-6)
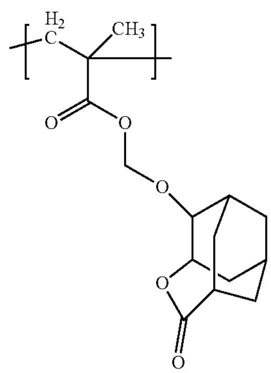
(a3-4-7)
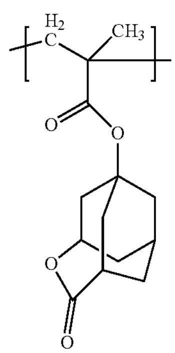

-continued (a3-4-8)

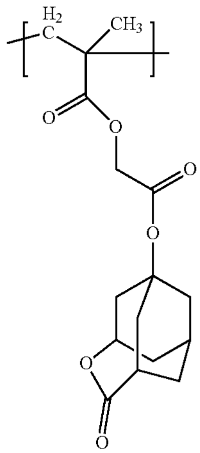

(a3-4-9)

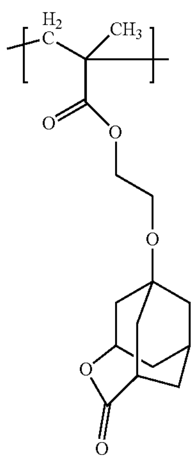

(a3-4-10)

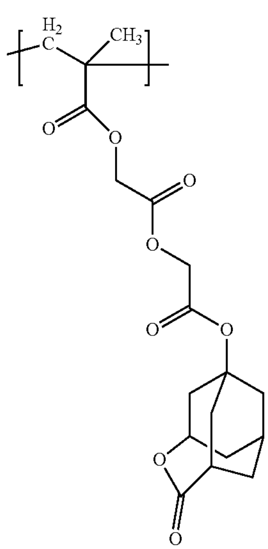

-continued (a3-4-11)

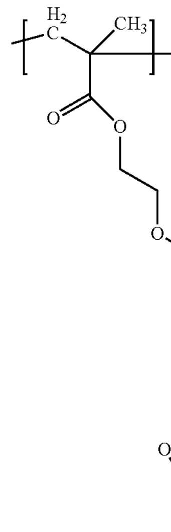

(a3-4-12)

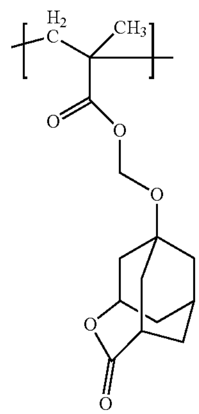

When the resin (A) includes the structural unit (a3), the total content is usually 1 to 70 mol %, preferably 3 to 65 mol %, and more preferably 5 to 60 mol %, based on all structural units of the resin (A).

Each content of the structural unit (a3-1), the structural unit (a3-2), the structural unit (a3-3) or the structural unit (a3-4) is preferably 1 to 60 mol %, more preferably 3 to 50 mol %, and still more preferably 5 to 50 mol %, based on all structural units of the resin (A).

<Structural Unit (a4)>

Examples of the structural unit (a4) include the following structural unit:

(a4)

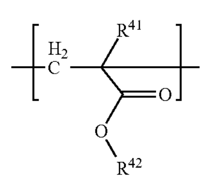

wherein, in formula (a4), $R^{41}$ represents a hydrogen atom or a methyl group, and $R^{42}$ represents a saturated hydrocarbon group having 1 to 24 carbon atoms having a halogen atom, and —$CH_2$— included in the saturated hydrocarbon group may be replaced by —O— or —CO—.

Examples of the saturated hydrocarbon group represented by $R^{42}$ include a chain saturated hydrocarbon group and a monocyclic or polycyclic alicyclic saturated hydrocarbon group, and groups formed by combining these groups.

Examples of the chain saturated hydrocarbon group include a methyl group, an ethyl group, a propyl group, a butyl group, a pentyl group, a hexyl group, a heptyl group, an octyl group, a decyl group, a dodecyl group, a pentadecyl group, a hexadecyl group, a heptadecyl group and an octadecyl group.

Examples of the monocyclic or polycyclic alicyclic saturated hydrocarbon group include cycloalkyl groups such as a cyclopentyl group, a cyclohexyl group, a cycloheptyl group and a cyclooctyl group; and polycyclic alicyclic saturated hydrocarbon groups such as a decahydronaphthyl group, an adamantyl group, a norbornyl group, and the following groups (* represents a bonding site).

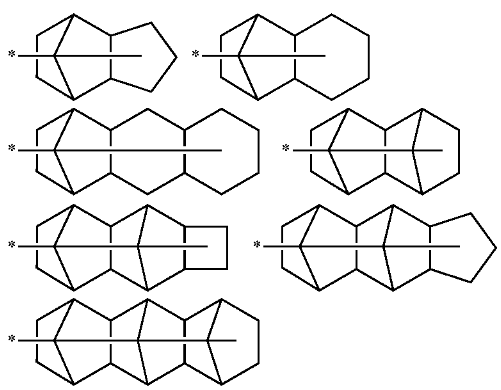

Examples of the group formed by combination include groups formed by combining one or more alkyl groups or one or more alkanediyl groups with one or more alicyclic saturated hydrocarbon groups, and include an alkanediyl group-alicyclic saturated hydrocarbon group, an alicyclic saturated hydrocarbon group-alkyl group, an alkanediyl group-alicyclic saturated hydrocarbon group-alkyl group and the like.

Examples of the structural unit (a4) include a structural unit represented by formula (a4-0), a structural unit represented by formula (a4-1) and a structural unit represented by formula (a4-4):

(a4-0)

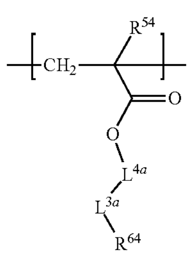

wherein, in formula (a4-0), $R^{54}$ represents a hydrogen atom or a methyl group, $L^{4a}$ represents a single bond or an alkanediyl group having 1 to 4 carbon atoms, $L^{3a}$ represents a perfluoroalkanediyl group having 1 to 8 carbon atoms or a perfluorocycloalkanediyl group having 3 to 12 carbon atoms, and $R^6$ represents a hydrogen atom or a fluorine atom.

Examples of the alkanediyl group in $L^{4a}$ include linear alkanediyl groups such as a methylene group, an ethylene group, a propane-1,3-diyl group and a butane-1,4-diyl group; and branched alkanediyl groups such as an ethane-1,1-diyl group, a propane-1,2-diyl group, a butane-1,3-diyl group, a 2-methylpropane-1,3-diyl group and a 2-methylpropane-1,2-diyl group.

Examples of the perfluoroalkanediyl group in $L^3$a include a difluoromethylene group, a perfluoroethylene group, a perfluoroethylfluoromethylene group, a perfluoropropane-1,3-diyl group, a perfluoropropane-1,2-diyl group, a perfluoropropane-2,2-diyl group, a perfluorobutane-1,4-diyl group, a perfluorobutane-2,2-diyl group, a perfluorobutane-1,2-diyl group, a perfluoropentane-1,5-diyl group, a perfluoropentane-2,2-diyl group, a perfluoropentane-3,3-diyl group, a perfluorohexane-1,6-diyl group, a perfluorohexane-2,2-diyl group, a perfluorohexane-3,3-diyl group, a perfluoroheptane-1,7-diyl group, a perfluoroheptane-2,2-diyl group, a perfluoroheptane-3,4-diyl group, a perfluoroheptane-4,4-diyl group, a perfluorooctane-1,8-diyl group, a perfluorooctane-2,2-diyl group, a perfluorooctane-3,3-diyl group, a perfluorooctane-4,4-diyl group and the like.

Examples of the perfluorocycloalkanediyl group in $L^{3a}$ include a perfluorocyclohexanediyl group, a perfluorocyclopentanediyl group, a perfluorocycloheptanediyl group, a perfluoroadamantanediyl group and the like.

$L^{4a}$ is preferably a single bond, a methylene group or an ethylene group, and more preferably a single bond or a methylene group.

$L^{3a}$ is preferably a perfluoroalkanediyl group having 1 to 6 carbon atoms, and more preferably a perfluoroalkanediyl group having 1 to 3 carbon atoms.

Examples of the structural unit (a4-0) include the following structural units, and structural units in which a methyl group corresponding to $R^{54}$ in the structural unit (a4-0) in the following structural units is substituted with a hydrogen atom:

(a4-0-1)

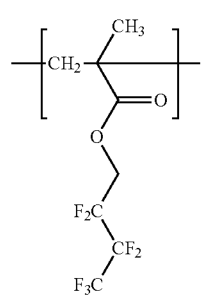

(a4-0-2)

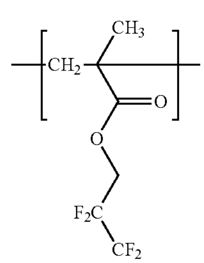

-continued
(a4-0-3)
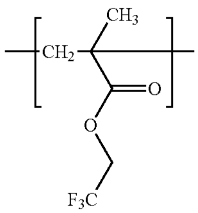
(a4-0-4)
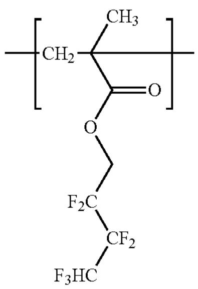
(a4-0-5)
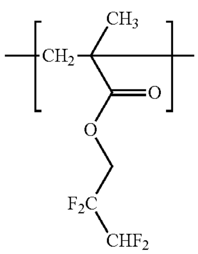
(a4-0-6)
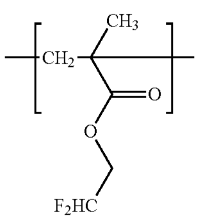
(a4-0-7)
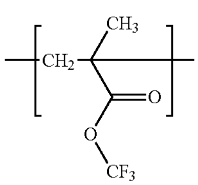
(a4-0-8)
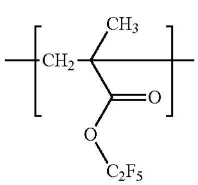
(a4-0-9)
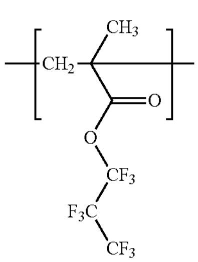
-continued
(a4-0-10)
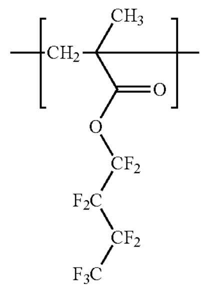
(a4-0-11)
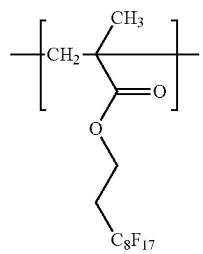
(a4-0-12)
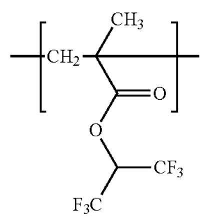
(a4-0-13)
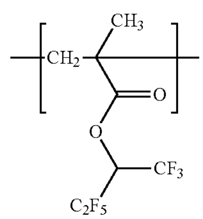
(a4-0-14)
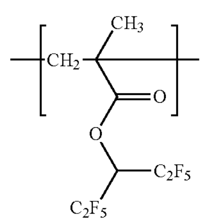
(a4-0-15)
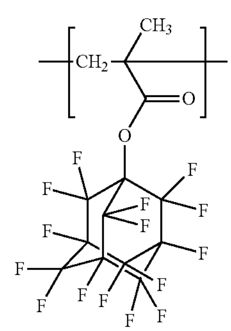

-continued (a4-0-16)

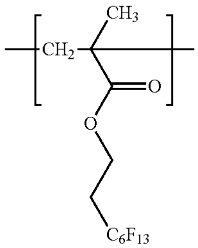

(a4-1)

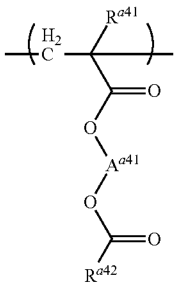

wherein, in formula (a4-1), $R^{a41}$ represents a hydrogen atom or a methyl group, $R^{a42}$ represents a saturated hydrocarbon group having 1 to 20 carbon atoms which may have a substituent, and —$CH_2$— included in the saturated hydrocarbon group may be replaced by —O— or —CO—, $A^{a41}$ represents an alkanediyl group having 1 to 6 carbon atoms which may have a substituent or a group represented by formula (a-g1), in which at least one of $A^{a41}$ and $R^{a42}$ has, as a substituent, a halogen atom (preferably a fluorine atom):

$$*—A^{a42}—(X^{a41}—A^{a43})_s—X^{a42}—A^{a44}—* \quad \text{(a-g1)}$$

[wherein, in formula (a-g1), s represents 0 or 1, $A^{a42}$ and $A^{a44}$ each independently represent a divalent saturated hydrocarbon group having 1 to 5 carbon atoms which may have a substituent, $A^{a43}$ represents a single bond or a divalent saturated hydrocarbon group having 1 to 5 carbon atoms which may have a substituent, $X^{a41}$ and $X^{a42}$ each independently represent —O—, —CO—, —CO—O— or —O—CO—, in which the total number of carbon atoms of $A^{a42}$, $A^{a43}$, $A^{a44}$, $X^{a41}$ and $X^{a42}$ is 7 or less], and

* is a bonding site and * at the right side is a bonding site to —O—CO—$R^{a42}$.

Examples of the saturated hydrocarbon group in $R^{a42}$ include a chain hydrocarbon group and a monocyclic or polycyclic saturated alicyclic hydrocarbon group, and groups formed by combining these groups.

Examples of the chain hydrocarbon group include a methyl group, an ethyl group, a propyl group, a butyl group, a pentyl group, a hexyl group, a heptyl group, an octyl group, a decyl group, a dodecyl group, a pentadecyl group, a hexadecyl group, a heptadecyl group and an octadecyl group.

Examples of the monocyclic or polycyclic saturated alicyclic hydrocarbon group include cycloalkyl groups such as a cyclopentyl group, a cyclohexyl group, a cycloheptyl group and a cyclooctyl group; and polycyclic alicyclic hydrocarbon groups such as a decahydronaphthyl group, an adamantyl group, a norbornyl group and the following groups (* represents a bonding site).

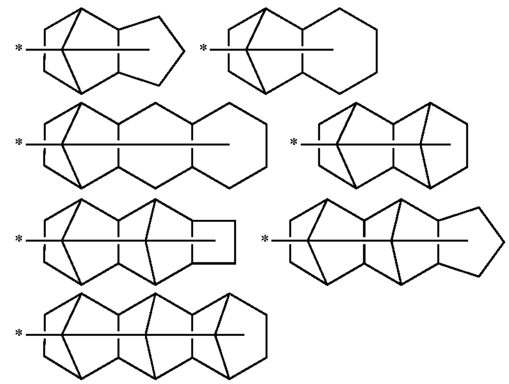

Examples of the group formed by combination include groups formed by combining one or more alkyl groups or one or more alkanediyl groups with one or more saturated alicyclic hydrocarbon groups, and include an -alkanediyl group-saturated alicyclic hydrocarbon group, a -saturated alicyclic hydrocarbon group-alkyl group, an -alkanediyl group-saturated alicyclic hydrocarbon group-alkyl group and the like.

Examples of the substituent possessed by $R^{a42}$ include at least one selected from the group consisting of a halogen atom and a group represented by formula (a-g3). Examples of the halogen atom include a fluorine atom, a chlorine atom, a bromine atom and an iodine atom, and the halogen atom is preferably a fluorine atom:

$$*—X^{a43}\text{-}A^{a45} \quad \text{(a-g3)}$$

wherein, in formula (a-g3), $X^{a43}$ represents an oxygen atom, a carbonyl group, *—O—CO— or *—CO—O—, $A^{a45}$ represents a saturated hydrocarbon group having 1 to 17 carbon atoms which may have a halogen atom, and

* represents a bonding site to $R^{a42}$.

In $R^{a42}$—$X^{a43}$-$A^{a4}$5, when $R^{a42}$ has no halogen atom, $A^{a45}$ represents a saturated hydrocarbon group having 1 to 17 carbon atoms which has at least one halogen atom.

Examples of the saturated hydrocarbon group in $A^{a45}$ include alkyl groups such as a methyl group, an ethyl group, a propyl group, a butyl group, a pentyl group, a hexyl group, a heptyl group, an octyl group, a decyl group, a dodecyl group, a pentadecyl group, a hexadecyl group, a heptadecyl group and an octadecyl group; monocyclic alicyclic hydrocarbon groups such as a cyclopentyl group, a cyclohexyl group, a cycloheptyl group and a cyclooctyl group; and polycyclic alicyclic hydrocarbon groups such as a decahydronaphthyl group, an adamantyl group, a norbornyl group and the following groups (* represents a bonding site).

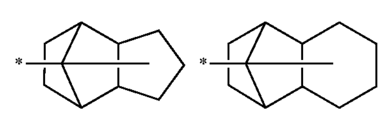

-continued

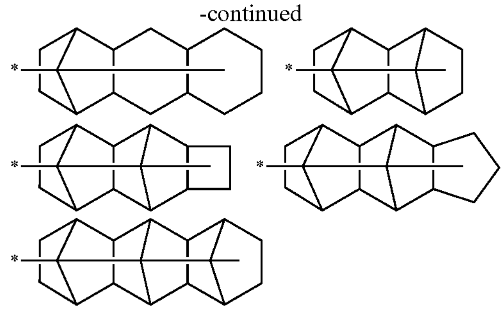

Examples of the group formed by combination include groups formed by combining one or more alkyl groups or one or more alkanediyl groups with one or more alicyclic hydrocarbon groups, and include an -alkanediyl group-alicyclic hydrocarbon group, an -alicyclic hydrocarbon group-alkyl group, an -alkanediyl group-alicyclic hydrocarbon group-alkyl group and the like.

$R^{a42}$ is preferably a saturated hydrocarbon group which may have a halogen atom, and more preferably an alkyl group having a halogen atom and/or a saturated hydrocarbon group having a group represented by formula (a-g3).

When $R^{a42}$ is a saturated hydrocarbon group which has a halogen atom, a saturated hydrocarbon group having a fluorine atom is preferable, a perfluoroalkyl group or a perfluorocycloalkyl group is more preferable, a perfluoroalkyl group having 1 to 6 carbon atoms is still more preferable, and a perfluoroalkyl group having 1 to 3 carbon atoms is particularly preferable. Examples of the perfluoroalkyl group include a perfluoromethyl group, a perfluoroethyl group, a perfluoropropyl group, a perfluorobutyl group, a perfluoropentyl group, a perfluorohexyl group, a perfluoroheptyl group and a perfluorooctyl group. Examples of the perfluorocycloalkyl group include a perfluorocyclohexyl group and the like.

When $R^{a42}$ is a saturated hydrocarbon group having a group represented by formula (a-g3), the total number of carbon atoms of $R^{a42}$ is preferably 15 or less, and more preferably 12 or less, including the number of carbon atoms included in the group represented by formula (a-g3). When having the group represented by formula (a-g3) as the substituent, the number thereof is preferably 1.

When $R^{a42}$ is a saturated hydrocarbon group having the group represented by formula (a-g3), $R^{a42}$ is still more preferably a group represented by formula (a-g2):

$$*\text{-}A^{a46}\text{-}X^{a44}\text{-}A^{a47} \quad \text{(a-g2)}$$

wherein, in formula (a-g2), $A^{a46}$ represents a divalent saturated hydrocarbon group having 1 to 17 carbon atoms which may have a halogen atom, $X^{a44}$ represents —O—CO— or —CO—O—(** represents a bonding site to $A^{a46}$), $A^{a47}$ represents a saturated hydrocarbon group having 1 to 17 carbon atoms which may have a halogen atom, the total number of carbon atoms of $A^{a46}$, $A^{a47}$ and $X^{a44}$ is 18 or less, and at least one of $A^{a46}$ and $A^{a47}$ has at least one halogen atom, and

* represents a bonding site to a carbonyl group.

The number of carbon atoms of the saturated hydrocarbon group for $A^{a46}$ is preferably 1 to 6, and more preferably 1 to 3.

The number of carbon atoms of the saturated hydrocarbon group for $A^{a47}$ is preferably 4 to 15, and more preferably 5 to 12, and $A^{a47}$ is still more preferably a cyclohexyl group or an adamantyl group.

Preferred structure of the group represented by formula (a-g2) is the following structure (* is a bonding site to a carbonyl group).

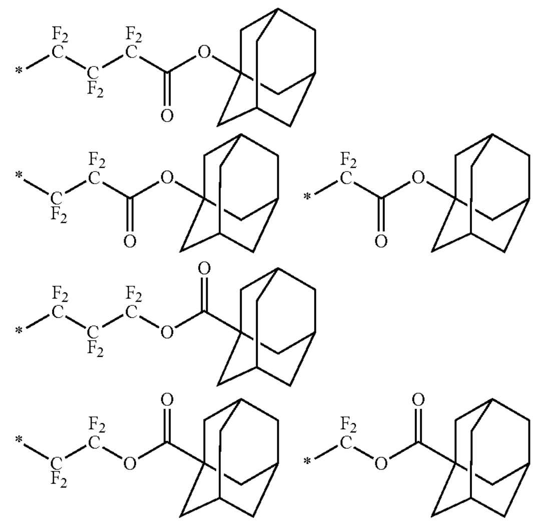

Examples of the alkanediyl group in $A^{a41}$ include linear alkanediyl groups such as a methylene group, an ethylene group, a propane-1,3-diyl group, a butane-1,4-diyl group, a pentane-1,5-diyl group and a hexane-1,6-diyl group; and branched alkanediyl groups such as a propane-1,2-diyl group, a butane-1,3-diyl group, a 2-methylpropane-1,2-diyl group, a 1-methylbutane-1,4-diyl group and a 2-methylbutane-1,4-diyl group.

Examples of the substituent in the alkanediyl group represented by $A^{a41}$ include a hydroxy group and an alkoxy group having 1 to 6 carbon atoms.

$A^{a41}$ is preferably an alkanediyl group having 1 to 4 carbon atoms, more preferably an alkanediyl group having 2 to 4 carbon atoms, and still more preferably an ethylene group.

Examples of the divalent saturated hydrocarbon group represented by $A^{a42}$, $A^{a43}$ and $A^{a44}$ in the group represented by formula (a-g1) include a linear or branched alkanediyl group and a monocyclic divalent alicyclic saturated hydrocarbon group, and a divalent saturated hydrocarbon group formed by combining an alkanediyl group and a divalent alicyclic saturated hydrocarbon group. Specific examples thereof include a methylene group, an ethylene group, a propane-1,3-diyl group, a propane-1,2-diyl group, a butane-1,4-diyl group, a 1-methylpropane-1,3-diyl group, a 2-methylpropane-1,3-diyl group, a 2-methylpropane-1,2-diyl group and the like.

Examples of the substituent of the divalent saturated hydrocarbon group represented by $A^{a42}$, $A^{a43}$ and $A^{a44}$ include a hydroxy group and an alkoxy group having 1 to 6 carbon atoms.

s is preferably 0.

In a group represented by formula (a-g1), examples of the group in which $X^{a42}$ is —O—, —CO—, —CO—O— or —O—CO-include the following groups. In the following exemplification, * and  each represent a bonding site, and  is a bonding site to —O—CO—$R^{a42}$.

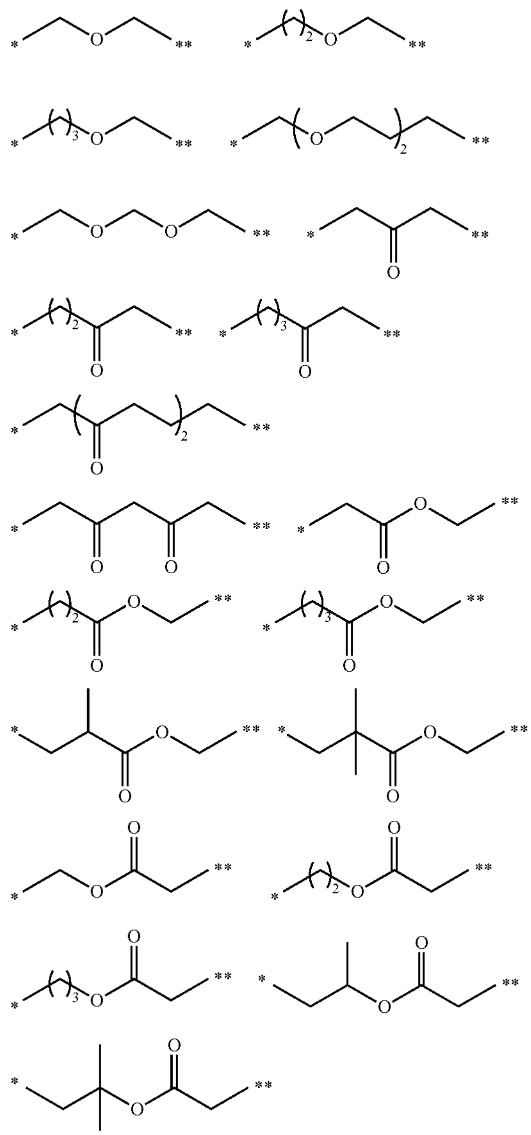
Examples of the structural unit represented by formula (a4-1) include the following structural units, and structural units in which a methyl group corresponding to $R^{a41}$ in the structural unit represented by formula (a4-1) in the following structural units is substituted with a hydrogen atom.
(a4-1-1)
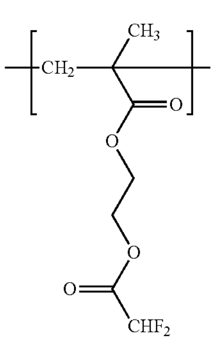
-continued
(a4-1-2)
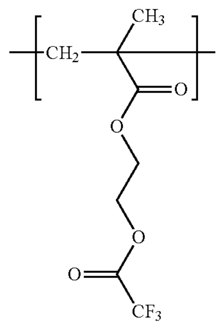
(a4-1-3)
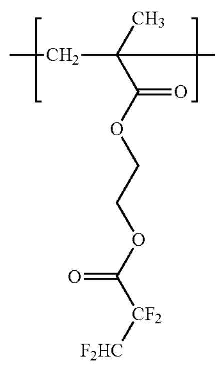
(a4-1-4)
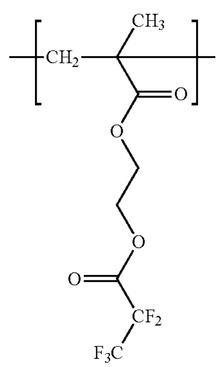
(a4-1-5)
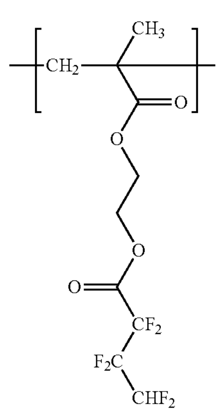

-continued
(a4-1-6)
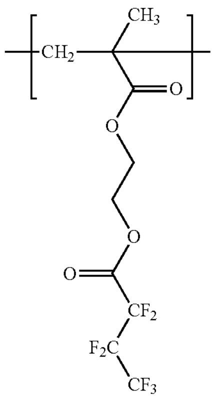
(a4-1-7)
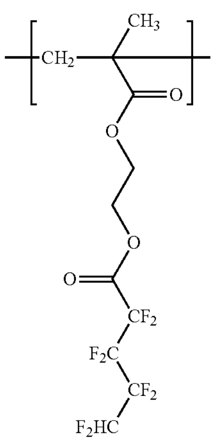
(a4-1-8)
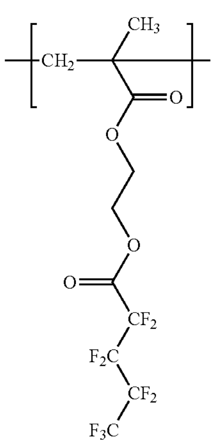
-continued
(a4-1-9)
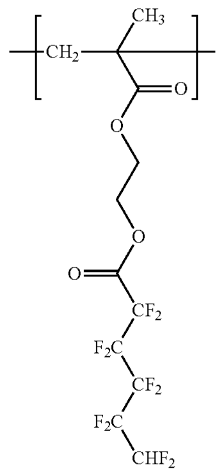
(a4-1-10)
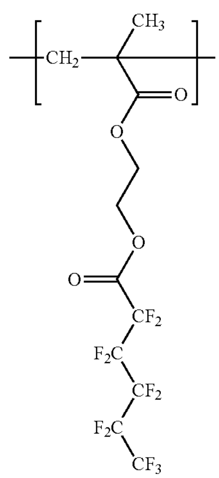
(a4-1-11)
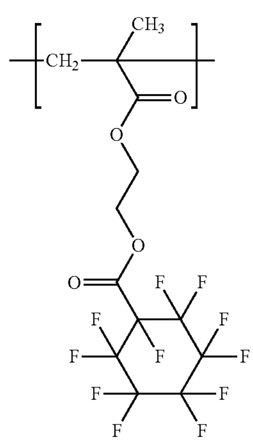

-continued
(a4-1′-1)
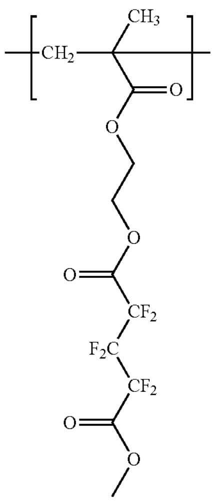
(a4-1′-2)
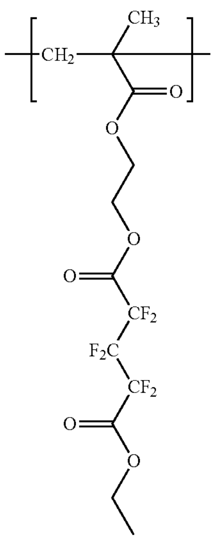
(a4-1′-3)
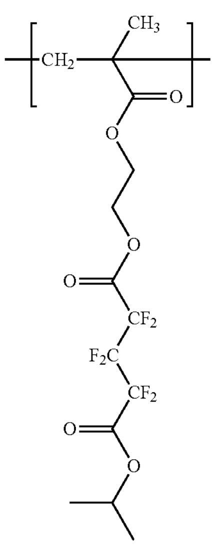
-continued
(a4-1′-4)
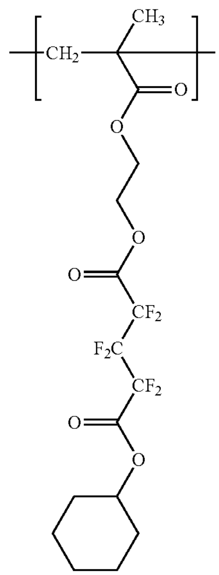
(a4-1′-5)
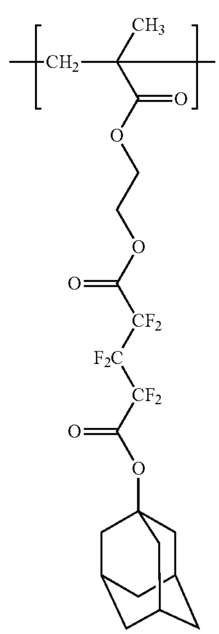

-continued
(a4-1′-6)
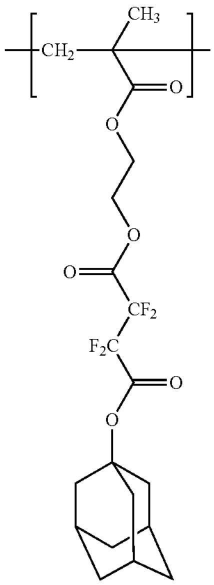
(a4-1′-7)
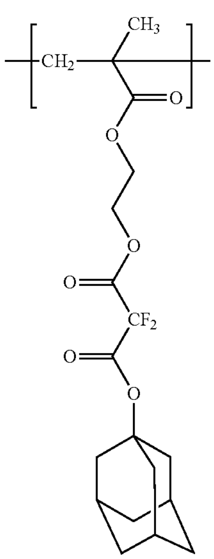
-continued
(a4-1′-8)
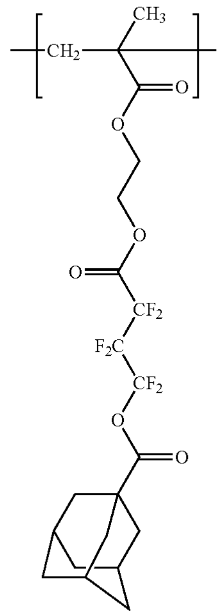
(a4-1′-9)
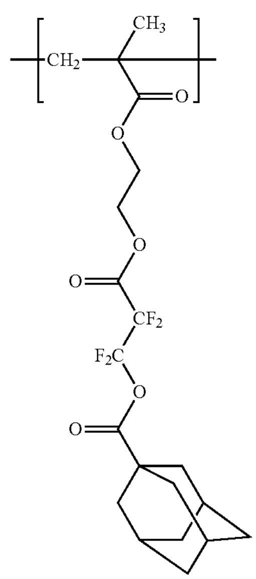

-continued (a4-1'-10)

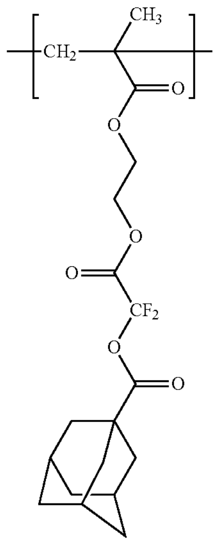

(a4-1'-11)

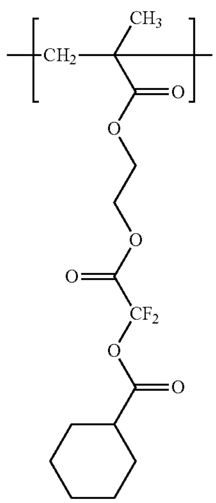

Examples of the structural unit represented by formula (a4-e) include a structural unit represented by formula (a4-2) and a structural unit represented by formula (a4-3), (a4-2)

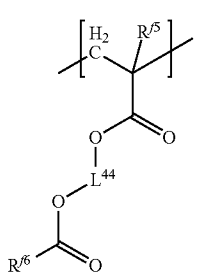

wherein, in formula (a4-2), $R^{f5}$ represents a hydrogen atom or a methyl group, $L^{44}$ represents an alkanediyl group having 1 to 6 carbon atoms, and the —$CH_2$— included in the alkanediyl group may be replaced by —O— or —CO—, $R^{f6}$ represents a saturated hydrocarbon group having 1 to 20 carbon atoms having a fluorine atom, and the upper limit of the total number of carbon atoms of $L^{44}$ and $R^{f6}$ is 21.

Examples of the alkanediyl group having 1 to 6 carbon atoms for $L^{44}$ include the same groups as mentioned for $A^{a41}$.

Examples of the saturated hydrocarbon group for $R^{f6}$ include the same groups as mentioned for $R^{a42}$.

The alkanediyl group in $L^{44}$ is preferably an alkanediyl group having 2 to 4 carbon atoms, and more preferably an ethylene group.

Examples of the structural unit represented by formula (a4-2) include structural units each represented by formula (a4-1-1) to formula (a4-1-11). It is also possible to exemplify, as the structural unit represented by formula (a4-2), a structural unit in which a methyl group corresponding to $R^{f5}$ in a structural unit (a4-2) is substituted with a hydrogen atom.

(a4-3)

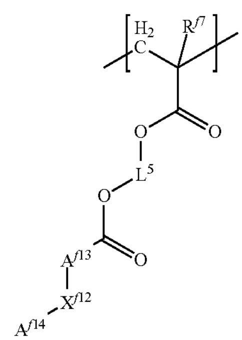

wherein, in formula (a4-3), $R^{f7}$ represents a hydrogen atom or a methyl group, $L^5$ represents an alkanediyl group having 1 to 6 carbon atoms, $A^{f13}$ represents a divalent saturated hydrocarbon group having 1 to 18 carbon atoms which may have a fluorine atom, $X^{f12}$ represents *—O—CO— or *—CO—O—(* represents a bonding site to $A^{f13}$), $A^{f14}$ represents a saturated hydrocarbon group having 1 to 17 carbon atoms which may have a fluorine atom, and at least one of $A^{f13}$ and $A^{f14}$ has a fluorine atom, and the upper limit of the total number of carbon atoms of $L^5$, $A^{f13}$ and $A^{f14}$ is 20.

Examples of the alkanediyl group in $L^5$ include those which are the same as mentioned for $A^{a41}$.

The divalent saturated hydrocarbon group which may have a fluorine atom in $A^{f13}$ is preferably a divalent chain saturated hydrocarbon group which may have a fluorine atom and a divalent alicyclic saturated hydrocarbon group which may have a fluorine atom, and more preferably a perfluoroalkanediyl group.

Examples of the divalent chain saturated hydrocarbon group which may have a fluorine atom include alkanediyl groups such as a methylene group, an ethylene group, a propanediyl group, a butanediyl group and a pentanediyl group; and perfluoroalkanediyl groups such as a difluoromethylene group, a perfluoroethylene group, a perfluoropropanediyl group, a perfluorobutanediyl group and a perfluoropentanediyl group.

The divalent alicyclic saturated hydrocarbon group which may have a fluorine atom may be either monocyclic or polycyclic. Examples of the monocyclic group include a cyclohexanediyl group and a perfluorocyclohexanediyl group. Examples of the polycyclic group include an adamantanediyl group, a norbornanediyl group, a perfluoroadamantanediyl group and the like.

Examples of the saturated hydrocarbon group and the saturated hydrocarbon group which may have a fluorine atom for $A^{f14}$ include the same groups as mentioned for $R^{a42}$. Of these groups, preferable are fluorinated alkyl groups such as a trifluoromethyl group, a difluoromethyl group, a methyl group, a perfluoroethyl group, a 2,2,2-trifluoroethyl group, a 1,1,2,2-tetrafluoroethyl group, an ethyl group, a perfluoropropyl group, a 2,2,3,3,3-pentafluoropropyl group, a propyl group, a perfluorobutyl group, a 1,1,2,2,3,3,4,4-octafluorobutyl group, a butyl group, a perfluoropentyl group, a 2,2,3,3,4,4,5,5,5-nonafluoropentyl group, a pentyl group, a hexyl group, a perfluorohexyl group, a heptyl group, a perfluoroheptyl group, an octyl group and a perfluorooctyl group; a cyclopropylmethyl group, a cyclopropyl group, a cyclobutylmethyl group, a cyclopentyl group, a cyclohexyl group, a perfluorocyclohexyl group, an adamantyl group, an adamantylmethyl group, an adamantyldimethyl group, a norbornyl group, a norbornylmethyl group, a perfluoroadamantyl group, a perfluoroadamantylmethyl group and the like.

In formula (a4-3), $L^5$ is preferably an ethylene group.

The divalent saturated hydrocarbon group for $A^{f13}$ is preferably a group including a divalent chain saturated hydrocarbon group having 1 to 6 carbon atoms and a divalent alicyclic saturated hydrocarbon group having 3 to 12 carbon atoms, and more preferably a divalent chain saturated hydrocarbon group having 2 to 3 carbon atoms.

The saturated hydrocarbon group for $A^{f14}$ is preferably a group including a chain saturated hydrocarbon group having 3 to 12 carbon atoms and an alicyclic saturated hydrocarbon group having 3 to 12 carbon atoms, and more preferably a group including a chain saturated hydrocarbon group having 3 to 10 carbon atoms and an alicyclic saturated hydrocarbon group having 3 to 10 carbon atoms. Of these groups, $A^{f14}$ is preferably a group including an alicyclic saturated hydrocarbon group having 3 to 12 carbon atoms, and more preferably a cyclopropylmethyl group, a cyclopentyl group, a cyclohexyl group, a norbornyl group and an adamantyl group.

Examples of the structural unit represented by formula (a4-3) include structural units each represented by formula (a4-1'-1) to formula (a4-1'-11). It is also possible to exemplify, as the structural unit represented by formula (a4-3), a structural unit in which a methyl group corresponding to $R^{f7}$ in a structural unit (a4-3) is substituted with a hydrogen atom.

Examples of the structural unit (a4) also include a structural unit represented by formula (a4-4):

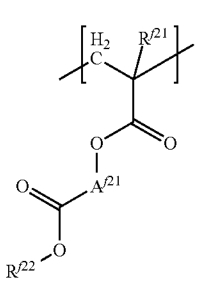

(a4-4)

wherein, in formula (a4-4), $R^{f21}$ represents a hydrogen atom or a methyl group, $A^{f21}$ represents $-(CH_2)_{j1}-$, $-(CH_2)_{j2}-O-(CH_2)_{j3}-$ or $-(CH_2)_{j4}-CO-O-(CH_2)_{j5}-$, j1 to j5 each independently represent an integer of 1 to 6, and $R^{f22}$ represents a saturated hydrocarbon group having 1 to 10 carbon atoms having a fluorine atom.

Examples of the saturated hydrocarbon group for $R^{f22}$ include those which are the same as the saturated hydrocarbon group represented by $R^{a42}$. $R^{f22}$ is preferably an alkyl group having 1 to 10 carbon atoms having a fluorine atom or an alicyclic saturated hydrocarbon group having 1 to 10 carbon atoms having a fluorine atom, more preferably an alkyl group having 1 to 10 carbon atoms having a fluorine atom, and still more preferably an alkyl group having 1 to 6 carbon atoms having a fluorine atom.

In formula (a4-4), $A^{f21}$ is preferably $-(CH_2)_{j1}-$, more preferably an ethylene group or a methylene group, and still more preferably a methylene group.

The structural unit represented by formula (a4-4) includes, for example, the following structural units and structural units in which a methyl group corresponding to $R^{f21}$ in the structural unit (a4-4) is substituted with a hydrogen atom in structural units represented by the following formulas.

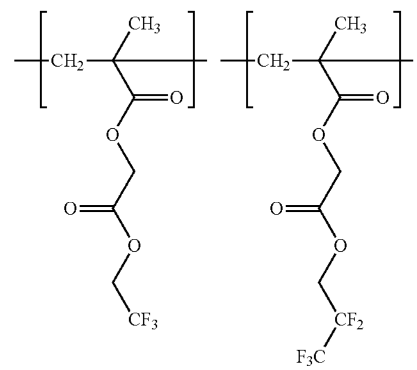

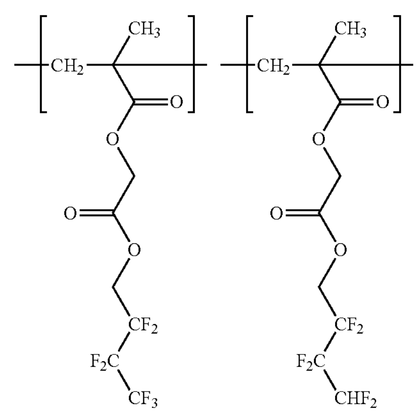

-continued
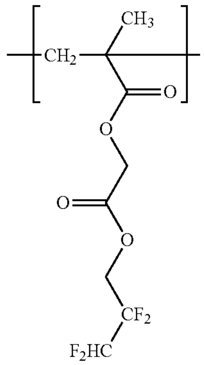
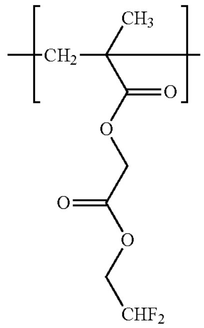
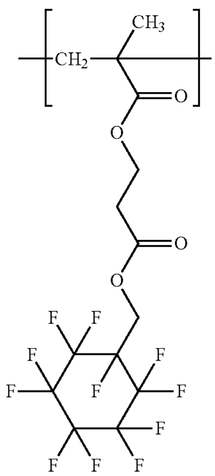
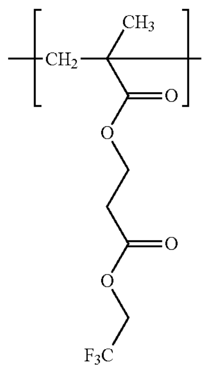
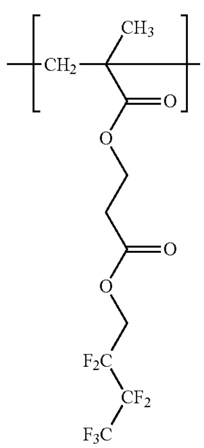
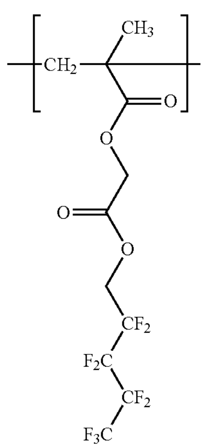
-continued
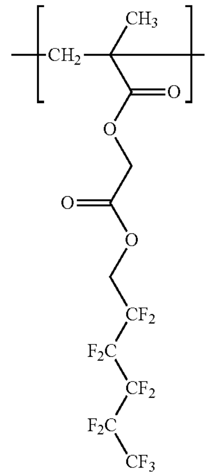
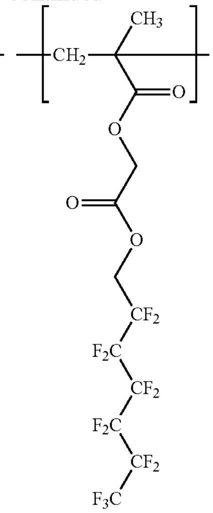
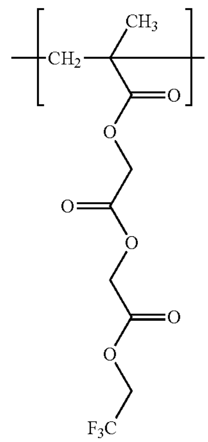
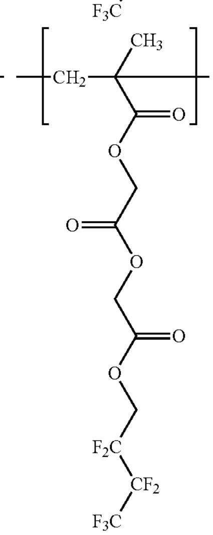
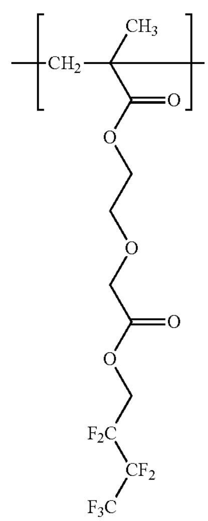
When the resin (A) includes the structural unit (a4), the content is preferably 1 to 20 mol %, more preferably 2 to 15 mol %, and still more preferably 3 to 10 mol %, based on all structural units of the resin (A).
<Structural Unit (a5)>
Examples of a non-leaving hydrocarbon group possessed by the structural unit (a5) include groups having a linear, branched or cyclic hydrocarbon group. Of these, the structural unit (a5) is preferably a group having an alicyclic hydrocarbon group.

The structural unit (a5) includes, for example, a structural unit represented by formula (a5-1):

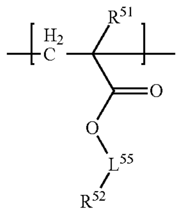

(a5-1)

wherein, in formula (a5-1), $R^{51}$ represents a hydrogen atom or a methyl group, $R^{52}$ represents an alicyclic hydrocarbon group having 3 to 18 carbon atoms, and a hydrogen atom included in the alicyclic hydrocarbon group may be substituted with an aliphatic hydrocarbon group having 1 to 8 carbon atoms, and $L^{55}$ represents a single bond or a divalent saturated hydrocarbon group having 1 to 18 carbon atoms, and —$CH_2$— included in the saturated hydrocarbon group may be replaced by —O— or —CO—.

The alicyclic hydrocarbon group in $R^{52}$ may be either monocyclic or polycyclic. The monocyclic alicyclic hydrocarbon group includes, for example, a cyclopropyl group, a cyclobutyl group, a cyclopentyl group and a cyclohexyl group. The polycyclic alicyclic hydrocarbon group includes, for example, an adamantyl group and a norbornyl group.

The aliphatic hydrocarbon group having 1 to 8 carbon atoms includes, for example, alkyl groups such as a methyl group, an ethyl group, a propyl group, an isopropyl group, a butyl group, a sec-butyl group, a tert-butyl group, a pentyl group, a hexyl group, an octyl group and a 2-ethylhexyl group.

Examples of the alicyclic hydrocarbon group having a substituent includes a 3-methyladamantyl group and the like.

$R^{52}$ is preferably an unsubstituted alicyclic hydrocarbon group having 3 to 18 carbon atoms, and more preferably an adamantyl group, a norbornyl group or a cyclohexyl group.

Examples of the divalent saturated hydrocarbon group in $L^{55}$ include a divalent chain saturated hydrocarbon group and a divalent alicyclic saturated hydrocarbon group, and a divalent chain saturated hydrocarbon group is preferable.

The divalent chain saturated hydrocarbon group includes, for example, alkanediyl groups such as a methylene group, an ethylene group, a propanediyl group, a butanediyl group and a pentanediyl group.

The divalent alicyclic saturated hydrocarbon group may be either monocyclic or polycyclic. Examples of the monocyclic alicyclic saturated hydrocarbon group include cycloalkanediyl groups such as a cyclopentanediyl group and a cyclohexanediyl group. Examples of the polycyclic divalent alicyclic saturated hydrocarbon group include an adamantanediyl group and a norbornanediyl group.

Examples of the group in which —$CH_2$— included in the divalent saturated hydrocarbon group represented by $L^{55}$ is replaced by —O— or —CO— include groups represented by formula (L1-1) to formula (L1-4). In the following formulas, * and ** each represent a bonding site, and * represents a bonding site to an oxygen atom.

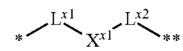

(L1-1)

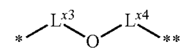

(L1-2)

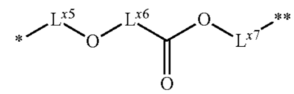

(L1-3)

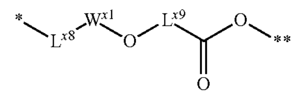

(L1-4)

In formula (L1-1), $X^{x1}$ represents *—O—CO— or *—CO—O—(* represents a bonding site to $L^{x1}$), $L^{x1}$ represents a divalent aliphatic saturated hydrocarbon group having 1 to 16 carbon atoms, $L^{x2}$ represents a single bond or a divalent aliphatic saturated hydrocarbon group having 1 to 15 carbon atoms, and the total number of carbon atoms of $L^{x1}$ and $L^{x2}$ is 16 or less.

In formula (L1-2), $L^{x3}$ represents a divalent aliphatic saturated hydrocarbon group having 1 to 17 carbon atoms, $L^{x4}$ represents a single bond or a divalent aliphatic saturated hydrocarbon group having 1 to 16 carbon atoms, and the total number of carbon atoms of $L^{x3}$ and $L^{x4}$ is 17 or less.

In formula (L1-3), $L^{x5}$ represents a divalent aliphatic saturated hydrocarbon group having 1 to 15 carbon atoms, $L^{x6}$ and $L^{x7}$ each independently represent a single bond or a divalent aliphatic saturated hydrocarbon group having 1 to 14 carbon atoms, and the total number of carbon atoms of $L^{x3}$, $L^{x6}$ and $L^{x7}$ is 15 or less.

In formula (L1-4), $L^{x8}$ and $L^{x9}$ represent a single bond or a divalent aliphatic saturated hydrocarbon group having 1 to 12 carbon atoms, $W^{x1}$ represents a divalent alicyclic saturated hydrocarbon group having 3 to 15 carbon atoms, and the total number of carbon atoms of $L^{x8}$, $L^{x9}$ and $W^{x1}$ is 15 or less.

$L^{x1}$ is preferably a divalent aliphatic saturated hydrocarbon group having 1 to 8 carbon atoms, and more preferably a methylene group or an ethylene group.

$L^{x2}$ is preferably a single bond or a divalent aliphatic saturated hydrocarbon group having 1 to 8 carbon atoms, and more preferably a single bond.

$L^{x3}$ is preferably a divalent aliphatic saturated hydrocarbon group having 1 to 8 carbon atoms.

$L^{x4}$ is preferably a single bond or a divalent aliphatic saturated hydrocarbon group having 1 to 8 carbon atoms.

$L^{x5}$ is preferably a divalent aliphatic saturated hydrocarbon group having 1 to 8 carbon atoms, and more preferably a methylene group or an ethylene group.

$L^{x6}$ is preferably a single bond or a divalent aliphatic saturated hydrocarbon group having 1 to 8 carbon atoms, and more preferably a methylene group or an ethylene group.

$L^{x7}$ is preferably a single bond or a divalent aliphatic saturated hydrocarbon group having 1 to 8 carbon atoms.

$L^{x8}$ is preferably a single bond or a divalent aliphatic saturated hydrocarbon group having 1 to 8 carbon atoms, and more preferably a single bond or a methylene group.

$L^{x9}$ is preferably a single bond or a divalent aliphatic saturated hydrocarbon group having 1 to 8 carbon atoms, and more preferably a single bond or a methylene group.

$W^{x1}$ is preferably a divalent alicyclic saturated hydrocarbon group having 3 to 10 carbon atoms, and more preferably a cyclohexanediyl group or an adamantanediyl group.

The group represented by formula (L1-1) includes, for example, the following divalent groups.

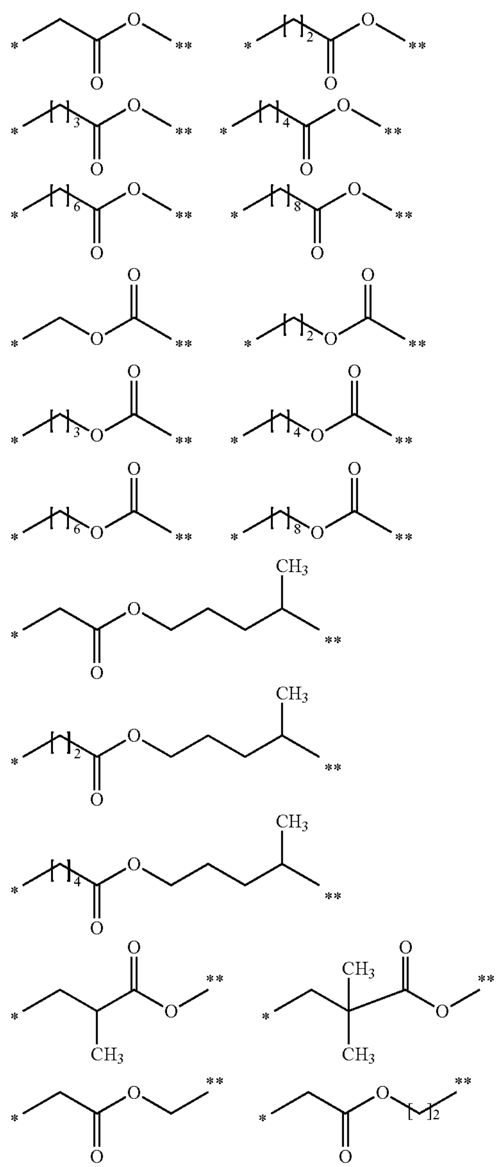

The group represented by formula (L1-2) includes, for example, the following divalent groups.

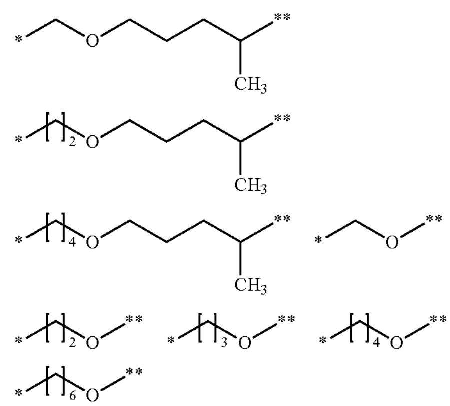

The group represented by formula (L1-3) includes, for example, the following divalent groups.

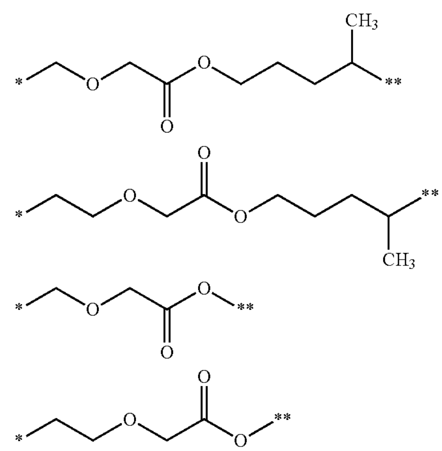

The group represented by formula (L1-4) includes, for example, the following divalent groups.

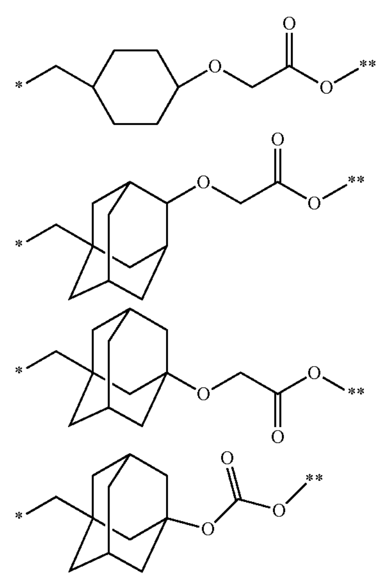

-continued
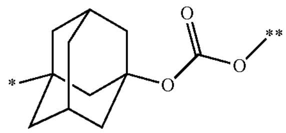
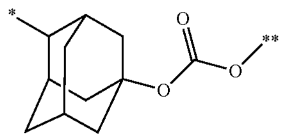
$L^{55}$ is preferably a single bond or a group represented by formula (L1-1).
Examples of the structural unit (a5-1) include the following structural units and structural units in which a methyl group corresponding to $R^{51}$ in the structural unit (a5-1) in the following structural units is substituted with a hydrogen atom.
(a5-1-1)
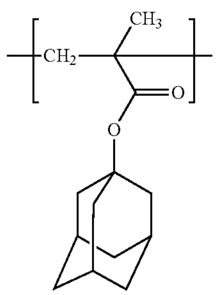
(a5-1-2)
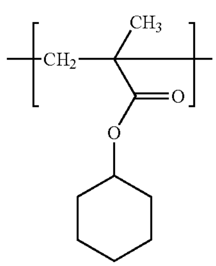
(a5-1-3)
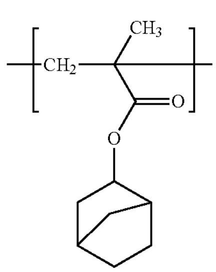
-continued
(a5-1-4)
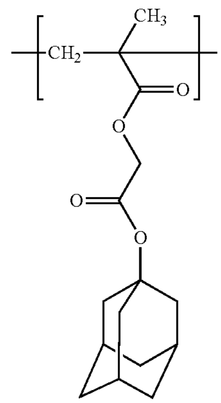
(a5-1-5)
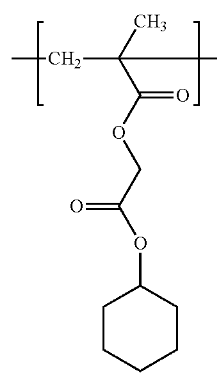
(a5-1-6)
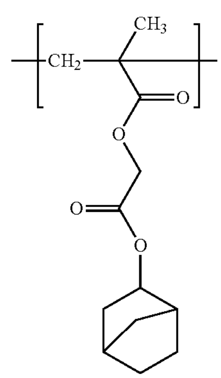
(a5-1-7)
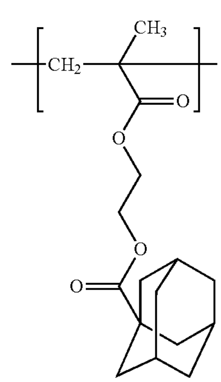

(a5-1-8)
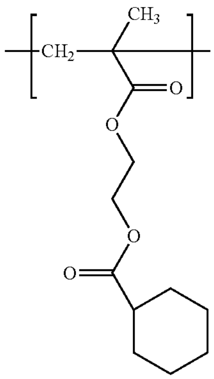
(a5-1-9)
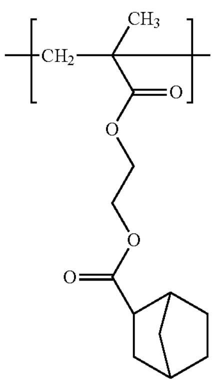
(a5-1-10)
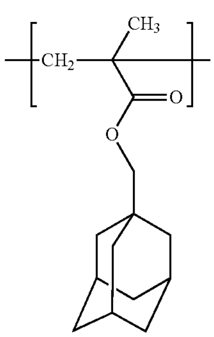
(a5-1-11)
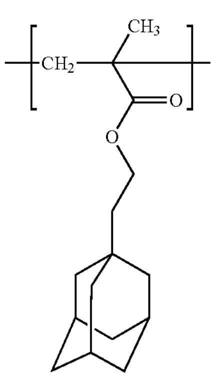
(a5-1-12)
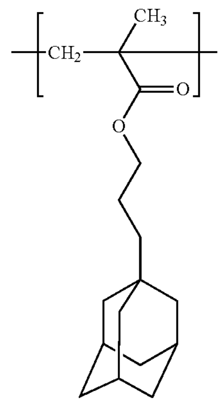
(a5-1-13)
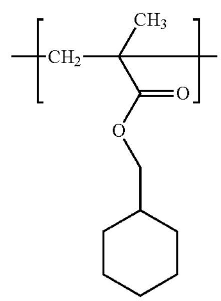
(a5-1-14)
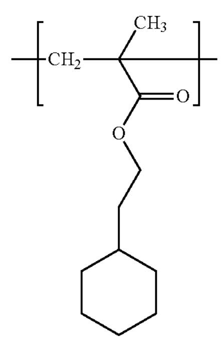
(a5-1-15)
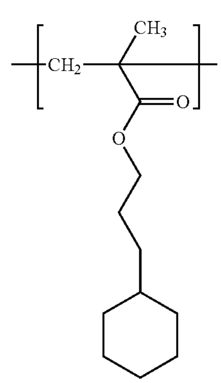

-continued (a5-1-16)

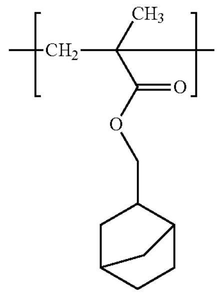

(a5-1-17)

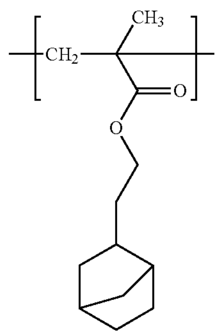

(a5-1-18)

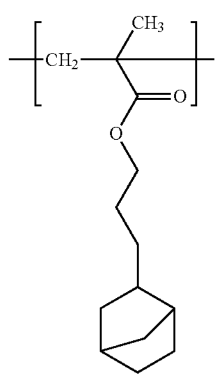

When the resin (A) includes the structural unit (a5), the content is preferably 1 to 30 mol %, more preferably 2 to 20 mol %, and still more preferably 3 to 15 mol %, based on all structural units of the resin (A).

<Structural Unit (II)>

The resin (A) may further include a structural unit which is decomposed upon exposure to radiation to generate an acid (hereinafter sometimes referred to as "structural unit (II)"). Specific examples of the structural unit (II) include the structural units mentioned in JP 2016-79235 A, and a structural unit having a sulfonate group or a carboxylate group and an organic cation in a side chain or a structural unit having a sulfonio group and an organic anion in a side chain are preferable.

The structural unit having a sulfonate group or a carboxylate group and an organic cation in a side chain is preferably a structural unit represented by formula (II-2-A'):

(II-2-A')

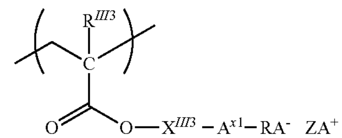

wherein, in formula (II-2-A'), $X^{III3}$ represents a divalent saturated hydrocarbon group having 1 to 18 carbon atoms, —$CH_2$— included in the saturated hydrocarbon group may be replaced by —O—, —S— or —CO—, and a hydrogen atom included in the saturated hydrocarbon group may be substituted with a halogen atom, an alkyl group having 1 to 6 carbon atoms which may have a halogen atom, or a hydroxy group, $A^{x1}$ represents an alkanediyl group having 1 to 8 carbon atoms, and a hydrogen atom included in the alkanediyl group may be substituted with a fluorine atom or a perfluoroalkyl group having 1 to 6 carbon atoms, $RA^-$ represents a sulfonate group or a carboxylate group, $R^{III3}$ represents a hydrogen atom, a halogen atom or an alkyl group having 1 to 6 carbon atoms which may have a halogen atom, and $ZA^+$ represents an organic cation.

Examples of the halogen atom represented by $R^{III3}$ include a fluorine atom, a chlorine atom, a bromine atom and an iodine atom.

Examples of the alkyl group having 1 to 6 carbon atoms which may have a halogen atom represented by $R^{III3}$ include those which are the same as the alkyl group having 1 to 6 carbon atoms which may have a halogen atom represented by $R^{a8}$.

Examples of the alkanediyl group having 1 to 8 carbon atoms represented by $A^{x1}$ include a methylene group, an ethylene group, a propane-1,3-diyl group, a butane-1,4-diyl group, a pentane-1,5-diyl group, a hexane-1,6-diyl group, an ethane-1,1-diyl group, a propane-1,1-diyl group, a propane-1,2-diyl group, a propane-2,2-diyl group, a pentane-2,4-diyl group, a 2-methylpropane-1,3-diyl group, a 2-methylpropane-1,2-diyl group, a pentane-1,4-diyl group, a 2-methylbutane-1,4-diyl group and the like.

Examples of the perfluoroalkyl group having 1 to 6 carbon atoms which may be substituted in $A^{x1}$ include a trifluoromethyl group, a perfluoroethyl group, a perfluoropropyl group, a perfluoroisopropyl group, a perfluorobutyl group, a perfluorosec-butyl group, a perfluorotert-butyl group, a perfluoropentyl group, a perfluorohexyl group and the like.

Examples of the divalent saturated hydrocarbon group having 1 to 18 carbon atoms represented by $X^{1113}$ include a linear or branched alkanediyl group, a monocyclic or polycyclic divalent alicyclic saturated hydrocarbon group, or a combination thereof.

Specific examples thereof include linear alkanediyl groups such as a methylene group, an ethylene group, a propane-1,3-diyl group, a propane-1,2-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group and a dodecane-1,12-diyl group; branched alkanediyl groups such as a butane-1,3-diyl group, a 2-methylpropane-1,3-diyl group, a 2-methylpropane-1,2-diyl group, a pentane-1,4-diyl group and a 2-methylbutane-1,4-diyl group; divalent monocyclic alicyclic saturated hydrocarbon groups, for example, cycloalkanediyl groups such as a cyclobutane-1,3-diyl group, a cyclopentane-1,3-diyl group, a cyclohexane-1,4-diyl group and a cyclooctane-1,5-diyl group; and divalent polycyclic alicyclic saturated hydrocarbon groups such as a norbornane-1,4-diyl group, a norbornane-2,5-diyl group, an adamantane-1,5-diyl group and an adamantane-2,6-diyl group.

Those in which $—CH_2—$ included in the saturated hydrocarbon group are replaced by —O—, —S— or —CO— include, for example, divalent groups represented by formula (X1) to formula (X53). Before replacing $—CH_2—$ included in the saturated hydrocarbon group by —O—, —S— or —CO—, the number of carbon atoms is 17 or less. In the following formulas, * and ** represent a bonding site, and * represents a bonding site to $A^{x1}$.

(X1)

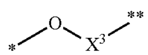

(X2)

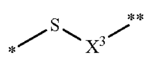

(X3)

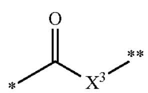

(X4)

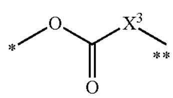

(X5)

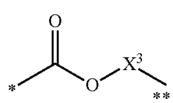

(X6)

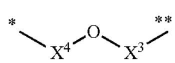

(X7)

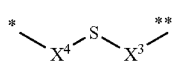

(X8)

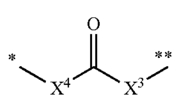

(X9)

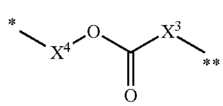

(X10)

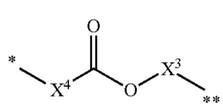

(X11)

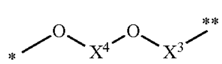

(X12)

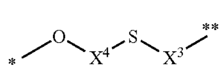

(X13)

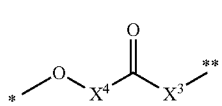

-continued (X14)

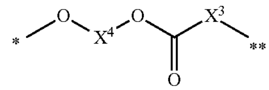

(X15)

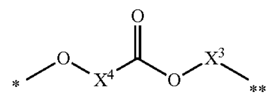

(X16)

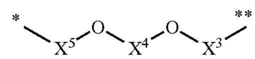

(x17)

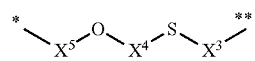

(X18)

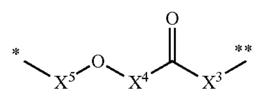

(X19)

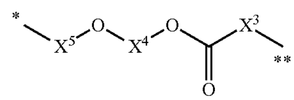

(X20)

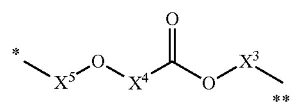

(X21)

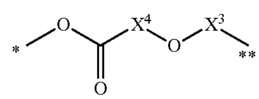

(X22)

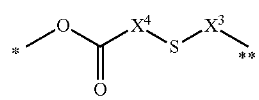

(X23)

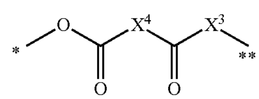

(X24)

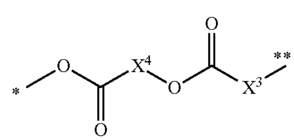

(X25)

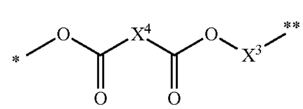

(X26)

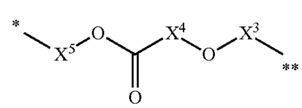

(X27)

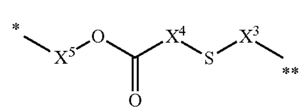

(X28)

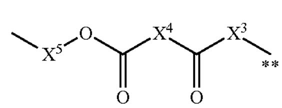

-continued
(X29)
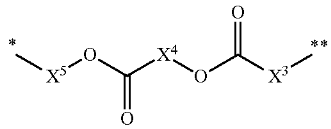
(X30)
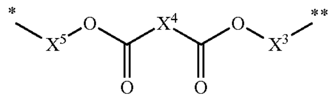
(X31)
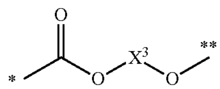
(X32)
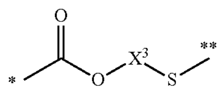
(X33)
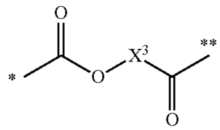
(X34)
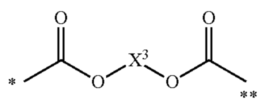
(X35)
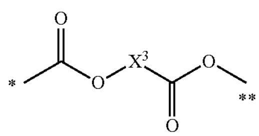
(X36)
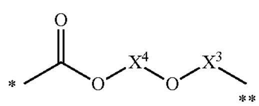
(X37)
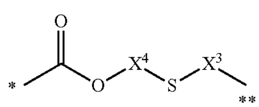
(X38)
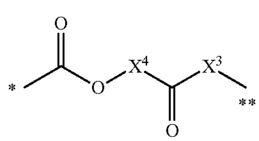
(X39)
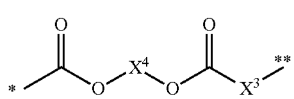
(X40)
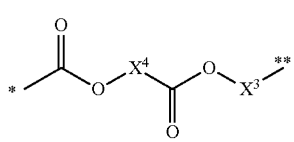
(X41)
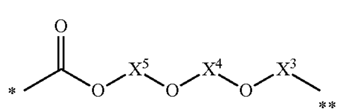
-continued
(X42)
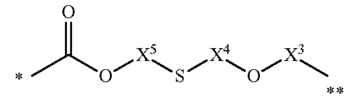
(X43)
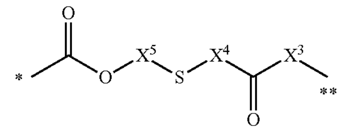
(X44)
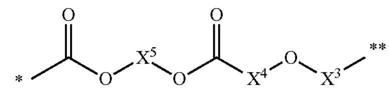
(X45)
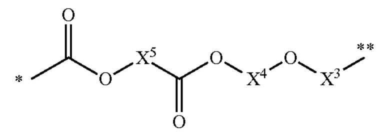
(X46)
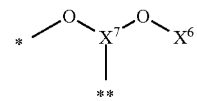
(X47)
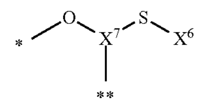
(X48)
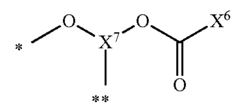
(X49)
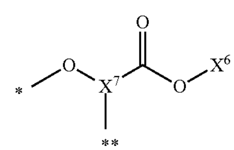
(X50)
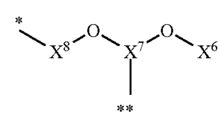
(X51)
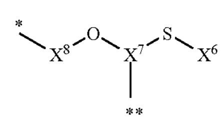
(X52)
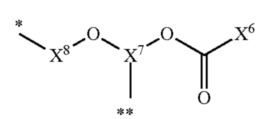
(x53)
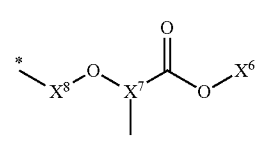

$X^3$ represents a divalent saturated hydrocarbon group having 1 to 16 carbon atoms.

$X^4$ represents a divalent saturated hydrocarbon group having 1 to 15 carbon atoms.

$X^5$ represents a divalent saturated hydrocarbon group having 1 to 13 carbon atoms.

$X^6$ represents a divalent saturated hydrocarbon group having 1 to 14 carbon atoms.

$X^7$ represents a trivalent saturated hydrocarbon group having 1 to 14 carbon atoms.

$X^8$ represents a divalent saturated hydrocarbon group having 1 to 13 carbon atoms.

Examples of the organic cation represented by $ZA^+$ include an organic onium cation, an organic sulfonium cation, an organic iodonium cation, an organic ammonium cation, a benzothiazolium cation and an organic phosphonium cation. Of these, an organic sulfonium cation and an organic iodonium cation are preferable, and an arylsulfonium cation is more preferable. Specific examples thereof include a cation represented by any one of formula (b2-1) to formula (b2-4) mentioned below.

The structural unit represented by formula (II-2-A') is preferably a structural unit represented by formula (11-2-A):

(II-2-A)

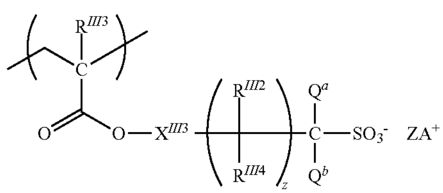

wherein, in formula (II-2-A), $R^{III3}$, $X^{III3}$ and $ZA^+$ are the same as defined above,

- z represents an integer of 0 to 6,
- $R^{III2}$ and $R^{III4}$ each independently represent a hydrogen atom, a fluorine atom or a perfluoroalkyl group having 1 to 6 carbon atoms, and when z is 2 or more, a plurality of $R^{III2}$ and $R^{III4}$ may be the same or different from each other, and
- $Q^a$ and $Q^b$ each independently represent a fluorine atom or a perfluoroalkyl group having 1 to 6 carbon atoms.

Examples of the perfluoroalkyl group having 1 to 6 carbon atoms represented by $R^{III2}$, $R^{III4}$, $Q^a$ and $Q^b$ include those which are the same as the perfluoroalkyl group having 1 to 6 carbon atoms represented by $Q^{b1}$ mentioned below.

The structural unit represented by formula (II-2-A) is preferably a structural unit represented by formula (II-2-A-1):

(II-2-A-1)

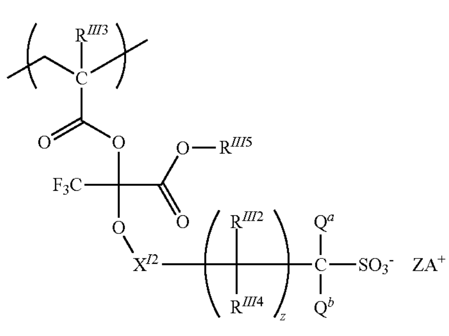

wherein, in formula (II-2-A-1),

- $R^{III2}$, $R^{III3}$, $R^{III4}$, $Q^a$, $Q^b$, z and $ZA^+$ are the same as defined above,
- $R^{III5}$ represents a saturated hydrocarbon group having 1 to 12 carbon atoms, and
- $X^{I2}$ represents a divalent saturated hydrocarbon group having 1 to 11 carbon atoms, —$CH_2$— included in the saturated hydrocarbon group may be replaced by —O—, —S— or —CO—, and a hydrogen atom included in the saturated hydrocarbon group may be substituted with a halogen atom or a hydroxy group.

Examples of the saturated hydrocarbon group having 1 to 12 carbon atoms represented by $R^{III5}$ include linear or branched alkyl groups such as a methyl group, an ethyl group, a propyl group, an isopropyl group, a butyl group, a sec-butyl group, a tert-butyl group, a pentyl group, a hexyl group, a heptyl group, an octyl group, a nonyl group, a decyl group, an undecyl group and a dodecyl group.

Examples of the divalent saturated hydrocarbon group represented by $X^{I2}$ include the same as those of the divalent saturated hydrocarbon group represented by $X^{III3}$.

The structural unit represented by formula (II-2-A-1) is preferably a structural unit represented by formula (11-2-A-2):

(II-2-A-2)

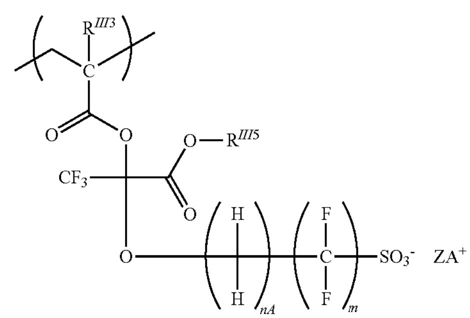

wherein, in formula (II-2-A-2), $R^{III3}$, $R^{III5}$ and $ZA^+$ are the same as defined above, and m and nA each independently represent 1 or 2.

Examples of structural unit represented by the formula (II-2-A') include the following structural units, structural units in which a group corresponding to a methyl group of $R^{III3}$ is substituted with a hydrogen atom, a halogen atom (e.g., a fluorine atom) or an alkyl group having 1 to 6 carbon atoms which may have a halogen atom (e.g., a trifluoromethyl group, etc.), and the structural units mentioned in WO 2012/050015 A. $ZA^+$ represents an organic cation.

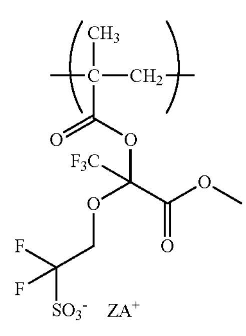

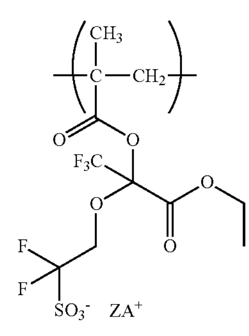

-continued

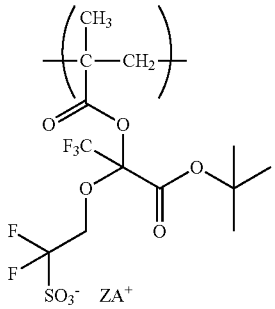

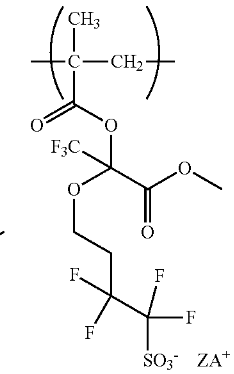

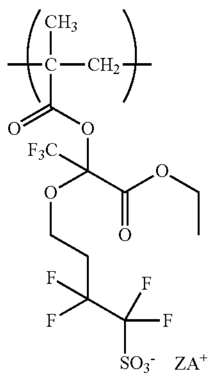

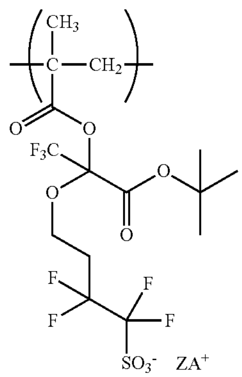

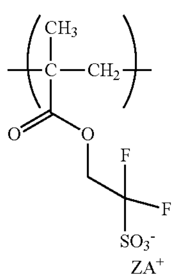

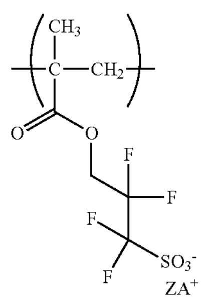

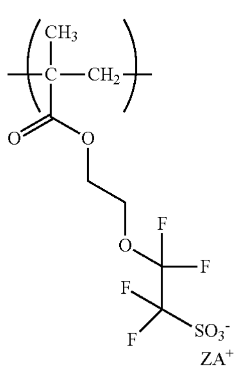

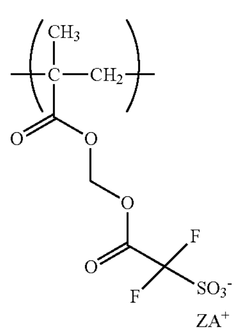

-continued

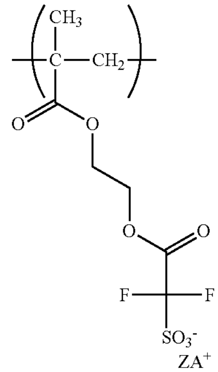

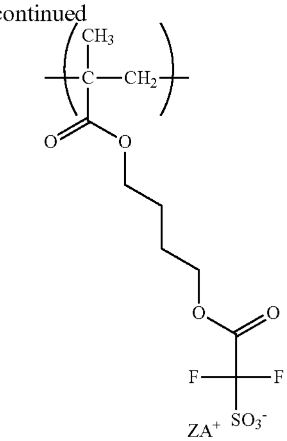

The structural unit having a sulfonio group and an organic anion in a side chain is preferably a structural unit represented by formula (II-1-1):

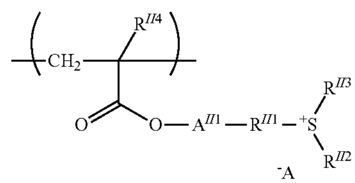

(II-1-1)

wherein, in formula (II-1-1), $A^{II1}$ represents a single bond or a divalent linking group, $R^{II1}$ represents a divalent aromatic hydrocarbon group having 6 to 18 carbon atoms, $R^{II2}$ and $R^{II3}$ each independently represent a hydrocarbon group having 1 to 18 carbon atoms, and $R^{II2}$ and $R^{II3}$ may be bonded each other to form a ring together with a sulfur atom to which $R^{II2}$ and $R^{II3}$ are bonded, $R^{II4}$ represents a hydrogen atom, a halogen atom or an alkyl group having 1 to 6 carbon atoms which may have a halogen atom, and $A^-$ represents an organic anion.

Examples of the divalent aromatic hydrocarbon group having 6 to 18 carbon atoms represented by $R^{II1}$ include a phenylene group and a naphthylene group.

Examples of the hydrocarbon group represented by $R^{II2}$ and $R^{II3}$ include an alkyl group, an alicyclic hydrocarbon group, an aromatic hydrocarbon group, and groups formed by combining these groups.

Examples of the alkyl group and the alicyclic hydrocarbon group include those which are the same as mentioned above.

Examples of the aromatic hydrocarbon group include aryl groups such as a phenyl group, a naphthyl group, an anthryl group, a biphenyl group and a phenanthryl group.

Examples of the combined group include groups obtained by combining the above-mentioned alkyl group and alicyclic hydrocarbon group, aralkyl groups such as a benzyl group, aromatic hydrocarbon groups having an alkyl group (a p-methylphenyl group, a p-tert-butylphenyl group, a tolyl group, a xylyl group, a cumenyl group, a mesityl group, a 2,6-diethylphenyl group, a 2-methyl-6-ethylphenyl group, etc.), aromatic hydrocarbon groups having an alicyclic hydrocarbon group (a p-cyclohexylphenyl group, a p-adamantylphenyl group, etc.), aryl-cycloalkyl groups such as a phenylcyclohexyl group, and the like.

Examples of the halogen atom represented by $R^{II4}$ include a fluorine atom, a chlorine atom, a bromine atom and an iodine atom.

Examples of the alkyl group having 1 to 6 carbon atoms which may have a halogen atom represented by $R^{II4}$ include those which are the same as the alkyl group having 1 to 6 carbon atoms which may have a halogen atom represented by $R^{a8}$.

Examples of the divalent linking group represented by $A^{II1}$ include a divalent saturated hydrocarbon group having 1 to 18 carbon atoms, and —$CH_2$— included in the divalent saturated hydrocarbon group may be replaced by —O—, —S— or —CO—. Specific examples thereof include those which are the same as the divalent saturated hydrocarbon group having 1 to 18 carbon atoms represented by $X^{III3}$.

Examples of the structural unit including a cation in formula (II-1-1) include the following structural units and structural units in which a group corresponding to a methyl group for $R^{II4}$ is substituted with a hydrogen atom, a halogen atom (e.g., a fluorine atom) or an alkyl group having 1 to 6 carbon atoms which may have a halogen atom (e.g., a trifluoromethyl group, etc.).

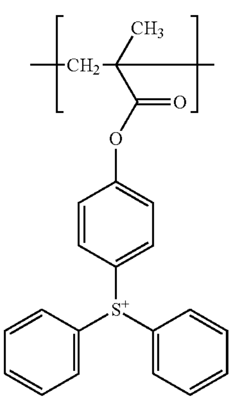

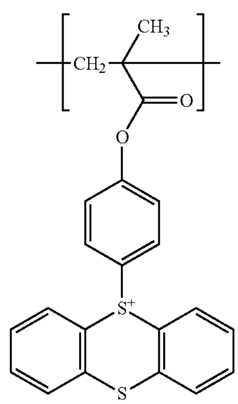

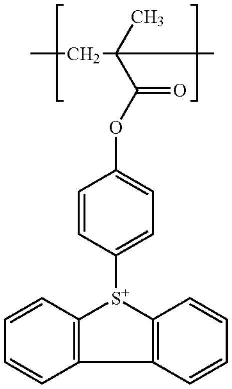

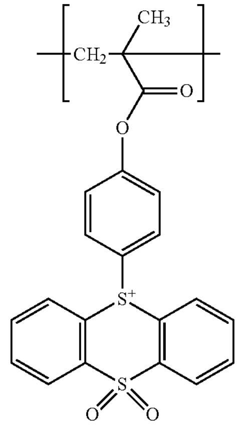

-continued

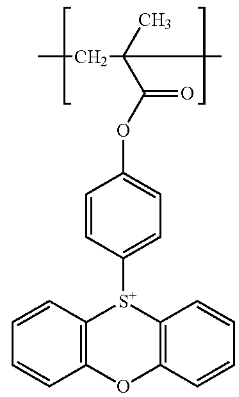

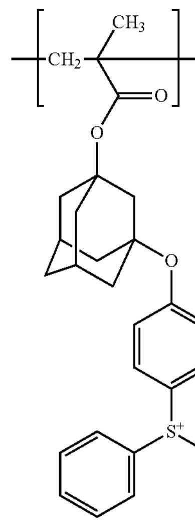

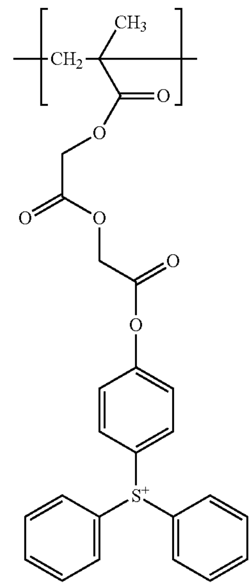

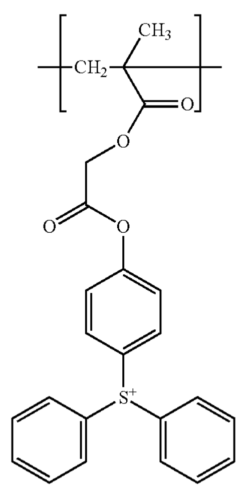

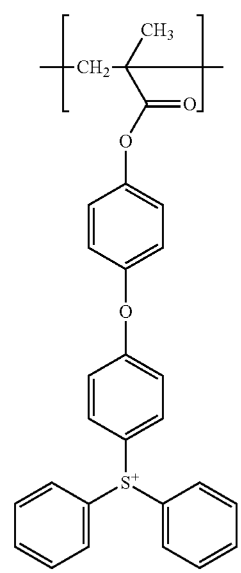

-continued

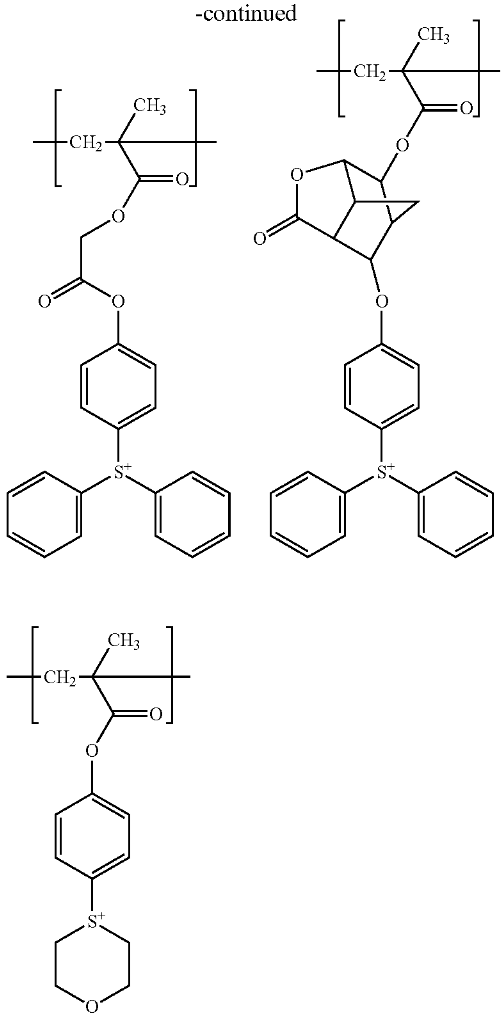

Examples of the organic anion represented by $A^-$ include a sulfonic acid anion, a sulfonylimide anion, a sulfonylmethide anion and a carboxylic acid anion. The organic anion represented by $A^-$ is preferably a sulfonic acid anion, and examples of the sulfonic acid anion include those which are the same as an anion represented by formula (B1) mentioned below.

Examples of the sulfonylimide anion represented by A-include the followings.

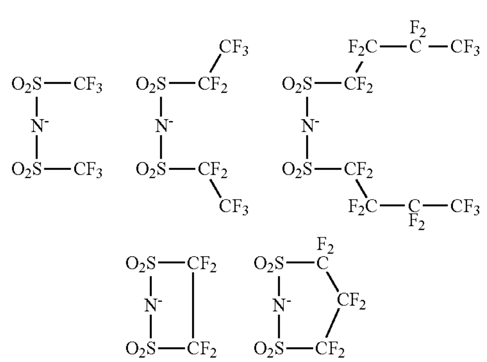

Examples of the sulfonylmethide anion include the followings.

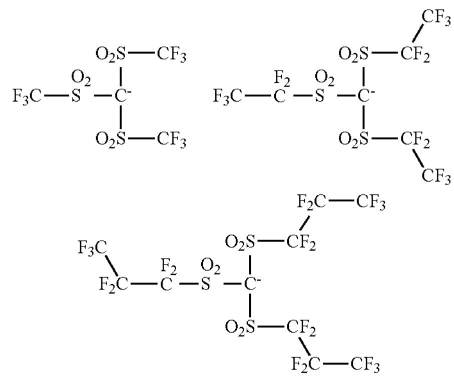

Examples of the carboxylic acid anion include the followings.

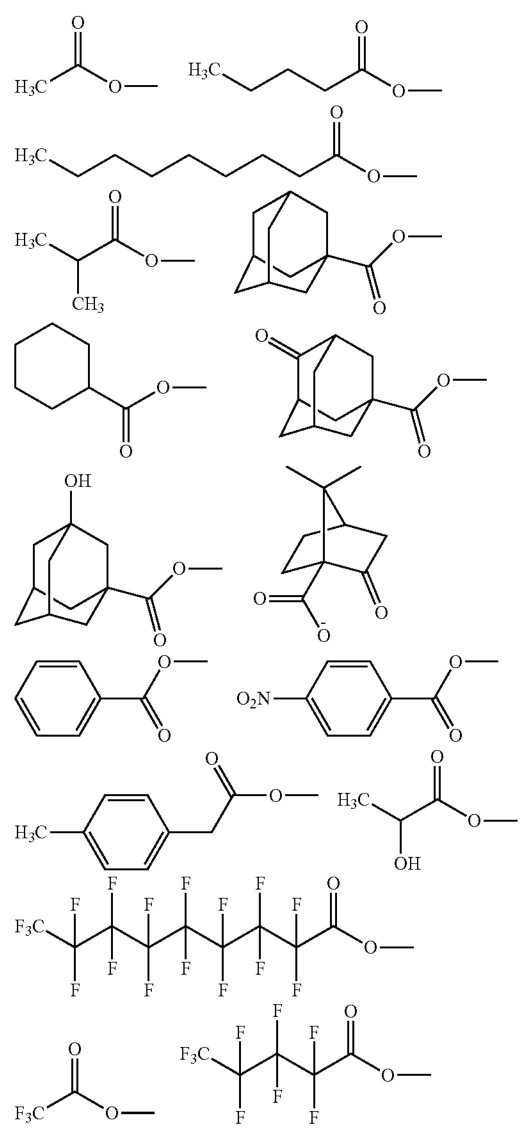

-continued
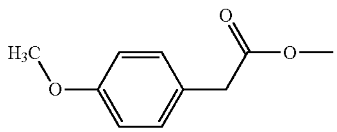
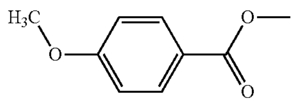
Examples of the structural unit represented by formula (II-1-1) include the following structural units.
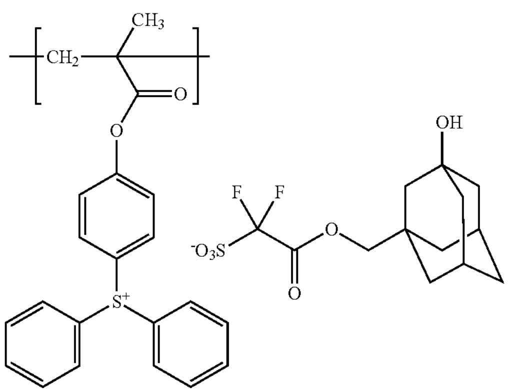
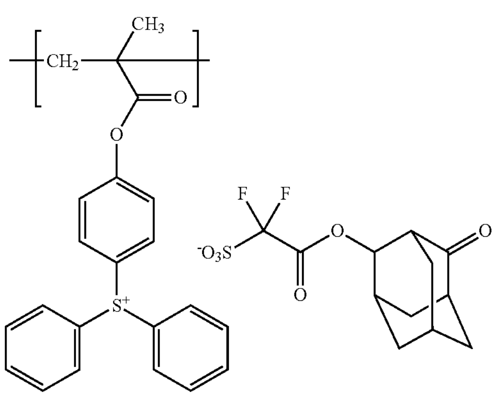
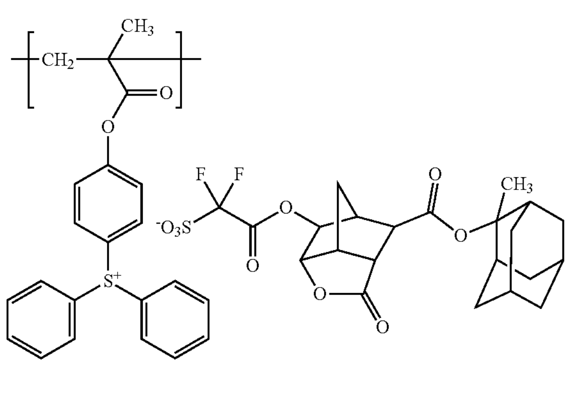
-continued
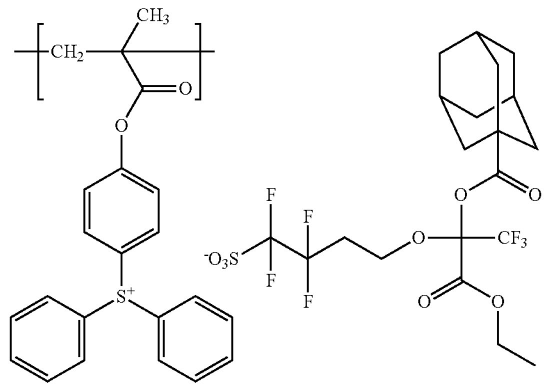
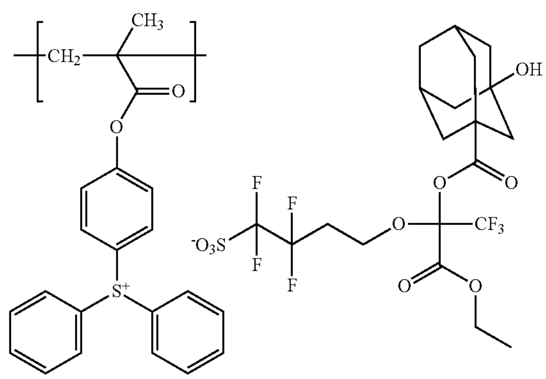
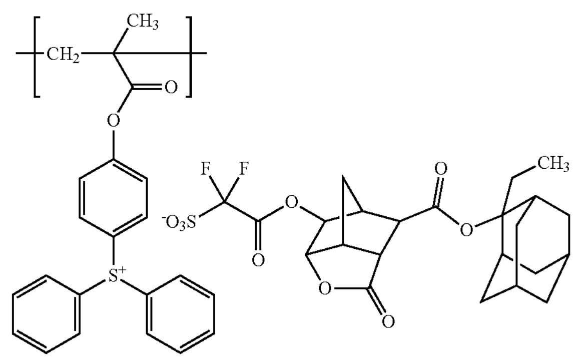
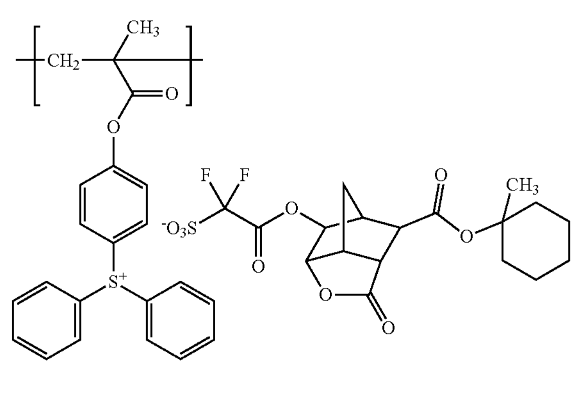

-continued

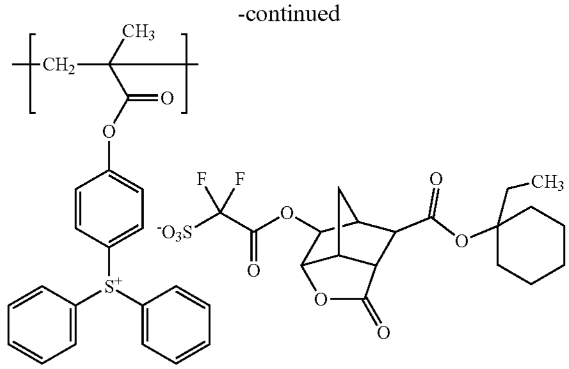

When the structural unit (II) is included in the resin (A), the content of the structural unit (II) is preferably 1 to 20 mol %, more preferably 2 to 15 mol %, and still more preferably 3 to 10 mol %, based on all structural units of the resin (A).

The resin (A) may include a structural unit other than the above-mentioned structural units, and examples of the structural unit include structural units well-known in this technical field.

The resin (A) is preferably a resin composed of a structural unit (I), a structural unit (a1-1) and a structural unit (a1-2), a resin composed of a structural unit (I) and a structural unit (a1-1), a resin composed of a structural unit (I) and a structural unit (a1-2), a resin composed of a structural unit (I), a structural unit (a1-1), a structural unit (a1-2) and a structural unit (s), a resin composed of a structural unit (I), a structural unit (a1-1), a structural unit (a1-2), a structural unit (a1) and a structural unit (s), a resin composed of a structural unit (I), a structural unit (a1-1) and a structural unit (s), a resin composed of a structural unit (I), a structural unit (a1-2) and a structural unit (s), a resin composed of a structural unit (I), a structural unit (a1-1), a structural unit (a1-2), a structural unit (s), a structural unit (a4) and/or a structural unit (a5), or a resin composed only of a structural unit (I), a structural unit (a1-1), a structural unit (a1-2) and a structural unit (a4), and more preferably a resin composed of a structural unit (I), a structural unit (a1-1) and a structural unit (a1-2), a resin composed of a structural unit (I), a structural unit (a1-1), a structural unit (a1-2) and a structural unit (s), a resin composed of a structural unit (I), a structural unit (a1-1), a structural unit (a1-2), a structural unit (a1) and a structural unit (s), a resin composed of a structural unit (I), a structural unit (a1-1) and a structural unit (s), or a resin composed of a structural unit (I), a structural unit (a1-2) and a structural unit (s).

The structural unit (a1) is preferably a structural unit (a1-4). The structural unit (s) is preferably at least one selected from the group consisting of a structural unit (a2) and a structural unit (a3). The structural unit (a2) is preferably at least one selected from the group consisting of a structural unit (a2-1) and a structural unit (a2-A). The structural unit (a3) is preferably at least one selected from the group consisting of a structural unit represented by formula (a3-1), a structural unit represented by formula (a3-2) and a structural unit represented by formula (a3-4).

The respective structural units constituting the resin (A) may be used alone, or two or more structural units may be used in combination. Using a monomer from which these structural units are derived, it is possible to produce by a known polymerization method (e.g., radical polymerization method). The content of the respective structural units included in the resin (A) can be adjusted according to the amount of the monomer used in the polymerization.

The weight-average molecular weight of the resin (A) is preferably 2,000 or more (more preferably 2,500 or more, and still more preferably 3,000 or more), and 50,000 or less (more preferably 30,000 or less, and still more preferably 15,000 or less).

In the present specification, the weight-average molecular weight is a value determined by gel permeation chromatography. The gel permeation chromatography can be measured under the analysis conditions mentioned in Examples.

<Compound (IA)>

The compound of the present invention is a compound represented by formula (IA) (hereinafter sometimes referred to as "compound (IA)"):

(IA)

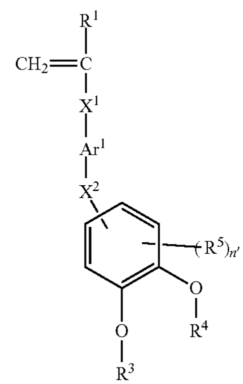

wherein, in formula (IA), $R^1$ represents a hydrogen atom or a methyl group, $X^1$ represents a single bond or —CO—O—* (* represents a bonding site to $Ar^1$), $X^2$ represents —CO—O—*, —O—*, —O—CO—*, —O—CO—$(CH_2)_{mm}$—O—* or —O—$(CH_2)_{nn}$—CO—O—* (* represents a bonding site to the benzene ring), mm and nn represent 0 or 1, $Ar^1$ represents an aromatic hydrocarbon group having 6 to 36 carbon atoms which may have a substituent, $R^3$ and $R^4$ each independently represent a hydrogen atom or an acid-labile group, or $R^3$ and $R^4$ may combine together to form a group having an acetal ring structure, $R^5$ represents a halogen atom, an alkyl fluoride group having 1 to 6 carbon atoms or an alkyl group having 1 to 12 carbon atoms, and —$CH_2$— included in the alkyl group and the alkyl fluoride group may be replaced by —O— or —CO—, and n' represents an integer of 0 to 3, and when n' is 2 or more, a plurality of $R^5$ may be the same or different from each other.

Examples of the compound represented by formula (IA) include a compound represented by formula (IA1) (hereinafter sometimes referred to as "compound (IA1)") or a compound represented by formula (IA2) (hereinafter sometimes referred to as "compound (IA2)"):

(IA1)

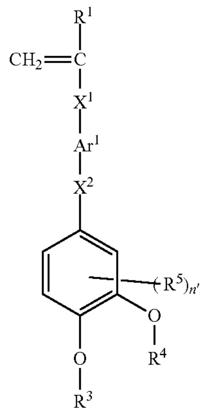

(IA2)

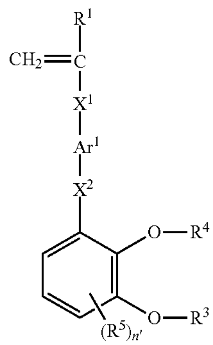

wherein, in formula (IA1) and formula (IA2), $R^1$, $X^1$, $X^2$, mm, nn, $Ar^1$, $R^3$, $R^4$, $R^5$ and n' are the same as defined above.

The compound (IA) is a compound in which $Ar^2$ is a trivalent or higher multivalent benzene ring, n=2, and each —O—$R^2$ is bonded adjacent to each other in formula (I). Such a compound (IA) is, for example, a monomer from which the structural units represented by the above-mentioned formula (I-13) to formula (I-16), formula (I-19) to formula (I-24), formula (I-27) to formula (I-66) and formula (I-71) to formula (I-92) are derived.

The compound (IA1) is a compound in which $Ar^2$ is a trivalent or higher multivalent benzene ring, n=2, and each —O—$R^2$ is bonded to the meta-position or the para-position with respect to the bonding position of $X^2$ in formula (I). Such a compound (IA1) is, for example, a monomer from which the structural units represented by the above-mentioned formula (I-13) to formula (I-16), formula (I-19) to formula (I-24) and formula (I-27) to formula (I-66) are derived.

The compound (IA2) is a compound in which $Ar^2$ is a trivalent or higher multivalent benzene ring, n=2, and each —O—$R^2$ is bonded to the ortho-position or the meta-position with respect to the bonding position of $X^2$ in formula (I). Such a compound (IA2) is, for example, a monomer from which the structural units represented by the above-mentioned formula (I-71) to formula (I-92) are derived.

Examples of the aromatic hydrocarbon group having 6 to 36 carbon atoms which may have a substituent for $Ar^1$ include the same groups exemplified as the aromatic hydrocarbon group having 6 to 36 carbon atoms which may have a substituent for $Ar^1$ in formula (I).

Examples of the acid-labile group for $R^3$ and $R^4$ include the same groups exemplified as the acid-labile group for $R^2$ in formula (I) (acid-labile group (1a) or acid-labile group (2a), etc.).

When $R^3$ and $R^4$ combine together to form a group having an acetal ring structure, examples of such a group include the same groups exemplified when two $R^2$ combine together to form a group having an acetal ring structure in formula (I) (group (3a), etc.).

When $R^3$ and $R^4$ combine together to form a group having an acetal ring structure, examples of such a group including the benzene ring include groups represented by the followings. * represents a bond to $X^2$.

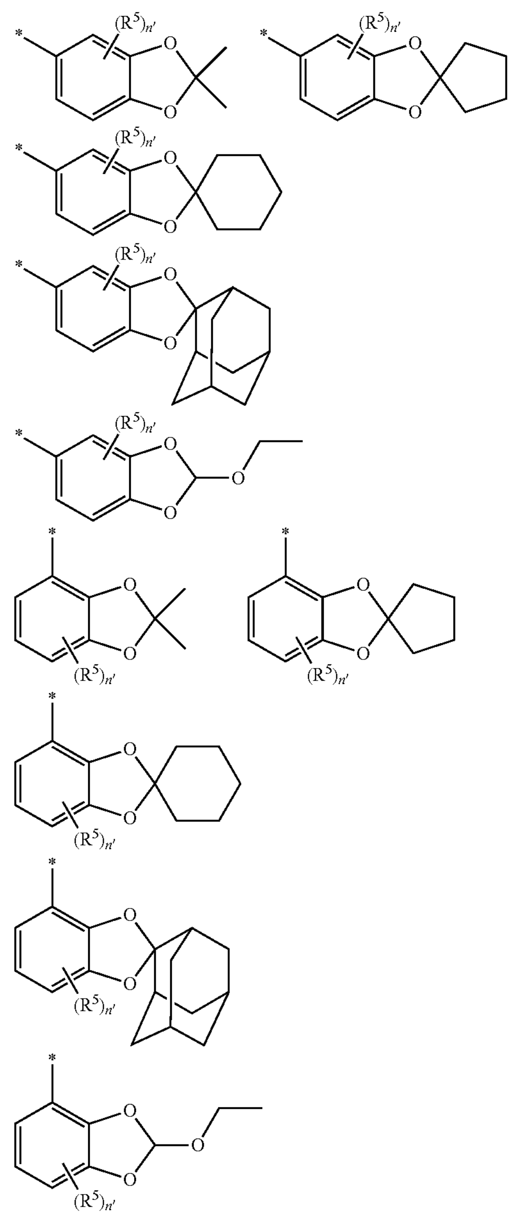

Examples of the halogen atom, the alkyl fluoride group having 1 to 6 carbon atoms or the alkyl group having 1 to 12 carbon atoms (—$CH_2$— included in the alkyl group and the alkyl fluoride group may be replaced by —O— or —CO—) for $R^5$ include the same groups exemplified as the substituent for $Ar^2$ in formula (I).

n' is preferably an integer of 0 to 2, more preferably 0 or 1, and still more preferably 0.
Examples of the compound (IA) include the followings.
(IA-13)
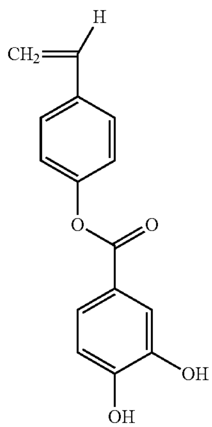
(IA-14)
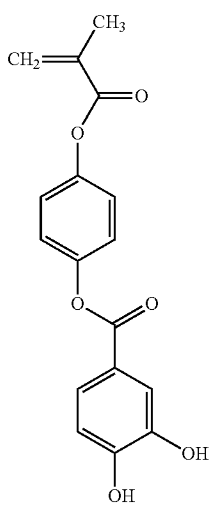
(IA-15)
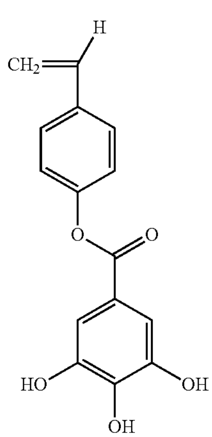
-continued
(IA-16)
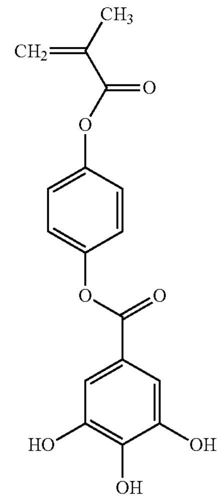
(IA-19)
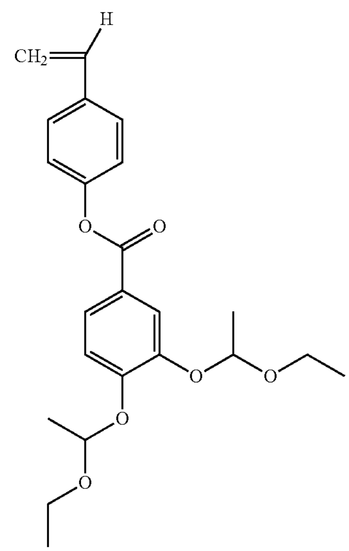
(IA-20)
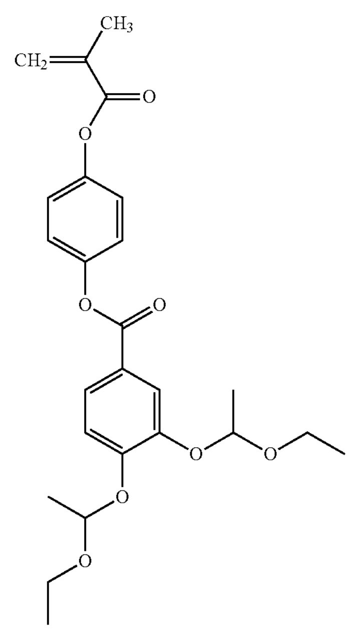

-continued
(IA-21)
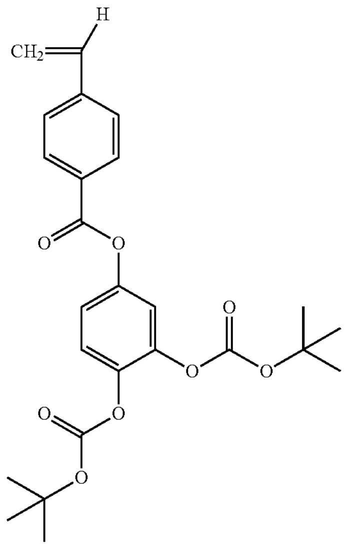
(IA-22)
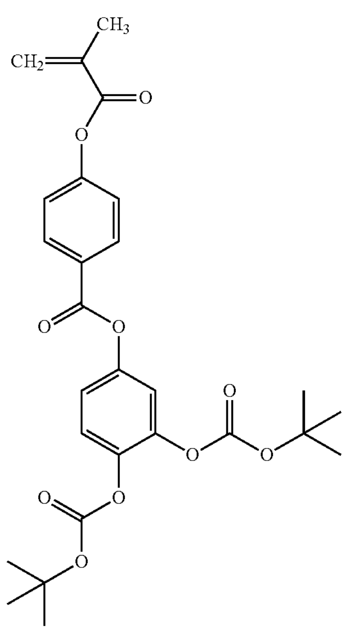
-continued
(IA-23)
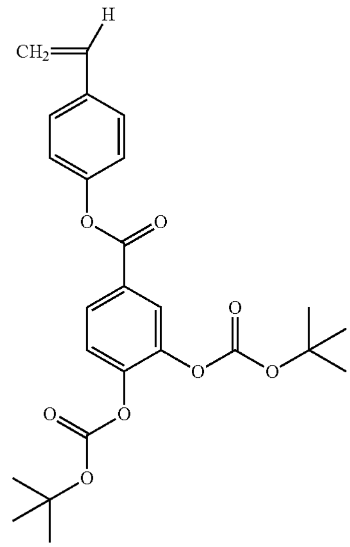
(IA-24)
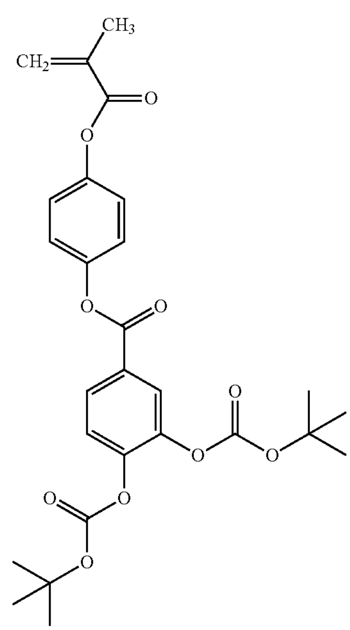

-continued
(IA-27)
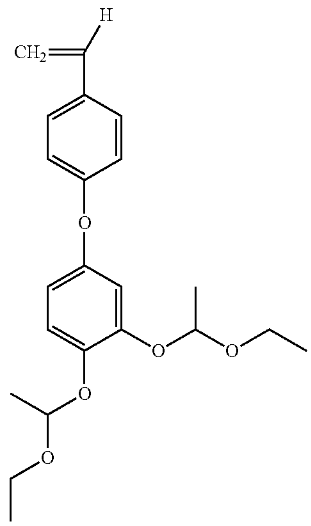
(IA-28)
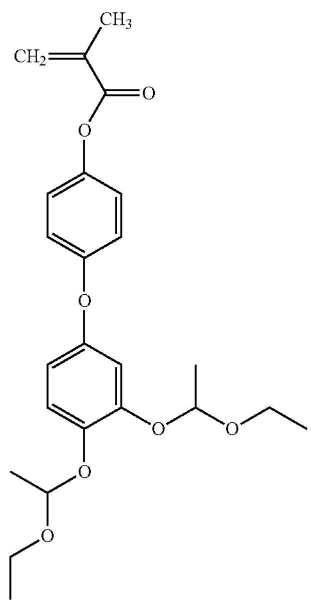
(IA-29)
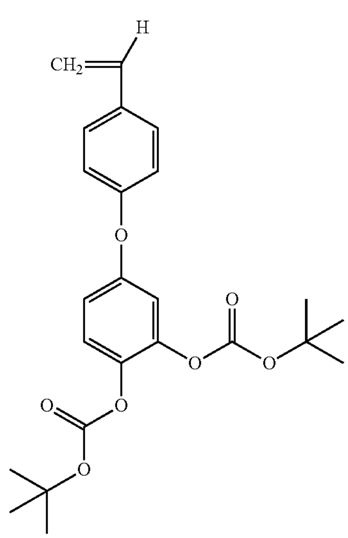
-continued
(IA-30)
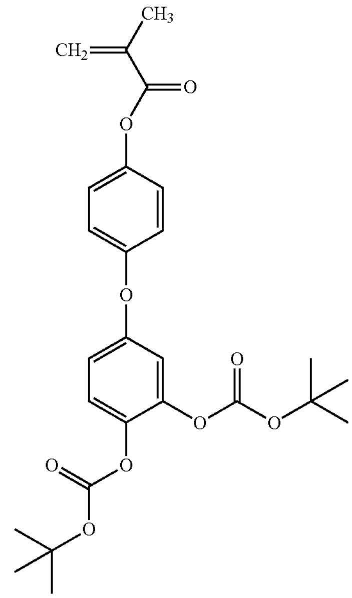
(IA-31)
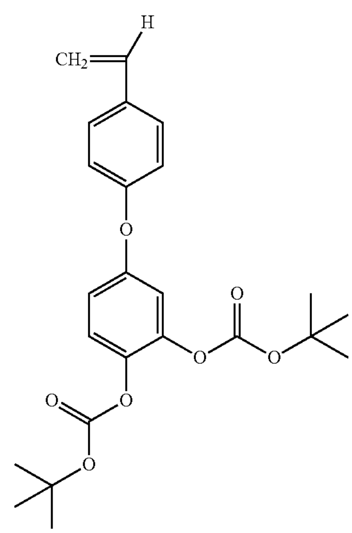

-continued
(IA-32)
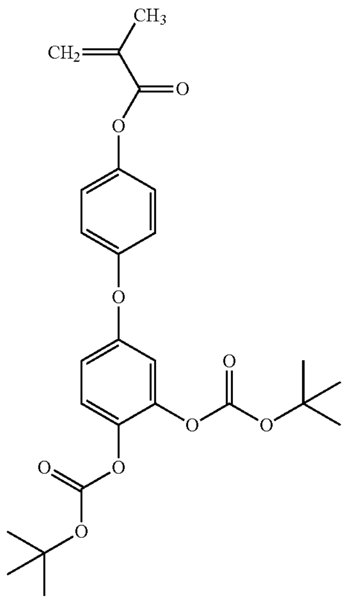
(IA-33)
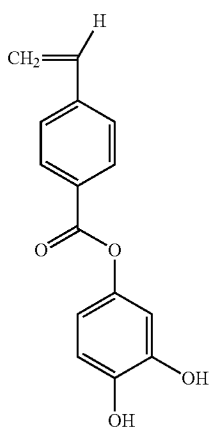
(IA-34)
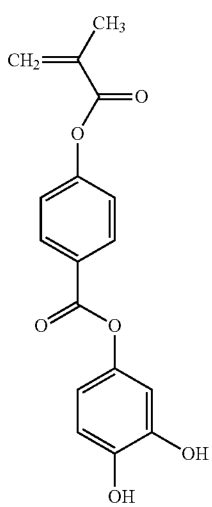
-continued
(IA-35)
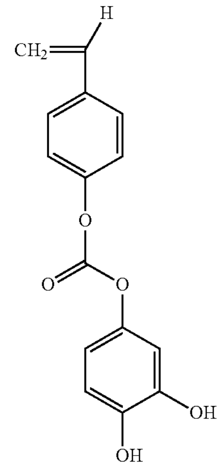
(IA-36)
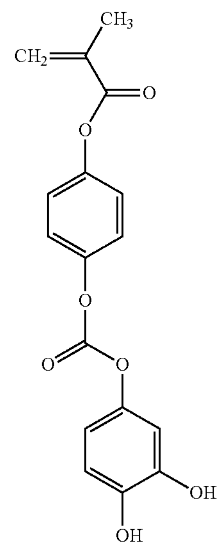
(IA-37)
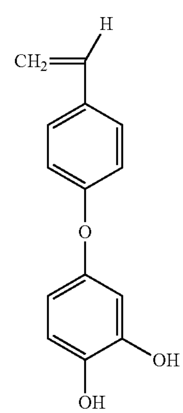

-continued
(IA-38)
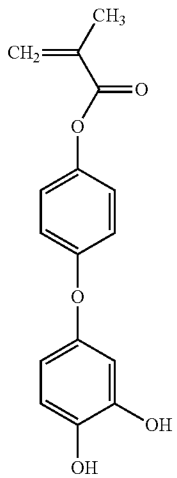
(IA-39)
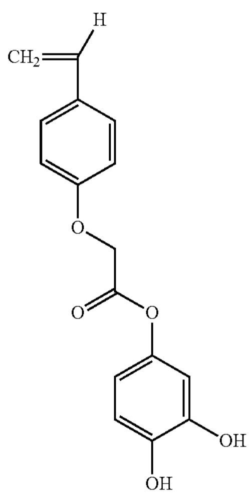
(IA-40)
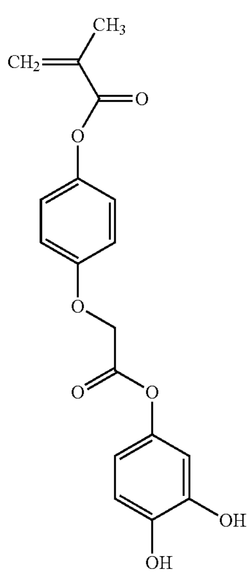
-continued
(IA-41)
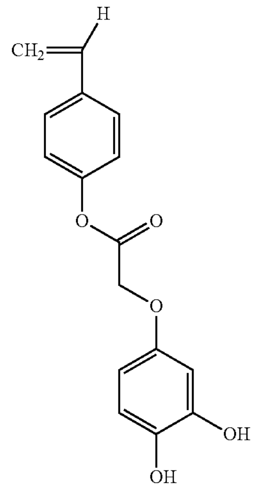
(IA-42)
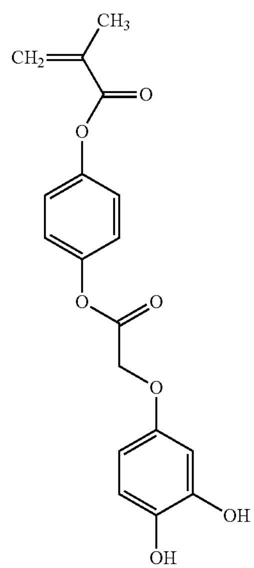
(IA-43)
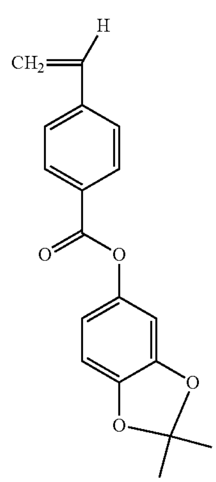

-continued
(IA-44)
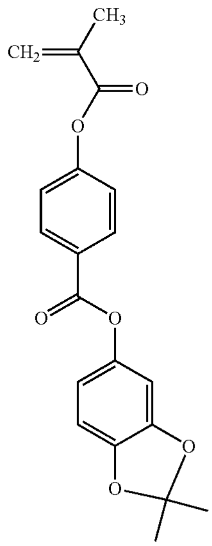
(IA-45)
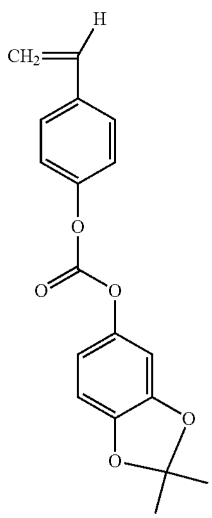
(IA-46)
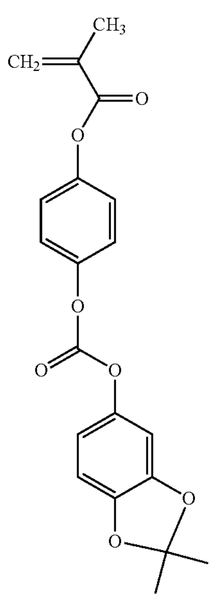
-continued
(IA-47)
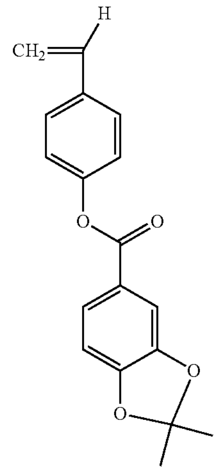
(IA-48)
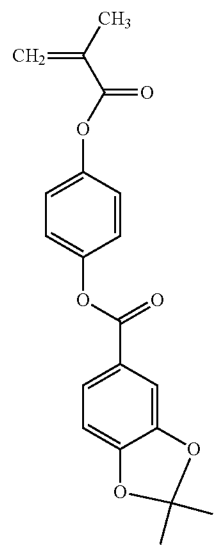
(IA-49)
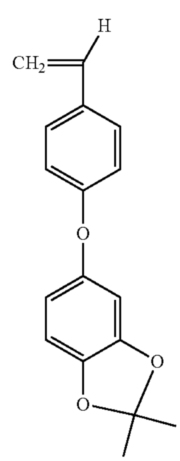

-continued
(IA-50)
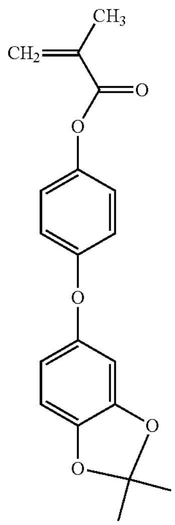
(IA-51)
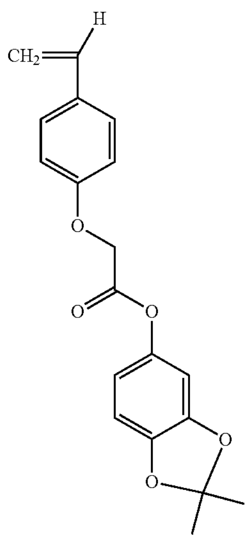
(IA-52)
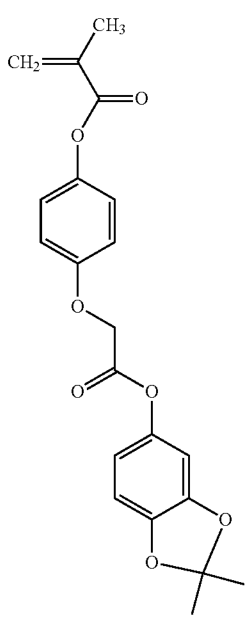
-continued
(IA-53)
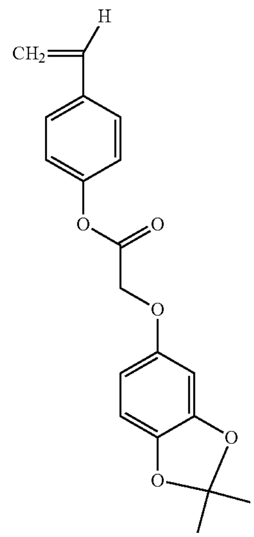
(IA-54)
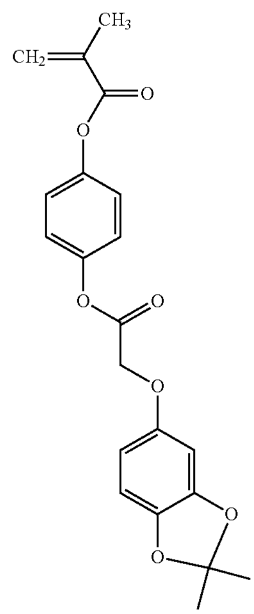
(IA-55)
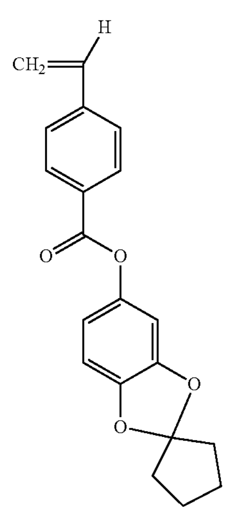

-continued
(IA-56)
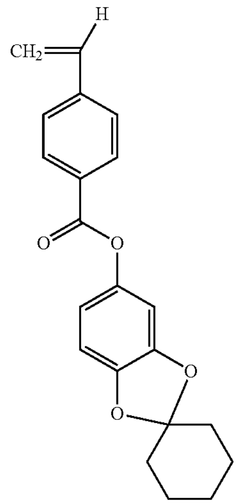
(IA-57)
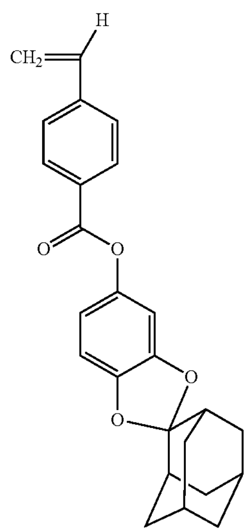
(IA-58)
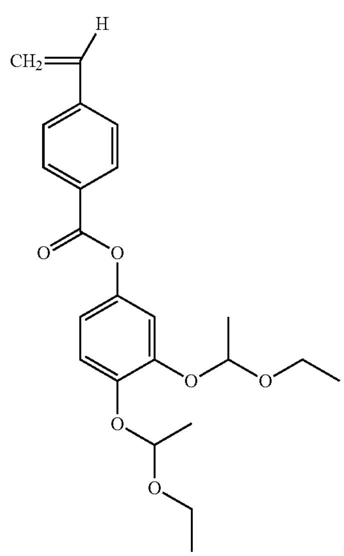
-continued
(IA-59)
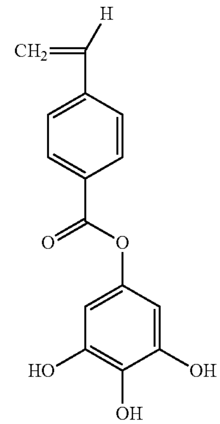
(IA-60)
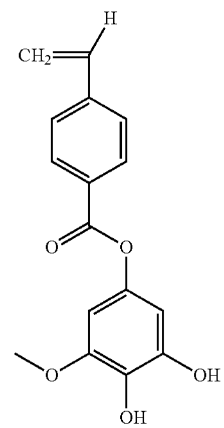
(IA-61)
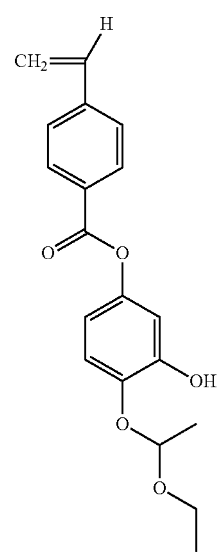

-continued
(IA-62)
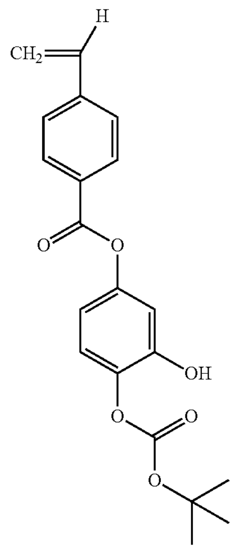
(IA-63)
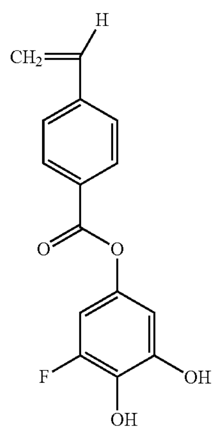
(IA-64)
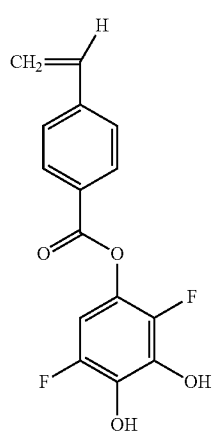
-continued
(IA-65)
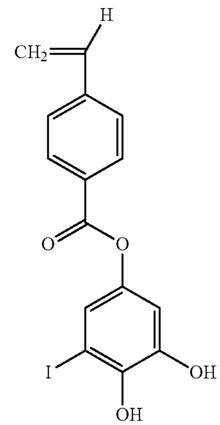
(IA-66)
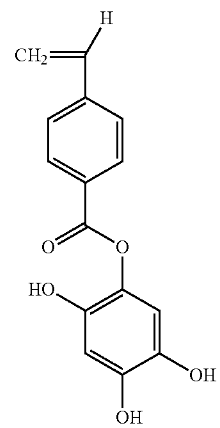
(IA-71)
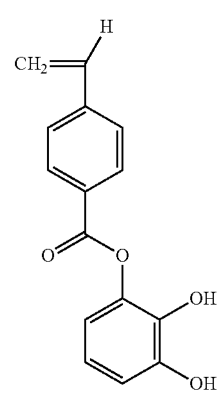

-continued
(IA-72)
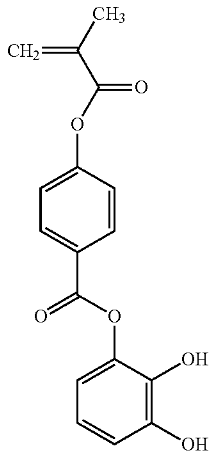
(IA-73)
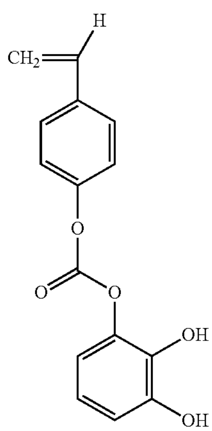
(IA-74)
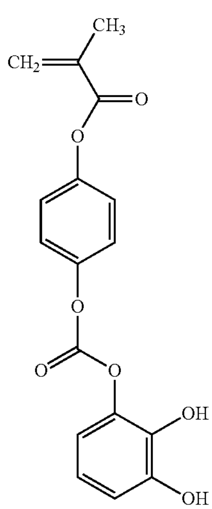
-continued
(IA-75)
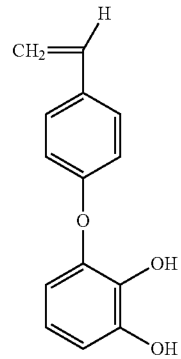
(IA-76)
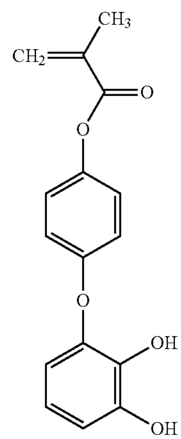
(IA-77)
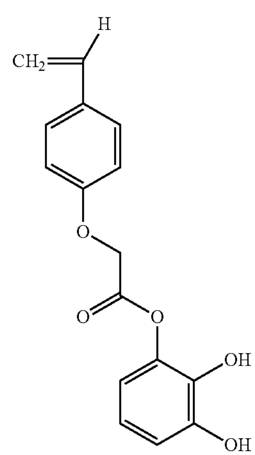

-continued
(IA-78)
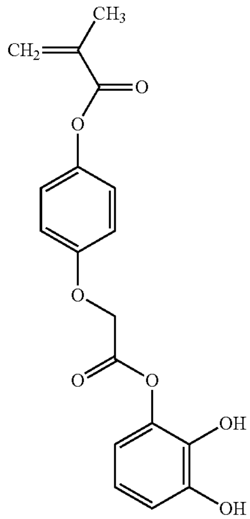
(IA-79)
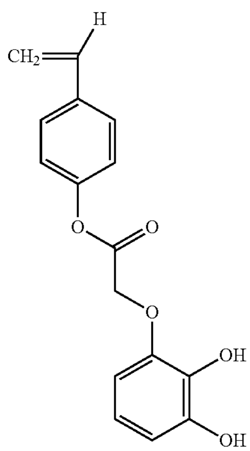
(IA-80)
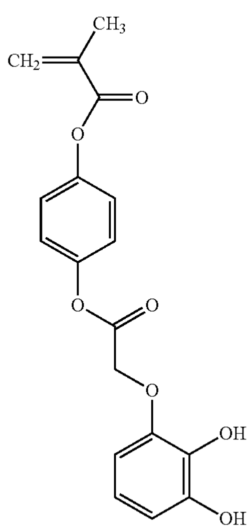
-continued
(IA-81)
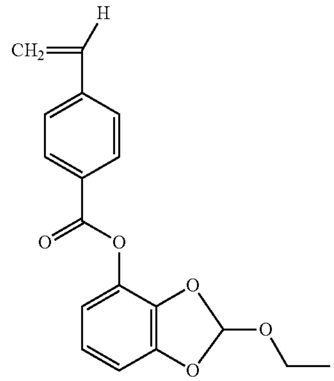
(IA-82)
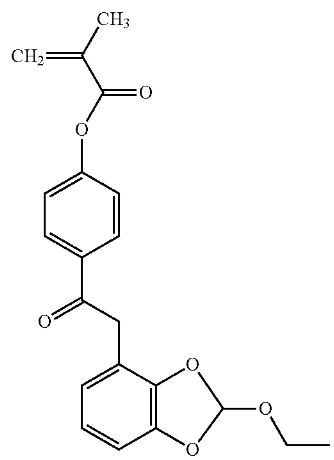
(IA-83)
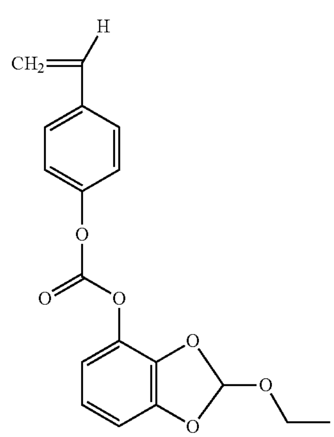

-continued
(IA-84)
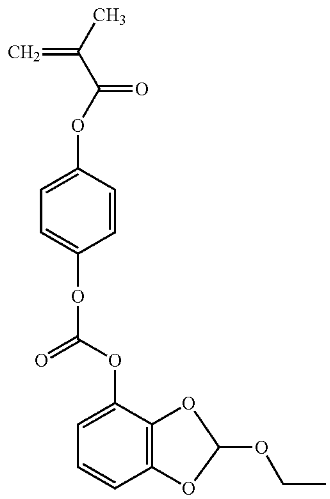
(IA-85)
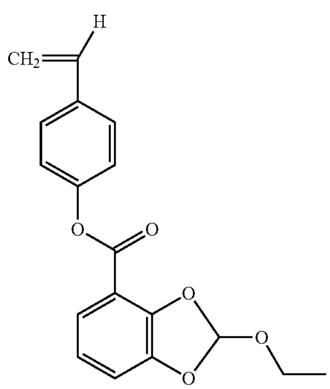
(IA-86)
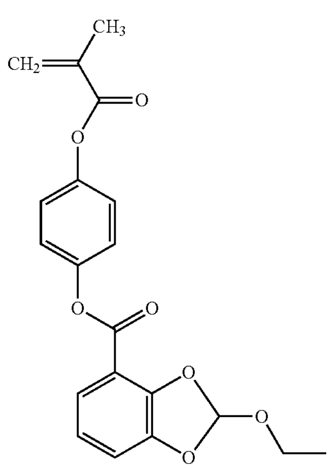
-continued
(IA-87)
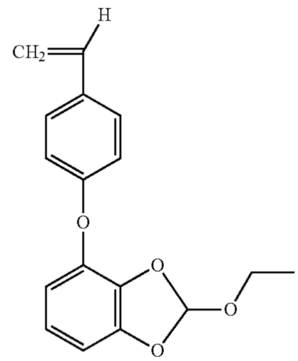
(IA-88)
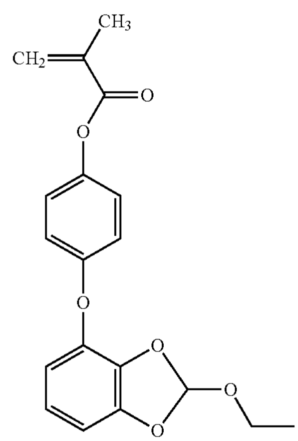
(IA-89)
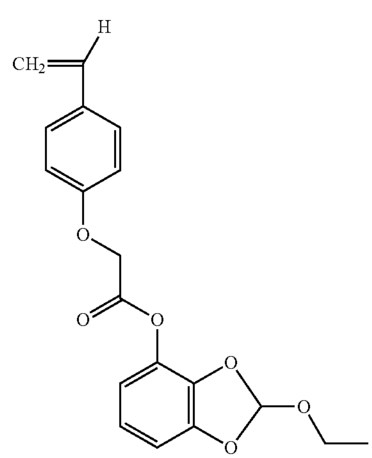

-continued (IA-90)

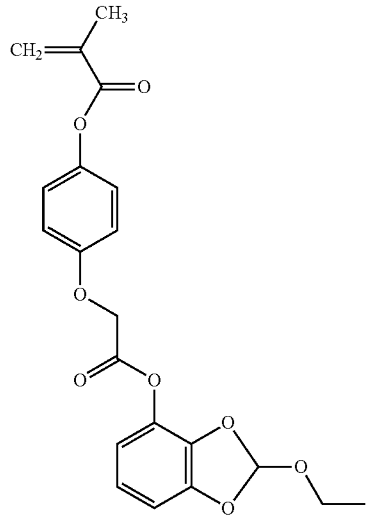

(IA-91)

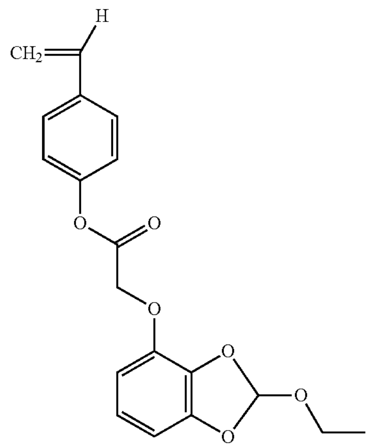

(IA-92)

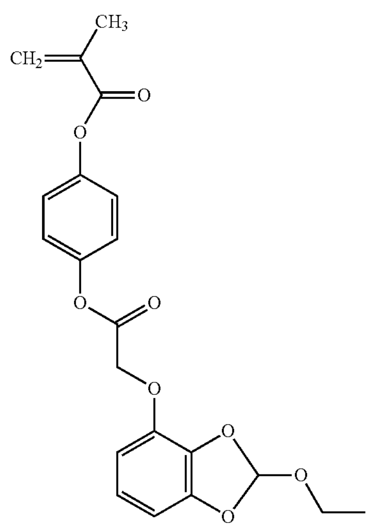

It is also possible to exemplify, as the compound (IA), a compound in which a hydrogen atom corresponding to $R^1$ in compounds each represented by formula (IA-13), formula (IA-15), formula (IA-19), formula (IA-21), formula (IA-23), formula (IA-27), formula (IA-29), formula (IA-31), formula (IA-33), formula (IA-35), formula (IA-37), formula (IA-39), formula (IA-41), formula (IA-43), formula (IA-45), formula (IA-47), formula (IA-49), formula (IA-51), formula (IA-53), formula (IA-55) to formula (IA-66), formula (IA-71), formula (IA-73), formula (IA-75), formula (IA-77), formula (IA-79), formula (IA-81), formula (IA-83), formula (IA-85), formula (IA-87), formula (IA-89) and formula (IA-91) is substituted with a methyl group, and a compound in which a methyl group corresponding to $R^1$ in compounds each represented by formula (IA-14), formula (IA-16), formula (IA-20), formula (IA-22), formula (IA-24), formula (IA-28), formula (IA-30), formula (IA-32), formula (IA-34), formula (IA-36), formula (IA-38), formula (IA-40), formula (IA-42), formula (IA-44), formula (IA-46), formula (IA-48), formula (IA-50), formula (IA-52), formula (IA-54), formula (IA-72), formula (IA-74), formula (IA-76), formula (IA-78), formula (IA-80), formula (IA-82), formula (IA-84), formula (IA-86), formula (IA-88), formula (IA-90) and formula (IA-92) is replaced by a hydrogen atom.

<Method for Producing Compound (IA)>

A compound (IA) can be obtained by reacting a compound represented by formula (I-a) with a compound represented by formula (I-b) in the presence of a catalyst in a solvent:

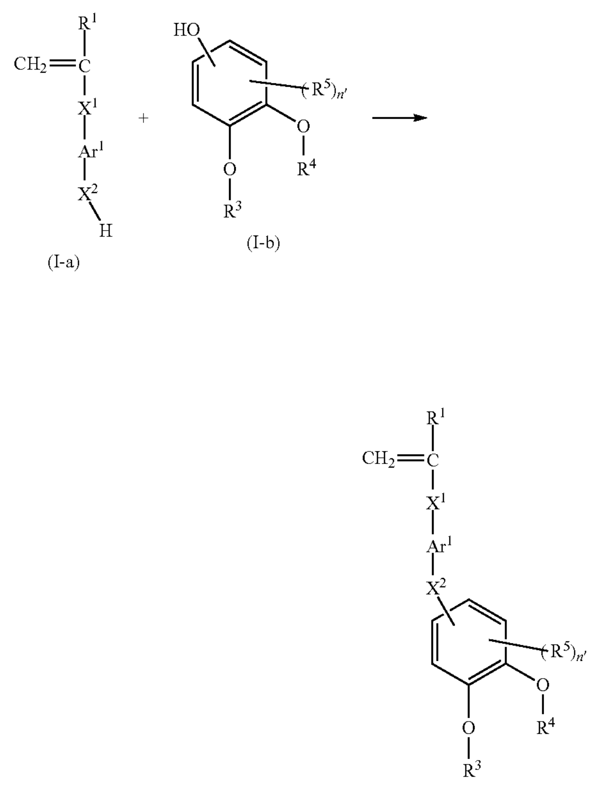

wherein all symbols are the same as defined above.

Examples of the solvent include methyl isobutyl ketone, chloroform, tetrahydrofuran and toluene.

Examples of the catalyst include base catalysts such as pyridine, dimethylaminopyridine, N-methylpiperidine, N-methylpyrrolidine and potassium hydroxide, or carbonyldiimidazole.

Examples of the compound represented by formula (I-a) include salts represented by the following formulas and the like, which are easily available on the market.

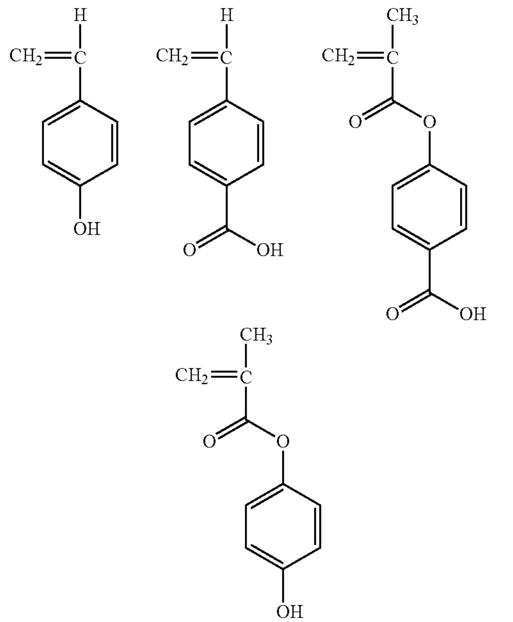

Examples of the compound represented by formula (I-b) include salts represented by the following formulas and the like, which are easily available on the market and can be easily produced by a known production method.

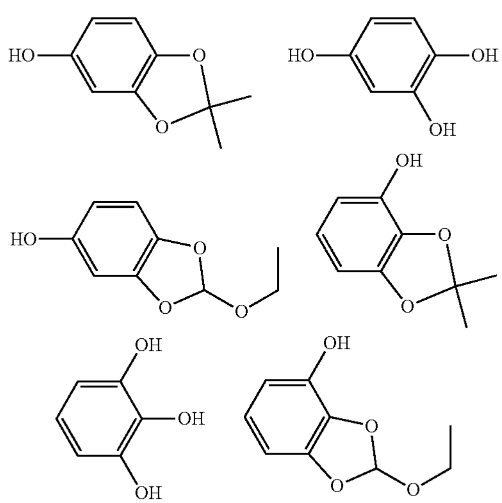

[Resist Composition]

The resist composition of the present invention preferably includes a resin (A) and an acid generator known in a resist field (hereinafter sometimes referred to as "acid generator (B)").

The resist composition of the present invention may further include a resin other than resin (A).

The resist composition of the present invention preferably includes a quencher such as a salt generating an acid having an acidity lower than that of an acid generated from an acid generator (hereinafter sometimes referred to as "quencher (C)"), and preferably includes a solvent (hereinafter sometimes referred to as "solvent (E)").

<Resin Other than Resin (A)>

The resin other than the resin (A) may be a resin which does not include at least one selected from the group consisting of a structural unit (I) or a structural unit (a1-1) and a structural unit (a1-2) Examples of such a resin include a resin in which the structural unit (I) is removed from the resin (A) (hereinafter sometimes referred to as "resin (AY)"), a resin in which at least one selected from the group consisting of the structural unit (a1-1) and the structural unit (a1-2) is removed from the resin (A) (hereinafter sometimes referred to as "resin (AZ)"), a resin composed only of a structural unit (a4) and a structural unit (a5) (hereinafter sometimes referred to as resin (X)) and the like.

The resin (X) is preferably a resin including a structural unit (a4).

In the resin (X), the content of the structural unit (a4) is preferably 30 mol % or more, more preferably 40 mol % or more, and still more preferably 45 mol % or more, based on the total of all structural units of the resin (X).

Examples of the structural unit which may be further included in the resin (X) include a structural unit (a2), a structural unit (a3) and structural units derived from other known monomers. The resin (X) is preferably a resin composed only of a structural unit (a4) and/or a structural unit (a5).

The respective structural unit constituting the resin (X) may be used alone, or two or more structural units may be used in combination. Using a monomer from which these structural units are derived, it is possible to produce by a known polymerization method (e.g., radical polymerization method). The content of the respective structural units included in the resin (X) can be adjusted according to the amount of the monomer used in the polymerization.

The weight-average molecular weight of the resin (AY), the resin (AZ) and the resin (X) is each independently preferably 6,000 or more (more preferably 7,000 or more), and 80,000 or less (more preferably 60,000 or less). The measurement means of the weight-average molecular weight of the resin (AY) and the resin (X) is the same as in the case of the resin (A).

When the resist composition of the present invention includes the resin (AY), the total content is usually 1 to 2,500 parts by mass (more preferably 10 to 1,000 parts by mass) based on 100 parts by mass of the resin (A).

When the resist composition includes the resin (X), the content is preferably 1 to 60 parts by mass, more preferably 1 to 50 parts by mass, still more preferably 1 to 40 parts by mass, yet more preferably 1 to 30 parts by mass, and further preferably 1 to 8 parts by mass, based on 100 parts by mass of the resin (A).

In the resist composition of the present invention, the resin (A) may be used in combination with the resin other than the resin (A), and when using in combination with the resin other than the resin (A), the resin (A) is preferably used in combination with a resin including a structural unit having an acid-labile group and/or a resin including a structural unit having a fluorine atom, and more preferably used in combination with the resin (AY), the resin (AZ) and/or the resin (X).

The content of the resin (A) in the resist composition is preferably 80% by mass or more and 99% by mass or less, and more preferably 90% by mass or more and 99% by mass or less, based on the solid component of the resist composition. When including the resin other than the resin (A), the total content of the resin (A) and the resin other than the resin (A) is preferably 80% by mass or more and 99% by mass or less, and more preferably 90% by mass or more and 99% by mass or less, based on the solid component of the resist composition. The solid component of the resist composition and the content of the resin thereto can be measured by a known analysis means such as liquid chromatography or gas chromatography.

<Acid Generator (B)>

Either nonionic or ionic acid generator may be used as the acid generator (B). Examples of the nonionic acid generator include sulfonate esters (e.g., 2-nitrobenzyl ester, aromatic sulfonate, oxime sulfonate, N-sulfonyloxyimide, sulfonyloxyketone, diazonaphthoquinone 4-sulfonate), sulfones (e.g., disulfone, ketosulfone, sulfonyldiazomethane) and the like. Typical examples of the ionic acid generator include onium salts containing an onium cation (e.g., diazonium salt, phosphonium salt, sulfonium salt, iodonium salt). Examples of the anion of the onium salt include sulfonic acid anion, sulfonylimide anion, sulfonylmethide anion and the like.

Specific examples of the acid generator (B) include compounds generating an acid upon exposure to radiation mentioned in JP 63-26653 A, JP 55-164824 A, JP 62-69263 A, JP 63-146038 A, JP 63-163452 A, JP 62-153853 A, JP 63-146029 A, U.S. Pat. Nos. 3,779,778, 3,849,137, DE Patent No. 3914407 and EP Patent No. 126,712. Compounds produced by a known method may also be used. Two or more acid generators (B) may also be used in combination.

The acid generator (B) is preferably a fluorine-containing acid generator, and more preferably a salt represented by formula (B1) (hereinafter sometimes referred to as "acid generator (B1)"):

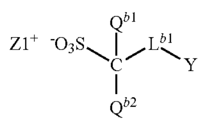

(B1)

wherein, in formula (B1), $Q^{b1}$ and $Q^{b2}$ each independently represent a fluorine atom or a perfluoroalkyl group having 1 to 6 carbon atoms, $L^{b1}$ represents a divalent saturated hydrocarbon group having 1 to 24 carbon atoms, —$CH_2$— included in the divalent saturated hydrocarbon group may be replaced by —O— or —CO—, and a hydrogen atom included in the divalent saturated hydrocarbon group may be substituted with a fluorine atom or a hydroxy group, Y represents a methyl group which may have a substituent or an alicyclic hydrocarbon group having 3 to 24 carbon atoms which may have a substituent, and —$CH_2$— included in the alicyclic hydrocarbon group may be replaced by —O—, —$S(O)_2$— or —CO—, and $Z1^+$ represents an organic cation.

Examples of the perfluoroalkyl group represented by $Q^{b1}$ and $Q^{b2}$ include a trifluoromethyl group, a perfluoroethyl group, a perfluoropropyl group, a perfluoroisopropyl group, a perfluorobutyl group, a perfluorosec-butyl group, a perfluorotert-butyl group, a perfluoropentyl group and a perfluorohexyl group.

Preferably, $Q^{b1}$ and $Q^{b2}$ are each independently a fluorine atom or trifluoromethyl group, and more preferably, both are fluorine atoms.

Examples of the divalent saturated hydrocarbon group in $L^{b1}$ include a linear alkanediyl group, a branched alkanediyl group, and a monocyclic or polycyclic divalent alicyclic saturated hydrocarbon group, or the divalent saturated hydrocarbon group may be a group formed by using two or more of these groups in combination.

Specific examples thereof include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group and a heptadecane-1,17-diyl group;

branched alkanediyl groups such as an ethane-1,1-diyl group, a propane-1,1-diyl group, a propane-1,2-diyl group, a propane-2,2-diyl group, a pentane-2,4-diyl group, a 2-methylpropane-1,3-diyl group, a 2-methylpropane-1,2-diyl group, a pentane-1,4-diyl group and a 2-methylbutane-1,4-diyl group;

monocyclic divalent alicyclic saturated hydrocarbon groups which are cycloalkanediyl groups such as a cyclobutane-1,3-diyl group, a cyclopentane-1,3-diyl group, a cyclohexane-1,4-diyl group and a cyclooctane-1,5-diyl group; and polycyclic divalent alicyclic saturated hydrocarbon groups such as a norbornane-1,4-diyl group, a norbornane-2,5-diyl group, an adamantane-1,5-diyl group and an adamantane-2,6-diyl group.

The group in which —$CH_2$— included in the divalent saturated hydrocarbon group represented by $L^{b1}$ is replaced by —O— or —CO— includes, for example, a group represented by any one of formula (b1-1) to formula (b1-3). In groups represented by formula (b1-1) to formula (b1-3) and groups represented by formula (b1-4) to formula (b1-11) which are specific examples thereof, * and ** represent a bond, and * represents a bond to —Y.

(b1-1)

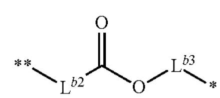

(b1-2)

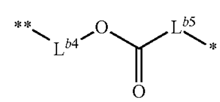

(b1-3)

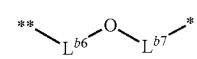

In formula (b1-1), $L^{b2}$ represents a single bond or a divalent saturated hydrocarbon group having 1 to 22 carbon atoms, and a hydrogen atom included in the saturated hydrocarbon group may be substituted with a fluorine atom, $L^{b3}$ represents a single bond or a divalent saturated hydrocarbon group having 1 to 22 carbon atoms, a hydrogen atom included in the saturated hydrocarbon group may be substituted with a fluorine atom or a hydroxy group, and —$CH_2$— included in the saturated hydrocarbon group may be replaced by —O— or —CO—, and the total number of carbon atoms of $L^{b2}$ and $L^{b3}$ is 22 or less.

In formula (b1-2), $L^{b4}$ represents a single bond or a divalent saturated hydrocarbon group having 1 to 22 carbon atoms, and a hydrogen atom included in the saturated hydrocarbon group may be substituted with a fluorine atom, $L^{b5}$ represents a single bond or a divalent saturated hydrocarbon group having 1 to 22 carbon atoms, a hydrogen atom included in the saturated hydrocarbon group may be substituted with a fluorine atom or a hydroxy group, and —$CH_2$— included in the saturated hydrocarbon group may be replaced by —O— or —CO—, and the total number of carbon atoms of $L^{b4}$ and $L^{b5}$ is 22 or less.

In formula (b1-3), $L^{b6}$ represents a single bond or a divalent saturated hydrocarbon group having 1 to 23 carbon atoms, and a hydrogen atom included in the saturated hydrocarbon group may be substituted with a fluorine atom or a hydroxy group, $L^{b7}$ represents a single bond or a divalent saturated hydrocarbon group having 1 to 23 carbon atoms, a hydrogen atom included in the saturated hydrocarbon group may be substituted with a fluorine atom or a hydroxy group, and —$CH_2$— included in the saturated hydrocarbon group may be replaced by —O— or —CO—, and the total number of carbon atoms of $L^{b6}$ and $L^{b7}$ is 23 or less.

* and ** represent a bond, and * represents a bond to Y.

In groups represented by formula (b1-1) to formula (b1-3), when —$CH_2$— included in the saturated hydrocarbon group is replaced by —O— or —CO—, the number of carbon atoms before replacement is taken as the number of carbon atoms of the saturated hydrocarbon group.

Examples of the divalent saturated hydrocarbon group include those which are the same as the saturated hydrocarbon group of $L^{b1}$.

$L^{b2}$ is preferably a single bond.

$L^{b3}$ is preferably a divalent saturated hydrocarbon group having 1 to 4 carbon atoms.

$L^{b4}$ is preferably a divalent saturated hydrocarbon group having 1 to 8 carbon atoms, and a hydrogen atom included in the divalent saturated hydrocarbon group may be substituted with a fluorine atom.

$L^{b5}$ is preferably a single bond or a divalent saturated hydrocarbon group having 1 to 8 carbon atoms.

$L^{b6}$ is preferably a single bond or a divalent saturated hydrocarbon group having 1 to 4 carbon atoms, and a hydrogen atom included in the saturated hydrocarbon group may be substituted with a fluorine atom.

$L^{b7}$ is preferably a single bond or a divalent saturated hydrocarbon group having 1 to 18 carbon atoms, a hydrogen atom included in the saturated hydrocarbon group may be substituted with a fluorine atom or a hydroxy group, and —$CH_2$— included in the divalent saturated hydrocarbon group may be replaced by —O— or —CO—.

The group in which —$CH_2$— included in the divalent saturated hydrocarbon group represented by $L^{b1}$ is replaced by —O— or —CO— is preferably a group represented by formula (b1-1) or formula (b1-3).

Examples of the group represented by formula (b1-1) include groups represented by formula (b1-4) to formula (b1-8):

(b1-4)

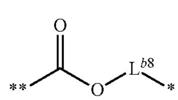

-continued (b1-5)

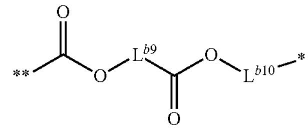

(b1-6)

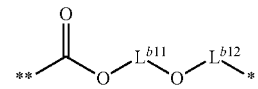

(b1-7)

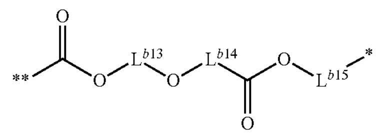

(b1-8)

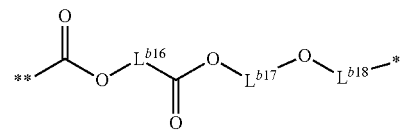

In formula (b1-4), $L^{b8}$ represents a single bond or a divalent saturated hydrocarbon group having 1 to 22 carbon atoms, and a hydrogen atom included in the saturated hydrocarbon group may be substituted with a fluorine atom or a hydroxy group.

In formula (b1-5), $L^{b9}$ represents a divalent saturated hydrocarbon group having 1 to 20 carbon atoms, and —$CH_2$— included in the divalent saturated hydrocarbon group may be replaced by —O— or —CO—, $L^{b10}$ represents a single bond or a saturated hydrocarbon group having 1 to 19 carbon atoms, and a hydrogen atom included in the divalent saturated hydrocarbon group may be substituted with a fluorine atom or a hydroxy group, and the total number of carbon atoms of $L^{b9}$ and $L^{b10}$ is 20 or less.

In formula (b1-6), $L^{b11}$ represents a divalent saturated hydrocarbon group having 1 to 21 carbon atoms, $L^{b12}$ represents a single bond or a divalent saturated hydrocarbon group having 1 to 20 carbon atoms, and a hydrogen atom included in the divalent saturated hydrocarbon group may be substituted with a fluorine atom or a hydroxy group, and the total number of carbon atoms of $L^{b11}$ and $L^{b12}$ is 21 or less.

In formula (b1-7), $L^{b13}$ represents a divalent saturated hydrocarbon group having 1 to 19 carbon atoms, $L^{b14}$ represents a single bond or a divalent saturated hydrocarbon group having 1 to 18 carbon atoms, and —$CH_2$— included in the divalent saturated hydrocarbon group may be replaced by —O— or —CO—, $L^{b15}$ represents a single bond or a divalent saturated hydrocarbon group having 1 to 18 carbon atoms, and a hydrogen atom included in the divalent saturated hydrocarbon group may be substituted with a fluorine atom or a hydroxy group, and the total number of carbon atoms of $L^{b13}$ to $L^{b15}$ is 19 or less.

In formula (b1-8), $L^{b16}$ represents a divalent saturated hydrocarbon group having 1 to 18 carbon atoms, and —$CH_2$— included in the divalent saturated hydrocarbon group may be replaced by —O— or —CO—, $L^{b17}$ represents a divalent saturated hydrocarbon group having 1 to 18 carbon atoms, $L^{b18}$ represents a single bond or a divalent saturated hydrocarbon group having 1 to 17 carbon atoms, and a hydrogen atom included in the divalent saturated hydrocarbon group may be substituted with a fluorine atom or a hydroxy group, the total number of carbon atoms of $L^{b16}$ to $L^{b18}$ is 19 or less, and

* and ** represent a bond, and * represents a bond to Y.

$L^{b8}$ is preferably a divalent saturated hydrocarbon group having 1 to 4 carbon atoms.

$L^{b9}$ is preferably a divalent saturated hydrocarbon group having 1 to 8 carbon atoms.

$L^{b10}$ is preferably a single bond or a divalent saturated hydrocarbon group having 1 to 19 carbon atoms, and more preferably a single bond or a divalent saturated hydrocarbon group having 1 to 8 carbon atoms.

$L^{b11}$ is preferably a divalent saturated hydrocarbon group having 1 to 8 carbon atoms.

$L^{b12}$ is preferably a single bond or a divalent saturated hydrocarbon group having 1 to 8 carbon atoms.

$L^{b13}$ is preferably a divalent saturated hydrocarbon group having 1 to 12 carbon atoms.

$L^{b14}$ is preferably a single bond or a divalent saturated hydrocarbon group having 1 to 6 carbon atoms.

$L^{b15}$ is preferably a single bond or a divalent saturated hydrocarbon group having 1 to 18 carbon atoms, and more preferably a single bond or a divalent saturated hydrocarbon group having 1 to 8 carbon atoms.

$L^{b16}$ is preferably a divalent saturated hydrocarbon group having 1 to 12 carbon atoms.

$L^{b17}$ is preferably a divalent saturated hydrocarbon group having 1 to 6 carbon atoms.

$L^{b18}$ is preferably a single bond or a divalent saturated hydrocarbon group having 1 to 17 carbon atoms, and more preferably a single bond or a divalent saturated hydrocarbon group having 1 to 4 carbon atoms.

Examples of the group represented by formula (b1-3) include groups represented by formula (b1-9) to formula (b1-11).

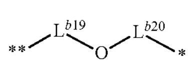

(b1-9)

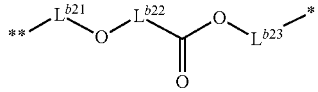

(b1-10)

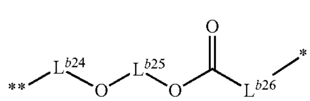

(b1-11)

In formula (b1-9), $L^{b19}$ represents a single bond or a divalent saturated hydrocarbon group having 1 to 23 carbon atoms, and a hydrogen atom included in the saturated hydrocarbon group may be substituted with a fluorine atom, $L^{b20}$ represents a single bond or a divalent saturated hydrocarbon group having 1 to 23 carbon atoms, and a hydrogen atom included in the saturated hydrocarbon group may be substituted with a fluorine atom, a hydroxy group or an alkylcarbonyloxy group, —$CH_2$— included in the alkylcarbonyloxy group may be replaced by —O— or —CO—, and a hydrogen atom included in the alkylcarbonyloxy group may be substituted with a hydroxy group, and the total number of carbon atoms of $L^{b19}$ and $L^{b20}$ is 23 or less.

In formula (b1-10), $L^{b21}$ represents a single bond or a divalent saturated hydrocarbon group having 1 to 21 carbon atoms, and a hydrogen atom included in the saturated hydrocarbon group may be substituted with a fluorine atom, $L^{b22}$ represents a single bond or a divalent saturated hydrocarbon group having 1 to 21 carbon atoms, $L^{b23}$ represents a single bond or a divalent saturated hydrocarbon group having 1 to 21 carbon atoms, and a hydrogen atom included in the saturated hydrocarbon group may be substituted with a fluorine atom, a hydroxy group or an alkylcarbonyloxy group, —$CH_2$— included in the alkylcarbonyloxy group may be replaced by —O— or —CO—, and a hydrogen atom included in the alkylcarbonyloxy group may be substituted with a hydroxy group, and the total number of carbon atoms of $L^{b21}$, $L^{b22}$ and $L^{b23}$ is 21 or less.

In formula (b1-11), $L^{b24}$ represents a single bond or a divalent saturated hydrocarbon group having 1 to 20 carbon atoms, and a hydrogen atom included in the saturated hydrocarbon group may be substituted with a fluorine atom, $L^{b25}$ represents a divalent saturated hydrocarbon group having 1 to 21 carbon atoms, $L^{b26}$ represents a single bond or a divalent saturated hydrocarbon group having 1 to 20 carbon atoms, a hydrogen atom included in the saturated hydrocarbon group may be substituted with a fluorine atom, a hydroxy group or an alkylcarbonyloxy group, —$CH_2$— included in the alkylcarbonyloxy group may be replaced by —O— or —CO—, and a hydrogen atom included in the alkylcarbonyloxy group may be substituted with a hydroxy group, the total number of carbon atoms of $L^{b24}$, $L^{b25}$ and $L^{b26}$ is 21 or less, and

* and ** represent a bond, and * represents a bond to Y.

In the group represented by formula (b1-9) to the group represented by formula (b1-11), when a hydrogen atom included in the saturated hydrocarbon group is substituted with an alkylcarbonyloxy group, the number of carbon atoms before substitution is taken as the number of carbon atoms of the saturated hydrocarbon group.

Examples of the alkylcarbonyloxy group include an acetyloxy group, a propionyloxy group, a butyryloxy group, a cyclohexylcarbonyloxy group, an adamantylcarbonyloxy group and the like.

Examples of the group represented by formula (b1-4) include the followings:

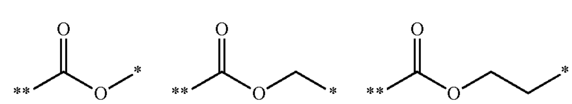

-continued
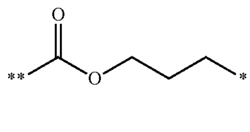
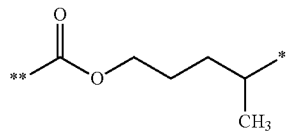
wherein * and ** represent a bond, and * represents a bond to Y.
Examples of the group represented by formula (b1-5) include the followings:
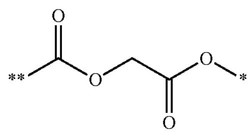
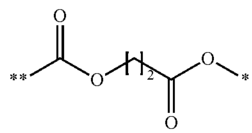
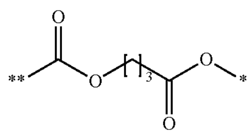
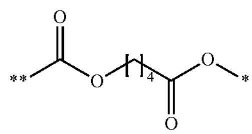
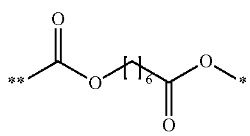
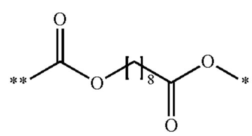
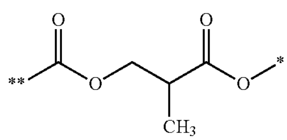
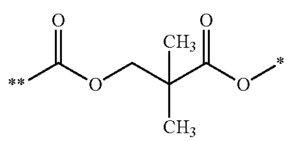
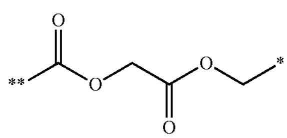
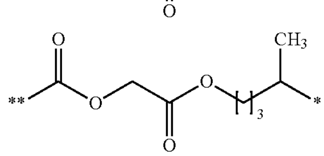
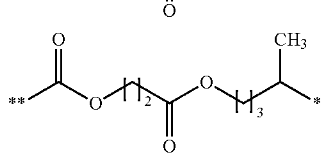
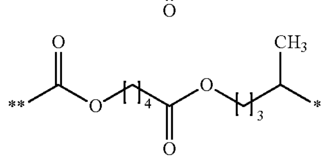
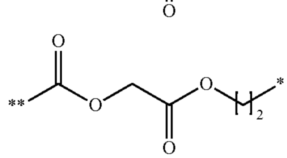
-continued
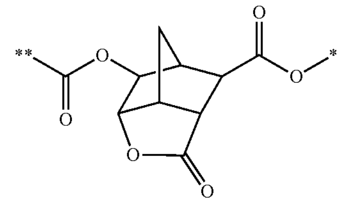
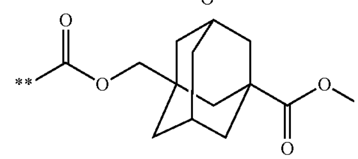
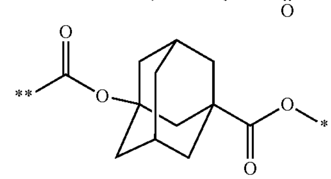
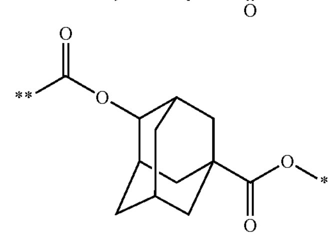
wherein * and ** represent a bond, and * represents a bond to Y.
Examples of the group represented by formula (b1-6) include the followings:
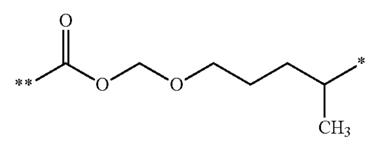
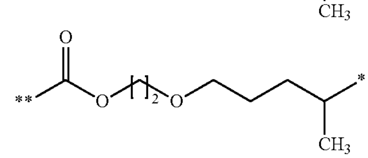
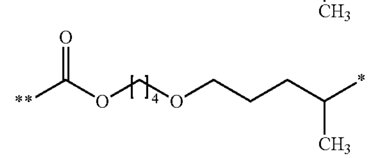
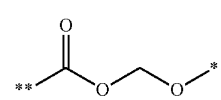
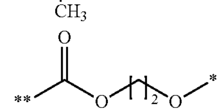
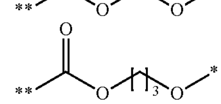
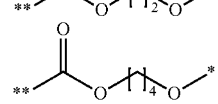
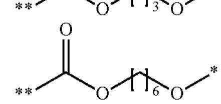
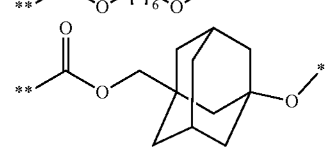

-continued

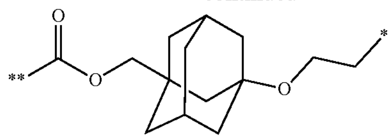

wherein * and ** represent a bond, and * represents a bond to Y.

Examples of the group represented by formula (b1-7) include the followings:

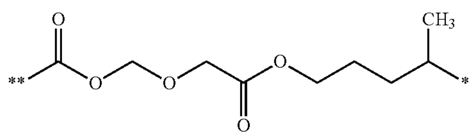

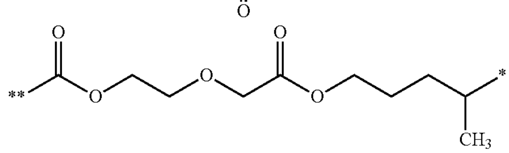

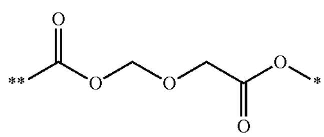

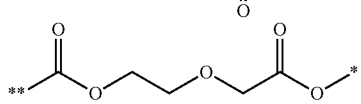

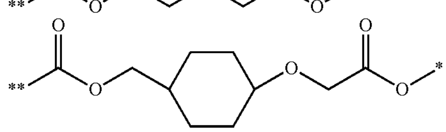

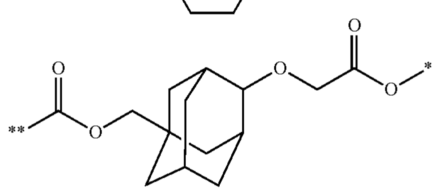

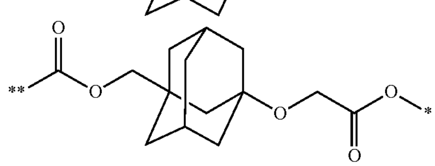

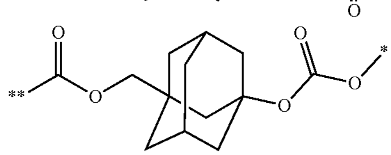

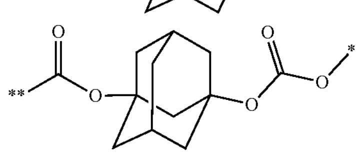

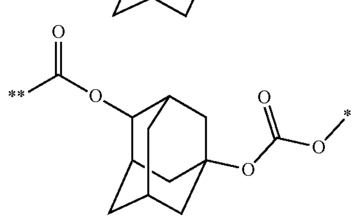

-continued

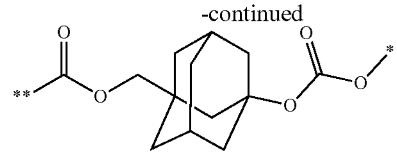

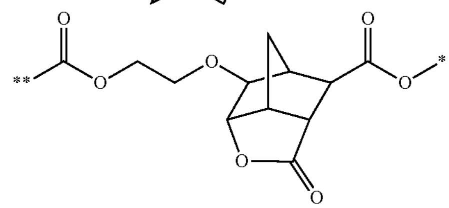

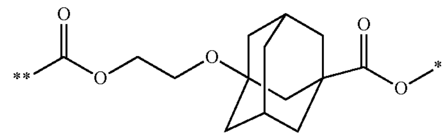

wherein * and ** represent a bond, and * represents a bond to Y.

Examples of the group represented by formula (b1-8) include the followings:

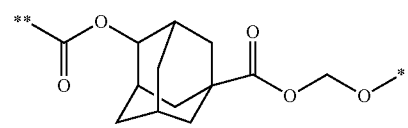

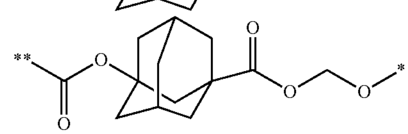

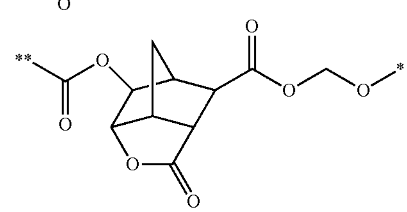

wherein * and ** represent a bond, and * represents a bond to Y.

Examples of the group represented by formula (b1-2) include the followings:

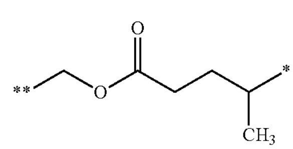

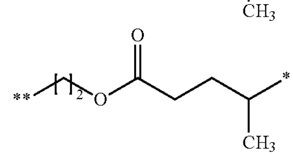

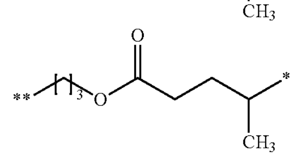

-continued
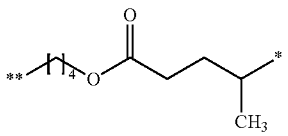
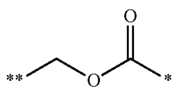
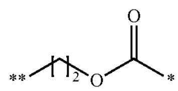
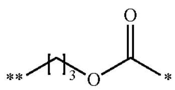
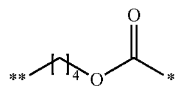
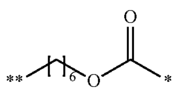
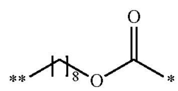
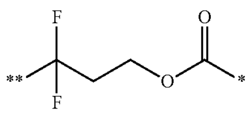
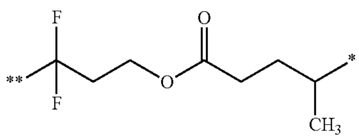
wherein * and ** represent a bond, and * represents a bond to Y.
Examples of the group represented by formula (b1-9) include the followings:
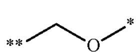
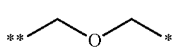
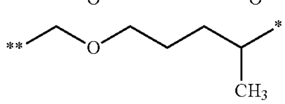
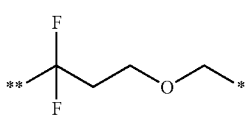
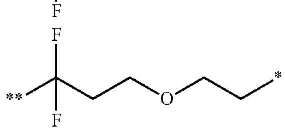
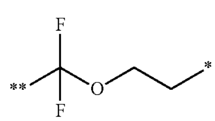
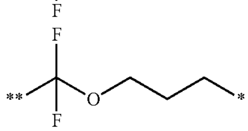
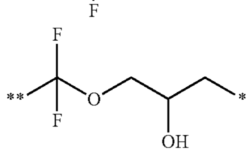
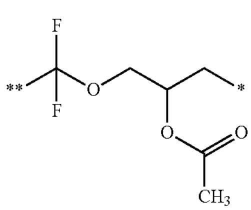
-continued
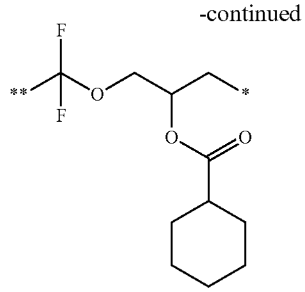
wherein * and ** represent a bond, and * represents a bond to Y.
Examples of the group represented by formula (b1-10) include the followings:
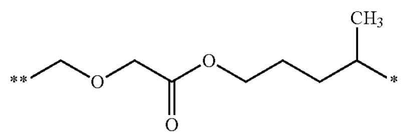
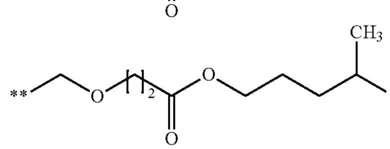
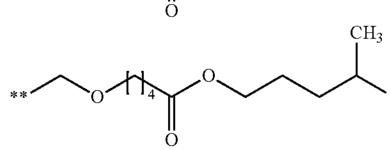
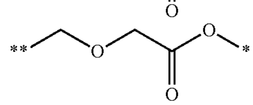
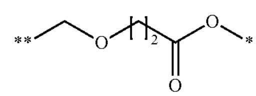
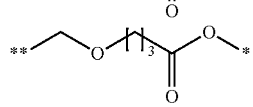
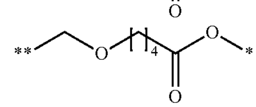
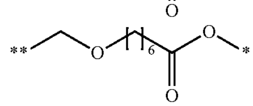
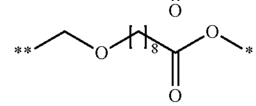
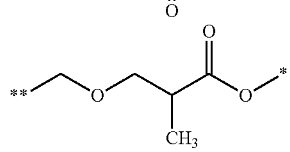
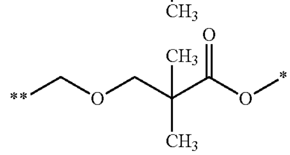
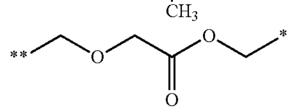
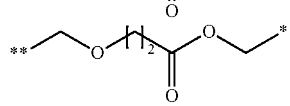
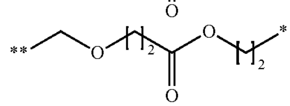
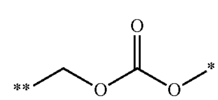
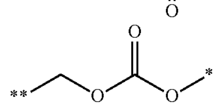
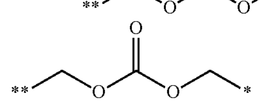

-continued
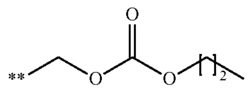
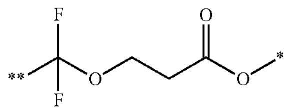
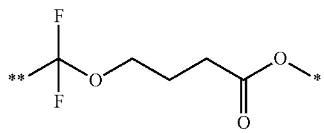
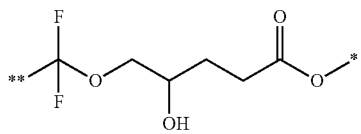
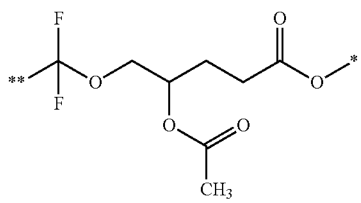
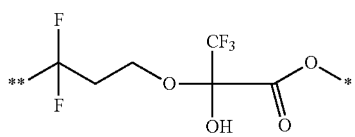
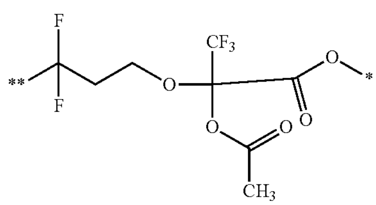
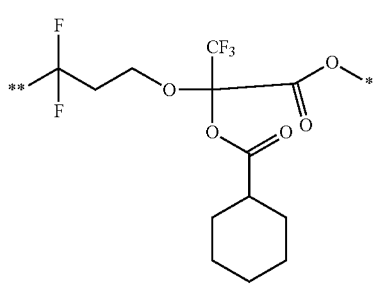
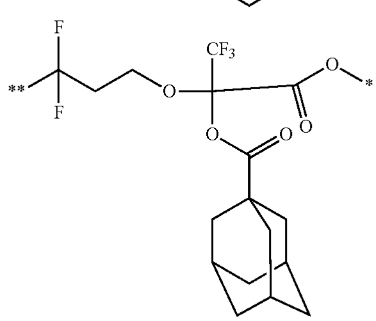
-continued
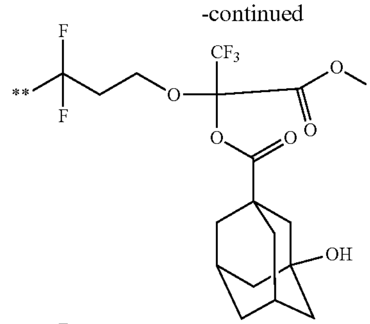
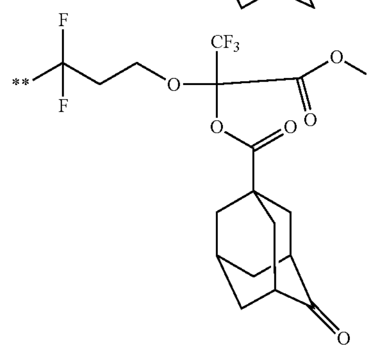
wherein * and ** represent a bond, and * represents a bond to Y.
Examples of the group represented by formula (b1-11) include the followings:
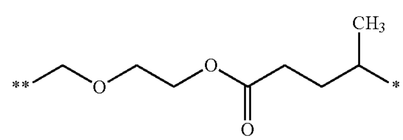
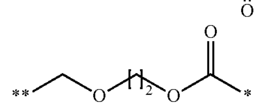
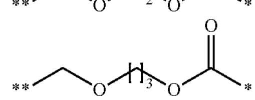
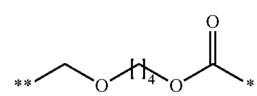
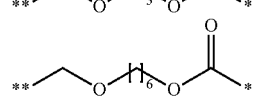
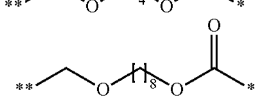
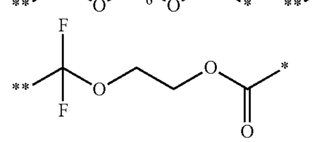
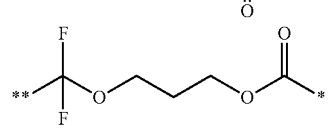
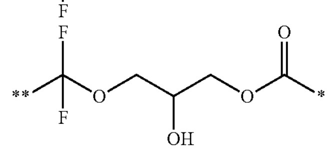
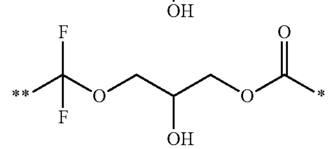

-continued

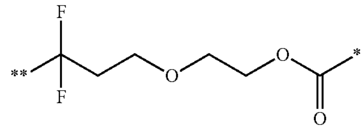

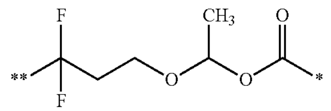

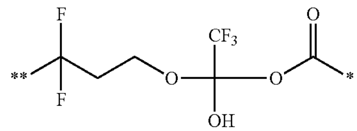

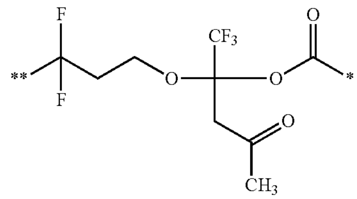

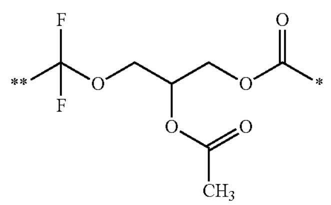

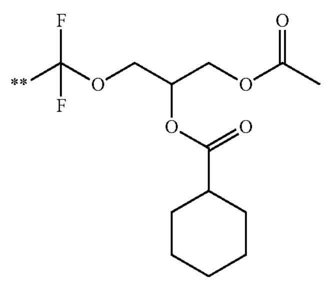

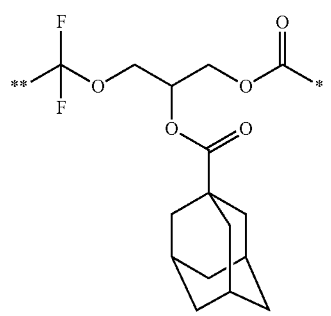

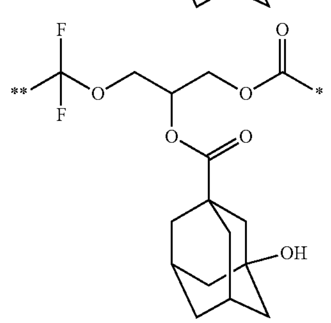

-continued

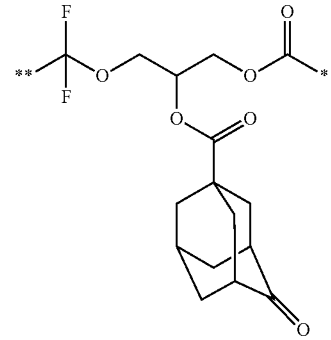

wherein * and ** represent a bond, and * represents a bond to Y.

Examples of the alicyclic hydrocarbon group represented by Y include groups represented by formula (Y1) to formula (Y11) and formula (Y36) to formula (Y38).

When —$CH_2$— included in the alicyclic hydrocarbon group represented by Y is replaced by —O—, —$S(O)_2$— or —CO—, the number may be 1, or 2 or more. Examples of such group include groups represented by formula (Y12) to formula (Y35) and formula (Y39) and formula (Y43) * represents a bond to $L^{b1}$.

(Y1)

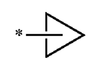

(Y2)

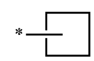

(Y3)

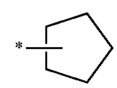

(Y4)

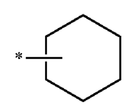

(Y5)

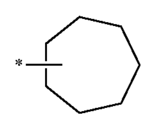

(Y6)

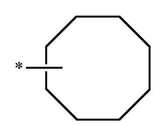

(Y7)

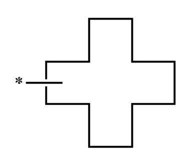

(Y8)

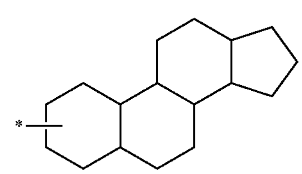

-continued
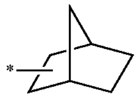
(Y9)
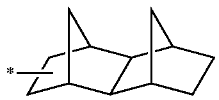
(Y10)
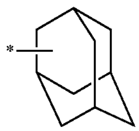
(Y11)
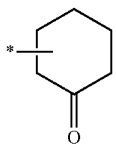
(Y12)
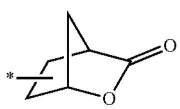
(Y13)
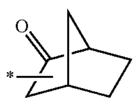
(Y14)
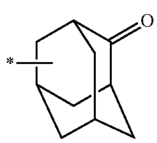
(Y15)
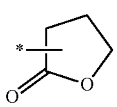
(Y16)
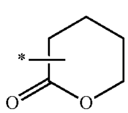
(Y17)
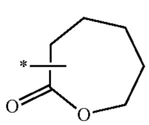
(Y18)
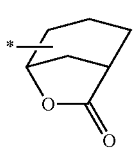
(Y19)
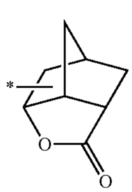
(Y20)
-continued
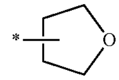
(Y21)
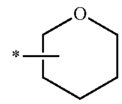
(Y22)
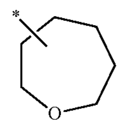
(Y23)
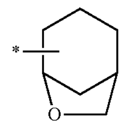
(Y24)
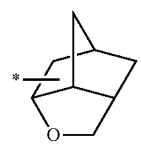
(Y25)
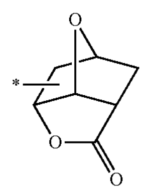
(Y26)
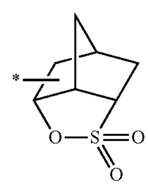
(Y27)
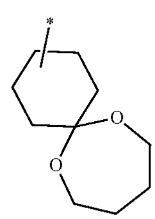
(Y28)
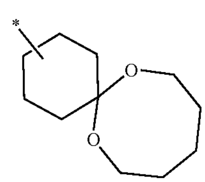
(Y29)
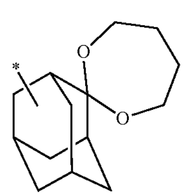
(Y30)

-continued (Y31)

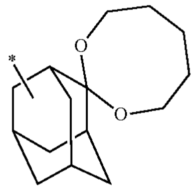

(Y32)

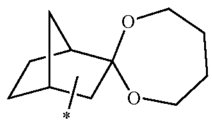

(Y33)

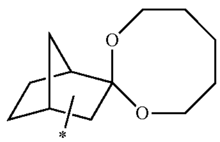

(Y34)

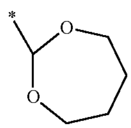

(Y35)

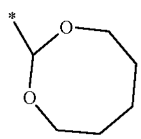

(Y36)

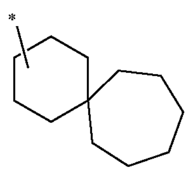

(Y37)

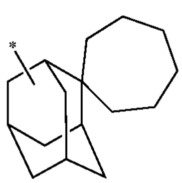

(Y38)

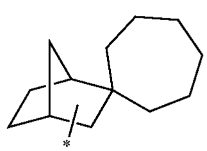

(Y39)

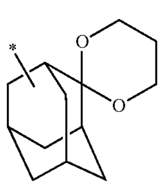

(Y40)

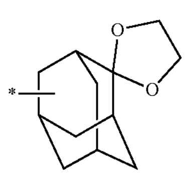

-continued (Y41)

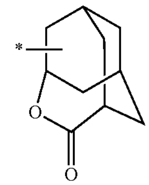

(Y42)

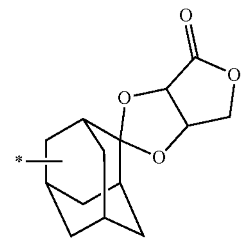

(Y43)

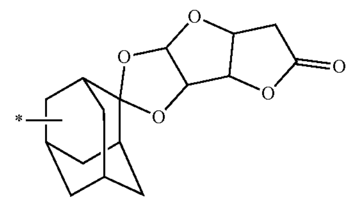

The alicyclic hydrocarbon group represented by Y is preferably a group represented by any one of formula (Y1) to formula (Y20), formula (Y26), formula (Y27), formula (Y30), formula (Y31) and formula (Y39) to formula (Y43), more preferably a group represented by formula (Y11), formula (Y15), formula (Y16), formula (Y20), formula (Y26), formula (Y27), formula (Y30), formula (Y31), formula (Y39), formula (Y40), formula (Y42) or formula (Y43), and still more preferably a group represented by formula (Y11), formula (Y15), formula (Y20), formula (Y26), formula (Y27), formula (Y30), formula (Y31), formula (Y39), formula (Y40), formula (Y42) or formula (Y43).

When the alicyclic hydrocarbon group represented by Y is a spiro ring containing an oxygen atom, such as formula (Y28) to formula (Y35), formula (Y39) to formula (Y40), formula (Y42) or formula (Y43), the alkanediyl group between two oxygen atoms preferably includes one or more fluorine atoms. Of alkanediyl groups included in a ketal structure, it is preferable that a methylene group adjacent to the oxygen atom is not substituted with a fluorine atom.

Examples of the substituent of the methyl group represented by Y include a halogen atom, a hydroxy group, an alicyclic hydrocarbon group having 3 to 16 carbon atoms, an aromatic hydrocarbon group having 6 to 18 carbon atoms, a glycidyloxy group, a $—(CH_2)_{ja}—CO—O—R^{b1}$ group or a $—(CH_2)_{ja}—O—CO—R^{b1}$ group (in which $R^{b1}$ represents an alkyl group having 1 to 16 carbon atoms, an alicyclic hydrocarbon group having 3 to 16 carbon atoms, an aromatic hydrocarbon group having 6 to 18 carbon atoms, or groups obtained by combining these groups, $—CH_2—$ included in the alkyl group and the alicyclic hydrocarbon group may be replaced by —O—, $—SO_2—$ or —CO—, a hydrogen atom included in the alkyl group, the alicyclic hydrocarbon group and the aromatic hydrocarbon group may be substituted with a hydroxy group or a fluorine atom, and ja represents an integer of 0 to 4).

Examples of the substituent of the alicyclic hydrocarbon group represented by Y include a halogen atom, a hydroxy group, an alkyl group having 1 to 16 carbon atoms which may be substituted with a hydroxy group (—$CH_2$— included in the alkyl group may be replaced by —O— or —CO—), an alicyclic hydrocarbon group having 3 to 16 carbon atoms, an aromatic hydrocarbon group having 6 to 18 carbon atoms, an aralkyl group having 7 to 21 carbon atoms, a glycidyloxy group, a —$(CH_2)_{ja}$—CO—O—$R^{b1}$ group or a —$(CH_2)_{ja}$—O—CO—$R^{b1}$ group (in which $R^{b1}$ represents an alkyl group having 1 to 16 carbon atoms, an alicyclic hydrocarbon group having 3 to 16 carbon atoms, an aromatic hydrocarbon group having 6 to 18 carbon atoms, or groups obtained by combining these groups, —$CH_2$— included in the alkyl group and the alicyclic hydrocarbon group may be replaced by —O—, —$SO_2$— or —CO—, a hydrogen atom included in the alkyl group, the alicyclic hydrocarbon group and the aromatic hydrocarbon group may be substituted with a hydroxy group or a fluorine atom, and ja represents an integer of 0 to 4).

Examples of the halogen atom include a fluorine atom, a chlorine atom, a bromine atom and an iodine atom.

Examples of the alicyclic hydrocarbon group include a cyclopentyl group, a cyclohexyl group, a methylcyclohexyl group, a dimethylcyclohexyl group, a cycloheptyl group, a cyclooctyl group, a norbornyl group, an adamantyl group and the like. The alicyclic hydrocarbon group may have a chain hydrocarbon group, and examples thereof include a methylcyclohexyl group, a dimethylcyclohexyl group and the like. The number of carbon atoms of the alicyclic hydrocarbon group is preferably 3 to 12, and more preferably 3 to 10.

Examples of the aromatic hydrocarbon group include aryl groups such as a phenyl group, a naphthyl group, an anthryl group, a biphenyl group and a phenanthryl group. The aromatic hydrocarbon group may have a chain hydrocarbon group or an alicyclic hydrocarbon group, and examples thereof include an aromatic hydrocarbon group having a chain hydrocarbon group having 1 to 18 carbon atoms (a tolyl group, a xylyl group, a cumenyl group, a mesityl group, a p-methylphenyl group, a p-ethylphenyl group, a p-tert-butylphenyl group, a 2,6-diethylphenyl group, a 2-methyl-6-ethylphenyl group, etc.), and an aromatic hydrocarbon group having an alicyclic hydrocarbon group having 3 to 18 carbon atoms (a p-adamantylphenyl group, a p-cyclohexylphenyl group, etc.). The number of carbon atoms of the aromatic hydrocarbon group is preferably 6 to 14, and more preferably 6 to 10.

Examples of the alkyl group include a methyl group, an ethyl group, a propyl group, an isopropyl group, a butyl group, a sec-butyl group, a tert-butyl group, a pentyl group, a hexyl group, a heptyl group, a 2-ethylhexyl group, an octyl group, a nonyl group, a decyl group, an undecyl group, a dodecyl group and the like. The number of carbon atoms of the alkyl group is preferably 1 to 12, more preferably 1 to 6, and still more preferably 1 to 4.

Examples of the alkyl group substituted with a hydroxy group include hydroxyalkyl groups such as a hydroxymethyl group and a hydroxyethyl group.

Examples of the aralkyl group include a benzyl group, a phenethyl group, a phenylpropyl group, a naphthylmethyl group and a naphthylethyl group.

Examples of the group in which —$CH_2$— included in the alkyl group is replaced by —O—, —$S(O)_2$— or —CO— include an alkoxy group, an alkoxycarbonyl group, an alkylcarbonyl group, an alkylcarbonyloxy group, or groups obtained by combining these groups.

Examples of the alkoxy group include a methoxy group, an ethoxy group, a propoxy group, a butoxy group, a pentyloxy group, a hexyloxy group, a heptyloxy group, an octyloxy group, a decyloxy group and a dodecyloxy group. The number of carbon atoms of the alkoxy group is preferably 1 to 12, more preferably 1 to 6, and still more preferably 1 to 4.

Examples of the alkoxycarbonyl group include a methoxycarbonyl group, an ethoxycarbonyl group, a butoxycarbonyl group and the like. The number of carbon atoms of the alkoxycarbonyl group is preferably 2 to 12, more preferably 2 to 6, and still more preferably 2 to 4.

Examples of the alkylcarbonyl group include an acetyl group, a propionyl group and a butyryl group. The number of carbon atoms of the alkylcarbonyl group is preferably 2 to 12, more preferably 2 to 6, and still more preferably 2 to 4.

Examples of the alkylcarbonyloxy group include an acetyloxy group, a propionyloxy group, a butyryloxy group and the like. The number of carbon atoms of the alkylcarbonyloxy group is preferably 2 to 12, more preferably 2 to 6, and still more preferably 2 to 4.

Examples of the combined group include a group obtained by combining an alkoxy group and an alkyl group, a group obtained by combining an alkoxy group and an alkoxy group, a group obtained by combining an alkoxy group and an alkylcarbonyl group, a group obtained by combining an alkoxy group and an alkylcarbonyloxy group and the like.

Examples of the group obtained by combining an alkoxy group and an alkyl group include alkoxyalkyl groups such as a methoxymethyl group, a methoxyethyl group, an ethoxyethyl group and an ethoxymethyl group. The number of carbon atoms of the alkoxyalkyl group is preferably 2 to 12, more preferably 2 to 6, and still more preferably 2 to 4.

Examples of the group obtained by combining an alkoxy group and an alkoxy group include alkoxyalkoxy groups such as a methoxymethoxy group, a methoxyethoxy group, an ethoxymethoxy group and an ethoxyethoxy group. The number of carbon atoms of the alkoxyalkoxy group is preferably 2 to 12, more preferably 2 to 6, and still more preferably 2 to 4.

Examples of the group obtained by combining an alkoxy group and an alkylcarbonyl group include alkoxyalkylcarbonyl groups such as a methoxyacetyl group, a methoxypropionyl group, an ethoxyacetyl group and an ethoxypropionyl group. The number of carbon atoms of the alkoxyalkylcarbonyl group is preferably 3 to 13, more preferably 3 to 7, and still more preferably 3 to 5.

Examples of the group obtained by combining an alkoxy group and an alkylcarbonyloxy group include alkoxyalkylcarbonyloxy groups such as a methoxyacetyloxy group, a methoxypropionyloxy group, an ethoxyacetyloxy group and an ethoxypropionyloxy group. The number of carbon atoms of the alkoxyalkylcarbonyloxy group is preferably 3 to 13, more preferably 3 to 7, and still more preferably 3 to 5.

Examples of the group in which —$CH_2$— included in the alicyclic hydrocarbon group is replaced by —O—, —$S(O)_2$— or —CO— include groups represented by formula (Y12) to formula (Y35) and formula (Y39) to formula (Y43).
Examples of Y include the followings.
(Y100)
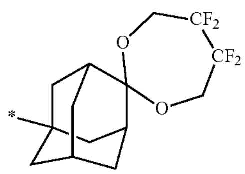
(Y101)
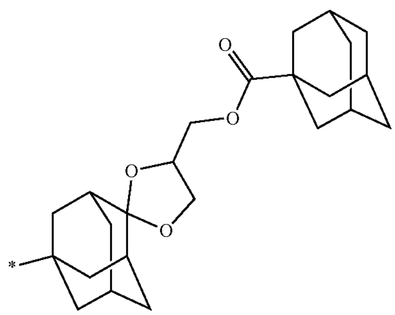
(Y102)
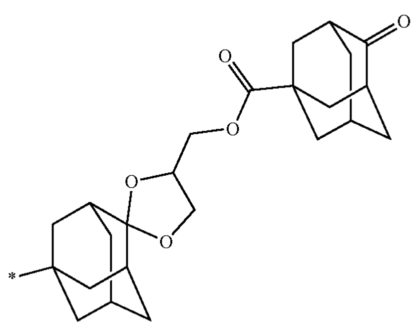
(Y103)
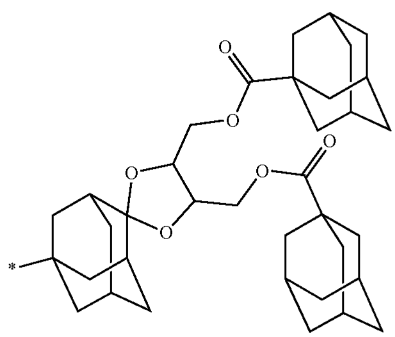
(Y104)
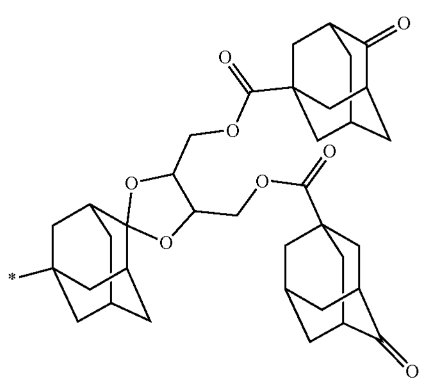
-continued
(Y105)
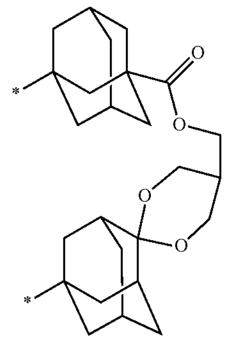
(Y106)
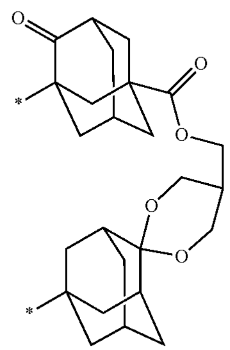
(Y107)
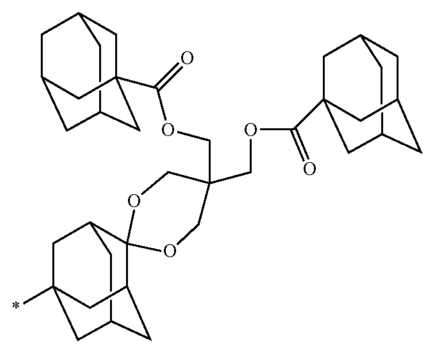
(Y108)
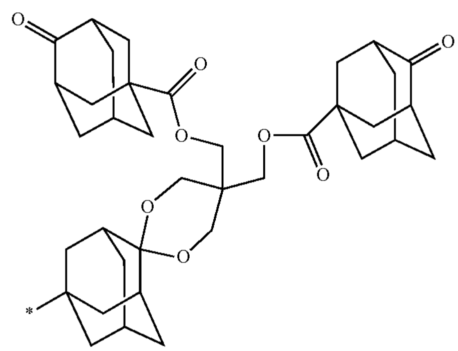
(Y109)
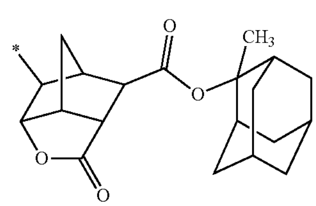

-continued
(Y110)
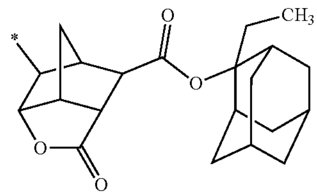
(Y111)
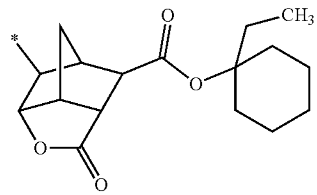
(Y42)
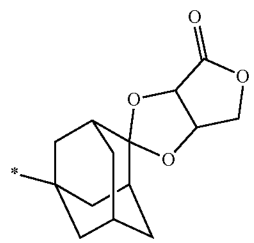
(Y112)
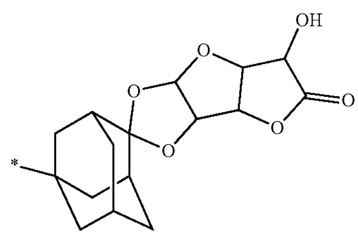
(Y113)
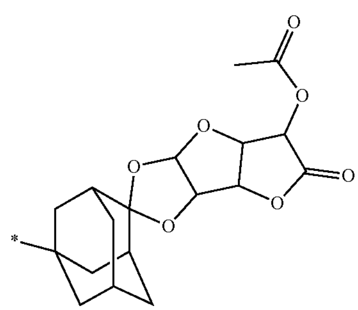
(Y114)
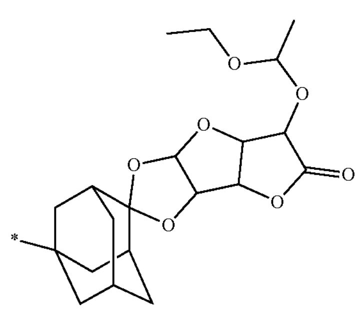
-continued
(Y115)
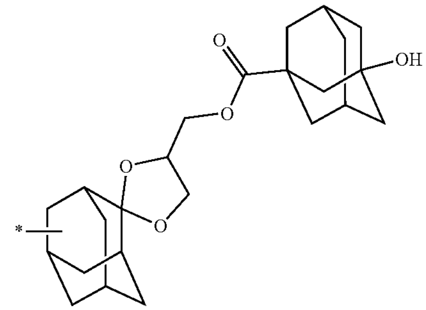
(Y116)
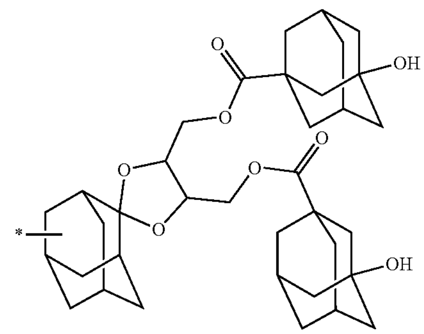
(Y11)
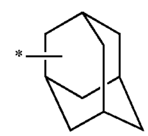
(Y4)
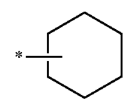
(Y117)
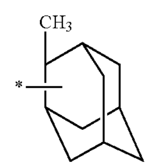
(Y118)
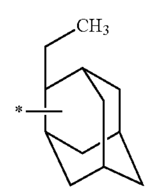
(Y119)
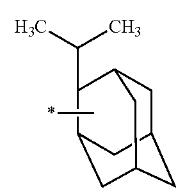
(Y120)
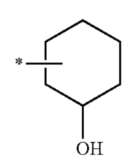

-continued
(Y121)
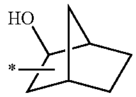
(Y122)
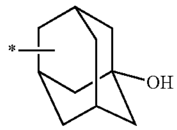
(Y123)
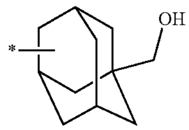
(Y15)
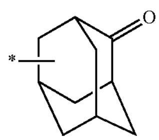
(Y124)
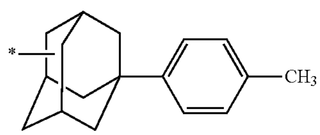
(Y125)
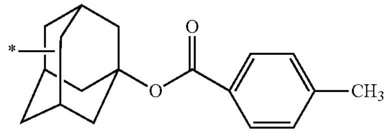
(Y126)
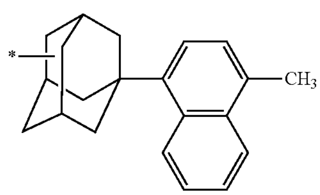
(Y127)
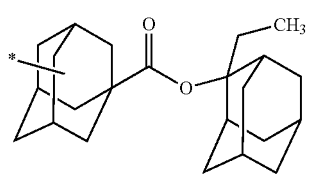
(Y128)
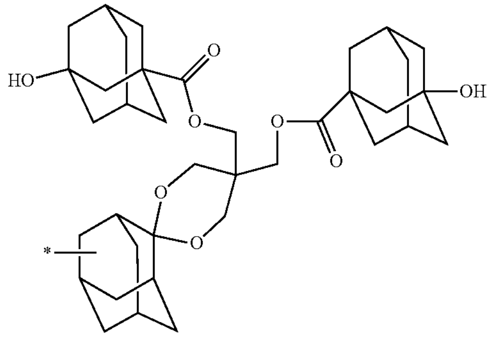
-continued
(Y129)
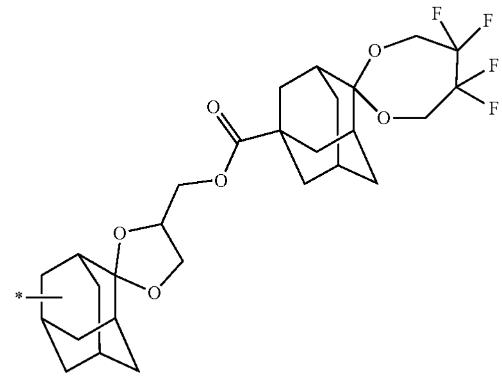
(Y130)
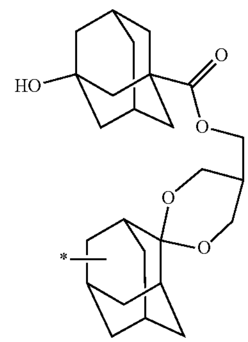
(Y131)
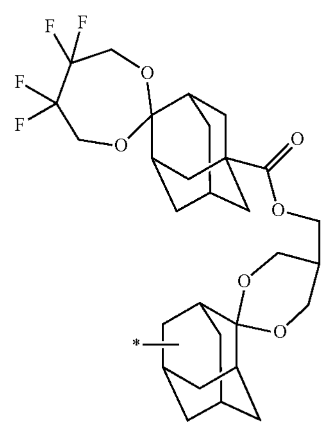
(Y132)
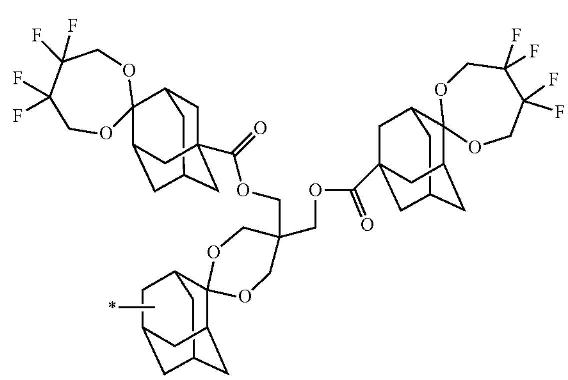

-continued (Y133)

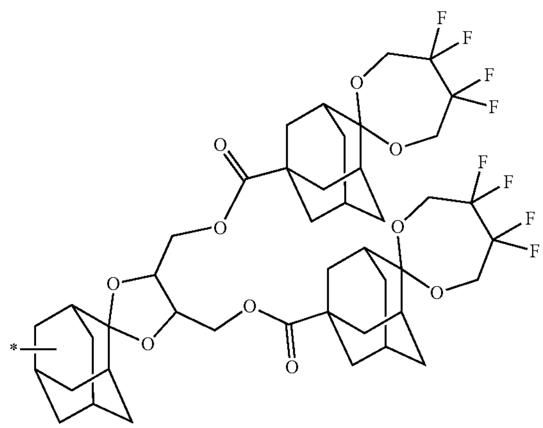

Y is preferably an alicyclic hydrocarbon group having 3 to 24 carbon atoms which may have a substituent, more preferably an alicyclic hydrocarbon group having 3 to 20 carbon atoms which may have a substituent, still more preferably an alicyclic hydrocarbon group having 3 to 18 carbon atoms which may have a substituent, and yet more preferably an adamantyl group which may have a substituent, and —$CH_2$— constituting the alicyclic hydrocarbon group or the adamantyl group may be replaced by —CO—, —$S(O)_2$— or —CO—. Specifically, Y is preferably an adamantyl group, a hydroxyadamantyl group, an oxoadamantyl group, or groups represented by formula (Y42) and formula (Y100) to formula (Y114).

The anion in the salt represented by formula (B1) is preferably anions represented by formula (B1-A-1) to formula (B1-A-59) [hereinafter sometimes referred to as “anion (B1-A-1)” according to the number of formula], and more preferably an anion represented by any one of formula (B1-A-1) to formula (B1-A-4), formula (B1-A-9), formula (B1-A-10), formula (B1-A-24) to formula (B1-A-33), formula (B1-A-36) to formula (B1-A-40) and formula (B1-A-47) to formula (B1-A-59).

(B1-A-1)

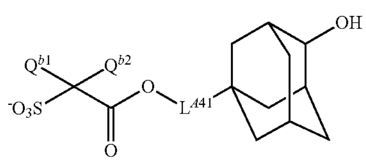

(B1-A-2)

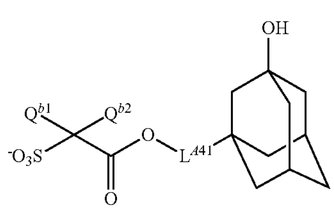

(B1-A-3)

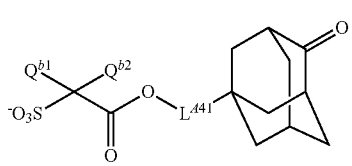

-continued (B1-A-4)

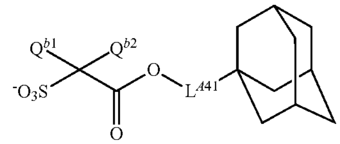

(B1-A-5)

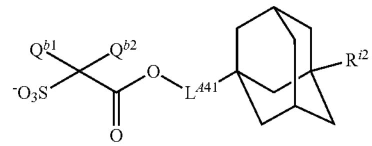

(B1-A-6)

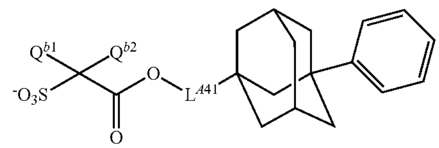

(B1-A-7)

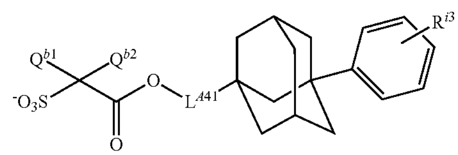

(B1-A-8)

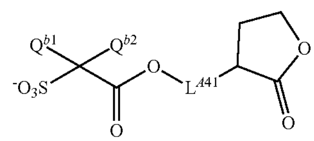

(B1-A-9)

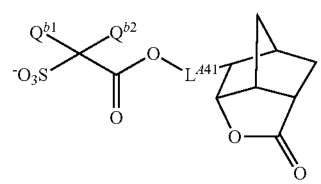

(B1-A-10)

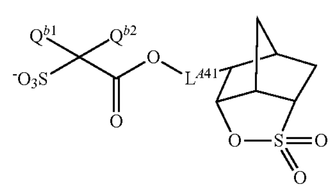

(B1-A-11)

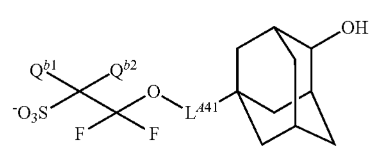

(B1-A-12)

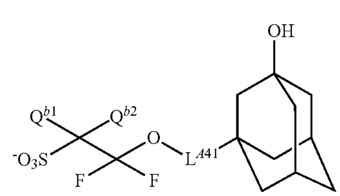

-continued
(B1-A-13)
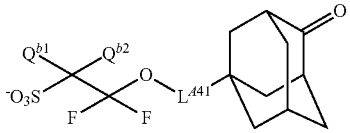
(B1-A-14)
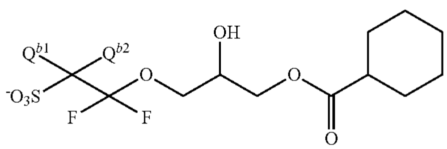
(B1-A-15)
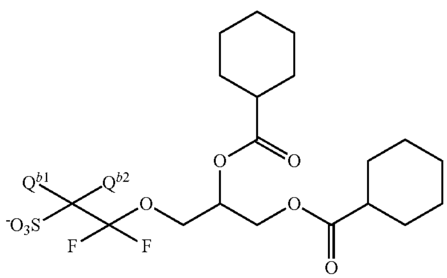
(B1-A-16)
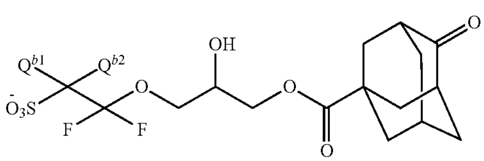
(B1-A-17)
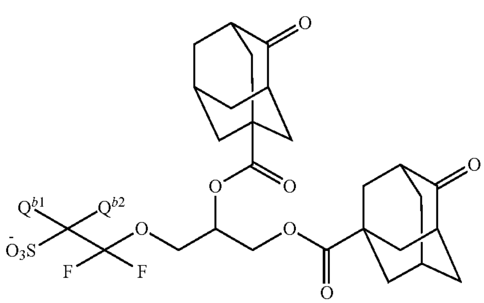
(B1-A-18)
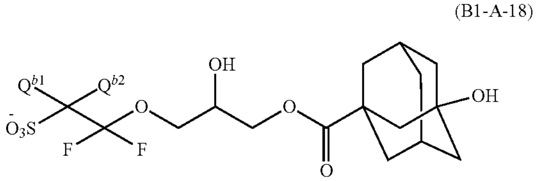
(B1-A-19)
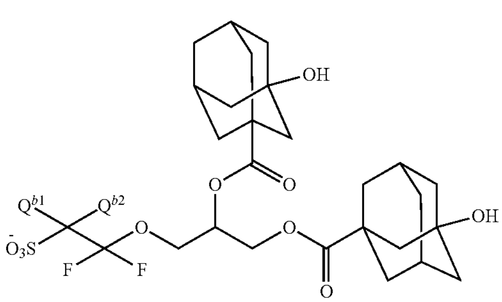
-continued
(B1-A-20)
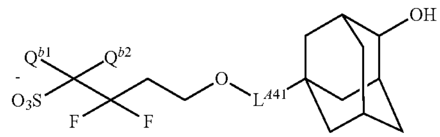
(B1-A-21)
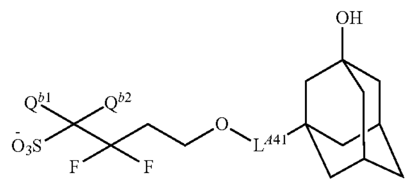
(B1-A-22)
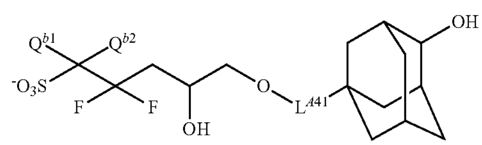
(B1-A-23)
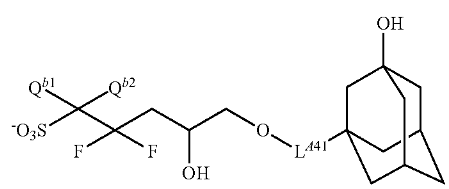
(B1-A-24)
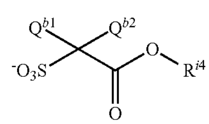
(B1-A-25)
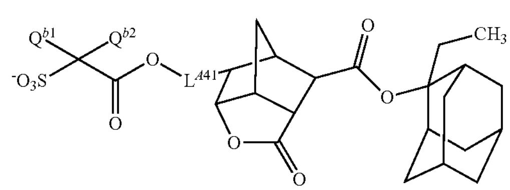
(B1-A-26)
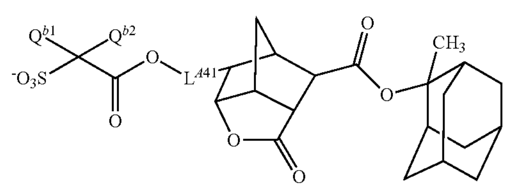
(B1-A-27)
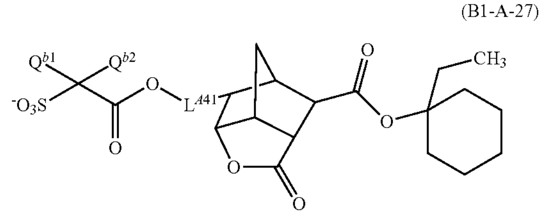

-continued
(B1-A-28)
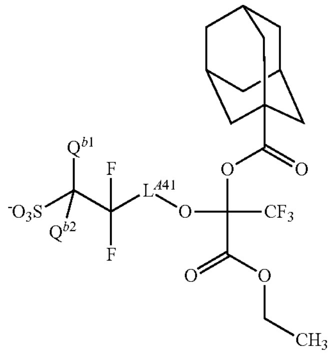
(B1-A-29)
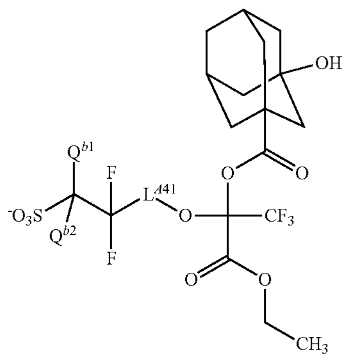
(B1-A-30)
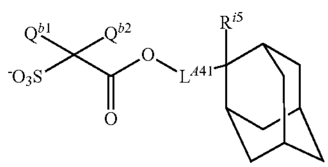
(B1-A-31)
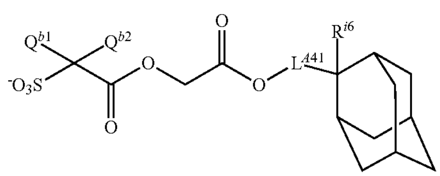
(B1-A-32)
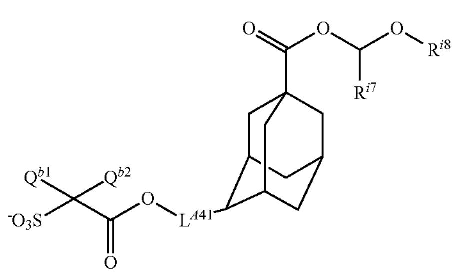
(B1-A-33)
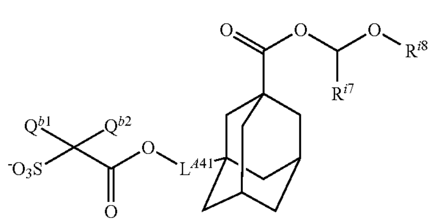
-continued
(B1-A-34)
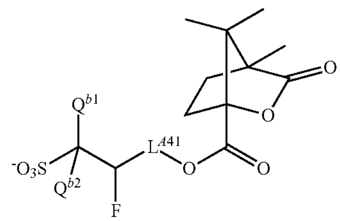
(B1-A-35)
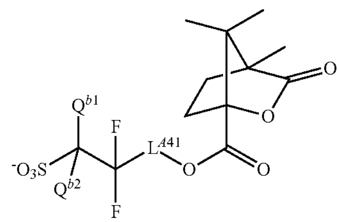
(B1-A-36)
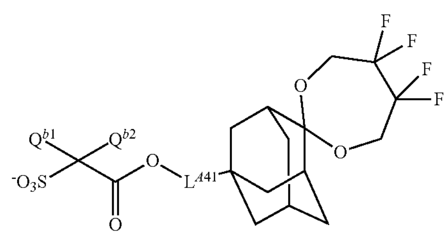
(B1-A-37)
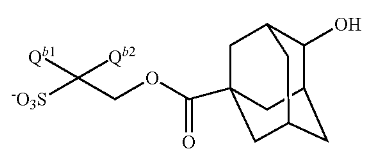
(B1-A-38)
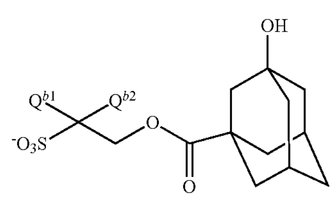
(B1-A-39)
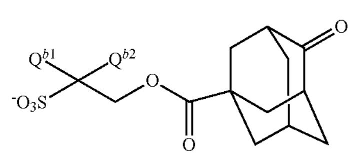
(B1-A-40)
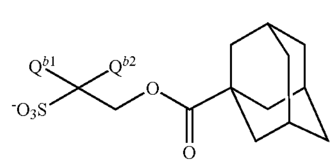
(B1-A-41)
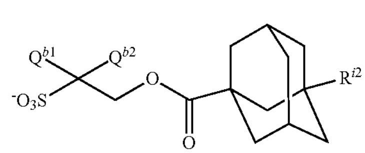

-continued
(B1-A-42)
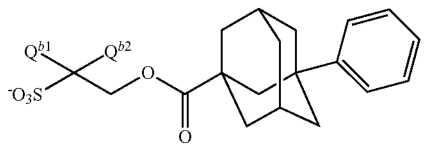
(B1-A-43)
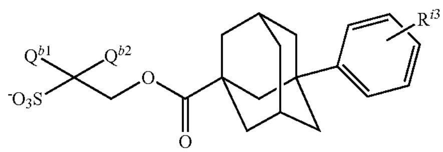
(B1-A-44)
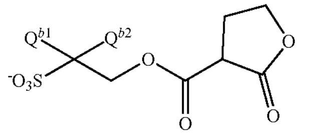
(B1-A-45)
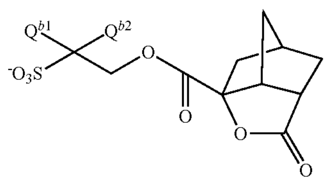
(B1-A-46)
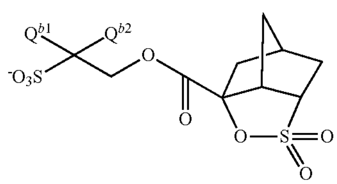
(B1-A-47)
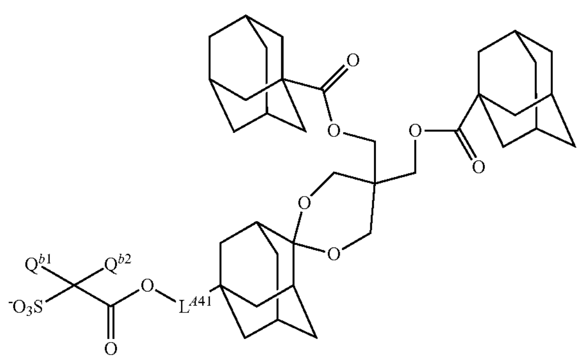
(B1-A-48)
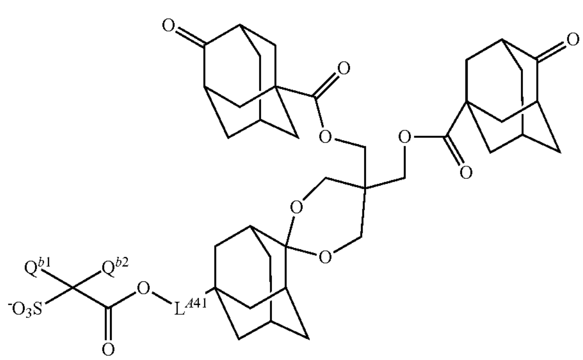
-continued
(B1-A-49)
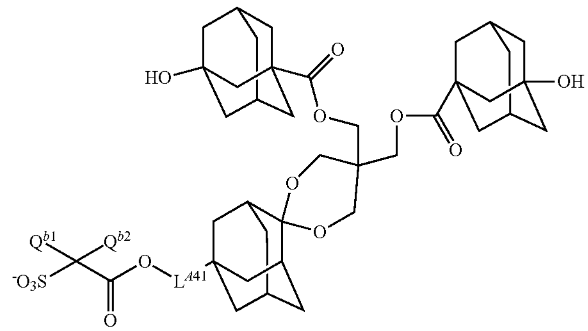
(B1-A-50)
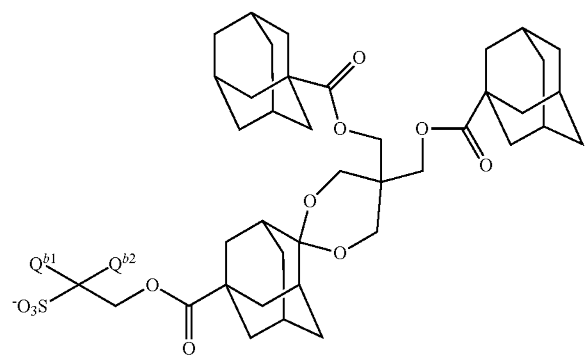
(B1-A-51)
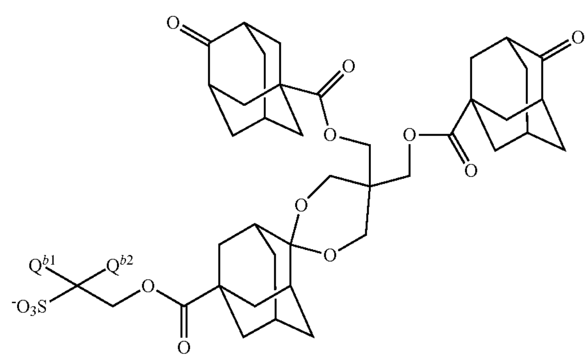
(B1-A-52)
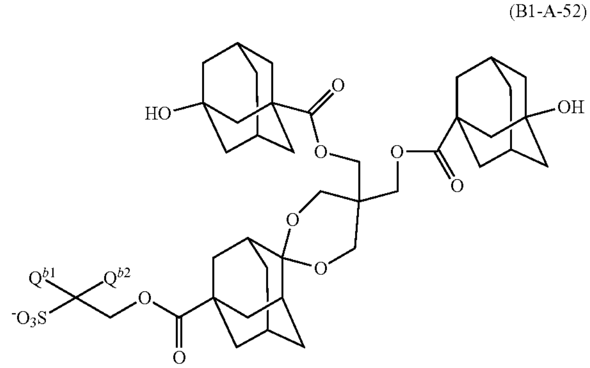

-continued (B1-A-53)

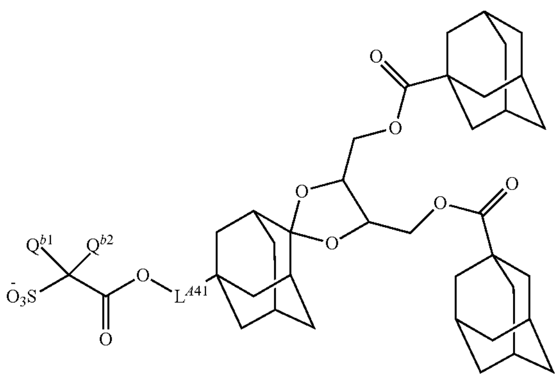

(B1-A-54)

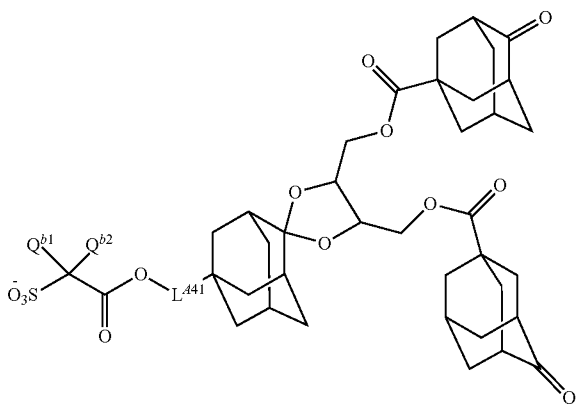

(B1-A-55)

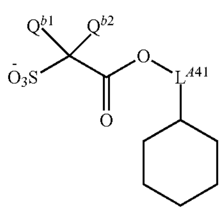

(B1-A-56)

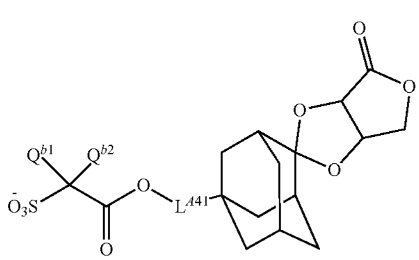

(B1-A-57)

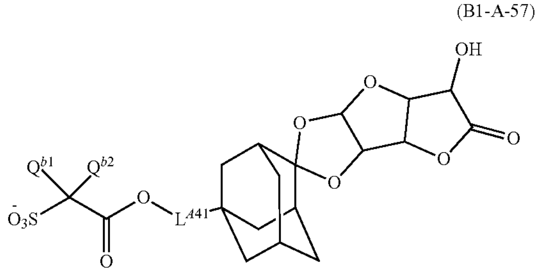

-continued (B1-A-58)

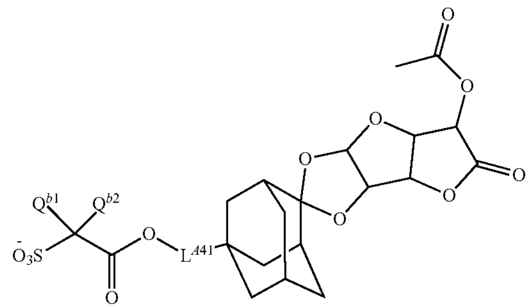

(B1-A-59)

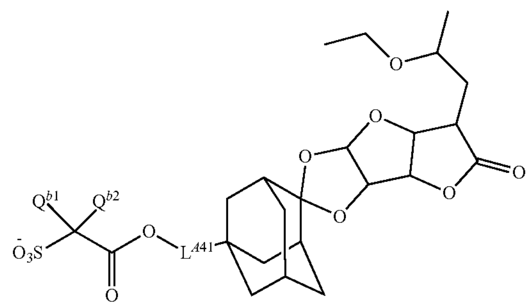

$R^{i2}$ to $R^{i7}$ each independently represent, for example, an alkyl group having 1 to 4 carbon atoms, and preferably a methyl group or an ethyl group. $R^{i8}$ is, for example, a chain hydrocarbon group having 1 to 12 carbon atoms, preferably an alkyl group having 1 to 4 carbon atoms, an alicyclic hydrocarbon group having 5 to 12 carbon atoms or groups formed by combining these groups, and more preferably a methyl group, an ethyl group, a cyclohexyl group or an adamantyl group. $L^{A41}$ is a single bond or an alkanediyl group having 1 to 4 carbon atoms. $Q^{b1}$ and $Q^{b2}$ are the same as defined above.

Specific examples of the anion in the salt represented by formula (B1) include anions mentioned in JP 2010-204646 A.

Examples of the anion in the salt represented by formula (B1) preferably include anions represented by formula (B1a-1) to formula (B1a-38).

(B1a-1)

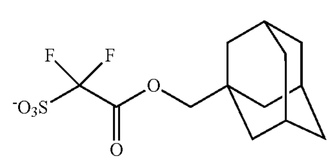

(B1a-2)

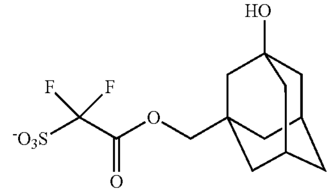

-continued
(B1a-3)
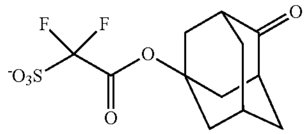
(B1a-4)
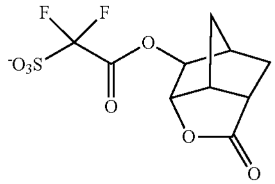
(B1a-5)
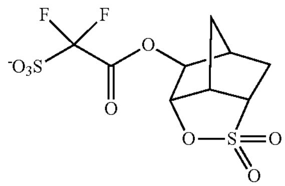
(B1a-6)
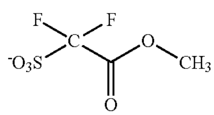
(B1a-7)
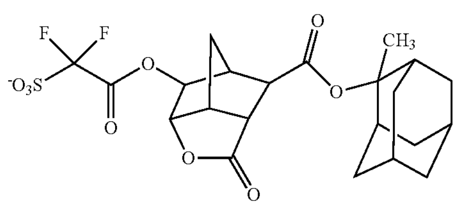
(B1a-8)
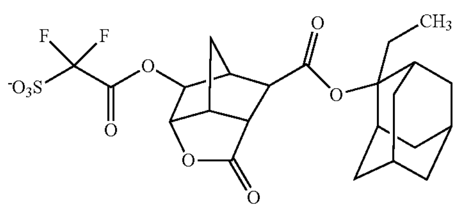
(B1a-9)
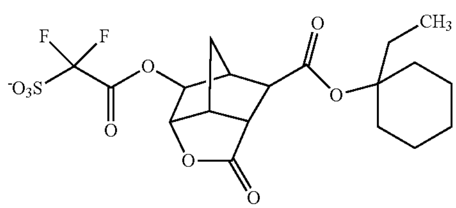
(B1a-10)
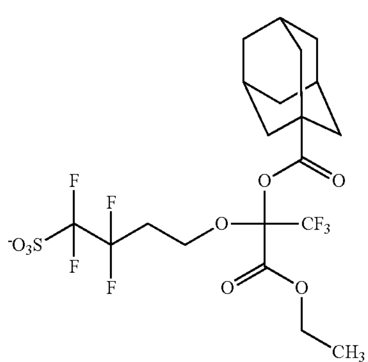
-continued
(B1a-11)
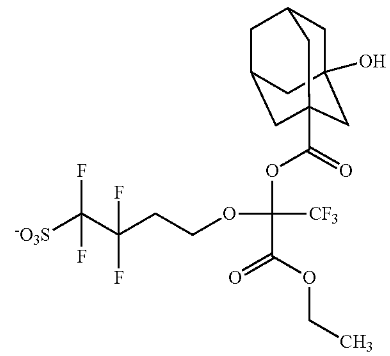
(B1a-12)
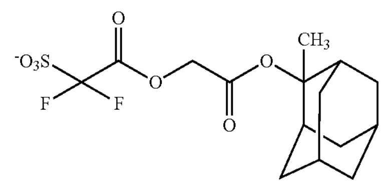
(B1a-13)
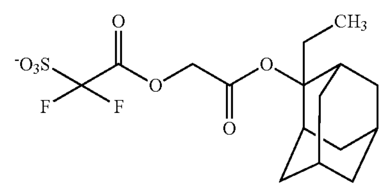
(B1a-14)
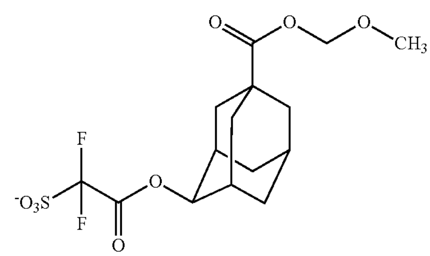
(B1a-15)
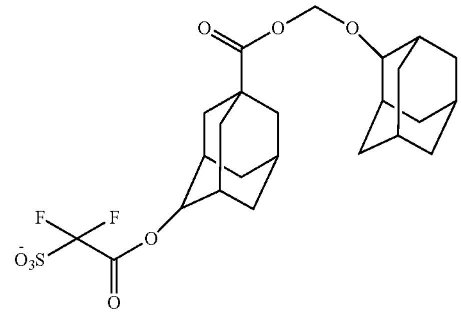
(B1a-16)
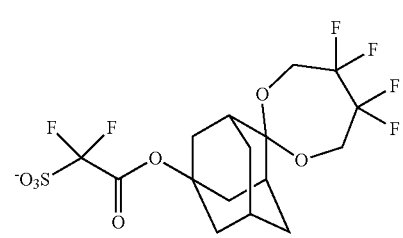

-continued
(B1a-17)
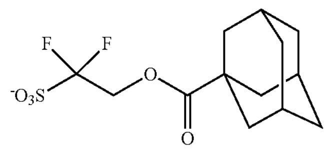
(B1a-18)
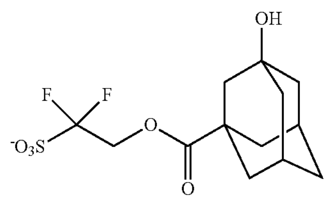
(B1a-19)
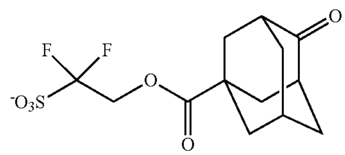
(B1a-20)
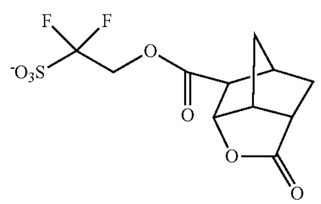
(B1a-21)
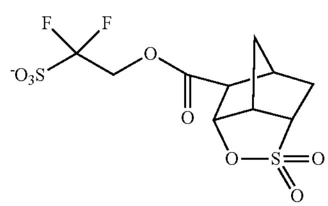
(B1a-22)
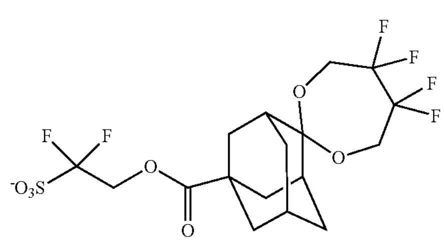
(B1a-23)
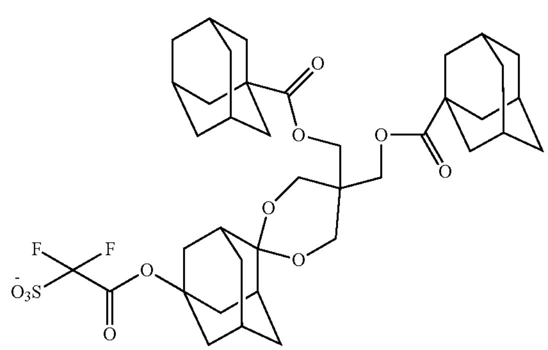
-continued
(B1a-24)
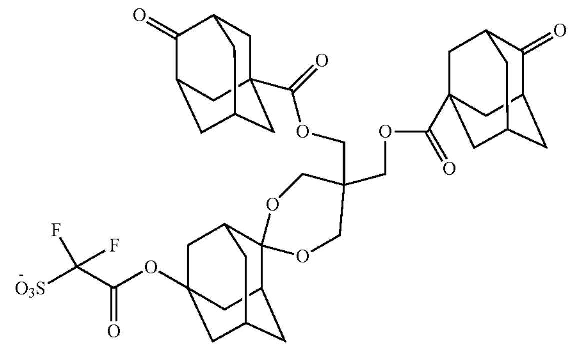
(B1a-25)
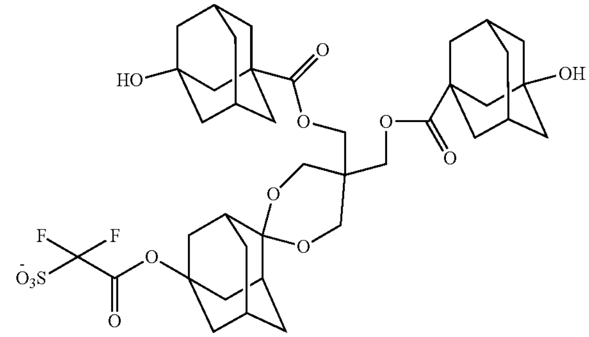
(B1a-26)
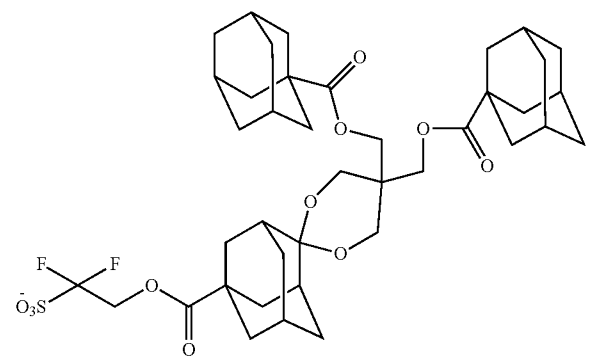
(B1a-27)
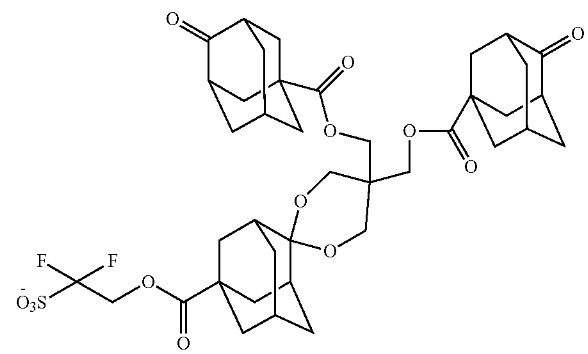

(B1a-28)
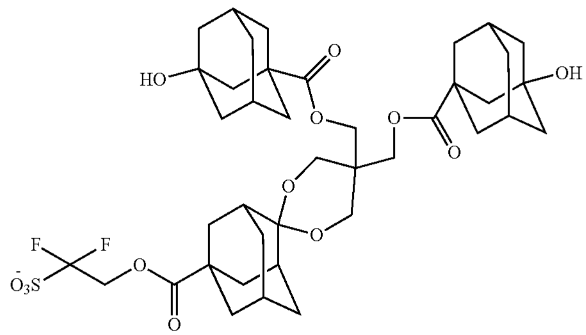
(B1a-29)
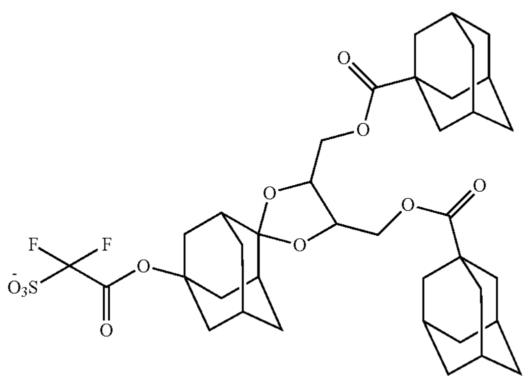
(B1a-30)
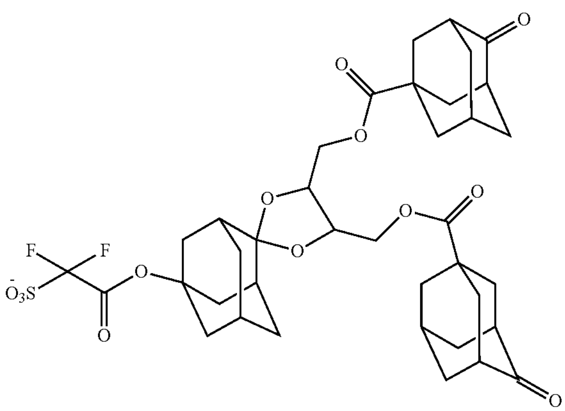
(B1a-31)
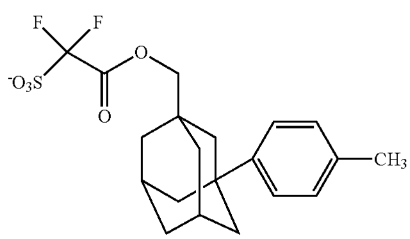
(B1a-32)
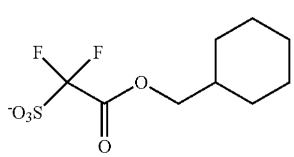
(B1a-33)
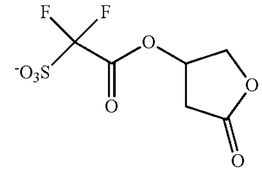
(B1a-34)
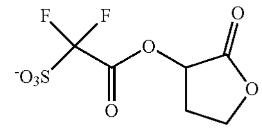
(B1a-35)
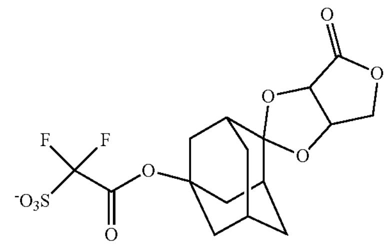
(B1a-36)
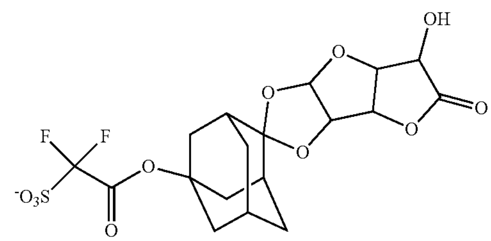
(B1a-37)
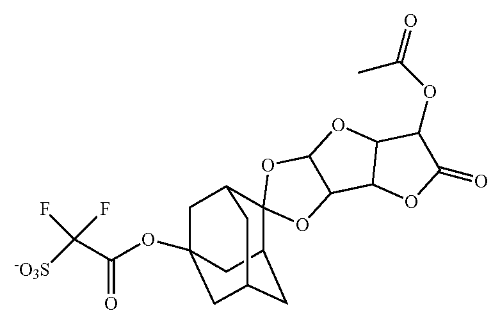
(B1a-38)
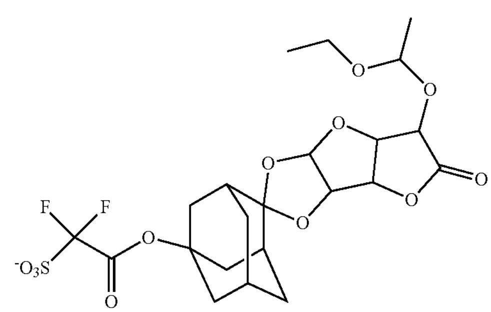
Of these anions, the anion is preferably an anion represented by any one of formula (B1a-1) to formula (B1a-3), formula (B1a-7) to formula (B1a-16), formula (B1a-18), formula (B1a-19) and formula (B1a-22) to formula (B1a-38).

Examples of the organic cation of $Z1^+$ include an organic onium cation, an organic sulfonium cation, an organic iodonium cation, an organic ammonium cation, a benzothiazolium cation and an organic phosphonium cation. Of these, an organic sulfonium cation and an organic iodonium cation are preferable, and an arylsulfonium cation is more preferable. Specific examples thereof include a cation represented by any one of formula (b2-1) to formula (b2-4) (hereinafter sometimes referred to as "cation (b2-1)" according to the number of formula).

(b2-1)

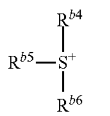

(b2-2)

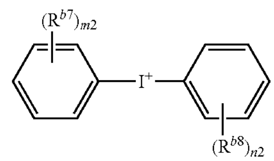

(b2-3)

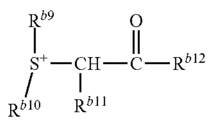

(b2-4)

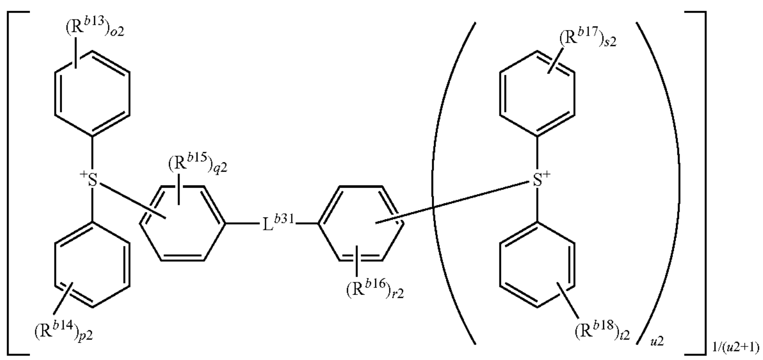

In formula (b2-1) to formula (b2-4), $R^{b4}$ to $R^{b6}$ each independently represent a chain hydrocarbon group having 1 to 30 carbon atoms, an alicyclic hydrocarbon group having 3 to 36 carbon atoms or an aromatic hydrocarbon group having 6 to 36 carbon atoms, a hydrogen atom included in the chain hydrocarbon group may be substituted with a hydroxy group, an alkoxy group having 1 to 12 carbon atoms, an alicyclic hydrocarbon group having 3 to 12 carbon atoms or an aromatic hydrocarbon group having 6 to 18 carbon atoms, a hydrogen atom included in the alicyclic hydrocarbon group may be substituted with a halogen atom, an aliphatic hydrocarbon group having 1 to 18 carbon atoms, an alkylcarbonyl group having 2 to 4 carbon atoms or a glycidyloxy group, and a hydrogen atom included in the aromatic hydrocarbon group may be substituted with a halogen atom, a hydroxy group, an aliphatic hydrocarbon group having 1 to 18 carbon atoms, an alkyl fluoride group having 1 to 12 carbon atoms or an alkoxy group having 1 to 12 carbon atoms, $R^{b4}$ and $R^{b5}$ may form a ring together with sulfur atoms to which $R^{b4}$ and $R^{b5}$ are bonded, and —$CH_2$— included in the ring may be replaced by —O—, —S— or —CO—, $R^{b7}$ and $R^{b8}$ each independently represent a halogen atom, a hydroxy group, an aliphatic hydrocarbon group having 1 to 12 carbon atoms or an alkoxy group having 1 to 12 carbon atoms, m2 and n2 each independently represent an integer of 0 to 5, when m2 is 2 or more, a plurality of $R^{b7}$ may be the same or different, and when n2 is 2 or more, a plurality of $R^{b}$ may be the same or different, $R^{b9}$ and $R^{b10}$ each independently represent a chain hydrocarbon group having 1 to 36 carbon atoms or an alicyclic hydrocarbon group having 3 to 36 carbon atoms, $R^{b9}$ and $R^{b10}$ may form a ring together with sulfur atoms to which $R^{b9}$ and $R^{b10}$ are bonded, and —$CH_2$— included in the ring may be replaced by —O—, —S— or —CO—, $R^{b11}$ represents a hydrogen atom, a chain hydrocarbon group having 1 to 36 carbon atoms, an alicyclic hydrocarbon group having 3 to 36 carbon atoms or an aromatic hydrocarbon group having 6 to 18 carbon atoms, $R^{b12}$ represents a chain hydrocarbon group having 1 to 12 carbon atoms, an alicyclic hydrocarbon group having 3 to 18 carbon atoms or an aromatic hydrocarbon group having 6 to 18 carbon atoms, a hydrogen atom included in the chain hydrocarbon group may be substituted with an aromatic hydrocarbon group having 6 to 18 carbon atoms, and a hydrogen atom included in the aromatic hydrocarbon group may be substituted with an alkoxy group having 1 to 12 carbon atoms or an alkylcarbonyloxy group having 1 to 12 carbon atoms, $R^{b11}$ and $R^{b12}$ may form a ring together with —CH—CO— to which $R^{b11}$ and $R^{b12}$ are bonded, and —$CH_2$— included in the ring may be replaced by —O—, —S— or —CO—, $R^{b13}$ to $R^{b18}$ each independently represent a halogen atom, a hydroxy group, an aliphatic hydrocarbon group having 1 to 12 carbon atoms or an alkoxy group having 1 to 12 carbon atoms, $L^{b31}$ represents a sulfur atom or an oxygen atom, o2, p2, s2 and t2 each independently represent an integer of 0 to 5, q2 and r2 each independently represent an integer of 0 to 4, u2 represents 0 or 1, and when o2 is 2 or more, a plurality of $R^{b13}$ may be the same or different, when p2 is 2 or more, a plurality of $R^{b14}$ may be the same or different, when q2 is 2 or more, a plurality of $R^{b15}$ may be the same or different, when r2 is 2 or more, a plurality of $R^{b16}$ may be the same or different, when s2 is 2 or more, a plurality of $R^{b17}$ may be the same or different, and when t2 is 2 or more, a plurality of $R^{b18}$ may be the same or different.

The aliphatic hydrocarbon group represents a chain hydrocarbon group and an alicyclic hydrocarbon group.

Examples of the chain hydrocarbon group include alkyl groups such as a methyl group, an ethyl group, a propyl group, an isopropyl group, a butyl group, a sec-butyl group, a tert-butyl group, a pentyl group, a hexyl group, an octyl group and a 2-ethylhexyl group.

Particularly, the chain hydrocarbon group for $R^{b9}$ to $R^{b12}$ preferably has 1 to 12 carbon atoms.

The alicyclic hydrocarbon group may be either monocyclic or polycyclic, and examples of the monocyclic alicyclic hydrocarbon group include cycloalkyl groups such as a cyclopropyl group, a cyclobutyl group, a cyclopentyl group, a cyclohexyl group, a cycloheptyl group, a cyclooctyl group and a cyclodecyl group. Examples of the polycyclic alicyclic hydrocarbon group include a decahydronaphthyl group, an adamantyl group, a norbornyl group, and the following groups.

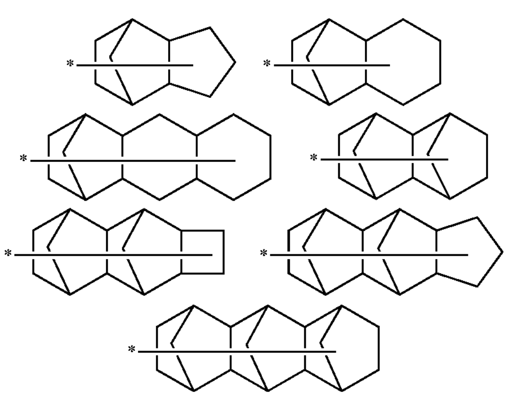

Particularly, the alicyclic hydrocarbon group for $R^{b9}$ to $R^{b12}$ preferably has 3 to 18 carbon atoms, and more preferably 4 to 12 carbon atoms.

Examples of the alicyclic hydrocarbon group in which a hydrogen atom is substituted with an aliphatic hydrocarbon group include a methylcyclohexyl group, a dimethylcyclohexyl group, a 2-methyladamantan-2-yl group, a 2-ethyladamantan-2-yl group, a 2-isopropyladamantan-2-yl group, a methylnorbornyl group, an isobornyl group and the like. In the alicyclic hydrocarbon group in which a hydrogen atom is substituted with an aliphatic hydrocarbon group, the total number of carbon atoms of the alicyclic hydrocarbon group and the aliphatic hydrocarbon group is preferably 20 or less.

An alkyl fluoride group having 1 to 12 carbon atoms represents an alkyl group having 1 to 12 carbon atoms which has a halogen atom. Examples of the alkyl fluoride group having 1 to 12 carbon atoms include alkyl fluoride groups such as a fluoromethyl group, a difluoromethyl group, a trifluoromethyl group, a perfluorobutyl group and the like. The number of carbon atoms of the alkyl fluoride group is preferably 1 to 9, more preferably 1 to 6, and still more preferably 1 to 4.

Examples of the aromatic hydrocarbon group include aryl groups such as a phenyl group, a biphenyl group, a naphthyl group and a phenanthryl group. The aromatic hydrocarbon group may have a chain hydrocarbon group or an alicyclic hydrocarbon group, and examples thereof include an aromatic hydrocarbon group having a chain hydrocarbon group (a tolyl group, a xylyl group, a cumenyl group, a mesityl group, a p-ethylphenyl group, a p-tert-butylphenyl group, a 2,6-diethylphenyl group, a 2-methyl-6-ethylphenyl group, etc.), an aromatic hydrocarbon group having an alicyclic hydrocarbon group (a p-cyclohexylphenyl group, a p-adamantylphenyl group, etc.) and the like.

When the aromatic hydrocarbon group includes the chain hydrocarbon group or the alicyclic hydrocarbon group, a chain hydrocarbon group having 1 to 18 carbon atoms and an alicyclic hydrocarbon group having 3 to 18 carbon atoms are preferable.

Examples of the aromatic hydrocarbon group in which a hydrogen atom is substituted with an alkoxy group include a p-methoxyphenyl group and the like.

Examples of the chain hydrocarbon group in which a hydrogen atom is substituted with an aromatic hydrocarbon group include aralkyl groups such as a benzyl group, a phenethyl group, a phenylpropyl group, a trityl group, a naphthylmethyl group and a naphthylethyl group.

Examples of the alkoxy group include a methoxy group, an ethoxy group, a propoxy group, a butoxy group, a pentyloxy group, a hexyloxy group, a heptyloxy group, an octyloxy group, a decyloxy group and a dodecyloxy group.

Examples of the alkylcarbonyl group include an acetyl group, a propionyl group and a butyryl group.

Examples of the halogen atom include a fluorine atom, a chlorine atom, a bromine atom and an iodine atom.

Examples of the alkylcarbonyloxy group include a methylcarbonyloxy group, an ethylcarbonyloxy group, a propylcarbonyloxy group, an isopropylcarbonyloxy group, a butylcarbonyloxy group, a sec-butylcarbonyloxy group, a tert-butylcarbonyloxy group, a pentylcarbonyloxy group, a hexylcarbonyloxy group, an octylcarbonyloxy group and a 2-ethylhexylcarbonyloxy group.

The ring formed together with sulfur atoms to which $R^{b4}$ and $R^{b5}$ are bonded may be a monocyclic, polycyclic, aromatic, nonaromatic, saturated or unsaturated ring. This ring includes a ring having 3 to 18 carbon atoms and is preferably a ring having 4 to 18 carbon atoms. The ring containing a sulfur atom includes a 3-membered to 12-membered ring and is preferably a 3-membered to 7-membered ring and specifically includes the following rings. * represents a bond.

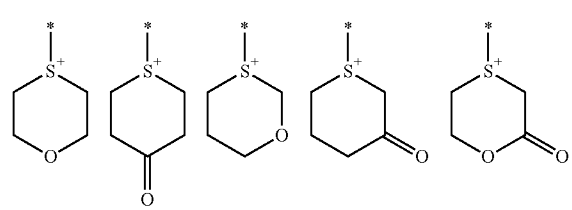

-continued

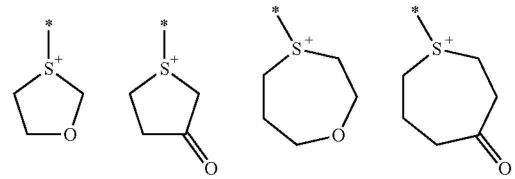

The ring formed by bonding $R^{b9}$ and $R^{b10}$ each other may be a monocyclic, polycyclic, aromatic, nonaromatic, saturated or unsaturated ring. This ring includes a 3-membered to 12-membered ring and is preferably a 3-membered to 7-membered ring. Examples of the ring include a thiolan-1-ium ring (a tetrahydrothiophenium ring), a thian-1-ium ring, a 1,4-oxathian-4-ium ring and the like.

The ring formed by bonding $R^{b11}$ and $R^{b12}$ each other may be a monocyclic, polycyclic, aromatic, nonaromatic, saturated or unsaturated ring. This ring includes a 3-membered to 12-membered ring and is preferably a 3-membered to 7-membered ring. Examples thereof include an oxocycloheptane ring, an oxocyclohexane ring, an oxonorbornane ring, an oxoadamantane ring and the like.

Of cation (b2-1) to cation (b2-4), a cation (b2-1) is preferable.

Examples of the cation (b2-1) include the following cations.

(b2-c-1)

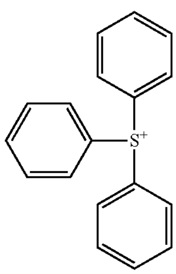

(b2-c-2)

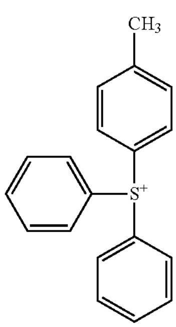

(b2-c-3)

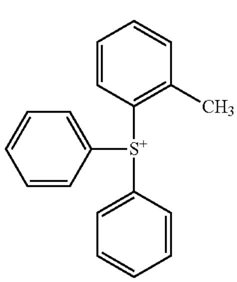

-continued (b2-c-4)

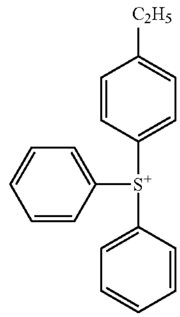

(b2-c-5)

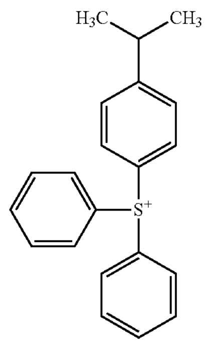

(b2-c-6)

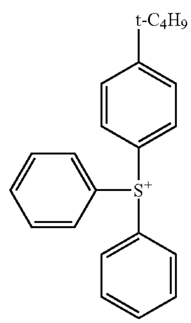

(b2-c-7)

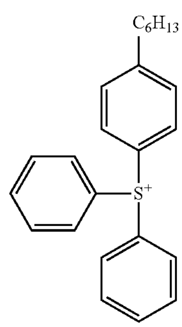

(b2-c-8)

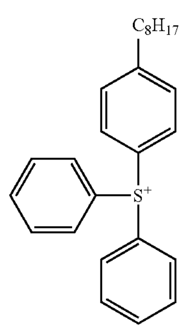

-continued
(b2-c-9)
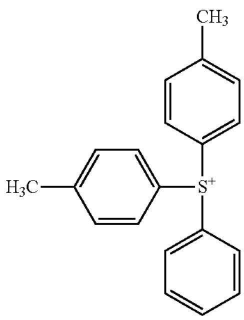
(b2-c-10)
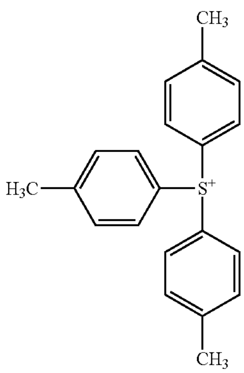
(b2-c-11)
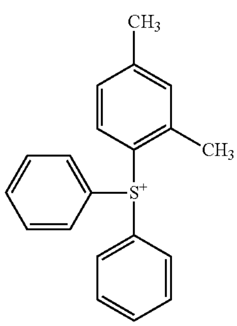
(b2-c-12)
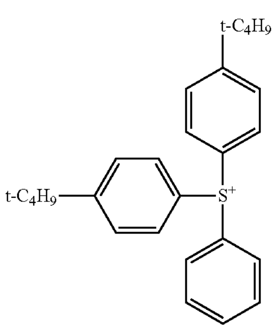
-continued
(b2-c-13)
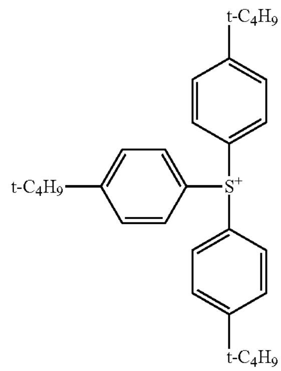
(b2-c-14)
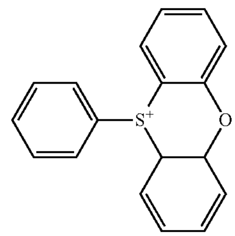
(b2-c-15)
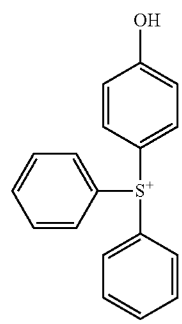
(b2-c-16)
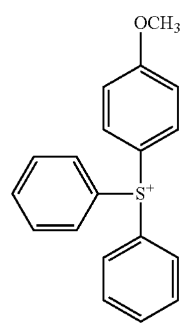
(b2-c-17)
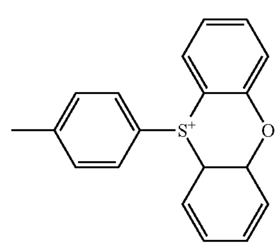

-continued
(b2-c-18)
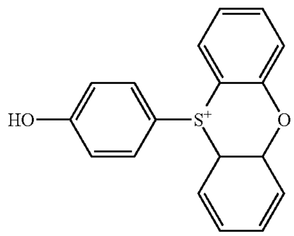
(b2-c-19)
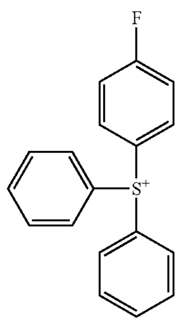
(b2-c-20)
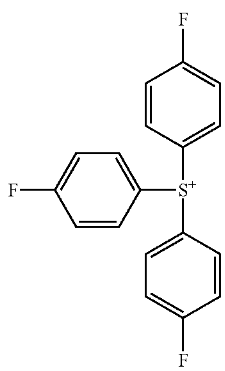
(b2-c-21)
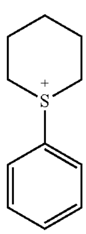
(b2-c-22)
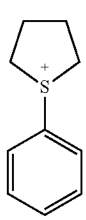
(b2-c-23)
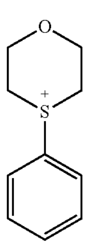
-continued
(b2-c-24)
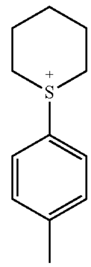
(b2-c-25)
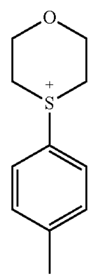
(b2-c-26)
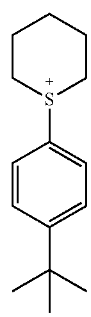
(b2-c-27)
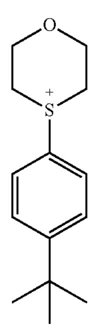
(b2-c-47)
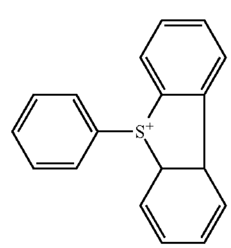

-continued
(b2-c-48)
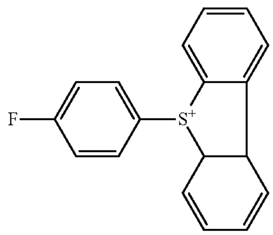
(b2-c-49)
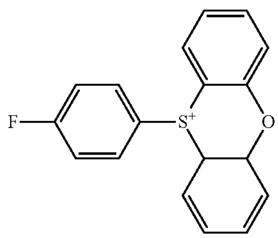
(b2-c-51)
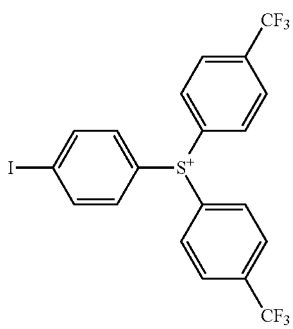
(b2-c-52)
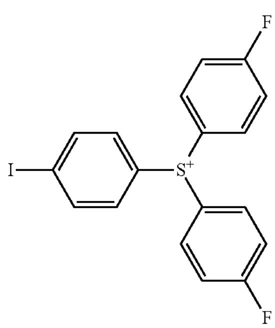
(b2-c-53)
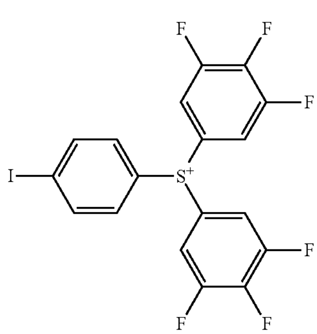
Examples of the cation (b2-2) include the following cations.
(b2-c-28)
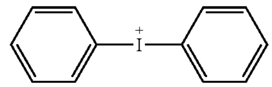
(b2-c-29)
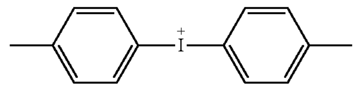
(b2-c-30)
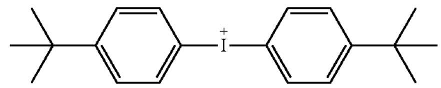
(b2-c-50)
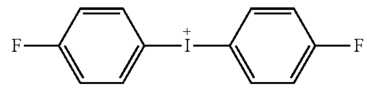
Examples of the cation (b2-3) include the following cations.
(b2-c-31)
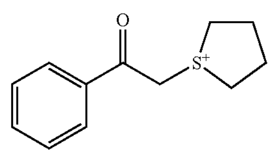
(b2-c-32)
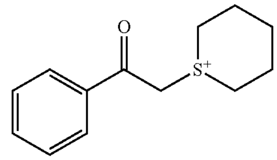
(b2-c-33)
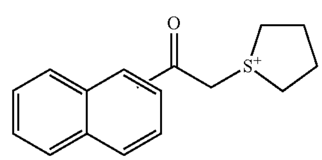
(b2-c-34)
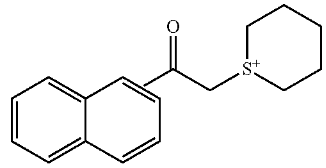
Examples of the cation (b2-4) include the following cations.
(b2-c-35)
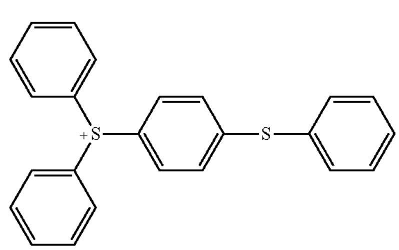

-continued
(b2-c-36)
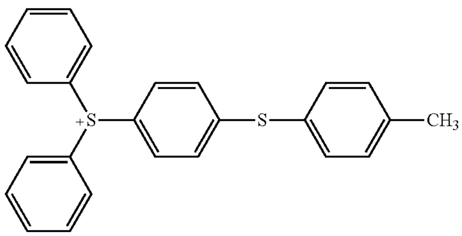
(b2-c-37)
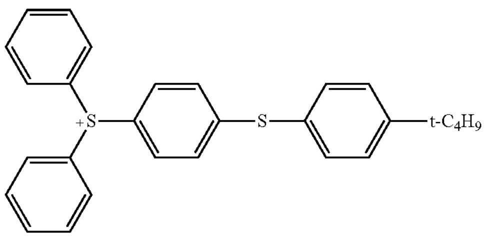
(b2-c-38)
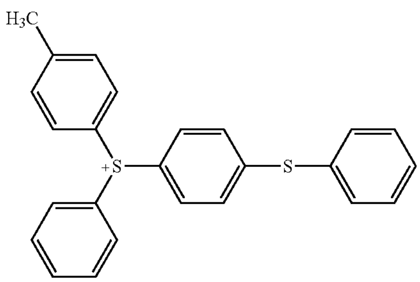
(b2-c-39)
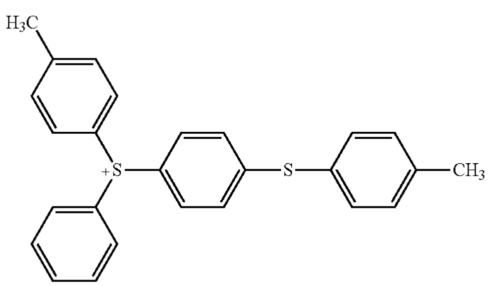
(b2-c-40)
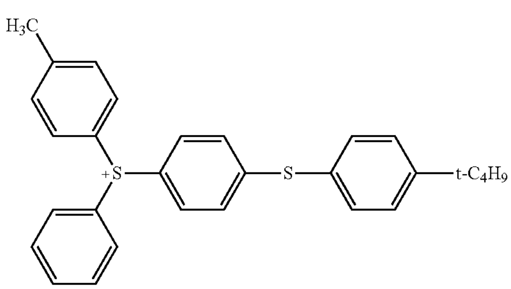
-continued
(b2-c-41)
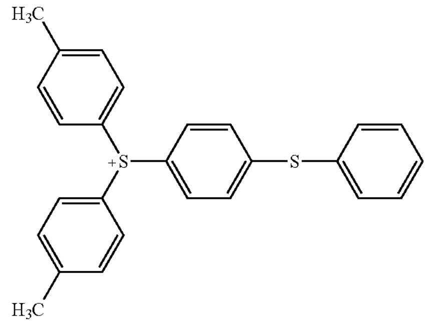
(b2-c-42)
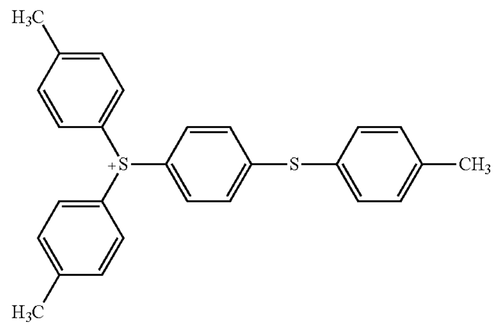
(b2-c-43)
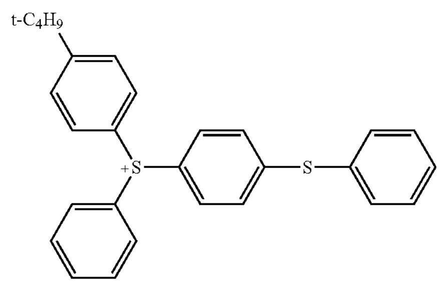
(b2-c-44)
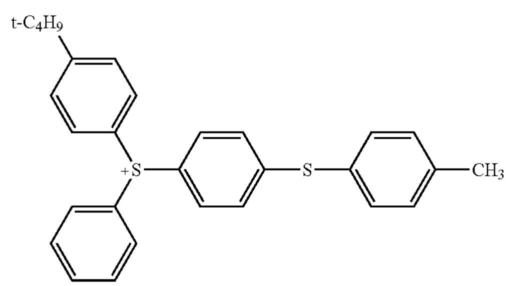
(b2-c-45)
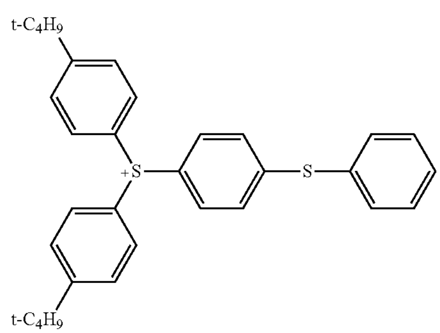

-continued (b2-c-46)

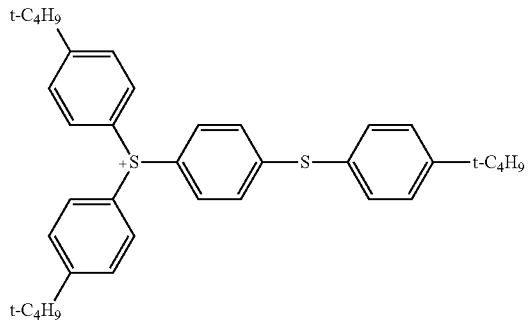

(b2-c-54)

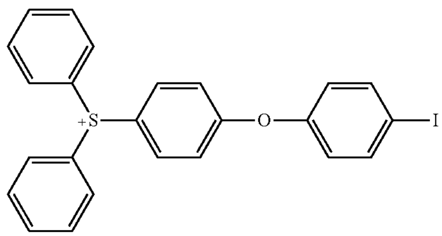

The acid generator (B) is a combination of the above-mentioned anions and the above-mentioned organic cations, and these can be optionally combined. Examples of the acid generator (B) are preferably combinations of an anion represented by any one of (B1a-1) to formula (B1a-3), formula (B1a-7) to formula (B1a-16), formula (B1a-18), formula (B1a-19) and formula (B1a-22) to formula (B1a-38) with a cation (b2-1), a cation (b2-3) or a cation (b2-4).

Examples of the acid generator (B) are preferably those represented by formula (B1-1) to formula (B1-56). Of these, those containing an arylsulfonium cation are preferable, and those represented by formula (B1-1) to formula (B1-3), formula (B1-5) to formula (B1-7), formula (B1-11) to formula (B1-14), formula (B1-20) to formula (B1-26), formula (B1-29) and formula (B1-31) to formula (B1-56) are particularly preferable.

(B1-1)

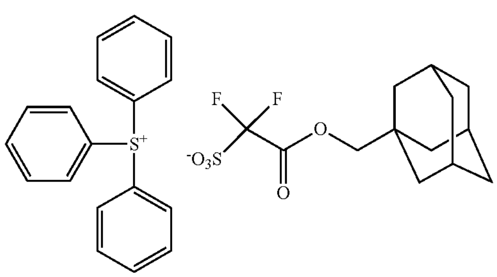

(B1-2)

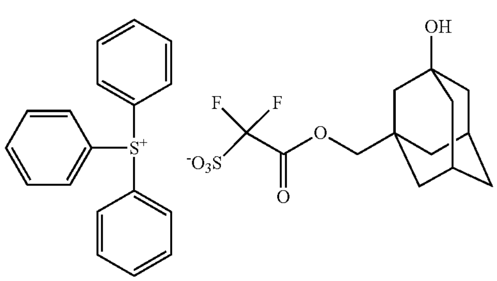

-continued (B1-3)

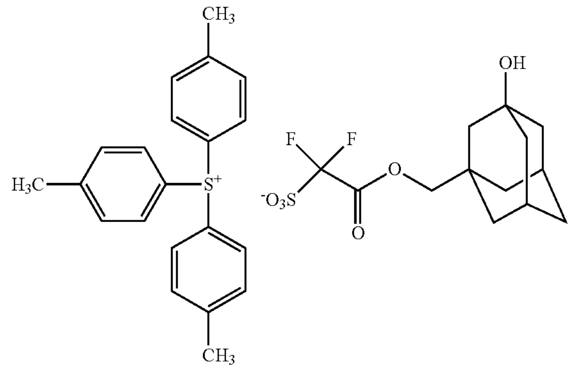

(B1-4)

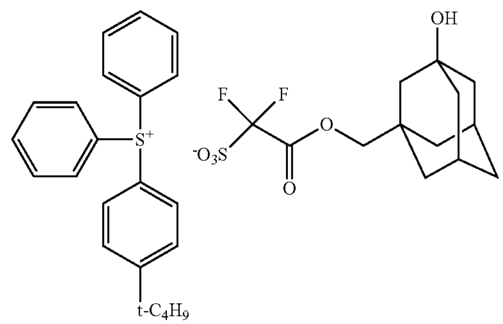

(B1-5)

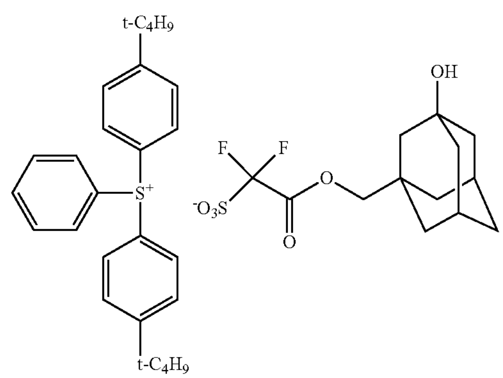

(B1-6)

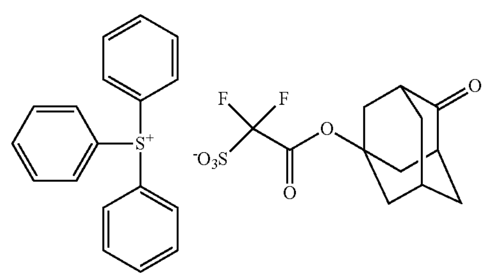

-continued
(B1-7)
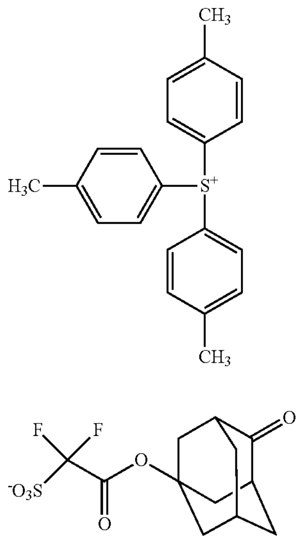
(B1-8)
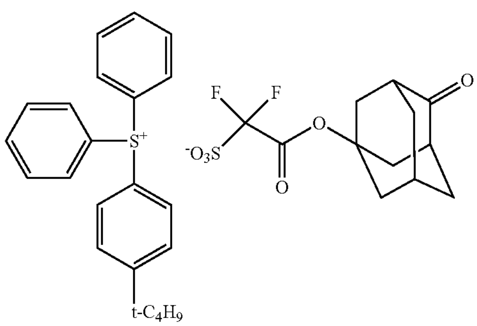
(B1-9)
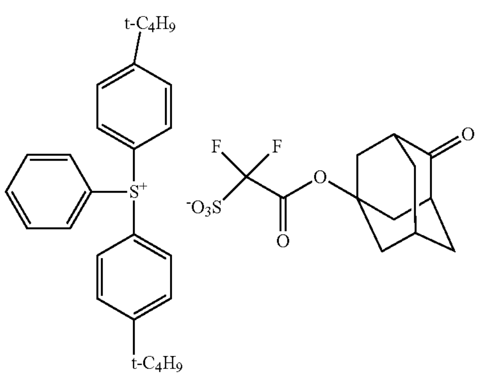
(B1-10)
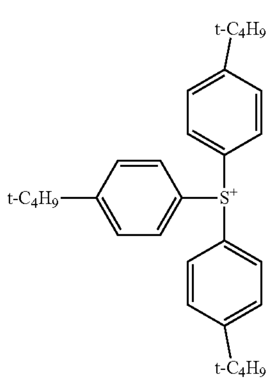
-continued
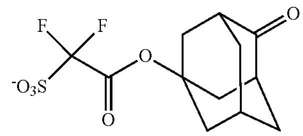
(B1-11)
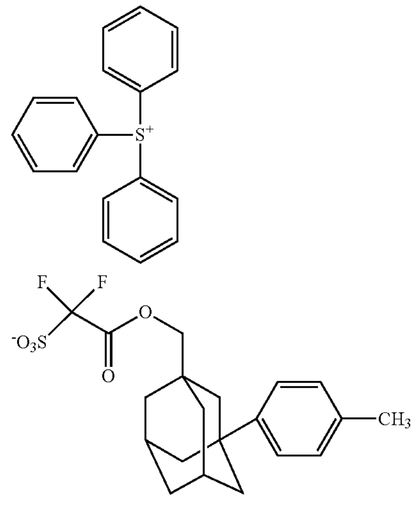
(B1-12)
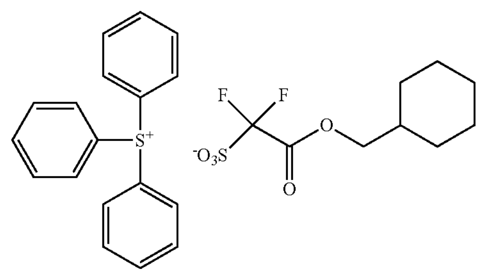
(B1-13)
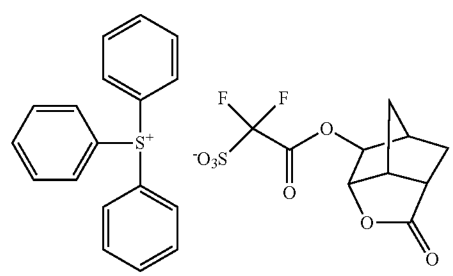
(B1-14)
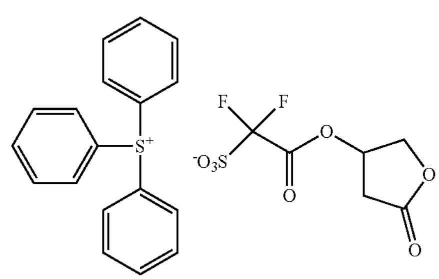
(B1-15)
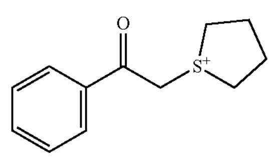

-continued
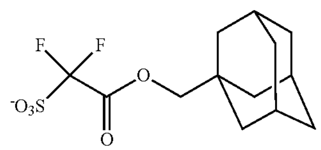
(B1-16)
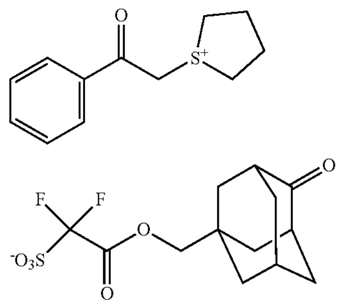
(B1-17)
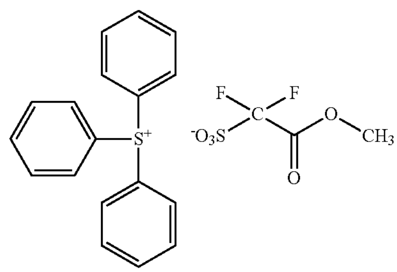
(B1-18)
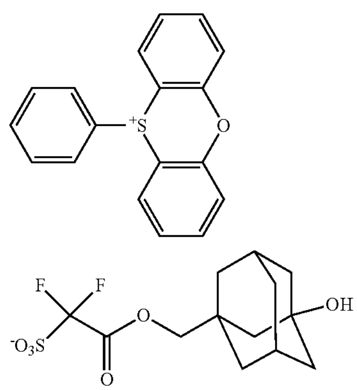
(B1-19)
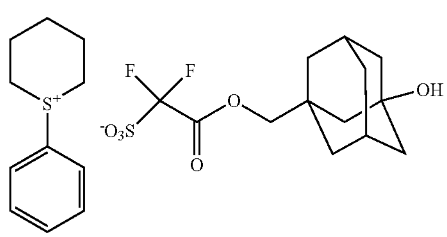
(B1-20)
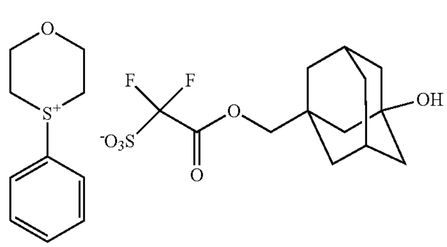
-continued
(B1-21)
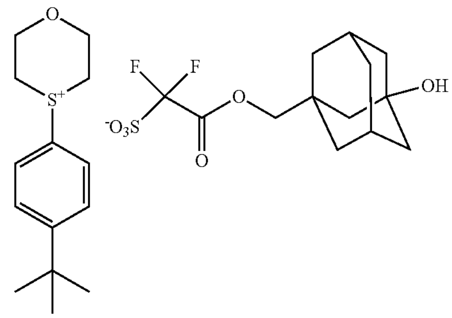
(B1-22)
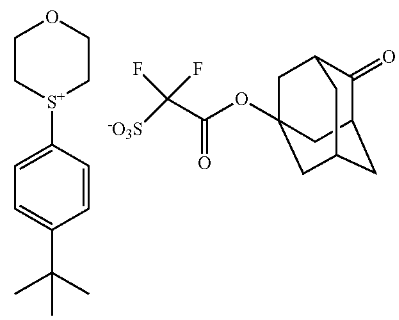
(B1-23)
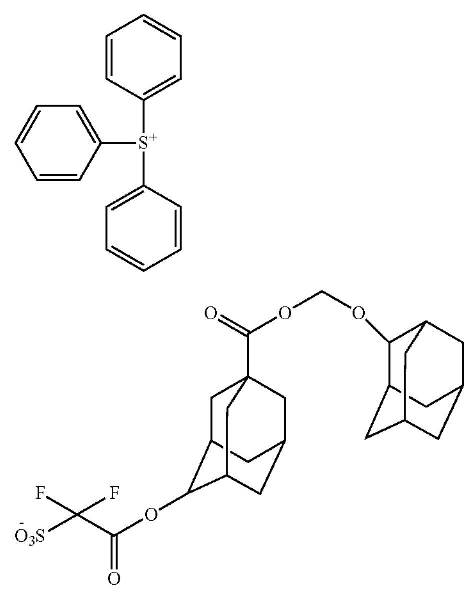
(B1-24)
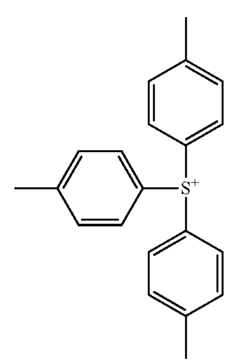

-continued
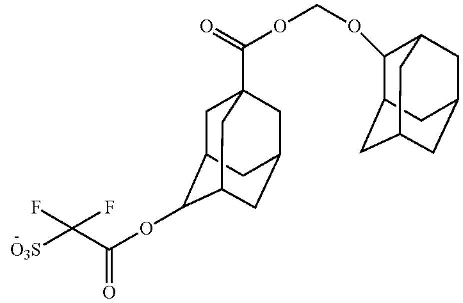
(B1-25)
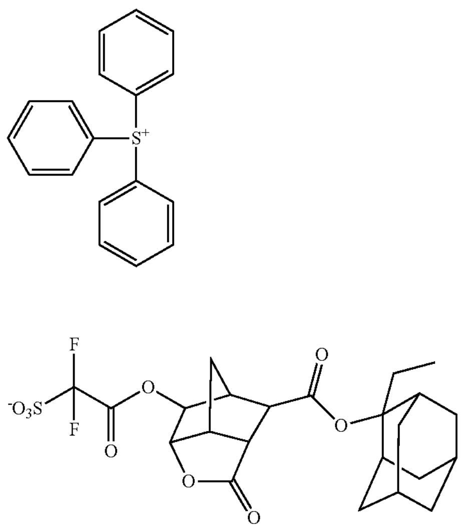
(B1-26)
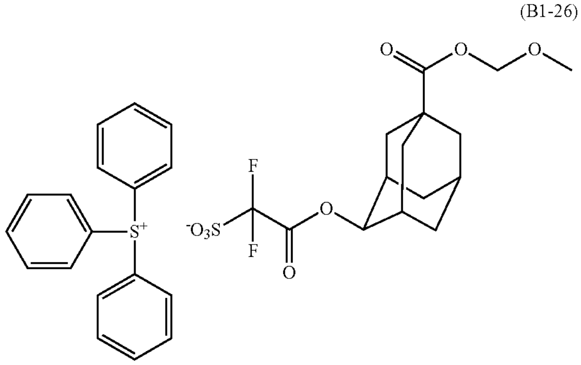
(B1-27)
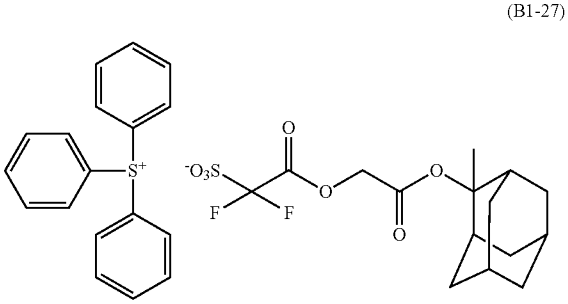
-continued
(B1-28)
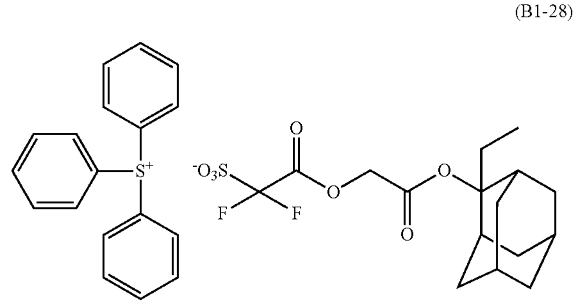
(B1-29)
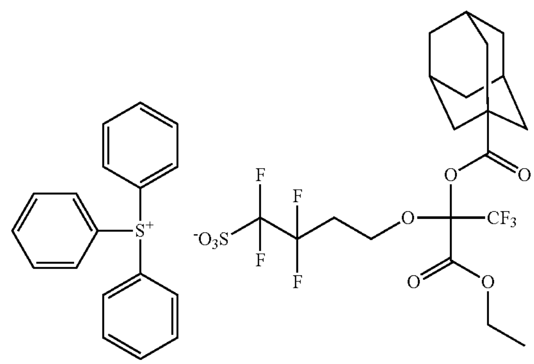
(B1-30)
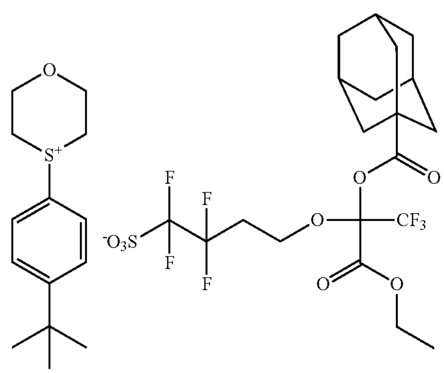
(B1-31)
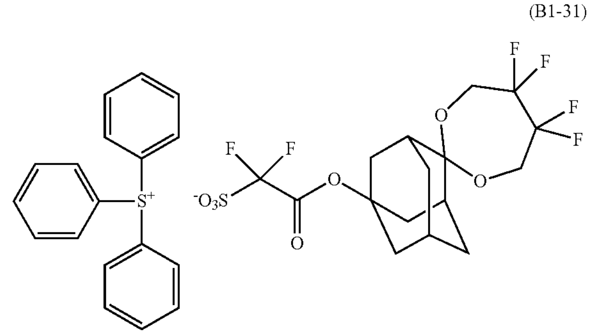

-continued
(B1-32)
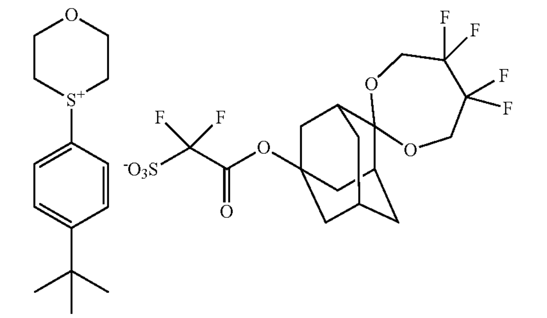
(B1-33)
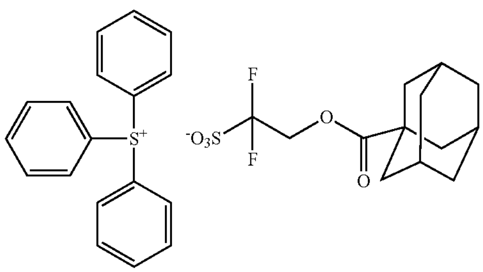
(B1-34)
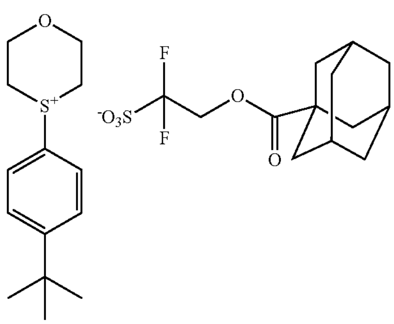
(B1-35)
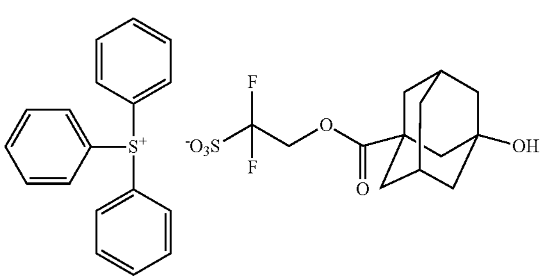
(B1-36)
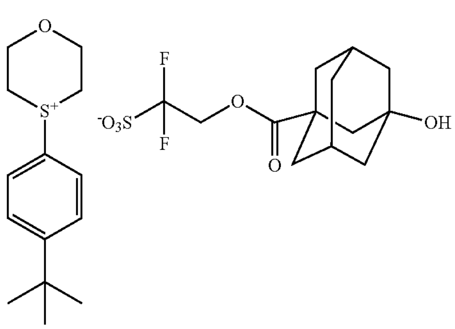
-continued
(B1-37)
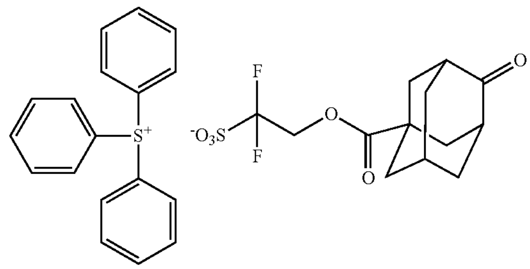
(B1-38)
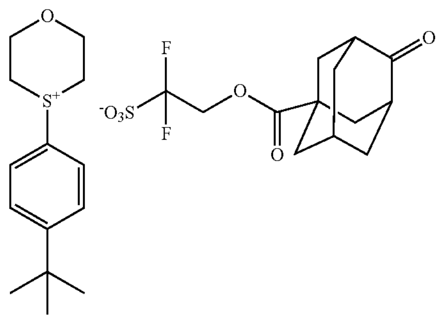
(B1-39)
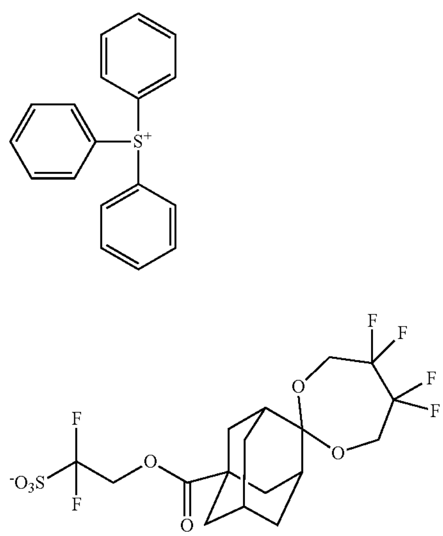
(B1-40)
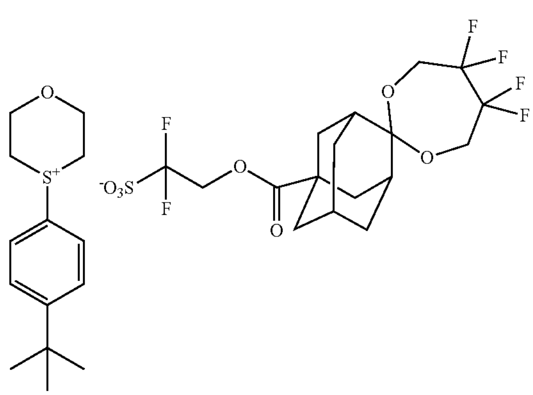

-continued
(B1-41)
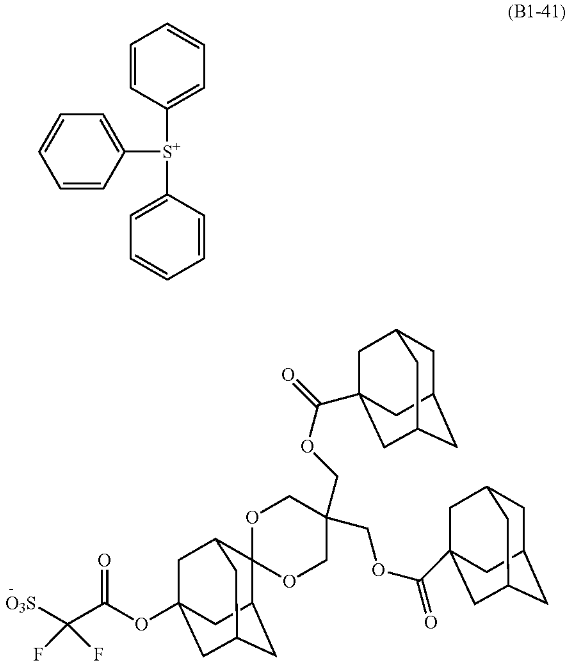
(B1-42)
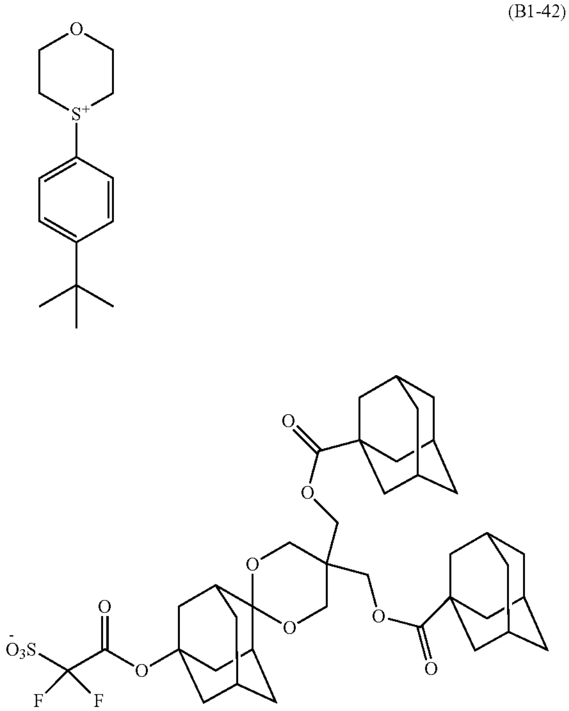
(B1-43)
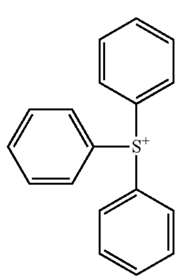
-continued
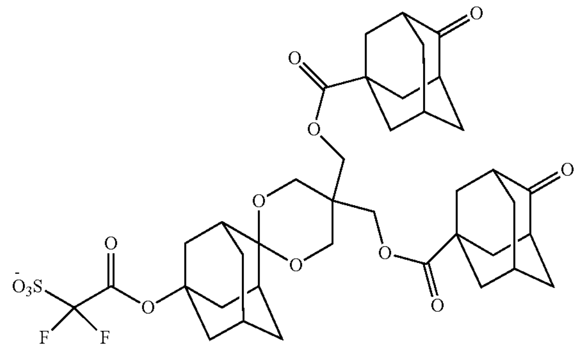
(B1-44)
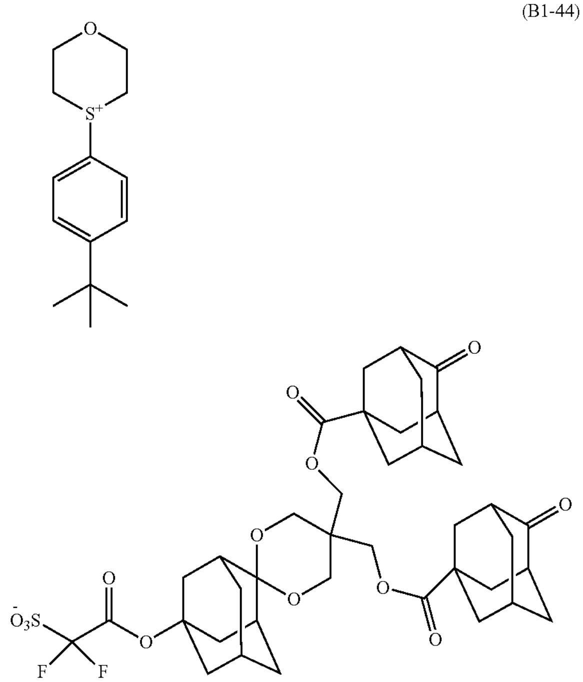
(B1-45)
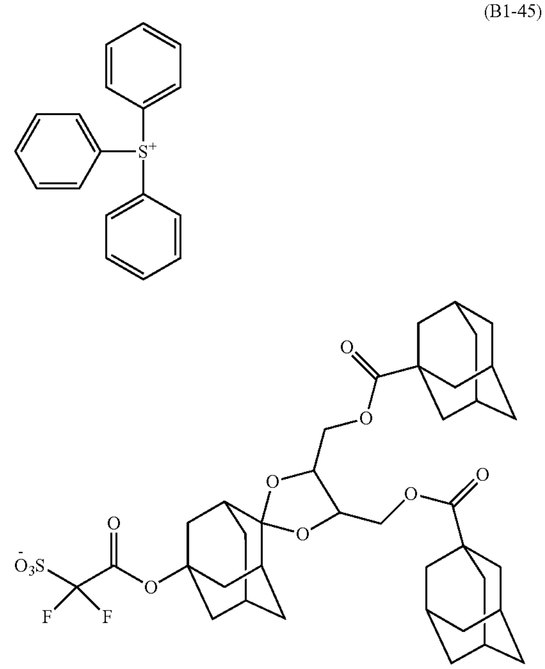

-continued
(B1-46)
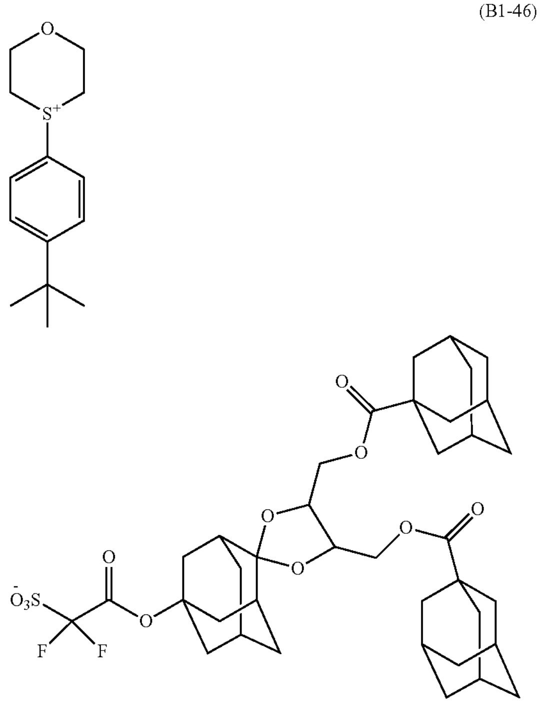
(B1-47)
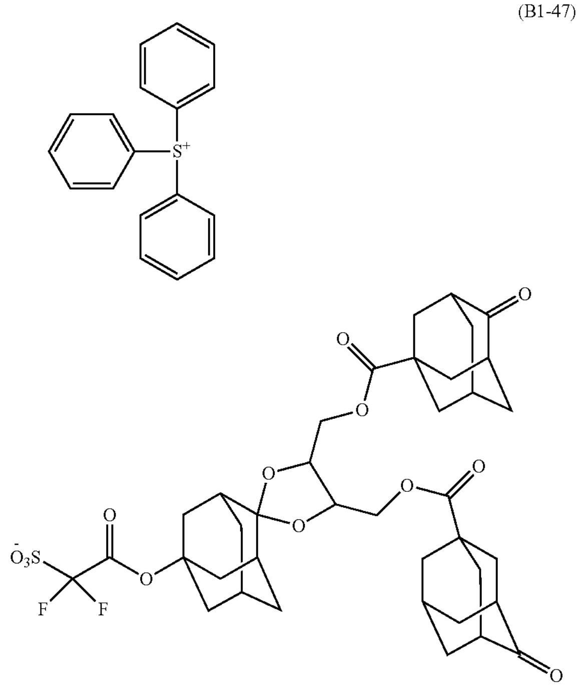
(B1-48)
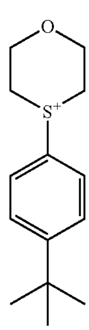
-continued
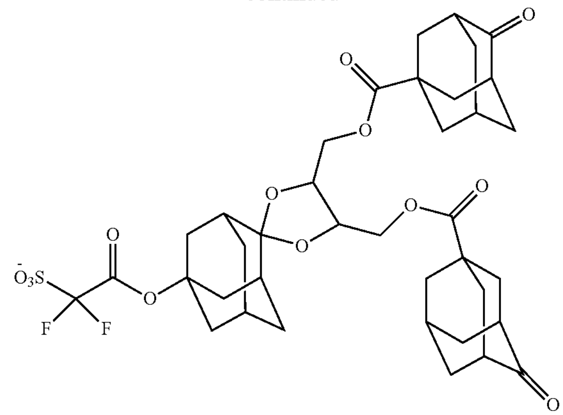
(B1-49)
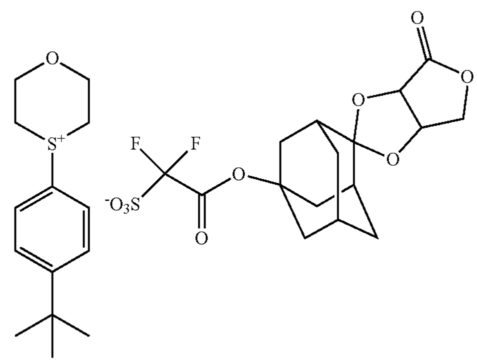
(B1-50)
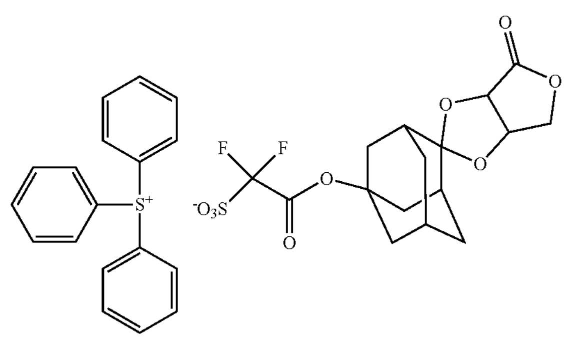
(B1-51)
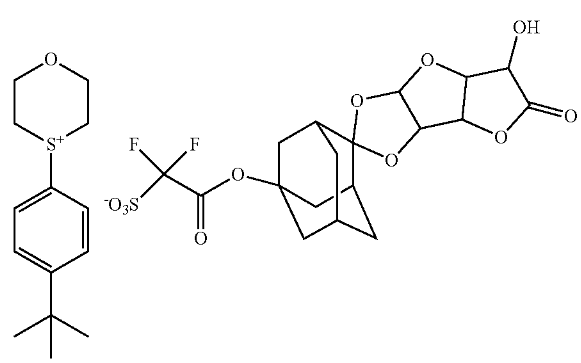

-continued (B1-52)

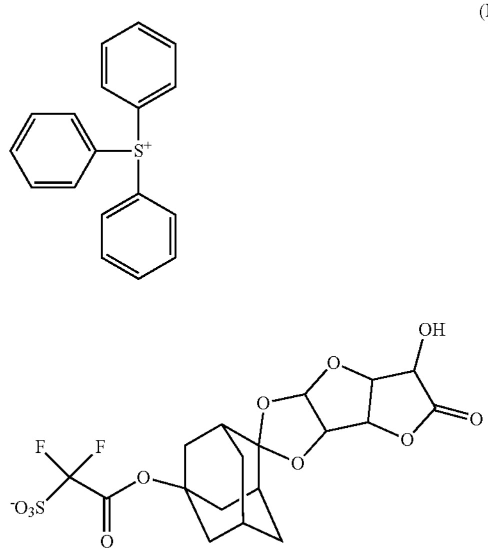

(B1-53)

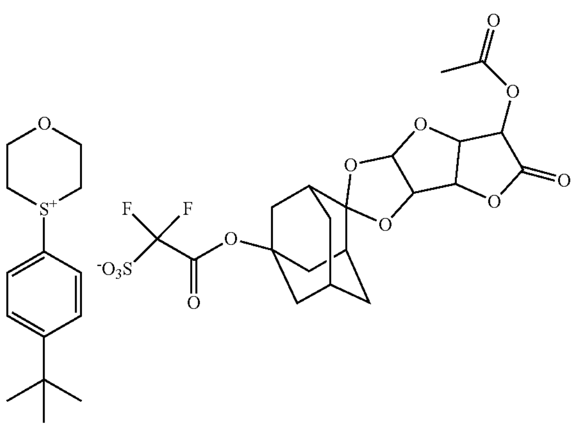

(B1-54)

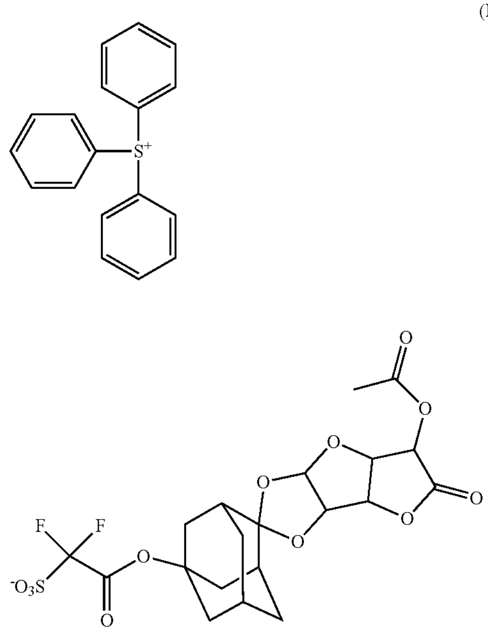

-continued (B1-55)

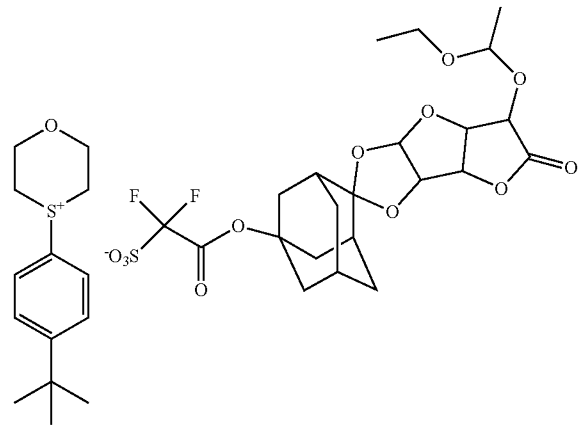

(B1-56)

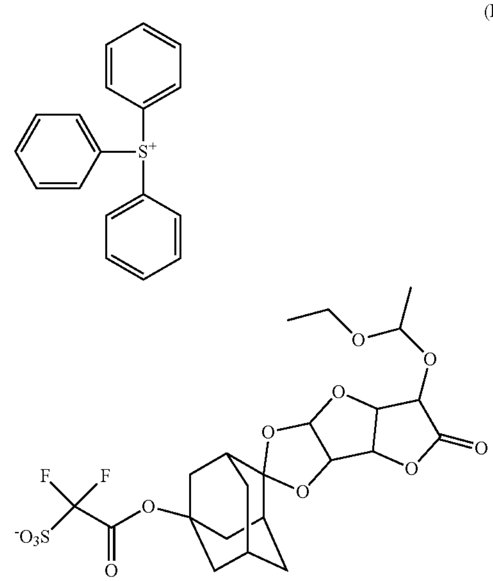

In the resist composition of the present invention, the content of the acid generator is preferably 1 part by mass or more and 45 parts by mass or less, more preferably 1 part by mass or more and 40 parts by mass or less, still more preferably 3 parts by mass or more and 40 parts by mass or less, and yet more preferably 10 parts by mass or more and 40 parts by mass or less, based on 100 parts by mass of the resin (A) mentioned above.

<Solvent (E)>

The content of the solvent (E) in the resist composition is usually 90% by mass or more and 99.9% by mass or less, preferably 92% by mass or more and 99% by mass or less, and more preferably 94% by mass or more and 99% by mass or less. The content of the solvent (E) can be measured, for example, by a known analysis means such as liquid chromatography or gas chromatography.

Examples of the solvent (E) include glycol ether esters such as ethylcellosolve acetate, methylcellosolve acetate and propylene glycol monomethyl ether acetate; glycol ethers such as propylene glycol monomethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. The solvent (E) may be used alone, or two or more solvents may be used.

<Quencher (C)>

Examples of the quencher (C) include a basic nitrogen-containing organic compound or a salt generating an acid having an acidity lower than that of an acid generated from the acid generator (B). When the resist composition includes the quencher (C), the content of the quencher (C) is preferably about 0.01 to 15% by mass, more preferably about 0.01 to 10% by mass, still more preferably about 0.1 to 5% by mass, and yet more preferably about 0.1 to 3% by mass, based on the amount of the solid component of the resist composition.

Examples of the basic nitrogen-containing organic compound include amine and an ammonium salt. Examples of the amine include an aliphatic amine and an aromatic amine. Examples of the aliphatic amine include a primary amine, a secondary amine and a tertiary amine.

Examples of the amine include 1-naphthylamine, 2-naphthylamine, aniline, diisopropylaniline, 2-, 3- or 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, dicyclohexylmethylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, 2,2'-methylenebisaniline, imidazole, 4-methylimidazole, pyridine, 4-methylpyridine, 1,2-di(2-pyridyl)ethane, 1,2-di(4-pyridyl)ethane, 1,2-di(2-pyridyl)ethene, 1,2-di(4-pyridyl)ethene, 1,3-di(4-pyridyl)propane, 1,2-di(4-pyridyloxy)ethane, di(2-pyridyl)ketone, 4,4'-dipyridyl sulfide, 4,4'-dipyridyl disulfide, 2,2'-dipyridylamine, 2,2'-dipicolylamine, bipyridine and the like, and aromatic amines such as diisopropylaniline are preferable and 2,6-diisopropylaniline is more preferable.

Examples of the ammonium salt include tetramethylammonium hydroxide, tetraisopropylammonium hydroxide, tetrabutylammonium hydroxide, tetrahexylammonium hydroxide, tetraoctylammonium hydroxide, phenyltrimethylammonium hydroxide, 3-(trifluoromethyl)phenyltrimethylammonium hydroxide, tetra-n-butylammonium salicylate and choline.

The acidity in a salt generating an acid having an acidity lower than that of an acid generated from the acid generator (B) is indicated by the acid dissociation constant (pKa). Regarding the salt generating an acid having an acidity lower than that of an acid generated from the acid generator (B), the acid dissociation constant of an acid generated from the salt usually meets the following inequality: $-3<\mathrm{pKa}$, preferably $-1<\mathrm{pKa}<7$, and more preferably $0<\mathrm{pKa}<5$.

Examples of the salt generating an acid having an acidity lower than that of an acid generated from the acid generator (B) include salts represented by the following formulas, a salt represented by formula (D) mentioned in JP 2015-147926 A (hereinafter sometimes referred to as "weak acid inner salt (D)"), and salts mentioned in JP 2012-229206 A, JP 2012-6908 A, JP 2012-72109 A, JP 2011-39502 A and JP 2011-191745 A. The salt is preferably a salt generating a carboxylic acid having an acidity lower than that of an acid generated from the acid generator (B) (a salt having a carboxylic acid anion), and more preferably a weak acid inner salt (D).

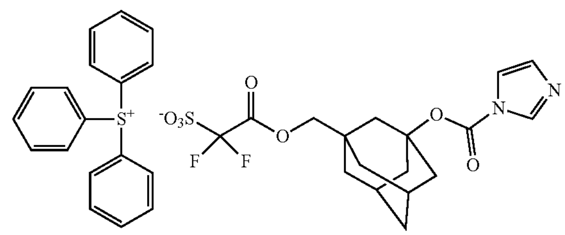

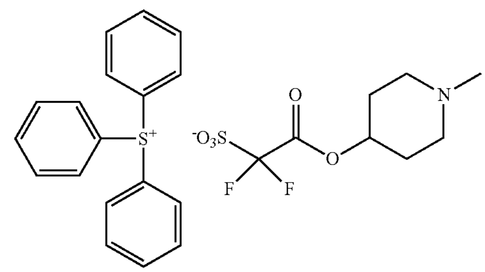

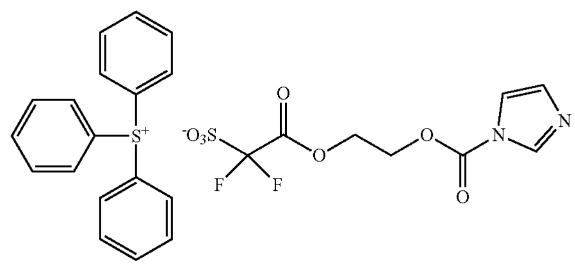

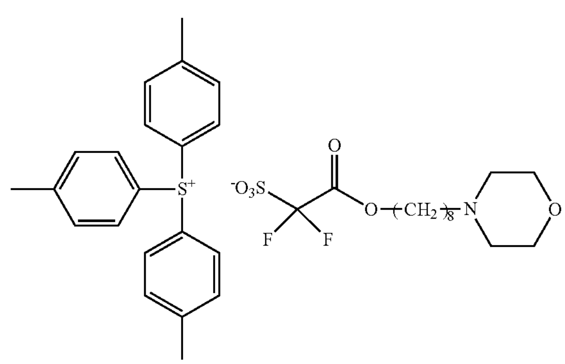

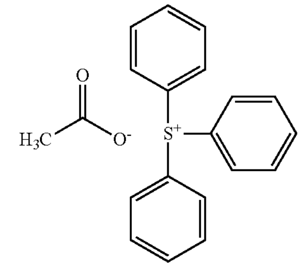

-continued
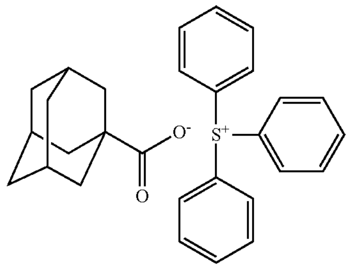
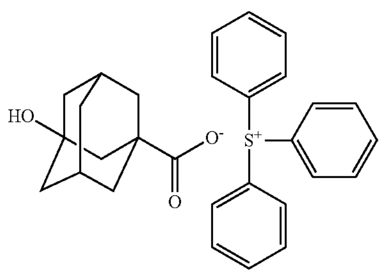
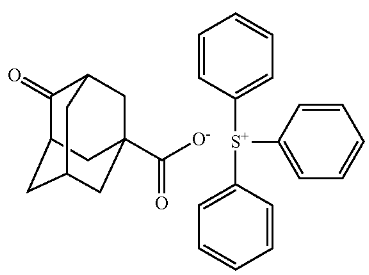
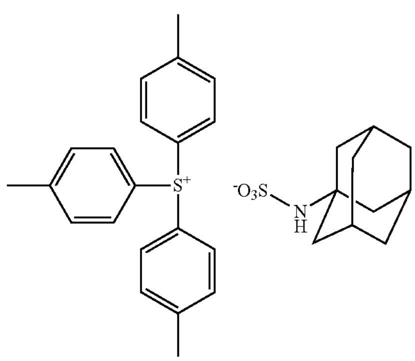
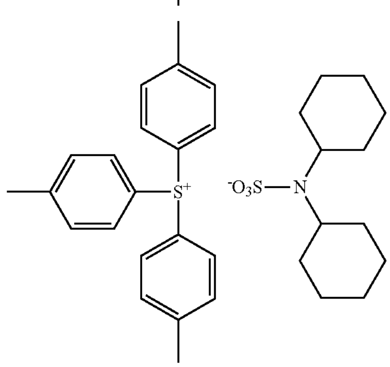
-continued
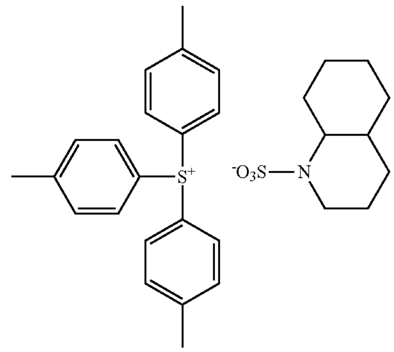
Examples of the weak acid inner salt (D) include the following salts.
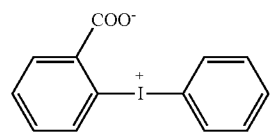
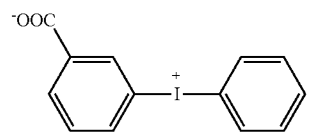
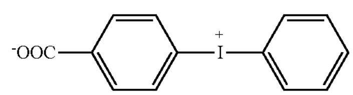
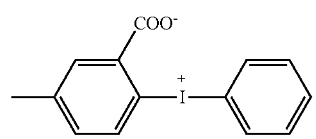
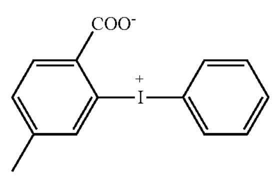
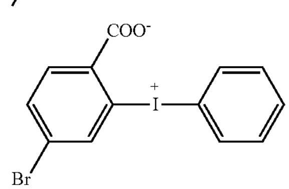
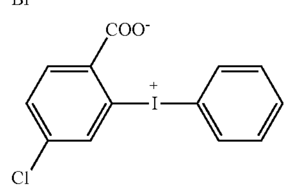
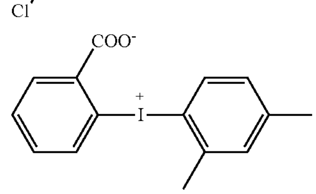

-continued

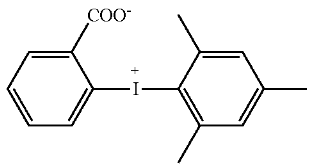

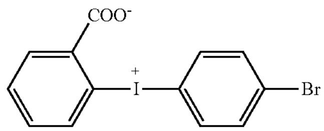

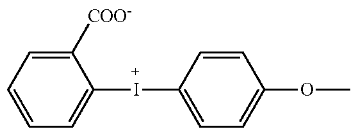

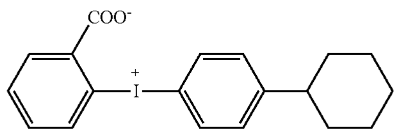

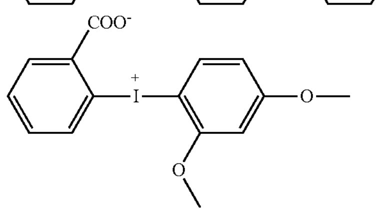

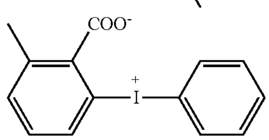

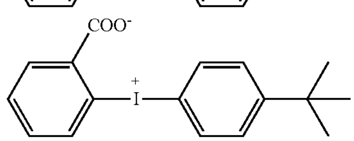

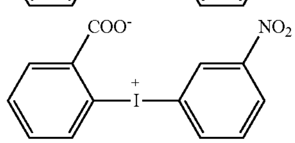

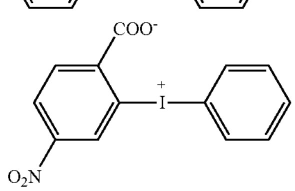

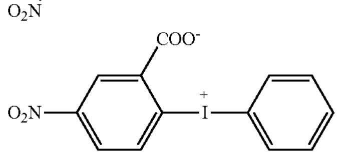

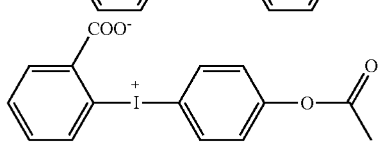

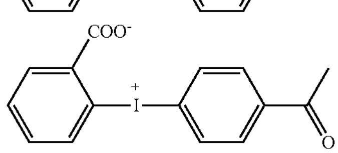

-continued

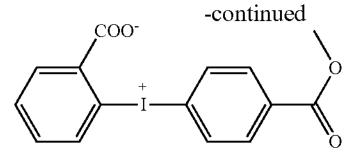

<Other Components>

The resist composition of the present invention may also include components other than the components mentioned above (hereinafter sometimes referred to as "other components (F)"). The other components (F) are not particularly limited and it is possible to use various additives known in the resist field, for example, sensitizers, dissolution inhibitors, surfactants, stabilizers and dyes.

<Preparation of Resist Composition>

The resist composition of the present invention can be prepared by mixing a resin (A), an acid generator (B) and, optionally, a resin other than the resin (A), a solvent (E), a quencher (C) and other components (F). The order of mixing these components is any order and is not particularly limited. It is possible to select, as the temperature during mixing, appropriate temperature from 10 to 40° C., according to the type of the resin, the solubility in the solvent (E) of the resin and the like. It is possible to select, as the mixing time, appropriate time from 0.5 to 24 hours according to the mixing temperature. The mixing means is not particularly limited and it is possible to use mixing with stirring.

After mixing the respective components, the mixture is preferably filtered through a filter having a pore diameter of about 0.003 to 0.2 μm.

<Method for Producing Resist Pattern>

The method for producing a resist pattern of the present invention comprises:

(1) a step of applying the resist composition of the present invention on a substrate, (2) a step of drying the applied composition to form a composition layer, (3) a step of exposing the composition layer, (4) a step of heating the exposed composition layer, and (5) a step of developing the heated composition layer.

The resist composition can be usually applied on a substrate using a conventionally used apparatus, such as a spin coater. Examples of the substrate include inorganic substrates such as a silicon wafer. Before applying the resist composition, the substrate may be washed, and an organic antireflection film may be formed on the substrate.

The solvent is removed by drying the applied composition to form a composition layer. Drying is performed by evaporating the solvent using a heating device such as a hot plate (so-called "prebake"), or a decompression device. The heating temperature is preferably 50 to 200° C. and the heating time is preferably 10 to 180 seconds. The pressure during drying under reduced pressure is preferably about 1 to $1.0\times10^5$ Pa.

The composition layer thus obtained is usually exposed using an aligner. The aligner may be a liquid immersion aligner. It is possible to use, as an exposure source, various exposure sources, for example, exposure sources capable of emitting laser beam in an ultraviolet region such as KrF excimer laser (wavelength of 248 nm), ArF excimer laser (wavelength of 193 nm) and $F_2$ excimer laser (wavelength of 157 nm), an exposure source capable of emitting harmonic laser beam in a far-ultraviolet or vacuum ultra violet region by wavelength-converting laser beam from a solid-state laser source (YAG or semiconductor laser), an exposure source capable of emitting electron beam or EUV and the like. In the present specification, such exposure to radiation is sometimes collectively referred to as exposure. The exposure is usually performed through a mask corresponding to a pattern to be required. When electron beam is used as the exposure source, exposure may be performed by direct writing without using the mask.

The exposed composition layer is subjected to a heat treatment (so-called "post-exposure bake") to promote the deprotection reaction in an acid-labile group. The heating temperature is usually about 50 to 200° C., and preferably about 70 to 150° C.

The heated composition layer is usually developed with a developing solution using a development apparatus. Examples of the developing method include a dipping method, a paddle method, a spraying method, a dynamic dispensing method and the like. The developing temperature is preferably, for example, 5 to 60° C. and the developing time is preferably, for example, 5 to 300 seconds. It is possible to produce a positive resist pattern or negative resist pattern by selecting the type of the developing solution as follows.

When the positive resist pattern is produced from the resist composition of the present invention, an alkaline developing solution is used as the developing solution. The alkaline developing solution may be various aqueous alkaline solutions used in this field. Examples thereof include aqueous solutions of tetramethylammonium hydroxide and (2-hydroxyethyl)trimethylammonium hydroxide (commonly known as choline). The surfactant may be contained in the alkaline developing solution.

It is preferable that the developed resist pattern is washed with ultrapure water and then water remaining on the substrate and the pattern is removed.

When the negative resist pattern is produced from the resist composition of the present invention, a developing solution containing an organic solvent (hereinafter sometimes referred to as "organic developing solution") is used as the developing solution.

Examples of the organic solvent contained in the organic developing solution include ketone solvents such as 2-hexanone and 2-heptanone; glycol ether ester solvents such as propylene glycol monomethyl ether acetate; ester solvents such as butyl acetate; glycol ether solvents such as propylene glycol monomethyl ether; amide solvents such as N,N-dimethylacetamide; and aromatic hydrocarbon solvents such as anisole.

The content of the organic solvent in the organic developing solution is preferably 90% by mass or more and 100% by mass or less, more preferably 95% by mass or more and 100% by mass or less, and still more preferably the organic developing solution is substantially composed of the organic solvent.

Particularly, the organic developing solution is preferably a developing solution containing butyl acetate and/or 2-heptanone. The total content of butyl acetate and 2-heptanone in the organic developing solution is preferably 50% by mass or more and 100% by mass or less, more preferably 90% by mass or more and 100% by mass or less, and still more preferably the organic developing solution is substantially composed of butyl acetate and/or 2-heptanone.

The surfactant may be contained in the organic developing solution. A trace amount of water may be contained in the organic developing solution.

During development, the development may be stopped by replacing by a solvent with the type different from that of the organic developing solution.

The developed resist pattern is preferably washed with a rinsing solution. The rinsing solution is not particularly limited as long as it does not dissolve the resist pattern, and it is possible to use a solution containing an ordinary organic solvent which is preferably an alcohol solvent or an ester solvent.

After washing, the rinsing solution remaining on the substrate and the pattern is preferably removed.

<Applications>

The resist composition of the present invention is suitable as a resist composition for exposure of KrF excimer laser, a resist composition for exposure of ArF excimer laser, a resist composition for exposure of electron beam (EB) or a resist composition for exposure of EUV, and particularly suitable as a resist composition for exposure of electron beam (EB) or a resist composition for exposure of EUV, and the resist composition is useful for fine processing of semiconductors.

EXAMPLES

The present invention will be described more specifically by way of Examples. Percentages and parts expressing the contents or amounts used in the Examples are by mass unless otherwise specified.

The weight-average molecular weight is a value determined by gel permeation chromatography. Analysis conditions of gel permeation chromatography are as follows.

Column: TSKgel Multipore HXL-M×3+guardcolumn (manufactured by TOSOH CORPORATION)
Eluent: tetrahydrofuran
Flow rate: 1.0 mL/min
Detector: RI detector
Column temperature: 40° C.
Injection amount: 100 μl
Molecular weight standards: polystyrene standard (manufactured by TOSOH CORPORATION)

Structures of compounds were confirmed by measuring a molecular ion peak using mass spectrometry (Liquid Chromatography: Model 1100, manufactured by Agilent Technologies, Inc., Mass Spectrometry: Model LC/MSD, manufactured by Agilent Technologies, Inc.). The value of this molecular ion peak in the following Examples is indicated by "MASS".

Synthesis Example 1: Synthesis of Compound Represented by Formula (I-17)

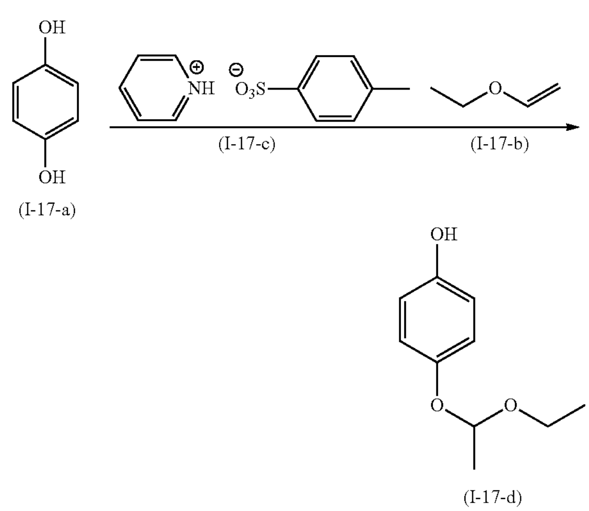

20 Parts of a compound represented by formula (I-17-a), 2.28 parts of a compound represented by formula (I-17-c), 100 parts of ethyl acetate and 15 parts of tetrahydrofuran were mixed, followed by stirring at 23° C. for 30 minutes. To the mixed solution thus obtained, 6.55 parts of a compound represented by formula (I-17-b) was added, followed by stirring at 23° C. for 18 hours. To the reaction mass thus obtained, 20 parts of n-heptane and 70 parts of ion-exchanged water were added and, after stirring at 23° C. for 30 minutes, the organic layer was isolated through separation. To the organic layer thus recovered, 60 parts of ion-exchanged water was added and, after stirring at 23° C. for 30 minutes, the organic layer was isolated through separation. This water washing operation was repeated four times. The organic layer thus obtained was concentrated and then the concentrated mass was isolated from a column (silica gel 60 N (spherical, neutral) 100-210 μm; manufactured by Kanto Chemical Co., Inc., developing solvent: n-heptane/ethyl acetate=1/1) to obtain 7.48 parts of a compound represented by formula (1-17-d).

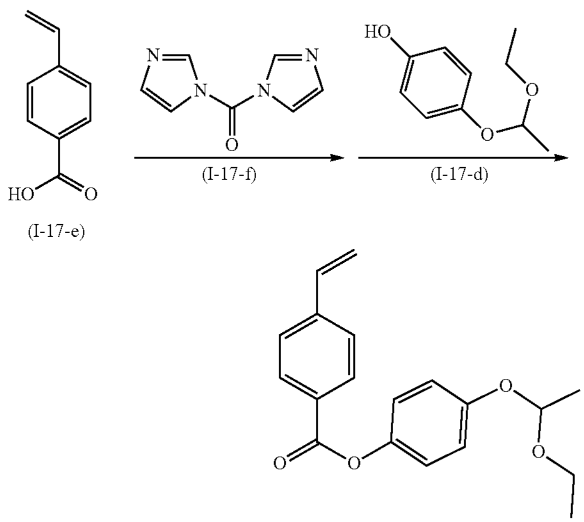

(I-17)

5.90 Parts of a compound represented by formula (I-17-e), 7.10 parts of a compound represented by formula (I-17-f) and 30 parts of acetonitrile were mixed, followed by stirring at 23° C. for 30 minutes and further stirring at 60° C. for 1 hour. To the mixture thus obtained, 7.26 parts of a compound represented by formula (I-17-d) was added, followed by stirring at 60° C. for 1 hour. The reaction mass thus obtained was cooled to 23° C., and then 100 parts of ethyl acetate and 50 parts of ion-exchanged water were added and, after stirring at 23° C. for 30 minutes, the organic layer was isolated through separation. This water washing operation was repeated four times. The organic layer thus obtained was concentrated, and then the concentrated mass was isolated from a column (silica gel 60 N (spherical, neutral) 100-210 μm; manufactured by Kanto Chemical Co., Inc., developing solvent: n-heptane/ethyl acetate=5/1) to obtain 9.44 parts of a compound represented by formula (I-17).

MASS (mass analysis): 313.1 $[M+H]^+$

Synthesis Example 2: Synthesis of Compound Represented by Formula (I-25)

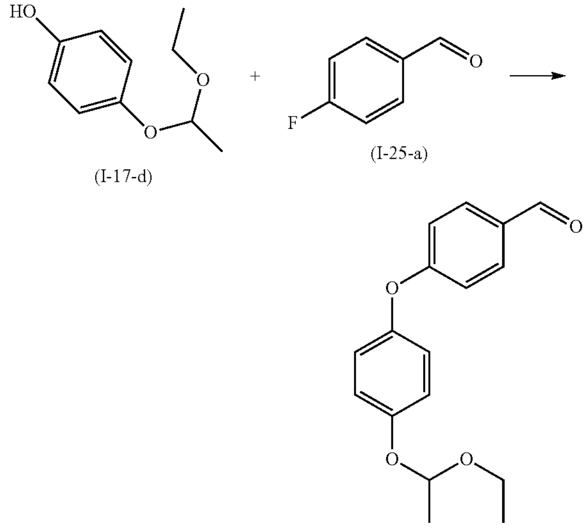

(I-25-b)

5.00 parts of a compound represented by formula (I-25-a), 10.39 parts of a compound represented by formula (I-17-d), 50 parts of dimethylformamide and 11.14 parts of potassium carbonate were mixed, followed by stirring at 23° C. for 30 minutes and further stirring at 120° C. for 18 hours. The mixture thus obtained was cooled to 23° C., and then 150 parts of ion-exchanged water and 150 parts of ethyl acetate were added and, after stirring at 23° C. for 30 minutes, the organic layer was isolated through separation. To the organic layer thus obtained, 150 parts of ion-exchanged water was added and, after stirring at 23° C. for 30 minutes, the organic layer was isolated through separation. This water washing operation was repeated three times. The organic layer thus obtained was concentrated, and then the concentrated mass was isolated from a column (silica gel 60 N (spherical, neutral) 100-210 μm; manufactured by Kanto Chemical Co., Inc., developing solvent: n-heptane/ethyl acetate=5/1) to obtain 10.61 parts of a compound represented by formula (I-25-b).

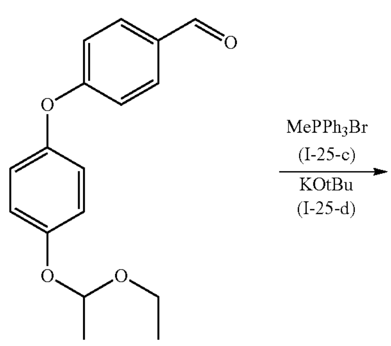

(I-25-b)

-continued

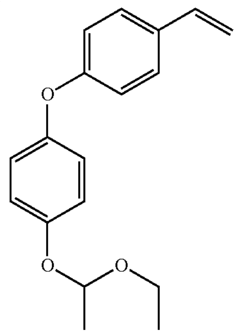

(I-25)

17.16 Parts of a compound represented by formula (I-25-c), 5.39 parts of a compound represented by formula (I-25-d) and 120 parts of tetrahydrofuran were mixed, followed by stirring at 23° C. for 30 minutes and further cooling to 5° C. To the mixture thus obtained, 10.58 parts of a compound represented by formula (I-25-b) was added at 5° C. over 30 minutes, followed by temperature rising to 23° C., stirring at 23° C. for 12 hours and further filtration. To the filtrate thus obtained, 100 parts of ion-exchanged water and 200 parts of ethyl acetate were added and, after stirring at 23° C. for 30 minutes, the organic layer was isolated through separation. To the organic layer thus obtained, 100 parts of ion-exchanged water was added and, after stirring at 23° C. for 30 minutes, the organic layer was isolated through separation. This water washing operation was repeated three times. The organic layer thus obtained was concentrated, and then the concentrated mass was isolated from a column (silica gel 60 N (spherical, neutral) 100-210 μm; manufactured by Kanto Chemical Co., Inc., developing solvent: n-heptane/ethyl acetate=5/1) to obtain 6.82 parts of a compound represented by formula (I-25).

MASS (mass analysis): 285.1 $[M+H]^+$

Example 1: Synthesis of Compound Represented by Formula (I-43)

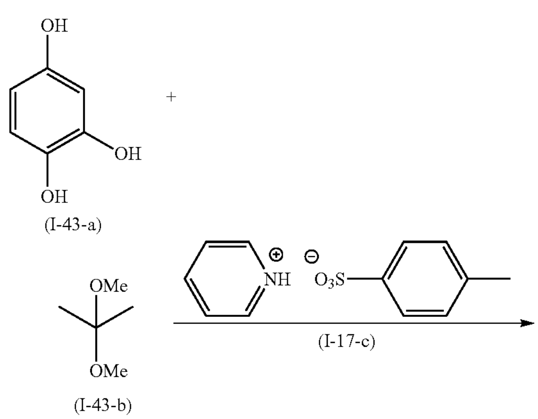

(I-43-a) (I-43-b) (I-17-c)

-continued

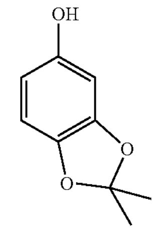

(I-43-d)

5.00 Parts of a compound represented by formula (I-43-a), 0.008 part of a compound represented by formula (I-17-c) and 50 parts of toluene were mixed, followed by stirring at 23° C. for 30 minutes and further temperature rising to 100° C. To the mixed solution thus obtained, 6.19 parts of a compound represented by formula (I-43-b) was added drop-wise at 100° C., followed by stirring at 110° C. for 2 hours and further cooling to 23° C. To the mixture thus obtained, 25 parts of ethyl acetate and 30 parts of ion-exchanged water were added and, after stirring at 23° C. for 30 minutes, the organic layer was isolated through separation. To the organic layer thus recovered, 30 parts of ion-exchanged water was added and, after stirring at 23° C. for 30 minutes, the organic layer was isolated through separation. This water washing operation was repeated three times. The organic layer thus obtained was concentrated to obtain 5.85 parts of a compound represented by formula (I-43-d).

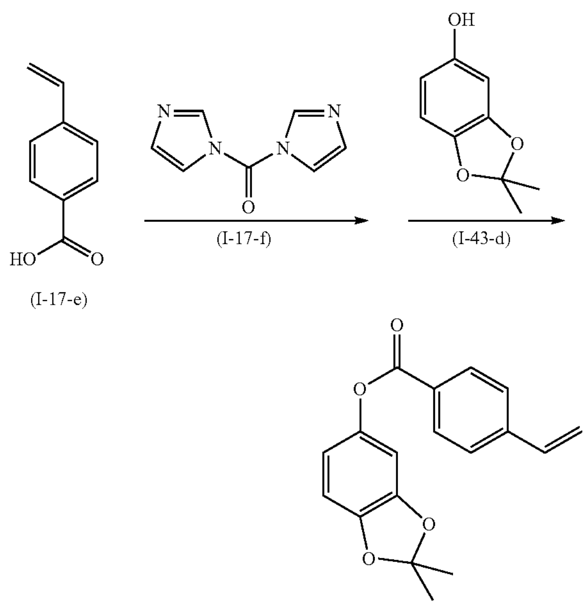

(I-17-e) (I-17-f) (I-43-d)

(I-43)

4.20 Parts of a compound represented by formula (I-17-e), 5.06 parts of a compound represented by formula (I-17-f) and 30 parts of acetonitrile were mixed, followed by stirring at 23° C. for 30 minutes and further stirring at 60° C. for 1 hour. To the mixture thus obtained, 5.79 parts of a compound represented by formula (I-43-d) was added, followed by stirring at 60° C. for 1 hour. The reaction mass thus obtained was cooled to 23° C., and then 100 parts of ethyl acetate and 50 parts of ion-exchanged water were added and, after stirring at 23° C. for 30 minutes, the organic layer was isolated through separation. To the organic layer thus recovered, 50 parts of ion-exchanged water was added and, after stirring at 23° C. for 30 minutes, the organic layer was isolated through separation. This water washing operation was repeated three times. The organic layer thus obtained was concentrated, and then the concentrated mass was isolated from a column (silica gel 60 N (spherical, neutral) 100-210 μm; manufactured by Kanto Chemical Co., Inc., developing solvent: n-heptane/ethyl acetate=10/1) to obtain 3.10 parts of a compound represented by formula (I-43).

MASS (mass analysis): 297.1 $[M+H]^+$

Example 2: Synthesis of Compound Represented by Formula (I-33)

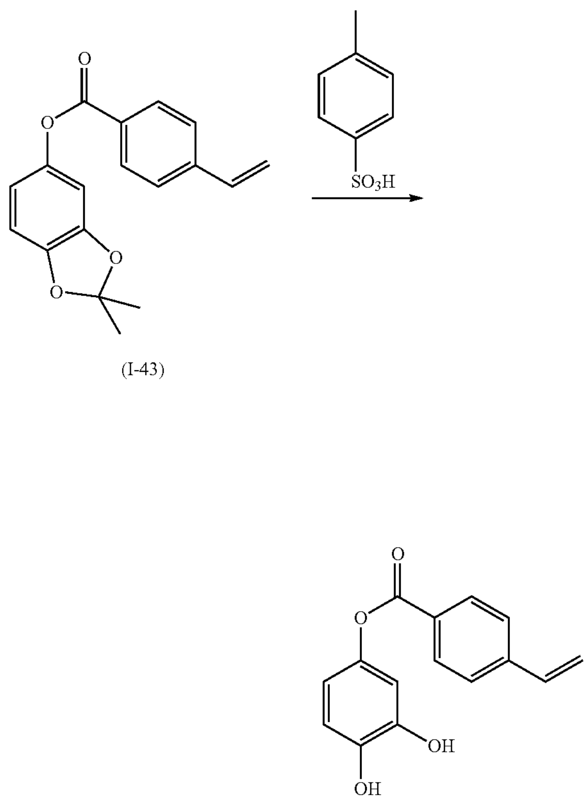

(I-43)

(I-33)

2.95 Parts of a compound represented by formula (I-43), 1.89 parts of p-toluenesulfonic acid and 30 parts of acetonitrile were mixed, followed by stirring at 23° C. for 30 minutes and further stirring at 60° C. for 10 hours. The mixture thus obtained was cooled to 23° C., and then 50 parts of ethyl acetate and 20 parts of ion-exchanged water were added and, after stirring at 23° C. for 30 minutes, the organic layer was isolated through separation. To the organic layer thus obtained, 20 parts of ion-exchanged water was added and, after stirring at 23° C. for 30 minutes, the organic layer was isolated through separation. This water washing operation was repeated three times. The organic layer thus obtained was concentrated to obtain 1.95 parts of a compound represented by formula (I-33).

MASS (mass analysis): 257.1 $[M+H]^+$

Synthesis Example 3: Synthesis of Compound Represented by Formula (I-67)

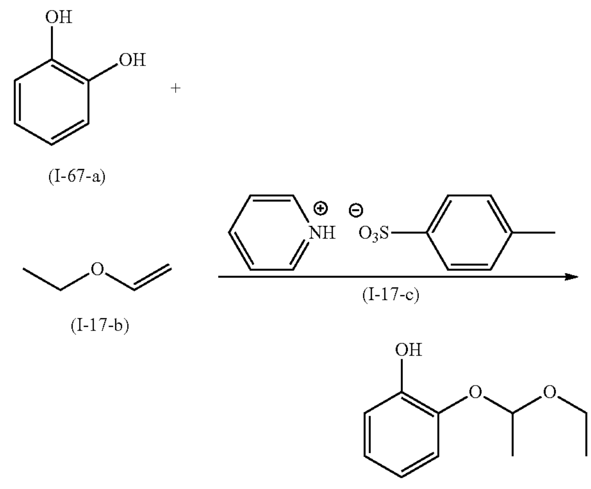

(I-67-a)

(I-17-b)

(I-17-c)

(I-67-d)

20 Parts of a compound represented by formula (I-67-a), 2.28 parts of a compound represented by formula (I-17-c), 100 parts of ethyl acetate and 14 parts of tetrahydrofuran were mixed, followed by stirring at 23° C. for 30 minutes and further cooling to 10° C. To the mixed solution thus obtained, 6.55 parts of a compound represented by formula (I-17-b) was added dropwise at 10° C., followed by temperature rising to 23° C. and further stirring at 23° C. for 2 hours. To the mixture thus obtained, 70 parts of ion-exchanged water was added and, after stirring at 23° C. for 30 minutes, the organic layer was isolated through separation. This water washing operation was repeated five times. The organic layer thus obtained was concentrated, and then the concentrated mass was isolated from a column (silica gel 60 N (spherical, neutral) 100-210 μm; manufactured by Kanto Chemical Co., Inc., developing solvent: n-heptane/ethyl acetate=10/1) to obtain 8.75 parts of a compound represented by formula (1-67-d).

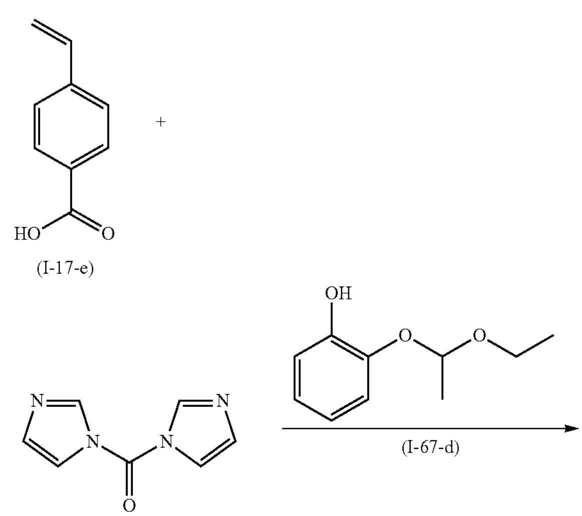

(I-17-e)

(I-17-f)

(I-67-d)

-continued

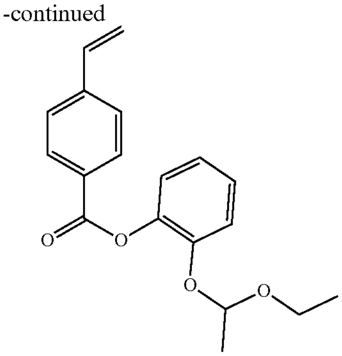

(I-67)

6.40 Parts of a compound represented by formula (I-17-e), 7.70 parts of a compound represented by formula (I-17-f) and 32 parts of acetonitrile were mixed, followed by stirring at 23° C. for 30 minutes and further stirring at 60° C. for 1 hour. To the mixture thus obtained, 8.65 parts of a compound represented by formula (I-67-d) was added, followed by stirring at 60° C. for 1 hour. The reaction mass thus obtained was cooled to 23° C., and then 100 parts of ethyl acetate and 50 parts of ion-exchanged water were added and, after stirring at 23° C. for 30 minutes, the organic layer was isolated through separation. This water washing operation was repeated four times. The organic layer thus obtained was concentrated, and then the concentrated mass was isolated from a column (silica gel 60 N (spherical, neutral) 100-210 μm; manufactured by Kanto Chemical Co., Inc., developing solvent: n-heptane/ethyl acetate=5/1) to obtain 9.84 parts of a compound represented by formula (I-67).

MASS (mass analysis): 313.1 $[M+H]^+$

Synthesis Example 4: Synthesis of Compound Represented by Formula (I-68)

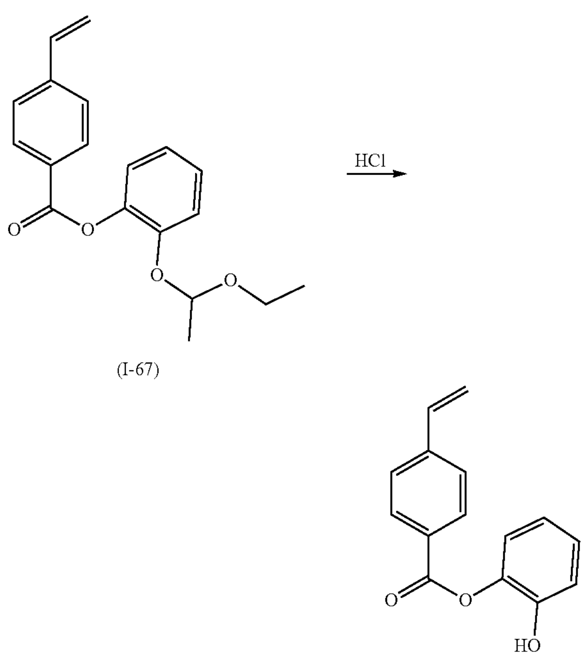

(I-67)

(I-68)

5.00 Parts of a compound represented by formula (I-67), 20 parts of 1N hydrochloric acid and 30 parts of acetonitrile were mixed, followed by stirring at 23° C. for 10 hours. To the mixture thus obtained, 50 parts of ethyl acetate was added and, after stirring at 23° C. for 30 minutes, the organic layer was isolated through separation. To the organic layer thus obtained, 20 parts of ion-exchanged water was added and, after stirring at 23° C. for 30 minutes, the organic layer was isolated through separation. This water washing operation was repeated three times. The organic layer thus obtained was concentrated and then 100 parts of n-heptane was added, followed by stirring at 23° C. for 30 minutes and further filtration to obtain 3.75 parts of a compound represented by formula (I-68).

MASS (mass analysis): 241.1 $[M+H]^+$

Example 3: Synthesis of Compound Represented by Formula (I-49)

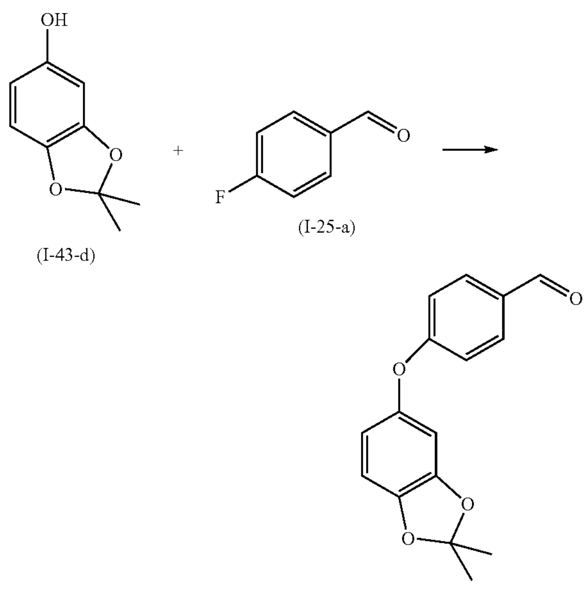

(I-43-d)

(I-25-a)

(I-49-b)

2.50 Parts of a compound represented by formula (I-25-a), 4.74 parts of a compound represented by formula (I-43-d), 25 parts of dimethylformamide and 5.57 parts of potassium carbonate were mixed, followed by stirring at 23° C. for 30 minutes and further stirring at 120° C. for 18 hours. The mixture thus obtained was cooled to 23° C., and then 80 parts of ion-exchanged water and 80 parts of ethyl acetate were added and, after stirring at 23° C. for 30 minutes, the organic layer was isolated through separation. To the organic layer thus obtained, 80 parts of ion-exchanged water was added and, after stirring at 23° C. for 30 minutes, the organic layer was isolated through separation. This water washing operation was repeated three times. The organic layer thus obtained was concentrated, and then the concentrated mass was isolated from a column (silica gel 60 N (spherical, neutral) 100-210 μm; manufactured by Kanto Chemical Co., Inc., developing solvent: n-heptane/ethyl acetate=5/1) to obtain 5.01 parts of a compound represented by formula (I-49-b).

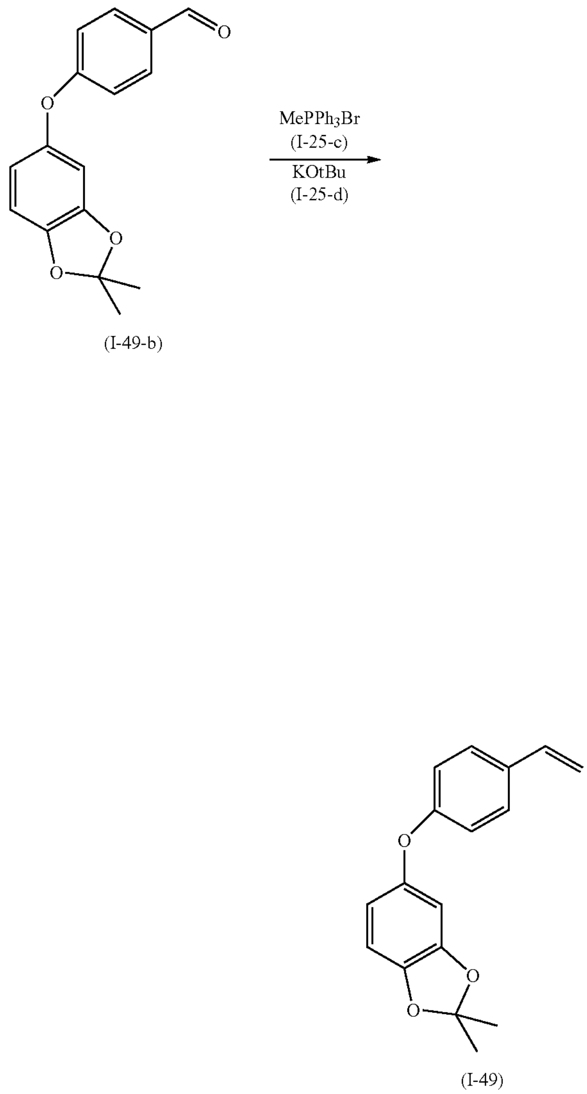

8.58 Parts of a compound represented by formula (I-25-c), 2.70 parts of a compound represented by formula (I-25-d) and 60 parts of tetrahydrofuran were mixed, followed by stirring at 23° C. for 30 minutes and further cooling to 5° C. To the mixture thus obtained, 5.00 parts of a compound represented by formula (I-49-b) was added at 5° C. over 30 minutes, followed by temperature rising to 23° C., stirring at 23° C. for 12 hours and further filtration. To the filtrate thus obtained, 100 parts of ion-exchanged water and 200 parts of ethyl acetate were added and, after stirring at 23° C. for 30 minutes, the organic layer was isolated through separation. To the organic layer thus obtained, 100 parts of ion-exchanged water was added and, after stirring at 23° C. for 30 minutes, the organic layer was isolated through separation. This water washing operation was repeated three times. The organic layer thus obtained was concentrated, and then the concentrated mass was isolated from a column (silica gel 60 N (spherical, neutral) 100-210 μm; manufactured by Kanto Chemical Co., Inc., developing solvent: n-heptane/ethyl acetate=5/1) to obtain 3.22 parts of a compound represented by formula (I-49).

MASS (mass analysis): 269.1 $[M+H]^+$

Example 4: Synthesis of Compound Represented by Formula (I-37)

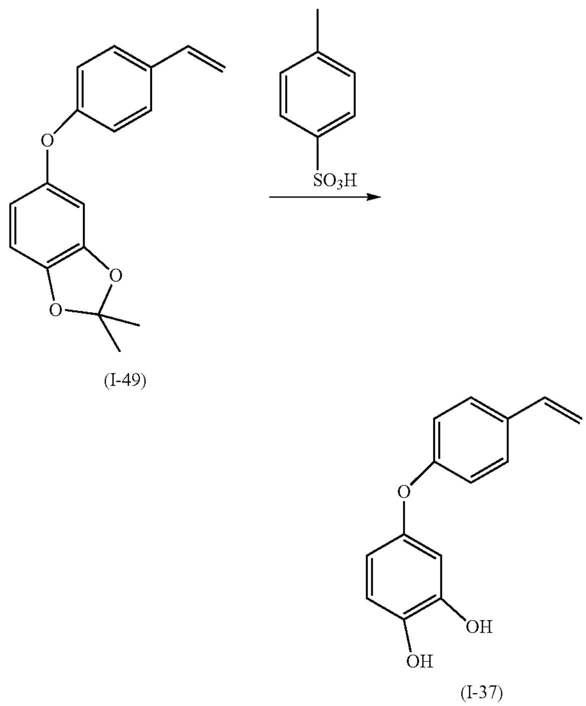

2.67 Parts of a compound represented by formula (I-49), 1.89 parts of p-toluenesulfonic acid and 30 parts of acetonitrile were mixed, followed by stirring at 23° C. for 30 minutes and further stirring at 60° C. for 10 hours. The mixture thus obtained was cooled to 23° C., and then 50 parts of ethyl acetate and 20 parts of ion-exchanged water were added and, after stirring at 23° C. for 30 minutes, the organic layer was isolated through separation. To the organic layer thus obtained, 20 parts of ion-exchanged water were added and, after stirring at 23° C. for 30 minutes, the organic layer was isolated through separation. This water washing operation was repeated three times. The organic layer thus obtained was concentrated to obtain 1.69 parts of a compound represented by formula (I-37).

MASS (mass analysis): 229.1 $[M+H]^+$

Example 5: Synthesis of Compound Represented by Formula (I-81)

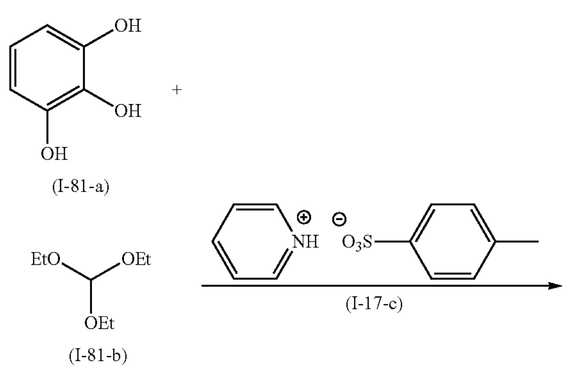

-continued

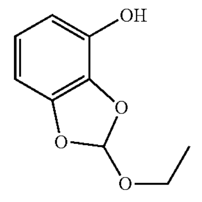

(I-81-d)

5.00 parts of a compound represented by formula (I-81-a), 0.008 part of a compound represented by formula (I-17-c) and 50 parts of toluene were mixed, followed by stirring at 23° C. for 30 minutes and further temperature rising to 100° C. To the mixed solution thus obtained, 7.05 parts of a compound represented by formula (I-81-b) was added at 100° C., followed by stirring at 110° C. for 2 hours and further cooling to 23° C. To the mixture thus obtained, 25 parts of ethyl acetate and 30 parts of ion-exchanged water were added and, after stirring at 23° C. for 30 minutes, the organic layer was isolated through separation. To the organic layer thus recovered, 30 parts of ion-exchanged water were added and, after stirring at 23° C. for 30 minutes, the organic layer was isolated through separation. This water washing operation was repeated three times. The organic layer thus obtained was concentrated, and then the concentrated mass was isolated from a column (silica gel 60 N (spherical, neutral) 100-210 μm; manufactured by Kanto Chemical Co., Inc., developing solvent: n-heptane/ethyl acetate=10/1) to obtain 2.19 parts of a compound represented by formula (I-81-d).

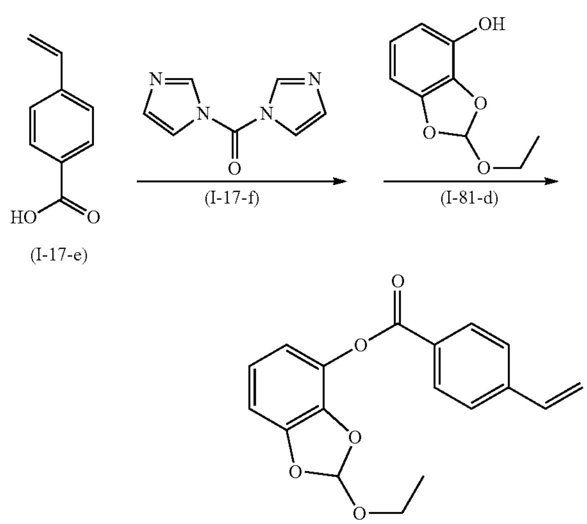

(I-17-e) (I-17-f) (I-81-d)

(I-81)

1.40 parts of a compound represented by formula (I-17-e), 1.69 parts of a compound represented by formula (I-17-f) and 20 parts of acetonitrile were mixed, followed by stirring at 23° C. for 30 minutes and further stirring at 60° C. for 1 hour. To the mixture thus obtained, 2.12 parts of a compound represented by formula (I-81-d) was added, followed by stirring at 60° C. for 1 hour. The reaction mass thus obtained was cooled to 23° C., and then 50 parts of ethyl acetate and 25 parts of ion-exchanged water were added and, after stirring at 23° C. for 30 minutes, the organic layer was isolated through separation. To the organic layer thus recovered, 25 parts of ion-exchanged water was added and, after stirring at 23° C. for 30 minutes, the organic layer was isolated through separation. This water washing operation was repeated three times. The organic layer thus obtained was concentrated, and then the concentrated mass was isolated from a column (silica gel 60 N (spherical, neutral) 100-210 μm; manufactured by Kanto Chemical Co., Inc., developing solvent: n-heptane/ethyl acetate=10/1) to obtain 1.03 parts of a compound represented by formula (I-81).

MASS (mass analysis): 313.1 $[M+H]^+$

Example 6: Synthesis of Compound Represented by Formula (I-71)

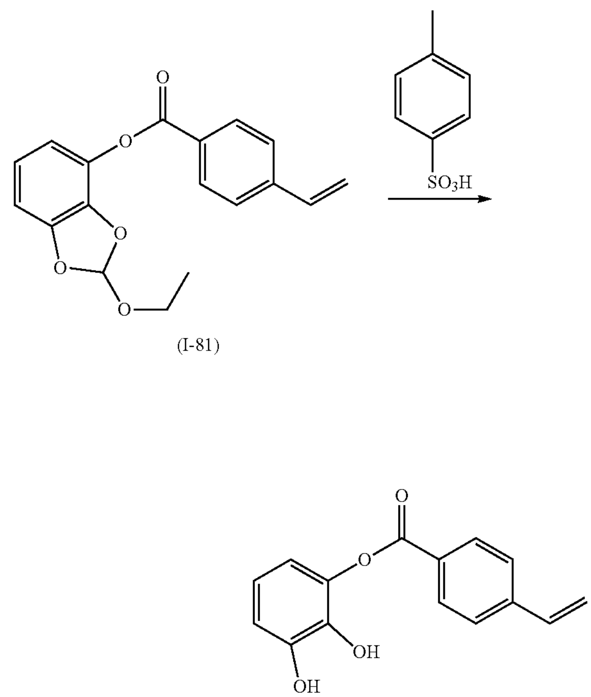

(I-81)

(I-71)

1.03 Parts of a compound represented by formula (I-81), 0.63 part of p-toluenesulfonic acid and 10 parts of acetonitrile were mixed, followed by stirring at 23° C. for 30 minutes and further stirring at 60° C. for 10 hours. The mixture thus obtained was cooled to 23° C., and then 30 parts of ethyl acetate and 15 parts of ion-exchanged water were added and, after stirring at 23° C. for 30 minutes, the organic layer was isolated through separation. To the organic layer thus obtained, 15 parts of ion-exchanged water was added and, after stirring at 23° C. for 30 minutes, the organic layer was isolated through separation. This water washing operation was repeated three times. The organic layer thus obtained was concentrated to obtain 0.38 part of a compound represented by formula (I-71).

MASS (mass analysis): 257.1 $[M+H]^+$

Synthesis of Resin

Compounds (monomers) used in the synthesis of resins are shown below.

-continued
(a1-1-3)
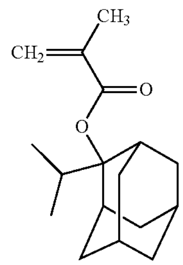
(a1-2-6)
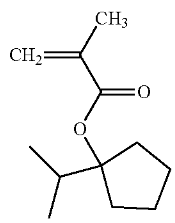
(a1-4-2)
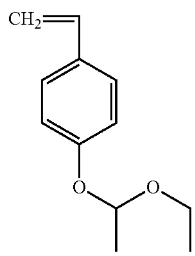
(a2-1-3)
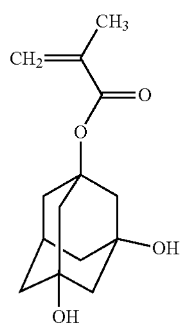
(a3-4-2)
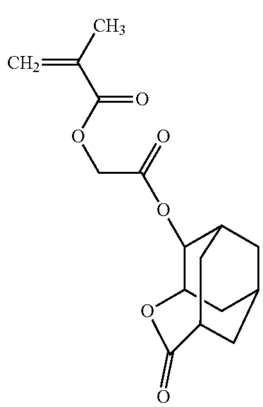
(I-17)
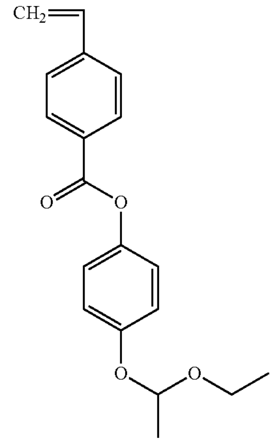
(I-25)
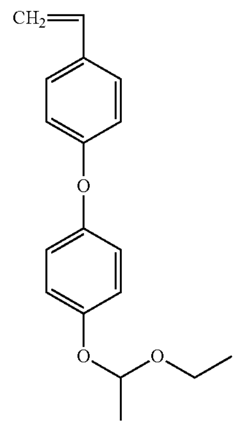
(I-33)
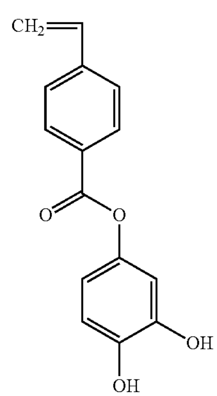

-continued
(I-43)
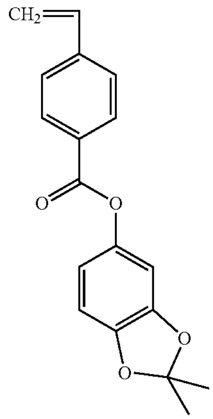
(I-37)
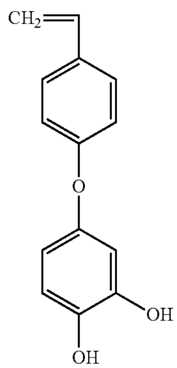
(I-49)
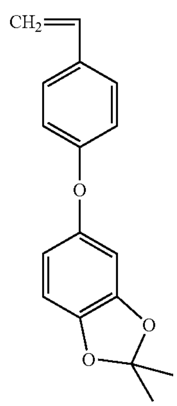
(I-67)
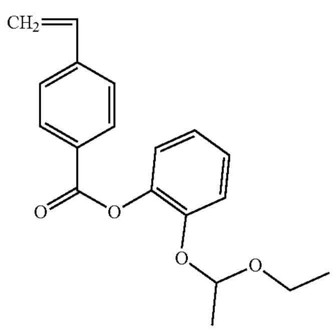
-continued
(I-68)
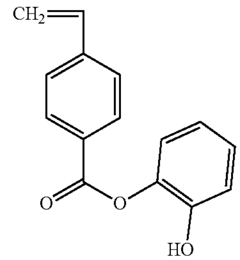
(I-71)
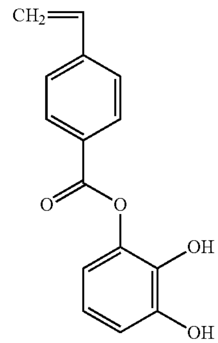
(I-81)
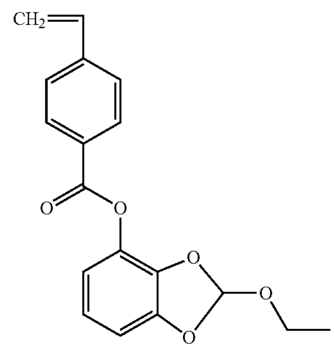
(ax-1)
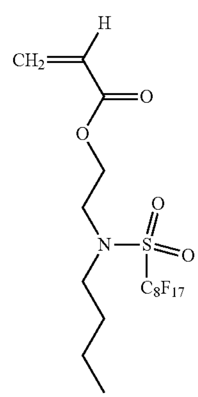
(ax-2)
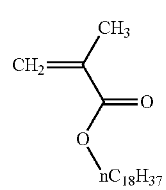
Hereinafter, these monomers are referred to as "monomer (a1-1-3)" according to the number of formula.

Example 7 [Synthesis of Resin A1]

Using a monomer (a1-4-2), a monomer (a1-1-3), a monomer (a1-2-6) and a monomer (I-17) as monomers, these monomers were mixed in a molar ratio of 19:25:38:18 [monomer (a1-4-2):monomer (a1-1-3):monomer (a1-2-6): monomer (I-17)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, an aqueous p-toluenesulfonic acid solution was added to the polymerization reaction solution, followed by stirring for 12 hours and further isolation through separation. The organic layer thus recovered was poured into a large amount of n-heptane to precipitate a resin, followed by filtration and recovery to obtain a resin A1 having a weight-average molecular weight of about $5.6\times10^3$ in a yield of 62%. This resin A1 includes the following structural units (an elimination ratio of an ethoxyethyl group in all ethoxyethyl groups of the monomer (a1-4-2) and the monomer (I-17) is 100%).

A1

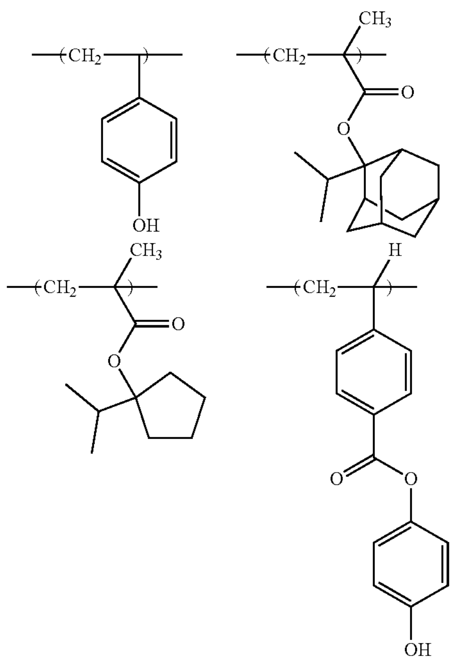

Example 8 [Synthesis of Resin A2]

Using a monomer (a1-4-2), a monomer (a1-1-3), a monomer (a1-2-6) and a monomer (I-17) as monomers, these monomers were mixed in a molar ratio of 19:25:38:18 [monomer (a1-4-2):monomer (a1-1-3):monomer (a1-2-6): monomer (I-17)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, the polymerization reaction solution was cooled to 15° C. and an aqueous p-toluenesulfonic acid solution was added, followed by stirring for 6 hours and further isolation through separation. The organic layer thus recovered was poured into a large amount of n-heptane to precipitate a resin, followed by filtration and recovery to obtain a resin A2 having a weight-average molecular weight of about $5.9\times10^3$ in a yield of 58%. This resin A2 includes the following structural units (an elimination ratio of an ethoxyethyl group in all ethoxyethyl groups of the monomer (a1-4-2) and the monomer (I-17) is 72%).

A2

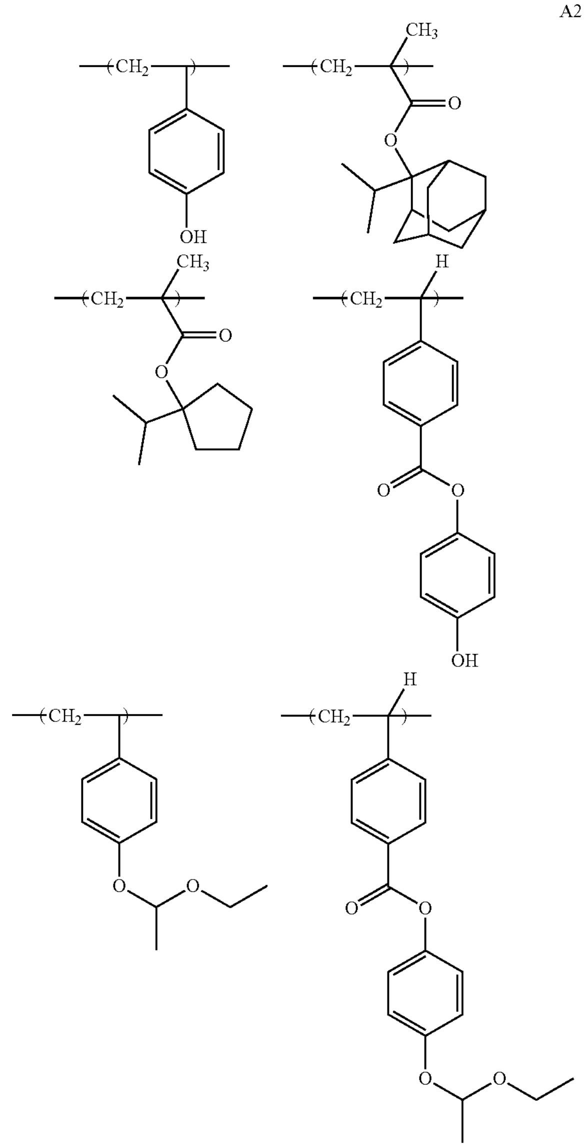

Example 9 [Synthesis of Resin A3]

Using a monomer (a1-1-3), a monomer (a1-2-6) and a monomer (I-17) as monomers, these monomers were mixed in a molar ratio of 25:38:37 [monomer (a1-1-3):monomer (a1-2-6):monomer (I-17)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, an aqueous p-toluenesulfonic acid solution was added to the polymerization reaction solution, followed by stirring for 12 hours and further isolation through separation. The organic layer thus recovered was poured into a large amount of n-heptane to precipitate a resin, followed by filtration and recovery to obtain a resin A3 having a weight-average molecular weight of about $5.5 \times 10^3$ in a yield of 65%. This resin A3 includes the following structural units (an elimination ratio of an ethoxyethyl group in all ethoxyethyl groups of the monomer (I-17) is 100%).

A3

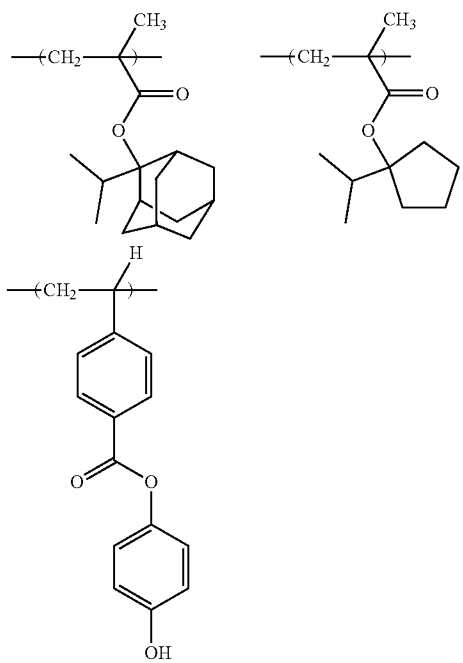

Example 10 [Synthesis of Resin A4]

Using a monomer (a1-4-2), a monomer (a1-1-3), a monomer (a1-2-6), a monomer (a2-1-3), a monomer (a3-4-2) and a monomer (I-17) as monomers, these monomers were mixed in a molar ratio of 12:20:35:3:15:15 [monomer (a1-4-2):monomer (a1-1-3):monomer (a1-2-6):monomer (a2-1-3):monomer (a3-4-2):monomer (I-17)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, an aqueous p-toluenesulfonic acid solution was added to the polymerization reaction solution, followed by stirring for 12 hours and further isolation through separation. The organic layer thus recovered was poured into a large amount of n-heptane to precipitate a resin, followed by filtration and recovery to obtain a resin A4 having a weight-average molecular weight of about $5.8 \times 10^3$ in a yield of 63%. This resin A4 includes the following structural units (an elimination ratio of an ethoxyethyl group in all ethoxyethyl groups of the monomer (a1-4-2) and the monomer (I-17) is 100%).

A4

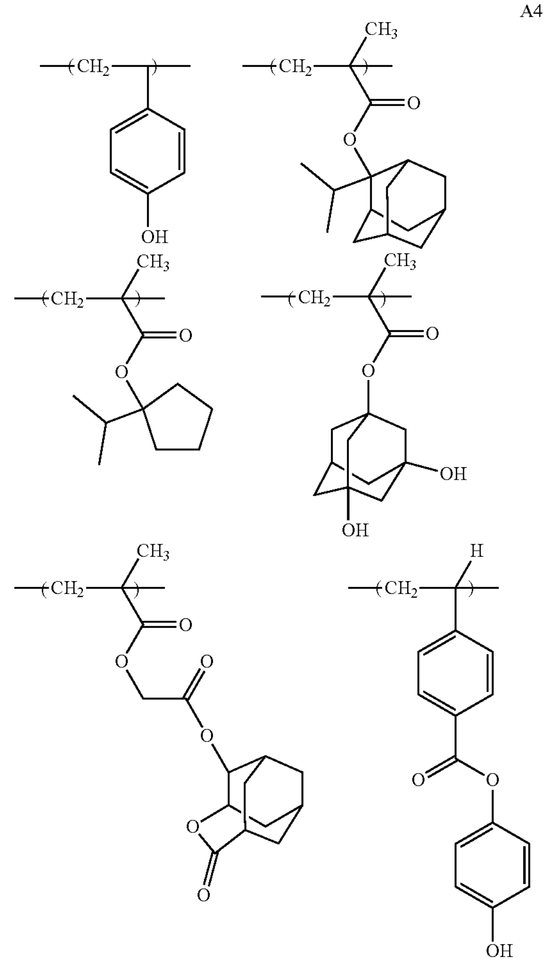

Example 11 [Synthesis of Resin A5]

Using a monomer (a1-1-3), a monomer (a1-2-6), a monomer (a2-1-3), a monomer (a3-4-2) and a monomer (I-17) as monomers, these monomers were mixed in a molar ratio of 20:35:3:15:27 [monomer (a1-1-3):monomer (a1-2-6):monomer (a2-1-3):monomer (a3-4-2):monomer (I-17)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, an aqueous p-toluenesulfonic acid solution was added to the polymerization reaction solution, followed by stirring for 12 hours and further isolation through separation. The organic layer thus recovered was poured into a large amount of n-heptane to precipitate a resin, followed by filtration and recovery to obtain a resin A5 having a weight-average molecular weight of about $5.4 \times 10^3$ in a yield of 66%. This resin A5 includes the following structural units (an elimination ratio of an ethoxyethyl group in all ethoxyethyl groups of the monomer (I-17) is 100%).

A5

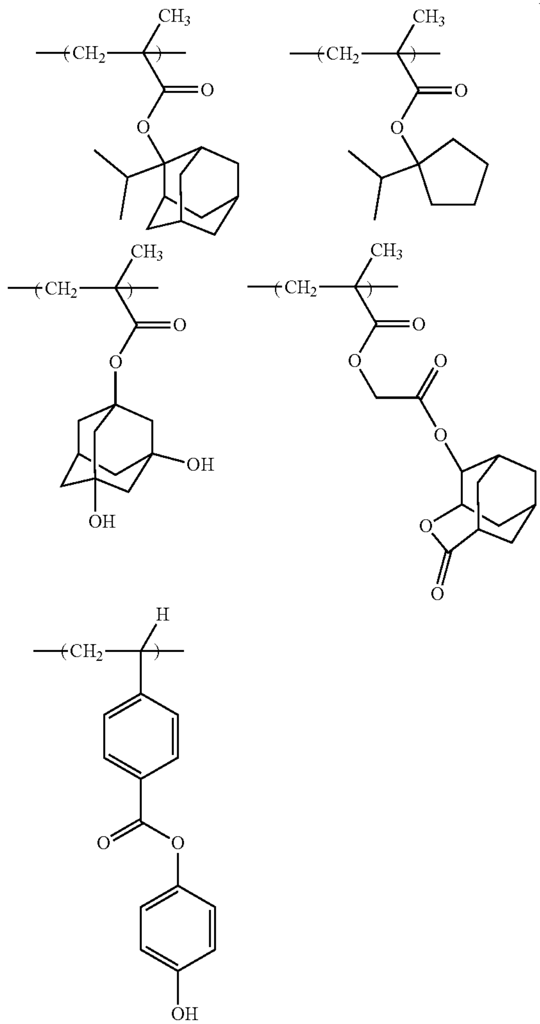

Example 12 [Synthesis of Resin A6]

Using a monomer (a1-4-2), a monomer (a1-1-3), a monomer (a1-2-6) and a monomer (I-25) as monomers, these monomers were mixed in a molar ratio of 19:25:38:18 [monomer (a1-4-2):monomer (a1-1-3):monomer (a1-2-6): monomer (I-25)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, an aqueous p-toluenesulfonic acid solution was added to the polymerization reaction solution, followed by stirring for 12 hours and further isolation through separation. The organic layer thus recovered was poured into a large amount of n-heptane to precipitate a resin, followed by filtration and recovery to obtain a resin A6 having a weight-average molecular weight of about $5.2\times10^3$ in a yield of 59%. This resin A6 includes the following structural units (an elimination ratio of an ethoxyethyl group in all ethoxyethyl groups of the monomer (a1-4-2) and the monomer (I-25) is 100%).

A6

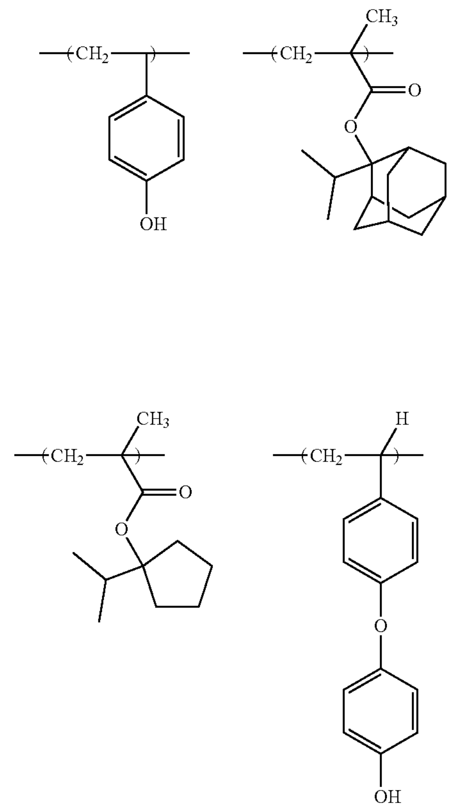

Example 13 [Synthesis of Resin A7]

Using a monomer (a1-4-2), a monomer (a1-1-3), a monomer (a1-2-6), a monomer (a2-1-3), a monomer (a3-4-2) and a monomer (I-25) as monomers, these monomers were mixed in a molar ratio of 12:20:35:3:15:15 [monomer (a1-4-2):monomer (a1-1-3):monomer (a1-2-6):monomer (a2-1-3):monomer (a3-4-2):monomer (I-25)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, an aqueous p-toluenesulfonic acid solution was added to the polymerization reaction solution, followed by stirring for 12 hours and further isolation through separation. The organic layer thus recovered was poured into a large amount of n-heptane to precipitate a resin, followed by filtration and recovery to obtain a resin A7 having a weight-average molecular weight of about $5.4\times10^3$ in a yield of 61%. This resin A7 includes the following structural units (an elimination ratio of an ethoxyethyl group in all ethoxyethyl groups of the monomer (a1-4-2) and the monomer (I-25) is 100%).

A7

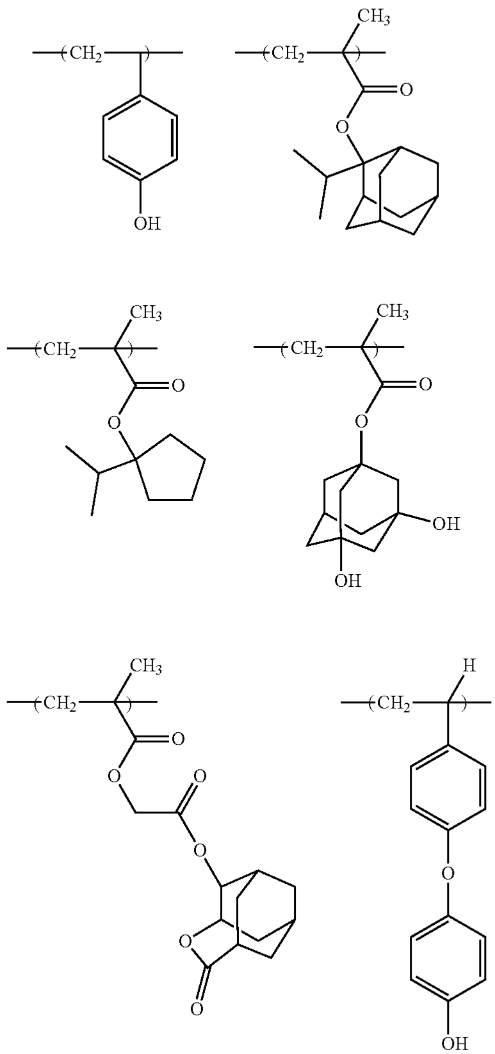

Example 14 [Synthesis of Resin A8]

Using a monomer (a1-4-2), a monomer (a1-1-3), a monomer (a1-2-6) and a monomer (I-33) as monomers, these monomers were mixed in a molar ratio of 19:25:38:18 [monomer (a1-4-2):monomer (a1-1-3):monomer (a1-2-6): monomer (I-33)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, an aqueous p-toluenesulfonic acid solution was added to the polymerization reaction solution, followed by stirring for 12 hours and further isolation through separation. The organic layer thus recovered was poured into a large amount of n-heptane to precipitate a resin, followed by filtration and recovery to obtain a resin A8 having a weight-average molecular weight of about $5.2\times10^3$ in a yield of 60%. This resin A8 includes the following structural units.

A8

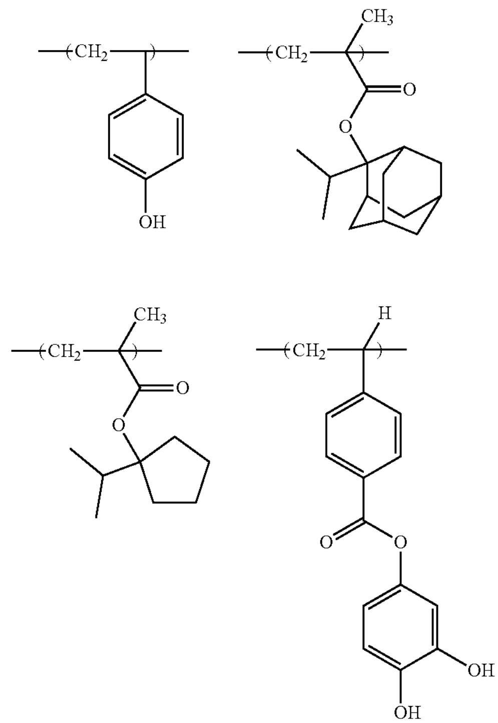

Example 15 [Synthesis of Resin A9]

Using a monomer (a1-1-3), a monomer (a1-2-6) and a monomer (I-33) as monomers, these monomers were mixed in a molar ratio of 25:38:37 [monomer (a1-1-3):monomer (a1-2-6):monomer (I-33)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, the polymerization reaction solution was poured into a large amount of n-heptane to precipitate a resin, followed by filtration and recovery to obtain a resin A9 having a weight-average molecular weight of about $5.0\times10^3$ in a yield of 65%. This resin A9 includes the following structural units.

A9

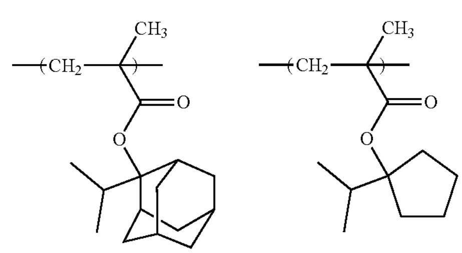

-continued

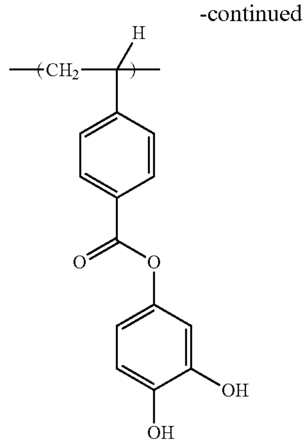

Example 16 [Synthesis of Resin A10]

Using acetoxystyrene, a monomer (a1-1-3), a monomer (a1-2-6) and a monomer (I-43) as monomers, these monomers were mixed in a molar ratio of 37:20:32:11 [acetoxystyrene:monomer (a1-1-3):monomer (a1-2-6):monomer (I-43)]. This monomer mixture was mixed with methyl isobutyl ketone in the amount of 1.5 mass times the total mass of all monomers. To the mixture thus obtained, azobisisobutyronitrile as an initiator was added in the amount of 7 mol % based on the total molar number of all monomers, and then polymerization was performed by heating at 85° C. for about 5 hours. Thereafter, an aqueous 25% tetramethylammonium hydroxide solution was added to the polymerization reaction solution, followed by stirring for 12 hours and further isolation through separation. The organic layer thus recovered was poured into a large amount of n-heptane to precipitate a resin, followed by filtration and recovery to obtain a resin A10 (copolymer) having a weight-average molecular weight of about $5.3 \times 10^3$ in a yield of 62%. This resin A10 includes the following structural units.

A10

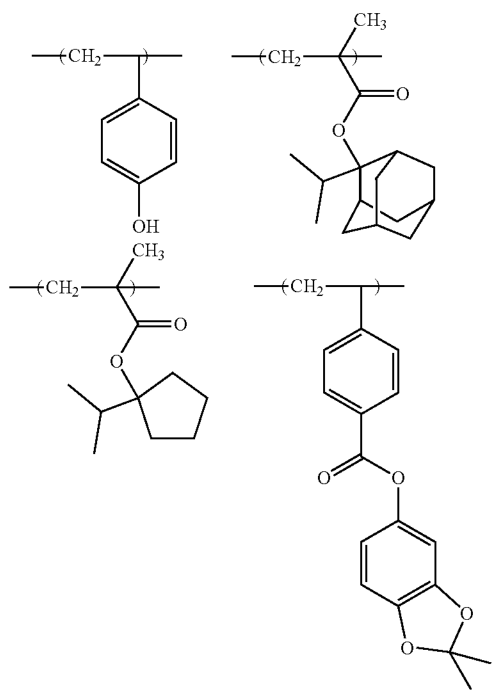

Example 17 [Synthesis of Resin A11]

Using a monomer (a1-4-2), a monomer (a1-1-3), a monomer (a1-2-6), a monomer (a2-1-3), a monomer (a3-4-2) and a monomer (I-33) as monomers, these monomers were mixed in a molar ratio of 12:20:35:3:15:15 [monomer (a1-4-2):monomer (a1-1-3):monomer (a1-2-6):monomer (a2-1-3):monomer (a3-4-2):monomer (I-33)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, an aqueous p-toluenesulfonic acid solution was added to the polymerization reaction solution, followed by stirring for 12 hours and further isolation through separation. The organic layer thus recovered was poured into a large amount of n-heptane to precipitate a resin, followed by filtration and recovery to obtain a resin A11 having a weight-average molecular weight of about $5.1 \times 10^3$ in a yield of 62%. This resin A11 includes the following structural units.

A11

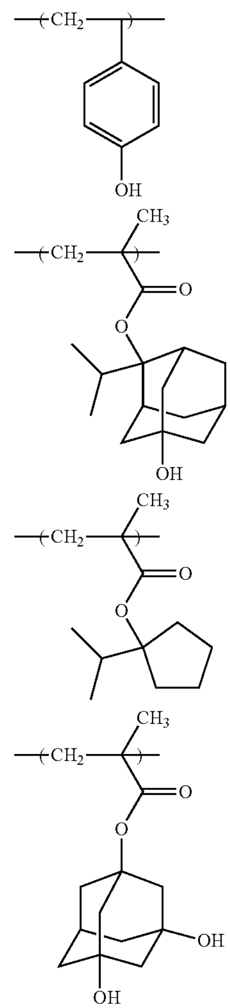

-continued

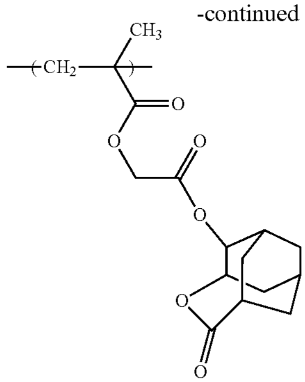

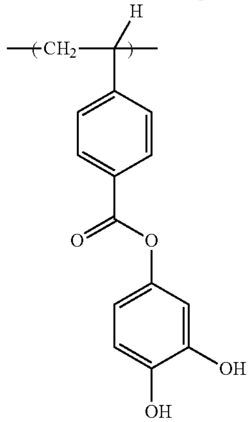

Example 18 [Synthesis of Resin A12]

Using a monomer (a1-1-3), a monomer (a1-2-6), a monomer (a2-1-3), a monomer (a3-4-2) and a monomer (I-33) as monomers, these monomers were mixed in a molar ratio of 20:35:3:15:27 [monomer (a1-1-3):monomer (a1-2-6):monomer (a2-1-3):monomer (a3-4-2):monomer (I-33)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, the polymerization reaction solution was poured into a large amount of n-heptane to precipitate a resin, followed by filtration and recovery to obtain a resin A12 having a weight-average molecular weight of about $5.2\times10^3$ in a yield of 64%. This resin A12 includes the following structural units.

A12

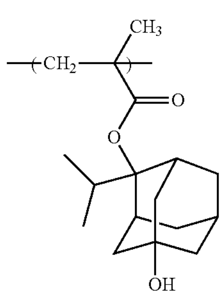

-continued

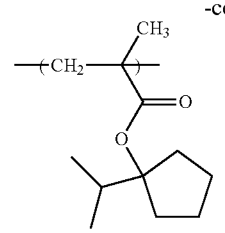

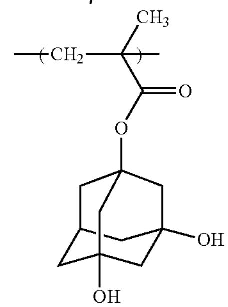

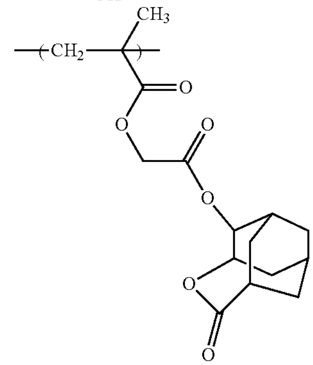

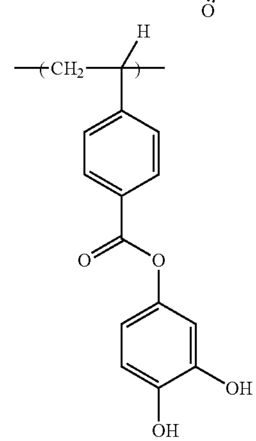

Example 19 [Synthesis of Resin A13]

Using a monomer (a1-4-2), a monomer (a1-1-3), a monomer (a1-2-6) and a monomer (I-68) as monomers, these monomers were mixed in a molar ratio of 19:25:38:18 [monomer (a1-4-2):monomer (a1-1-3):monomer (a1-2-6):monomer (I-68)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, the polymerization reaction solution was poured into a large amount of n-heptane to precipitate a resin, followed by filtration and recovery to obtain a resin A13 having a weight-average molecular weight of about $5.3\times10^3$ in a yield of 60%. This resin A13 includes the following structural units.

A13

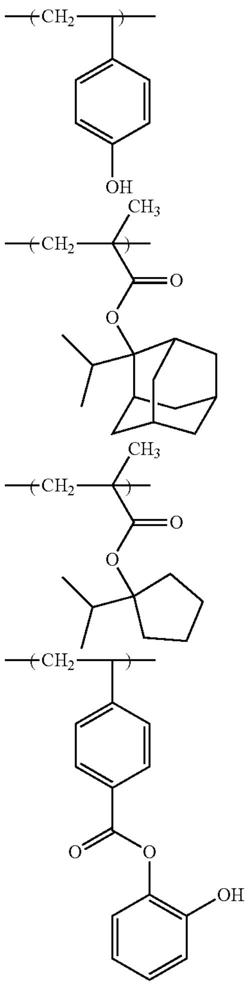

Example 20 [Synthesis of Resin A14]

Using acetoxystyrene, a monomer (a1-1-3), a monomer (a1-2-6) and a monomer (I-67) as monomers, these monomers were mixed in a molar ratio of 37:20:32:11 [acetoxystyrene:monomer (a1-1-3):monomer (a1-2-6):monomer (I-67)]. This monomer mixture was mixed with methyl isobutyl ketone in the amount of 1.5 mass times the total mass of all monomers. To the mixture thus obtained, azobisisobutyronitrile as an initiator was added in the amount of 7 mol % based on the total molar number of all monomers, and then polymerization was performed by heating at 85° C. for about 5 hours. Thereafter, an aqueous 25% tetramethylammonium hydroxide solution was added to the polymerization reaction solution, followed by stirring for 12 hours and further isolation through separation. The organic layer thus recovered was poured into a large amount of n-heptane to precipitate a resin, followed by filtration and recovery to obtain a resin A14 having a weight-average molecular weight of about $5.2\times10^3$ in a yield of 63%. This resin A14 includes the following structural units.

A14

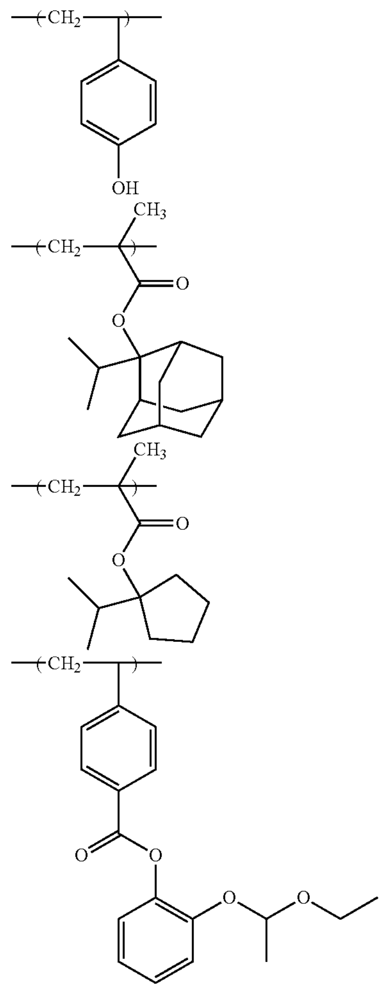

Example 21 [Synthesis of Resin A15]

Using a monomer (a1-4-2), a monomer (a1-1-3), a monomer (a1-2-6) and a monomer (I-37) as monomers, these monomers were mixed in a molar ratio of 19:25:38:18 [monomer (a1-4-2):monomer (a1-1-3):monomer (a1-2-6):monomer (I-37)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, an aqueous p-toluenesulfonic acid solution was added to the polymerization reaction solution, followed by stirring for 12 hours and further isolation through separation. The organic layer thus recovered was poured into a large amount of n-heptane to precipitate a resin, followed by filtration and recovery to obtain a resin A15 having a weight-average molecular weight of about $5.3\times10^3$ in a yield of 63%. This resin A15 includes the following structural units.

A15

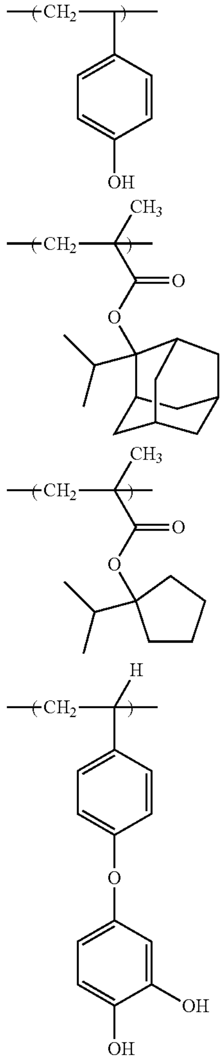

Example 22 [Synthesis of Resin A16]

Using a monomer (a1-1-3), a monomer (a1-2-6) and a monomer (I-37) as monomers, these monomers were mixed in a molar ratio of 25:38:37 [monomer (a1-1-3):monomer (a1-2-6):monomer (I-37)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, the polymerization reaction solution was poured into a large amount of n-heptane to precipitate a resin, followed by filtration and recovery to obtain a resin A16 having a weight-average molecular weight of about $5.2\times10^3$ in a yield of 61%. This resin A16 includes the following structural units.

A16

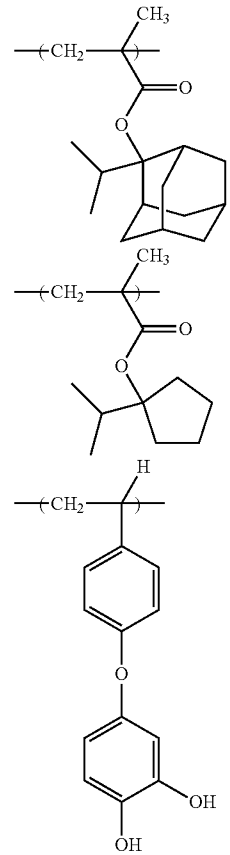

Example 23 [Synthesis of Resin A17]

Using acetoxystyrene, a monomer (a1-1-3), a monomer (a1-2-6) and a monomer (I-49) as monomers, these monomers were mixed in a molar ratio of 37:20:32:11 [acetoxystyrene:monomer (a1-1-3):monomer (a1-2-6):monomer (I-49)]. This monomer mixture was mixed with methyl isobutyl ketone in the amount of 1.5 mass times the total mass of all monomers. To the mixture thus obtained, azobisisobutyronitrile as an initiator was added in the amounts of 7 mol % based on the total molar number of all monomers, and then polymerization was performed by heating at 85° C. for about 5 hours. Thereafter, an aqueous 25% tetramethylammonium hydroxide solution was added to the polymerization reaction solution, followed by stirring for 12 hours and further isolation through separation. The organic layer thus recovered was poured into a large amount of n-heptane to precipitate a resin, followed by filtration and recovery to obtain a resin A17 (copolymer) having a weight-average molecular weight of about $5.5\times10^3$ in a yield of 60%. This resin A17 includes the following structural units.

A17

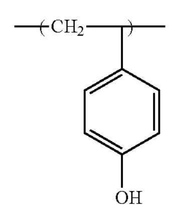

-continued

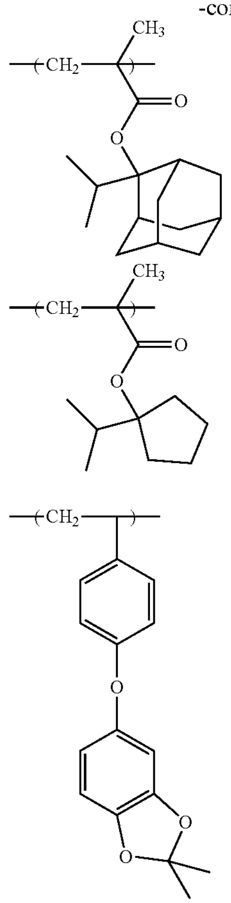

Example 24 [Synthesis of Resin A18]

Using a monomer (a1-4-2), a monomer (a1-1-3), a monomer (a1-2-6), a monomer (a2-1-3), a monomer (a3-4-2) and a monomer (I-37) as monomers, these monomers were mixed in a molar ratio of 12:20:35:3:15:15 [monomer (a1-4-2):monomer (a1-1-3):monomer (a1-2-6):monomer (a2-1-3):monomer (a3-4-2):monomer (I-37)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, an aqueous p-toluenesulfonic acid solution was added to the polymerization reaction solution, followed by stirring for 12 hours and further isolation through separation. The organic layer thus recovered was poured into a large amount of n-heptane to precipitate a resin, followed by filtration and recovery to obtain a resin A18 having a weight-average molecular weight of about $5.2\times10^3$ in a yield of 60%. This resin A18 includes the following structural units.

A18

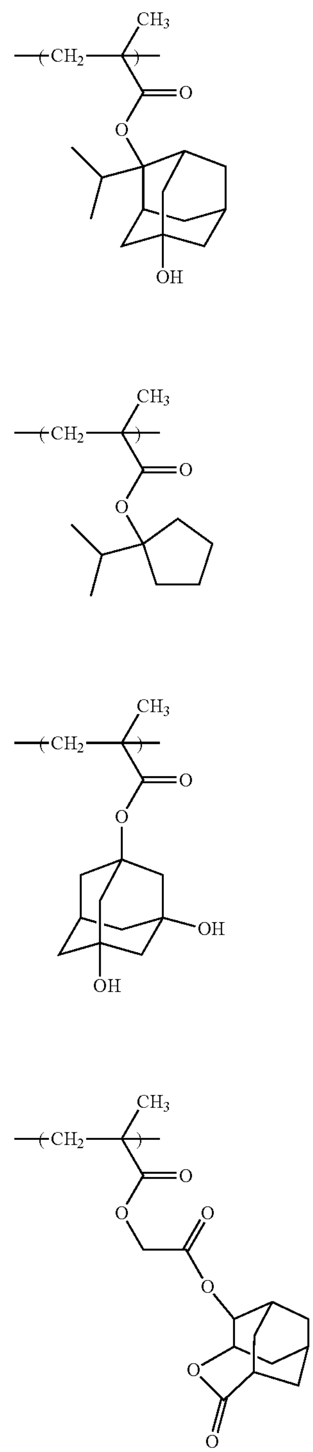

-continued

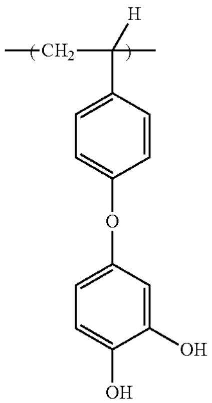

Example 25 [Synthesis of Resin A19]

Using a monomer (a1-1-3), a monomer (a1-2-6), a monomer (a2-1-3), a monomer (a3-4-2) and a monomer (I-37) as monomers, these monomers were mixed in a molar ratio of 20:35:3:15:27 [monomer (a1-1-3):monomer (a1-2-6):monomer (a2-1-3):monomer (a3-4-2):monomer (I-37)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, the polymerization reaction solution was poured into a large amount of n-heptane to precipitate a resin, followed by filtration and recovery to obtain a resin A19 having a weight-average molecular weight of about $5.3\times10^3$ in a yield of 63%. This resin A19 includes the following structural units.

A19

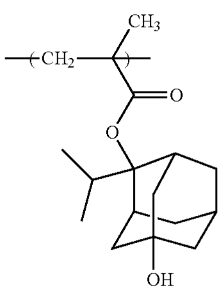

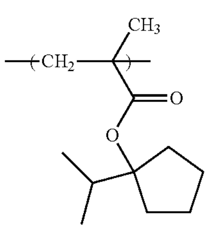

-continued

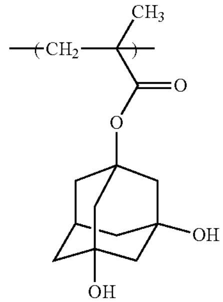

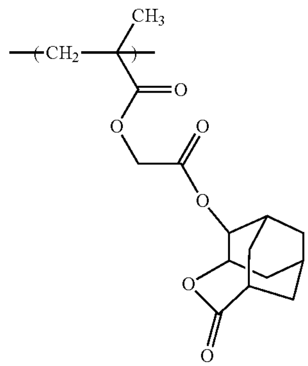

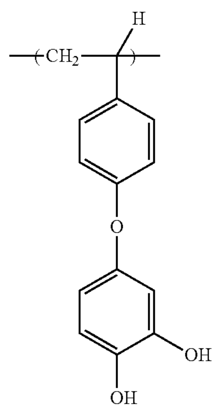

Example 26 [Synthesis of Resin A20]

Using a monomer (a1-1-3), a monomer (a1-2-6) and a monomer (I-71) as monomers, these monomers were mixed in a molar ratio of 25:38:37 [monomer (a1-1-3):monomer (a1-2-6):monomer (I-71)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, the polymerization reaction solution was poured into a large amount of n-heptane to precipitate a resin, followed by filtration and recovery to obtain a resin A20 having a weight-average molecular weight of about $5.5\times10^3$ in a yield of 58%. This resin A20 includes the following structural units.

A20

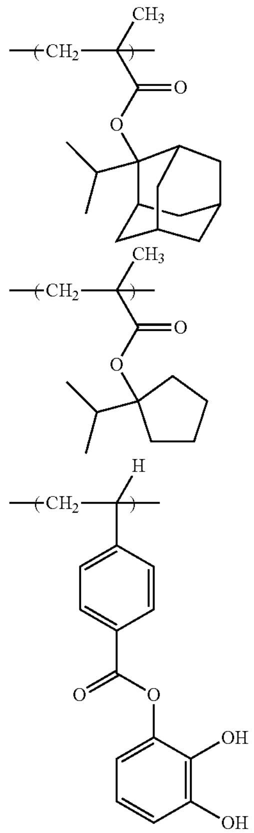

Example 27 [Synthesis of Resin A21]

Using acetoxystyrene, a monomer (a1-1-3), a monomer (a1-2-6) and a monomer (I-81) as monomers, these monomers were mixed in a molar ratio of 37:20:32:11 [acetoxystyrene:monomer (a1-1-3):monomer (a1-2-6):monomer (I-81)]. This monomer mixture was mixed with methyl isobutyl ketone in the amount of 1.5 mass times the total mass of all monomers. To the mixture thus obtained, azobisisobutyronitrile as an initiator was added in the amount of 7 mol % based on the total molar number of all monomers, and then polymerization was performed by heating at 85° C. for about 5 hours. Thereafter, an aqueous 25% tetramethylammonium hydroxide solution was added to the polymerization reaction solution, followed by stirring for 12 hours and further isolation through separation. The organic layer thus recovered was poured into a large amount of n-heptane to precipitate a resin, followed by filtration and recovery to obtain a resin A21 having a weight-average molecular weight of about $5.7\times10^3$ in a yield of 55%. This resin A21 includes the following structural units.

A21

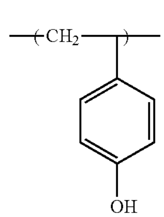

-continued

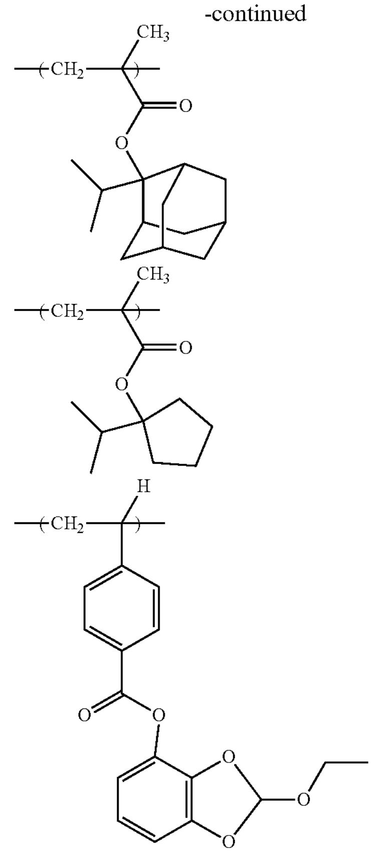

Example 28 [Synthesis of Resin A22]

Using a monomer (a1-1-3), a monomer (a1-2-6), a monomer (a2-1-3), a monomer (a3-4-2) and a monomer (I-71) as monomers, these monomers were mixed in a molar ratio of 20:35:3:15:27 [monomer (a1-1-3):monomer (a1-2-6):monomer (a2-1-3):monomer (a3-4-2):monomer (I-71)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, the polymerization reaction solution was poured into a large amount of n-heptane to precipitate a resin, followed by filtration and recovery to obtain a resin A22 having a weight-average molecular weight of about $5.4\times10^3$ in a yield of 59%. This resin A22 includes the following structural units.

A22

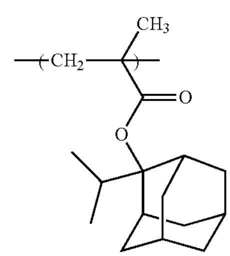

-continued

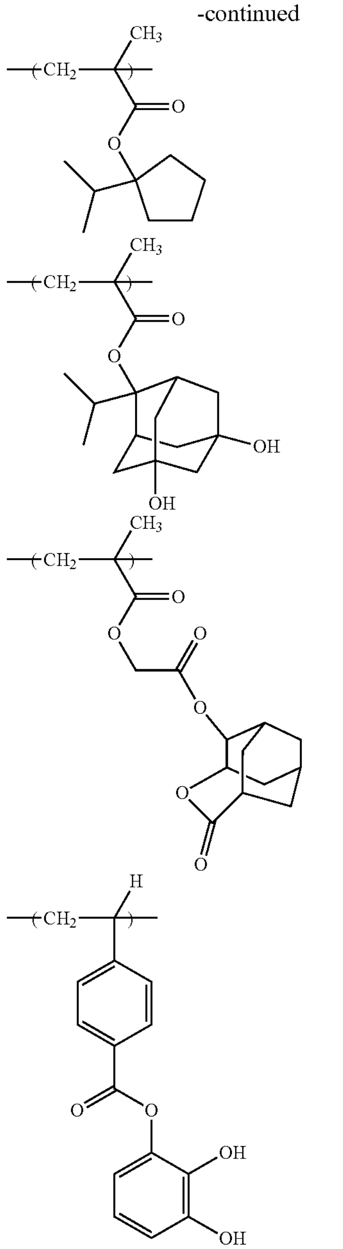

Synthesis Example 5 [Synthesis of Resin AX1]

Using a monomer (ax-1), a monomer (ax-2) and a monomer (I-17) as monomers, these monomers were mixed in a molar ratio of 30:30:40 [monomer (ax-1):monomer (ax-2): monomer (I-17)]. This monomer mixture was mixed with methyl isobutyl ketone in the amount of 1.5 mass times the total mass of all monomers. To the mixture thus obtained, azobisisobutyronitrile and azobis(2,4-dimethylvaleronitrile) as initiators were added in the amounts of 1.2 mol % and 3.6 mol % based on the total molar number of all monomers, and then polymerization was performed by heating at 73° C. for about 5 hours. Thereafter, an aqueous p-toluenesulfonic acid solution was added to the polymerization reaction solution, followed by stirring for 12 hours and further isolation through separation. The organic layer thus recovered was poured into a large amount of n-heptane to precipitate a resin, followed by filtration and recovery to obtain a resin AX1 having a weight-average molecular weight of about $5.4\times10^3$ in a yield of 66%. This resin AX1 includes the following structural units (an elimination ratio of an ethoxyethyl group in all ethoxyethyl groups of the monomer (I-17) is 100%).

AX1

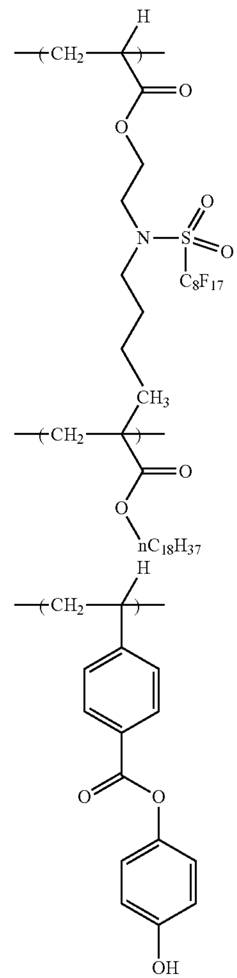

<Preparation of Resist Composition>

A mixture obtained by mixing and dissolving the respective components shown in Table 1 was filtered through a fluororesin filter having a pore diameter of 0.2 μm to prepare resist compositions.

TABLE 1

| Resist composition | Resin | Acid generator(B) | Quencher(C) | PB/PEB |
|---|---|---|---|---|
| Composition 1 | A1 = 10 parts | B1-43 = 3.4 parts | C1 = 0.7 parts | 110° C./120° C. |
| Composition 2 | A2 = 10 parts | B1-43 = 3.4 parts | C1 = 0.7 parts | 110° C./120° C. |

TABLE 1-continued

| Resist composition | Resin | Acid generator(B) | Quencher(C) | PB/PEB |
|---|---|---|---|---|
| Composition 3 | A3 = 10 parts | B1-43 = 3.4 parts | C1 = 0.7 parts | 110° C./120° C. |
| Composition 4 | A4 = 10 parts | B1-43 = 3.4 parts | C1 = 0.7 parts | 110° C./120° C. |
| Composition 5 | A5 = 10 parts | B1-43 = 3.4 parts | C1 = 0.7 parts | 110° C./120° C. |
| Composition 6 | A6 = 10 parts | B1-43 = 3.4 parts | C1 = 0.7 parts | 110° C./120° C. |
| Composition 7 | A7 = 10 parts | B1-43 = 3.4 parts | C1 = 0.7 parts | 110° C./120° C. |
| Composition 8 | A8 = 10 parts | B1-43 = 3.4 parts | C1 = 0.7 parts | 110° C./120° C. |
| Composition 9 | A9 = 10 parts | B1-43 = 3.4 parts | C1 = 0.7 parts | 110° C./120° C. |
| Composition 10 | A10 = 10 parts | B1-43 = 3.4 parts | C1 = 0.7 parts | 110° C./120° C. |
| Composition 11 | A11 = 10 parts | B1-43 = 3.4 parts | C1 = 0.7 parts | 110° C./120° C. |
| Composition 12 | A12 = 10 parts | B1-43 = 3.4 parts | C1 = 0.7 parts | 110° C./120° C. |
| Composition 13 | A13 = 10 parts | B1-43 = 3.4 parts | C1 = 0.7 parts | 110° C./120° C. |
| Composition 14 | A14 = 10 parts | B1-43 = 3.4 parts | C1 = 0.7 parts | 110° C./120° C. |
| Composition 15 | A15 = 10 parts | B1-43 = 3.4 parts | C1 = 0.7 parts | 110° C./120° C. |
| Composition 16 | A16 = 10 parts | B1-43 = 3.4 parts | C1 = 0.7 parts | 110° C./120° C. |
| Composition 17 | A17 = 10 parts | B1-43 = 3.4 parts | C1 = 0.7 parts | 110° C./120° C. |
| Composition 18 | A18 = 10 parts | B1-43 = 3.4 parts | C1 = 0.7 parts | 110° C./120° C. |
| Composition 19 | A19 = 10 parts | B1-43 = 3.4 parts | C1 = 0.7 parts | 110° C./120° C. |
| Composition 20 | A20 = 10 parts | B1-43 = 3.4 parts | C1 = 0.7 parts | 110° C./120° C. |
| Composition 21 | A21 = 10 parts | B1-43 = 3.4 parts | C1 = 0.7 parts | 110° C./120° C. |
| Composition 22 | A22 = 10 parts | B1-43 = 3.4 parts | C1 = 0.7 parts | 110° C./120° C. |
| Comparative Composition 1 | AX1 = 10 parts | B1-43 = 3.4 parts | C1 = 0.7 parts | 110° C./120° C. |

<Resin>

A1 to A22, AX1: Resin A1 To Resin A22, Resin AX1

<Acid Generator (B)>

B1-43: Salt represented by formula (B1-43) (synthesized in accordance with Examples of JP 2016-47815 A)

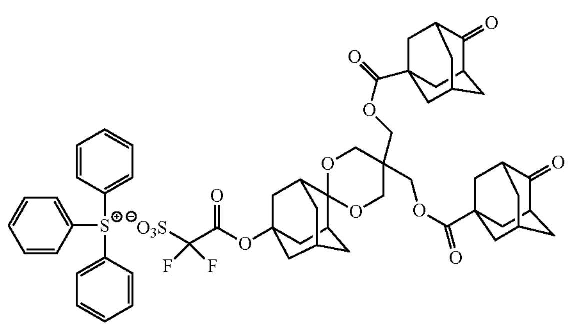

<Quencher (C)>

C1: synthesized by the method mentioned in JP 2011-39502 A

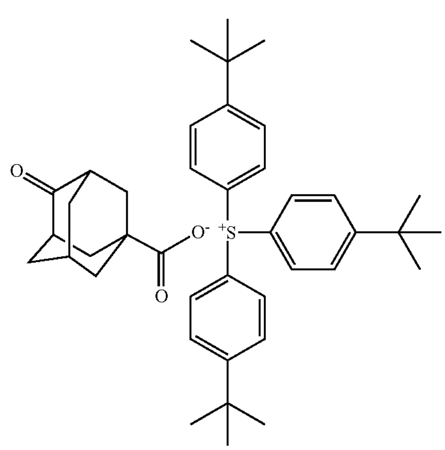 [SMILES: O=C1C2CC3CC1CC(C(=O)[O-])(C3)C2 ; CC(C)(C)c1ccc([S+](c2ccc(C(C)(C)C)cc2)c2ccc(C(C)(C)C)cc2)cc1]

<Solvent>

| | | |
|---|---|---|
| Propylene glycol monomethyl ether acetate | 400 | parts |
| Propylene glycol monomethyl ether | 150 | parts |
| γ-Butyrolactone | 5 | parts |

(Evaluation of Exposure of Resist Composition with Electron Beam: Alkaline Development)

Each 6 inch-diameter silicon wafer was treated with hexamethyldisilazane on a direct hot plate at 90° C. for 60 seconds. A resist composition was spin-coated on the silicon wafer in such a manner that the thickness of the composition layer became 0.04 μm. The coated silicon wafer was prebaked on the direct hot plate at the temperature shown in the column "PB" of Table 1 for 60 seconds to form a composition layer. Using an electron-beam direct-write system ("HL-800D 50 keV", manufactured by Hitachi, Ltd.), a line-and-space pattern was directly written on the composition layer formed on the wafer while changing the exposure dose stepwise.

After the exposure, post-exposure baking was performed on the hot plate at the temperature shown in the column "PEB" of Table 1 for 60 seconds, followed by paddle development with an aqueous 2.38% by mass tetramethylammonium hydroxide solution for 60 seconds to obtain a resist pattern.

The resist pattern (line-and-space pattern) thus obtained was observed by a scanning electron microscope and effective sensitivity was defined as the exposure dose at which a ratio of a line width to a space width of a 60 nm line-and-space pattern became 1:1.

Evaluation of Line Edge Roughness (LER): Line edge roughness was determined by measuring a roughness width of the irregularity in side wall surface of resist pattern produced at the effective sensitivity using a scanning electron microscope. The results are shown in Table 2.

TABLE 2

| | Composition | LER |
|---|---|---|
| Example 29 | Composition 1 | 3.68 |
| Example 30 | Composition 2 | 3.88 |

TABLE 2-continued

| | Composition | LER |
|---|---|---|
| Example 31 | Composition 3 | 3.71 |
| Example 32 | Composition 4 | 3.76 |
| Example 33 | Composition 5 | 3.75 |
| Example 34 | Composition 6 | 3.65 |
| Example 35 | Composition 7 | 3.74 |
| Example 36 | Composition 8 | 3.58 |
| Example 37 | Composition 9 | 3.56 |
| Example 38 | Composition 10 | 3.61 |
| Example 39 | Composition 11 | 3.64 |
| Example 40 | Composition 12 | 3.62 |
| Example 41 | Composition 13 | 3.65 |
| Example 42 | Composition 14 | 3.74 |
| Example 43 | Composition 15 | 3.54 |
| Example 44 | Composition 16 | 3.52 |
| Example 45 | Composition 17 | 3.58 |
| Example 46 | Composition 18 | 3.61 |
| Example 47 | Composition 19 | 3.59 |
| Example 48 | Composition 20 | 3.63 |
| Example 49 | Composition 21 | 3.69 |
| Example 50 | Composition 22 | 3.68 |
| Comparative Example 1 | Comparative Composition 1 | Failing to pattern formation |

(Evaluation of Exposure of Resist Composition with Electron Beam: Butyl Acetate Development)

Each 6 inch-diameter silicon wafer was treated with hexamethyldisilazane on a direct hot plate at 90° C. for 60 seconds. A resist composition was spin-coated on the silicon wafer in such a manner that the thickness of the composition layer became 0.04 pam. The coated silicon wafer was prebaked on the direct hot plate at the temperature shown in the column "PB" of Table 1 for 60 seconds to form a composition layer. Using an electron-beam direct-write system ("HL-800D 50 key", manufactured by Hitachi, Ltd.), a line-and-space pattern was directly written on the composition layer formed on the wafer while changing the exposure dose stepwise.

After the exposure, post-exposure baking was performed on the hot plate at the temperature shown in the column "PEB" of Table 1 for 60 seconds, and then the composition layer on the silicon wafer was developed with butyl acetate (manufactured by Tokyo Chemical Industry Co., Ltd.) as a developing solution at 23° C. for 20 seconds by the dynamic dispense method to obtain a resist pattern.

The resist pattern (line-and-space pattern) thus obtained was observed by a scanning electron microscope and effective sensitivity was defined as the exposure dose at which a ratio of a line width to a space width of a 60 nm line-and-space pattern became 1:1.

Evaluation of Line Edge Roughness (LER): Line edge roughness was determined by measuring a roughness width of the irregularity in side wall surface of resist pattern produced at the effective sensitivity using a scanning electron microscope. The results are shown in Table 3.

TABLE 3

| | Composition | LER |
|---|---|---|
| Example 51 | Composition 1 | 3.84 |
| Example 52 | Composition 2 | 3.92 |
| Example 53 | Composition 3 | 3.81 |
| Example 54 | Composition 4 | 3.71 |
| Example 55 | Composition 5 | 3.69 |
| Example 56 | Composition 6 | 3.81 |
| Example 57 | Composition 7 | 3.62 |
| Example 58 | Composition 8 | 3.66 |
| Example 59 | Composition 9 | 3.62 |
| Example 60 | Composition 10 | 3.69 |

TABLE 3-continued

| | Composition | LER |
|---|---|---|
| Example 61 | Composition 11 | 3.55 |
| Example 62 | Composition 12 | 3.52 |
| Example 63 | Composition 13 | 3.79 |
| Example 64 | Composition 14 | 3.81 |
| Example 65 | Composition 15 | 3.62 |
| Example 66 | Composition 16 | 3.59 |
| Example 67 | Composition 17 | 3.67 |
| Example 68 | Composition 18 | 3.52 |
| Example 69 | Composition 19 | 3.47 |
| Example 70 | Composition 20 | 3.61 |
| Example 71 | Composition 21 | 3.66 |
| Example 72 | Composition 22 | 3.49 |
| Comparative Example 2 | Comparative Composition 1 | Failing to pattern formation |

INDUSTRIAL APPLICABILITY

The resist composition including the resin of the present invention is suited for fine processing of semiconductors because of obtaining a resist pattern with satisfactory line edge roughness (LER), and thus it is industrially very useful.

The invention claimed is:

1. A resin comprising:

(i) a structural unit represented by formula (I), (ii) at least one structural unit selected from the group consisting of a structural unit represented by formula (a1-1) and a structural unit represented by formula (a1-2), and (iii) a structural unit represented by formula (a2-A), wherein the resin does not include an aromatic hydrocarbon group having more than 6 carbon atoms:

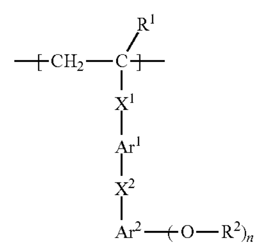

(I)

wherein, in formula (I), $R^1$ represents a hydrogen atom or a methyl group, $X^1$ represents a single bond or —CO—O—* and * represents a bonding site to $Ar^1$, $X^2$ represents —CO—O—*, —O—*, —O—CO—*, —O—CO—$(CH_2)_{mm}$—O—* or —O—$(CH_2)_{nn}$—CO—O—* and * represents a bonding site to $Ar^2$, mm and nn represent 0 or 1, $Ar^1$ represents an aromatic hydrocarbon group having 6 carbon atoms which may have a substituent, $Ar^2$ represents an aromatic hydrocarbon group having 6 carbon atoms which may have a substituent, $R^2$ each independently represent a hydrogen atom or an acid-labile group, or two $R^2$ may combine together to form a group having an acetal ring structure, n represents an integer of 2 or 3, a plurality of $R^2$ may be the same or different from each other:

(a1-1)

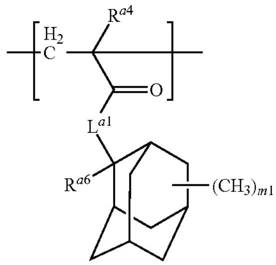

(a1-2)

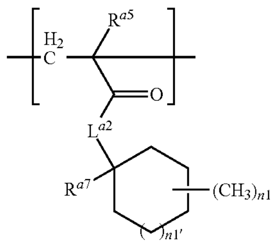

wherein, in formula (a1-1) and formula (a1-2), $L^{a1}$ and $L^{a2}$ each independently represent —O— or *—O—$(CH_2)_{k1}$—CO—O—, k1 represents an integer of 1 to 7, and * represents a bonding site to —CO—, $R^{a4}$ and $R^{a5}$ each independently represent a hydrogen atom or a methyl group, $R^{a6}$ and $R^{a7}$ each independently represent an alkyl group having 1 to 8 carbon atoms, an alkenyl group having 2 to 8 carbon atoms, an alicyclic hydrocarbon group having 3 to 18 carbon atoms, an aromatic hydrocarbon group having 6 to 18 carbon atoms, or a group obtained by combining these groups, m1 represents an integer of 0 to 14, n1 represents an integer of 0 to 10, and n1' represents an integer of 0 to 3, and (a2-A)

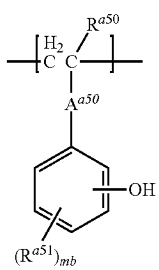

wherein, in formula (a2-A), $R^{a50}$ represents a hydrogen atom, a halogen atom or an alkyl group having 1 to 6 carbon atoms which may have a halogen atom, $R^{a51}$ represents a halogen atom, a hydroxy group, an alkyl group having 1 to 6 carbon atoms, an alkoxy group having 1 to 6 carbon atoms, an alkoxyalkyl group having 2 to 12 carbon atoms, an alkoxyalkoxy group having 2 to 12 carbon atoms, an alkylcarbonyl group having 2 to 4 carbon atoms, an alkylcarbonyloxy group having 2 to 4 carbon atoms, an acryloyloxy group or a methacryloyloxy group, $A^{a50}$ represents a single bond or * —$X^{a51}$-($A^{a52}$-$X^{a52}$)$_{nb}$—, and * represents a bonding site to carbon atoms to which —$R^{a50}$ is bonded, $A^{a52}$ represents an alkanediyl group having 1 to 6 carbon atoms, $X^{a51}$ and $X^{a52}$ each independently represent —O—, —CO—O— or —O—CO—, nb represents 0 or 1, and mb represents an integer of 0 to 4, and when mb is an integer of 2 or more, a plurality of $R^{a51}$ may be the same or different from each other.

2. The resin according to claim 1, wherein $X^1$ is a single bond.

3. The resin according to claim 1, wherein $X^2$ is —CO—O—* or —O—* and * represents a bonding site to $Ar^2$.

4. The resin according to claim 1, wherein n is 2.

5. The resin according to claim 1, wherein the acid-labile group in $R^2$ is a group represented by formula (1a) or a group represented by formula (2a):

(1a)

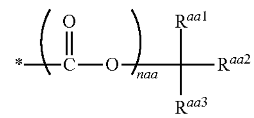

wherein, in formula (1a), $R^{aa1}$, $R^{aa2}$ and $R^{aa3}$ each independently represent an alkyl group having 1 to 8 carbon atoms which may have a substituent, an alkenyl group having 2 to 8 carbon atoms which may have a substituent, an alicyclic hydrocarbon group having 3 to 20 carbon atoms which may have a substituent, or an aromatic hydrocarbon group having 6 to 18 carbon atoms which may have a substituent, or $R^{aa1}$ and $R^{aa2}$ may be bonded each other to form an alicyclic hydrocarbon group having 3 to 20 carbon atoms together with carbon atoms to which $R^{aa1}$ and $R^{aa2}$ are bonded, $n^{aa}$ represents 0 or 1, and

* represents a bond:

(2a)

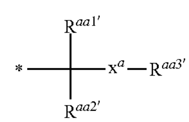

wherein, in formula (2a), $R^{aa1'}$ and $R^{aa2'}$ each independently represent a hydrogen atom or a hydrocarbon group having 1 to 12 carbon atoms, $R^{aa3'}$ represents a hydrocarbon group having 1 to 20 carbon atoms, or $R^{aa2'}$ and $R^{aa3'}$ may be bonded each other to form a heterocyclic group having 3 to 20 carbon atoms together with —C—$X^a$— to which $R^{aa2'}$ and $R^{aa3'}$ are bonded, —$CH_2$— included in the hydrocarbon group and the heterocyclic group may be replaced by —O— or —S—, $X^a$ represents an oxygen atom or a sulfur atom, and

* represents a bond.

6. The resin according to claim 1, wherein $R^2$ is a hydrogen atom, or n is 2 or more and two $R^2$ combine together to form a group having an acetal ring structure.

7. A resist composition comprising the resin according to claim 1 and an acid generator.

8. The resist composition according to claim 7, wherein the acid generator comprises a salt represented by formula (B1):

(B1)

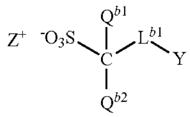

wherein, in formula (B1), $Q^{b1}$ and $Q^{b2}$ each independently represent a fluorine atom or a perfluoroalkyl group having 1 to 6 carbon atoms, $L^{b1}$ represents a divalent saturated hydrocarbon group having 1 to 24 carbon atoms, —$CH_2$— included in the divalent saturated hydrocarbon group may be replaced by —O— or —CO—, and a hydrogen atom included in the divalent saturated hydrocarbon group may be substituted with a fluorine atom or a hydroxy group, Y represents a methyl group which may have a substituent or an alicyclic hydrocarbon group having 3 to 24 carbon atoms which may have a substituent, and —$CH_2$— included in the alicyclic hydrocarbon group may be replaced by —O—, —$S(O)_2$— or —CO—, and $Z^+$ represents an organic cation.

9. The resist composition according to claim 7, further comprising a salt generating an acid having an acidity lower than that of an acid generated from the acid generator.

10. A method for producing a resist pattern, which comprises:

(1) a step of applying the resist composition according to claim 7 on a substrate, (2) a step of drying the applied composition to form a composition layer, (3) a step of exposing the composition layer, (4) a step of heating the exposed composition layer, and (5) a step of developing the heated composition layer.

11. A compound represented by formula (IA):

(IA)

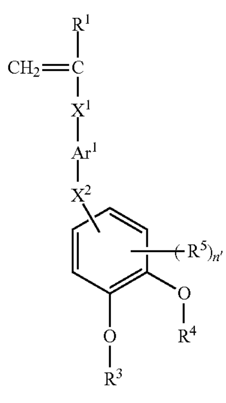

wherein, in formula (IA), $R^1$ represents a hydrogen atom or a methyl group, $X^1$ represents a single bond or —CO—O—* and * represents a bonding site to $Ar^1$, $X^2$ represents —CO—O—*, —O—*, —O—CO—*, —O—CO—$(CH_2)_{mm}$—O—* or —O—$(CH_2)_{nn}$—CO—O—* and * represents a bonding site to the benzene ring, mm and nn represent 0 or 1, $Ar^1$ represents an aromatic hydrocarbon group having 6 carbon atoms which may have a substituent, $R^3$ and $R^4$ each independently represent a hydrogen atom or an acid-labile group, or $R^3$ and $R^4$ may combine together to form a group having an acetal ring structure, $R^5$ represents a halogen atom, an alkyl fluoride group having 1 to 6 carbon atoms, an unsubstituted alkyl group having 1 to 12 carbon atoms, alkylcarbonyl group having 2 to 12 carbon atoms or an alkylcarbonyloxy group having 2 to 11 carbon atoms, and n' represents an integer of 1 to 3, and when n' is 2 or more, a plurality of $R^5$ may be the same or different from each other.

12. The compound according to claim 11, wherein $X^1$ is a single bond.

13. The compound according to claim 11, wherein $X^2$ is —CO—O—* or —O—* and * represents a bonding site to the benzene ring.

14. The compound according to claim 11, wherein n' is 1 or 2.

15. The compound according to claim 11, wherein $R^3$ and $R^4$ are a hydrogen atom, or $R^3$ and $R^4$ combine together to form a group having an acetal ring structure.

16. A resin comprising a structural unit derived from the compound according to claim 11.

17. A resin comprising:

(i) a structural unit represented by formula (I), (ii) at least one structural unit selected from the group consisting of a structural unit represented by formula (a1-1) and a structural unit represented by formula (a1-2), and (iii) a structural unit represented by formula (a2-A), wherein the resin does not include an aromatic hydrocarbon group having more than 6 carbon atoms:

(I)

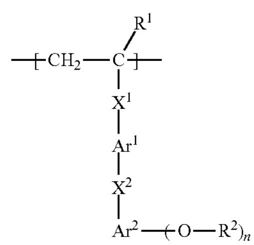

wherein, in formula (I), $R^1$ represents a hydrogen atom or a methyl group, $X^1$ represents a single bond or —CO—O—* and * represents a bonding site to $Ar^1$, $X^2$ represents —CO—O—*, —O—*, —O—CO—*, —O—CO—$(CH_2)_{mm}$—O—* or —O—$(CH_2)_{nn}$—CO—O—* and * represents a bonding site to $Ar^2$, mm and nn represent 0 or 1, $Ar^1$ represents an aromatic hydrocarbon group having 6 carbon atoms which may have a substituent, $Ar^2$ represents an aromatic hydrocarbon group having 6 carbon atoms which may have a substituent, $R^2$ each independently represent an acid-labile group, or when two or more $R^2$ exist, two $R^2$ may combine together to form a group having an acetal ring structure, n represents an integer of 1 to 3, and when n is an integer of 2 or more, a plurality of $R^2$ may be the same or different from each other:

(a1-1)

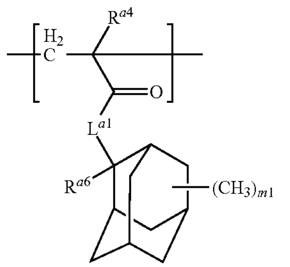

(a1-2)

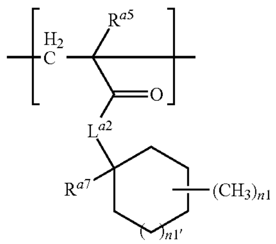

wherein, in formula (a1-1) and formula (a1-2), $L^{a1}$ and $L^{a2}$ each independently represent —O— or *—O—$(CH_2)_{k1}$—CO—O—, k1 represents an integer of 1 to 7, and * represents a bonding site to —CO—, $R^{a4}$ and $R^{a5}$ each independently represent a hydrogen atom or a methyl group, $R^{a6}$ and $R^{a7}$ each independently represent an alkyl group having 1 to 8 carbon atoms, an alkenyl group having 2 to 8 carbon atoms, an alicyclic hydrocarbon group having 3 to 18 carbon atoms, an aromatic hydrocarbon group having 6 to 18 carbon atoms, or a group obtained by combining these groups, m1 represents an integer of 0 to 14, n1 represents an integer of 0 to 10, and n1' represents an integer of 0 to 3, and (a2-A)

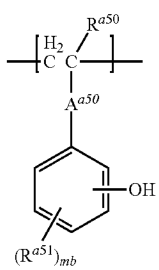

wherein, in formula (a2-A), $R^{a50}$ represents a hydrogen atom, a halogen atom or an alkyl group having 1 to 6 carbon atoms which may have a halogen atom, $R^{a51}$ represents a halogen atom, a hydroxy group, an alkyl group having 1 to 6 carbon atoms, an alkoxy group having 1 to 6 carbon atoms, an alkoxyalkyl group having 2 to 12 carbon atoms, an alkoxyalkoxy group having 2 to 12 carbon atoms, an alkylcarbonyl group having 2 to 4 carbon atoms, an alkylcarbonyloxy group having 2 to 4 carbon atoms, an acryloyloxy group or a methacryloyloxy group, $A^{a50}$ represents a single bond or * —$X^{a51}$-$(A^{a52}$-$X^{a52})_{nb}$—, and * represents a bonding site to carbon atoms to which —$R^{a50}$ is bonded, $A^{a52}$ represents an alkanediyl group having 1 to 6 carbon atoms, $X^{a51}$ and $X^{a52}$ each independently represent —O—, —CO—O— or —O—CO—, nb represents 0 or 1, and mb represents an integer of 0 to 4, and when mb is an integer of 2 or more, a plurality of $R^{a51}$ may be the same or different from each other.

18. The resin according to claim 17, wherein $X^1$ is a single bond.

19. The resin according to claim 17, wherein $X^2$ is —CO—O—* or —O—*, and * represents a bonding site to $Ar^2$.

20. The resin according to claim 17, wherein n is 1 or 2.

21. The resin according to claim 17, wherein the acid-labile group in $R^2$ is a group represented by formula (1a) or a group represented by formula (2a):

(1a)

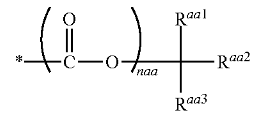

wherein, in formula (1a), $R^{aa1}$, $R^{aa2}$ and $R^{aa3}$ each independently represent an alkyl group having 1 to 8 carbon atoms which may have a substituent, an alkenyl group having 2 to 8 carbon atoms which may have a substituent, an alicyclic hydrocarbon group having 3 to 20 carbon atoms which may have a substituent, or an aromatic hydrocarbon group having 6 to 18 carbon atoms which may have a substituent, or $R^{aa1}$ and $R^{aa2}$ may be bonded each other to form an alicyclic hydrocarbon group having 3 to 20 carbon atoms together with carbon atoms to which $R^{aa1}$ and $R^{aa2}$ are bonded, $n^{aa}$ represents 0 or 1, and

* represents a bond:

(2a)

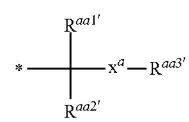

wherein, in formula (2a), $R^{aa1'}$ and $R^{aa2'}$ each independently represent a hydrogen atom or a hydrocarbon group having 1 to 12 carbon atoms, $R^{aa3'}$ represents a hydrocarbon group having 1 to 20 carbon atoms, or $R^{aa2'}$ and $R^{aa3'}$ may be bonded each other to form a heterocyclic group having 3 to 20 carbon atoms together with —C—$X^a$— to which $R^{aa2'}$ and $R^{aa3'}$ are bonded, —$CH_2$— included in the hydrocarbon group and the heterocyclic group may be replaced by —O— or —S—, $X^a$ represents an oxygen atom or a sulfur atom, and

* represents a bond.

22. The resin according to claim 17, wherein n is 2 or more and two $R^2$ combine together to form a group having an acetal ring structure.

23. A resist composition comprising the resin according to claim 17 and an acid generator.

24. The resist composition according to claim 23, wherein the acid generator comprises a salt represented by formula (B1):

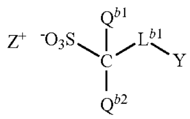

(B1)

wherein, in formula (B1), $Q^{b1}$ and $Q^{b2}$ each independently represent a fluorine atom or a perfluoroalkyl group having 1 to 6 carbon atoms, $L^{b1}$ represents a divalent saturated hydrocarbon group having 1 to 24 carbon atoms, —$CH_2$— included in the divalent saturated hydrocarbon group may be replaced by —O— or —CO—, and a hydrogen atom included in the divalent saturated hydrocarbon group may be substituted with a fluorine atom or a hydroxy group, Y represents a methyl group which may have a substituent or an alicyclic hydrocarbon group having 3 to 24 carbon atoms which may have a substituent, and —$CH_2$— included in the alicyclic hydrocarbon group may be replaced by —O—, —$S(O)_2$— or —CO—, and $Z^+$ represents an organic cation.

25. The resist composition according to claim 23, further comprising a salt generating an acid having an acidity lower than that of an acid generated from the acid generator.

26. A method for producing a resist pattern, which comprises:

(1) a step of applying the resist composition according to claim 23 on a substrate, (2) a step of drying the applied composition to form a composition layer, (3) a step of exposing the composition layer, (4) a step of heating the exposed composition layer, and (5) a step of developing the heated composition layer.

* * * * *